(12) United States Patent
Yamazaki et al.

(10) Patent No.: US 12,200,934 B2
(45) Date of Patent: Jan. 14, 2025

(54) SEMICONDUCTOR DEVICE, STORAGE DEVICE, AND ELECTRONIC DEVICE

(71) Applicant: Semiconductor Energy Laboratory Co., Ltd., Atsugi (JP)

(72) Inventors: Shunpei Yamazaki, Setagaya (JP); Hajime Kimura, Atsugi (JP); Hitoshi Kunitake, Isehara (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 296 days.

(21) Appl. No.: 17/640,549

(22) PCT Filed: Sep. 15, 2020

(86) PCT No.: PCT/IB2020/058537
§ 371 (c)(1),
(2) Date: Mar. 4, 2022

(87) PCT Pub. No.: WO2021/059079
PCT Pub. Date: Apr. 1, 2021

(65) Prior Publication Data
US 2022/0328516 A1    Oct. 13, 2022

(30) Foreign Application Priority Data

Sep. 27, 2019 (JP) .................. 2019-177398
Sep. 27, 2019 (JP) .................. 2019-177403
Dec. 19, 2019 (JP) .................. 2019-229433

(51) Int. Cl.
*H10B 41/10* (2023.01)
*H10B 41/27* (2023.01)
(Continued)

(52) U.S. Cl.
CPC .............. *H10B 43/27* (2023.02); *H10B 41/10* (2023.02); *H10B 41/27* (2023.02); *H10B 41/35* (2023.02);
(Continued)

(58) Field of Classification Search
CPC ......... H10B 43/27; H10B 43/40; H10B 41/10
See application file for complete search history.

(56) References Cited

U.S. PATENT DOCUMENTS 9,059,029 B2    6/2015  Arai
9,312,257 B2    4/2016  Yamazaki et al.
(Continued)

FOREIGN PATENT DOCUMENTS

CN    110832640 A    2/2020
JP    2018-207038 A  12/2018
(Continued)

OTHER PUBLICATIONS

International Search Report (Application No. PCT/IB2020/058537) Dated Dec. 1, 2020.
(Continued)

*Primary Examiner* — Douglas M Menz
(74) *Attorney, Agent, or Firm* — Eric J. Robinson; Robinson Intellectual Property Law Office, P.C.

(57) ABSTRACT

A semiconductor device with high storage capacity is provided. The semiconductor device includes first to sixth insulators, first to third conductors, and first to third material layers. The first conductor overlaps with a first insulator and a first material layer. A first region of the first material layer overlaps with a second material layer, a second conductor, a second insulator, and a third insulator. The third material layer is positioned in a region including a second region of the first material layer and top surfaces of the second material layer, the second conductor, the second insulator, (Continued)

and the third insulator; a fourth insulator is positioned over the third material layer; the sixth insulator is positioned over the fourth insulator; and a fifth insulator is positioned over the sixth insulator. The third conductor is positioned over the fifth insulator overlapping with the second region of the first material layer. The first to third material layers include oxide containing indium, an element M (M is aluminum, gallium, tin, or titanium), and zinc.

12 Claims, 78 Drawing Sheets

(51) Int. Cl.
  *H10B 41/35* (2023.01)
  *H10B 41/40* (2023.01)
  *H10B 43/10* (2023.01)
  *H10B 43/27* (2023.01)
  *H10B 43/35* (2023.01)
  *H10B 43/40* (2023.01)

(52) U.S. Cl.
  CPC ............ *H10B 41/40* (2023.02); *H10B 43/10* (2023.02); *H10B 43/35* (2023.02); *H10B 43/40* (2023.02)

(56) References Cited

U.S. PATENT DOCUMENTS

| | | | |
|---|---|---|---|
| 9,425,107 B2 | 8/2016 | Matsubayashi | |
| 9,748,273 B2 | 8/2017 | Yamazaki et al. | |
| 10,038,011 B2 | 7/2018 | Yamazaki et al. | |
| 10,170,630 B2 | 1/2019 | Arai | |
| 10,418,381 B2 | 9/2019 | Yamazaki et al. | |
| 10,593,693 B2 | 3/2020 | Yamazaki et al. | |
| 10,665,604 B2 | 5/2020 | Kimura et al. | |
| 10,685,984 B2 | 6/2020 | Yamazaki et al. | |
| 10,886,292 B2 | 1/2021 | Kimura et al. | |
| 11,011,542 B2 | 5/2021 | Yamazaki et al. | |
| 11,133,330 B2 | 9/2021 | Yamazaki et al. | |
| 11,152,366 B2 | 10/2021 | Yamazaki et al. | |
| 11,227,920 B2 | 1/2022 | Yamazaki | |
| 11,380,706 B2 * | 7/2022 | Park ................ | H10B 41/27 |
| 11,682,667 B2 * | 6/2023 | Yamazaki ......... | H01L 21/76846 |
| | | | 257/401 |
| 2016/0149004 A1 | 5/2016 | Rabkin et al. | |
| 2019/0027493 A1 | 1/2019 | Kimura et al. | |
| 2020/0161309 A1 | 5/2020 | Asami | |
| 2020/0203339 A1 | 6/2020 | Yamazaki et al. | |
| 2021/0151463 A1 | 5/2021 | Kimura et al. | |
| 2021/0343751 A1 | 11/2021 | Yamazaki et al. | |
| 2021/0366926 A1 | 11/2021 | Yamazaki et al. | |
| 2022/0037323 A1 | 2/2022 | Yamazaki et al. | |

FOREIGN PATENT DOCUMENTS

| | | |
|---|---|---|
| JP | 2019-024087 A | 2/2019 |
| KR | 2020-0019149 A | 2/2020 |
| WO | WO-2019/003060 | 1/2019 |

OTHER PUBLICATIONS

Written Opinion (Application No. PCT/IB2020/058537) Dated Dec. 1, 2020.

* cited by examiner

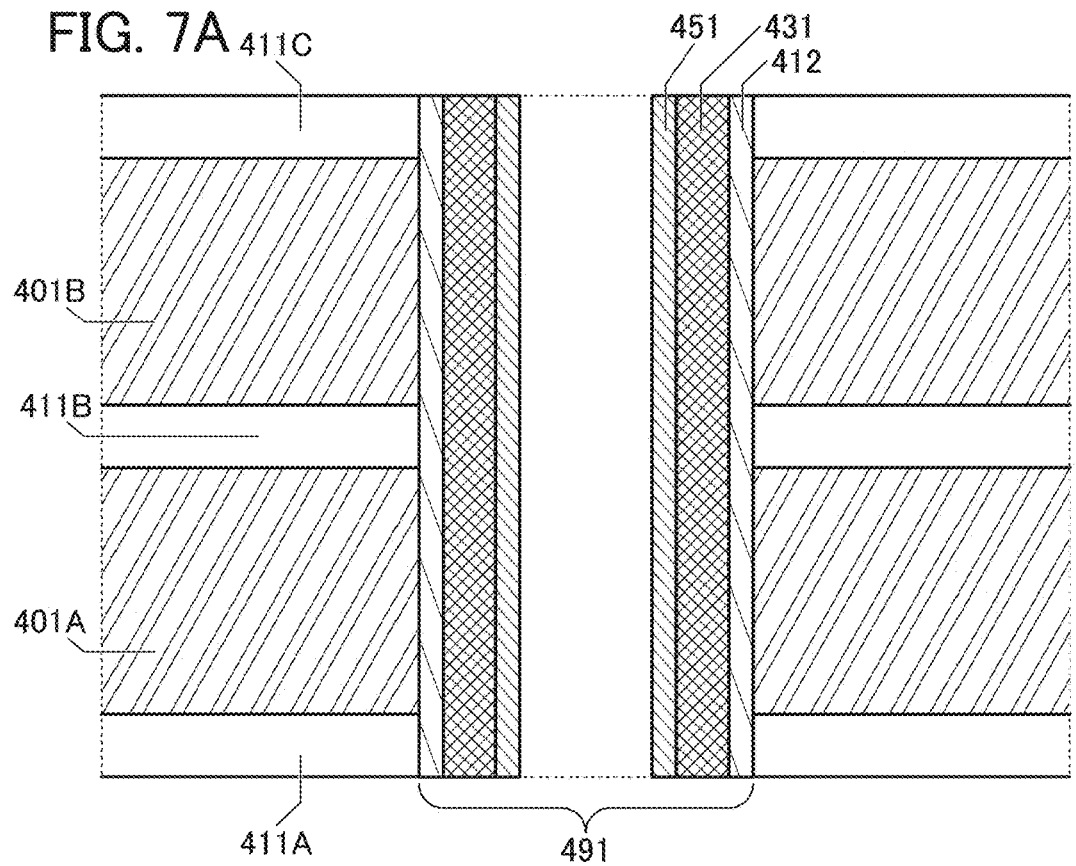
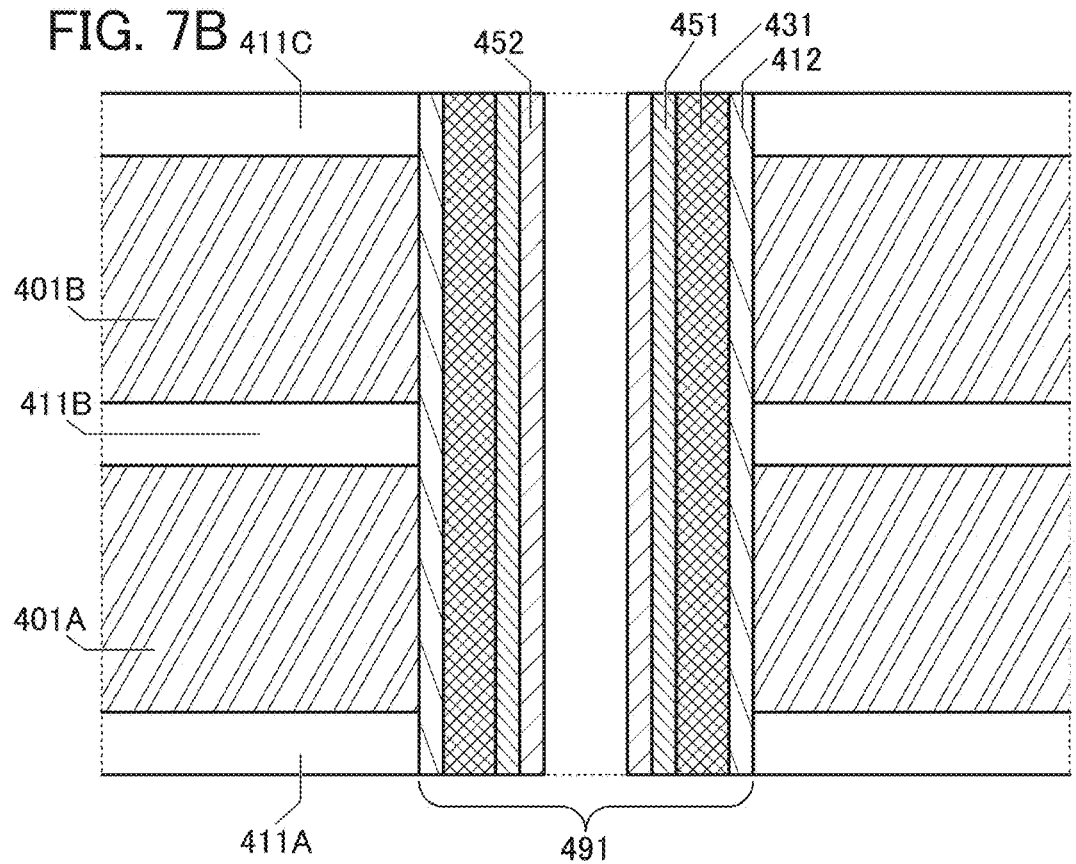

FIG. 59A
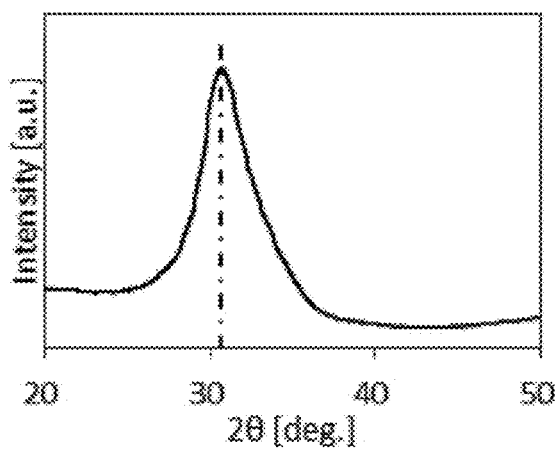
FIG. 59B
FIG. 59C
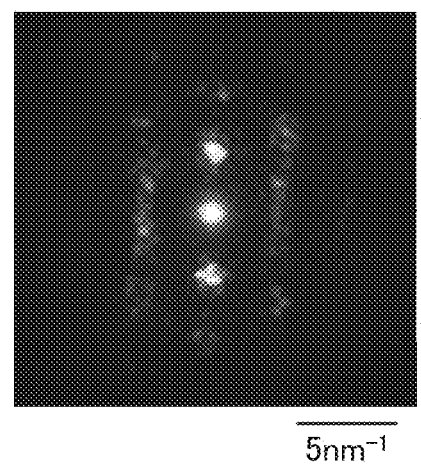

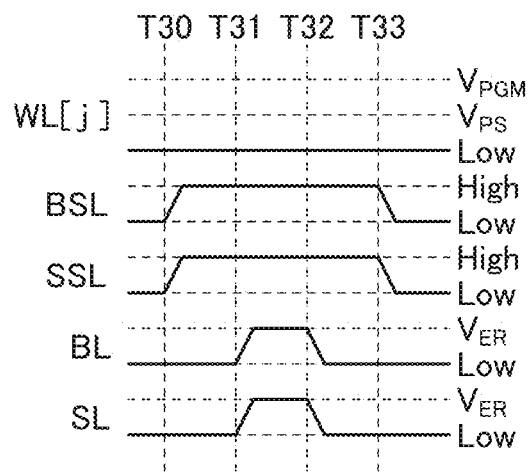
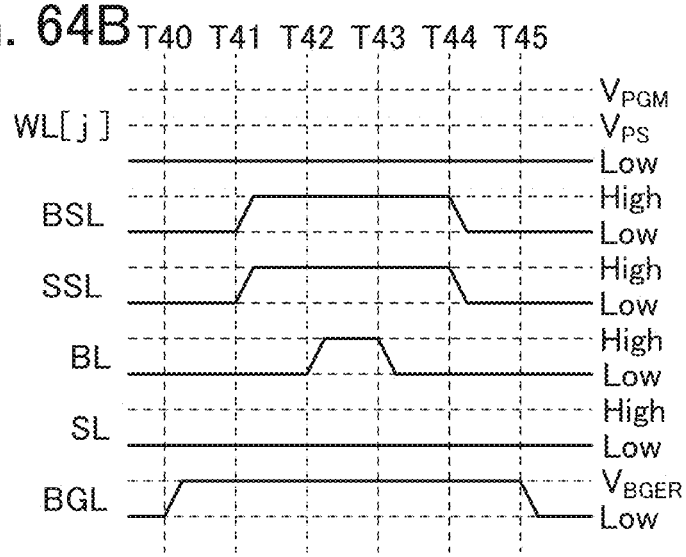

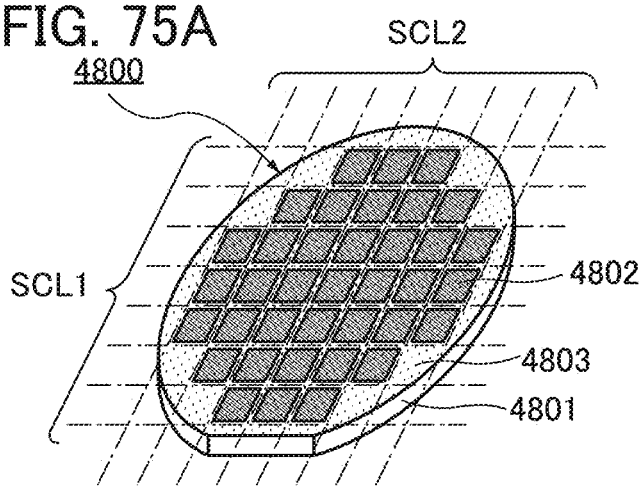
FIG. 75A
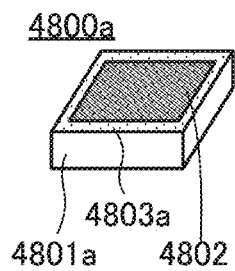
FIG. 75B
FIG. 75C
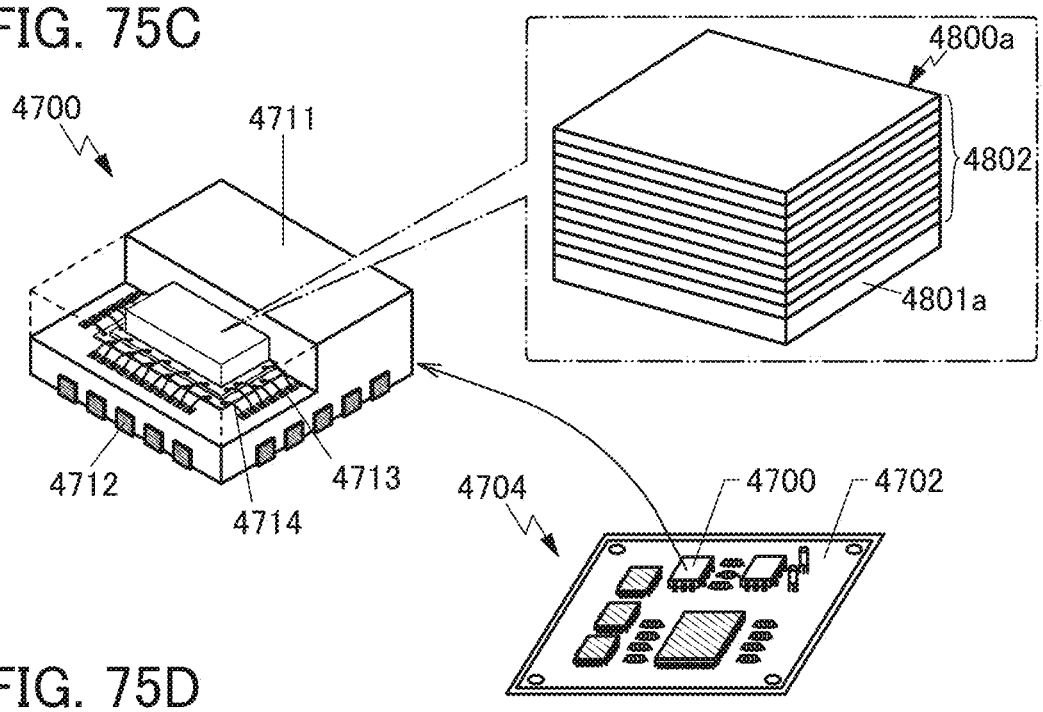
FIG. 75D
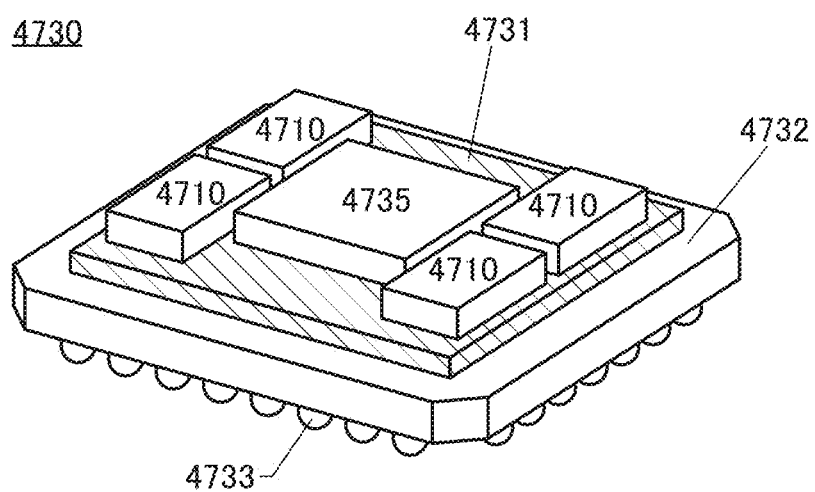

SEMICONDUCTOR DEVICE, STORAGE DEVICE, AND ELECTRONIC DEVICE

TECHNICAL FIELD

One embodiment of the present invention relates to a semiconductor device, a storage device, and an electronic device.

Note that one embodiment of the present invention is not limited to the above technical field. The technical field of the invention disclosed in this specification and the like relates to an object, an operation method, or a manufacturing method. Alternatively, one embodiment of the present invention relates to a process, a machine, manufacture, or a composition of matter. Therefore, specific examples of the technical field of one embodiment of the present invention disclosed in this specification include a semiconductor device, a display device, a liquid crystal display device, a light-emitting device, a power storage device, an imaging device, a storage device, a signal processing device, a processor, an electronic device, a system, a driving method thereof, a manufacturing method thereof, and a testing method thereof.

BACKGROUND ART

In recent years, electronic components such as central processing units (CPUs), graphics processing units (GPUs), storage devices, and sensors have been used in various electronic devices such as personal computers, smartphones, and digital cameras; the electronic components have been improved in various aspects such as miniaturization and low power consumption.

Storage devices with large storage capacity are especially required because the amount of data handled in the aforementioned electronic devices and the like has increased. As an example of a means for increasing storage capacity, Patent Document 1 discloses a three-dimensional NAND memory element using metal oxide for a channel formation region.

REFERENCE

Patent Document

[Patent Document 1] United States Patent Application Publication No. 2016/149004

SUMMARY OF THE INVENTION

Problems to be Solved by the Invention

A semiconductor layer of a transistor included in a memory element or the like is divided into a channel formation region and a low-resistance region. In particular, in the case where metal oxide is used for a semiconductor layer of a three-dimensional NAND memory, how to form a low-resistance region of the metal oxide is important. In metal oxide used for a semiconductor layer of a transistor, a low-carrier-concentration (in some cases, also referred to as intrinsic, substantially intrinsic, or the like in this specification and the like) region functions as a channel formation region, and a high-carrier-concentration region functions as a low-resistance region. Accordingly, forming a channel formation region and a low-resistance region separately is a challenge in fabricating a three-dimensional NAND memory using metal oxide for a semiconductor layer. After the channel formation region and the low-resistance region are formed separately, a film with a high barrier property is preferably formed in the channel formation region so as not to change the carrier concentration in the channel formation region due to diffusion of impurities or the like. In order to increase the data capacity of the NAND memory, it is preferable that the channel formation region and the low-resistance region be formed small and separately and the number of cell transistors for one string be increased. Note that the cell transistor is an example of a memory cell and includes a transistor with a structure capable of holding data, and the like.

An object of one embodiment of the present invention is to provide a highly reliable semiconductor device. Another object of one embodiment of the present invention is to provide a semiconductor device with large data capacity. Another object of one embodiment of the present invention is to provide a novel semiconductor device. Another object of one embodiment of the present invention is to apply a storage device including a novel semiconductor device. Another object of one embodiment of the present invention is to provide an electronic device including the storage device.

Note that the objects of one embodiment of the present invention are not limited to the objects listed above. The objects listed above do not preclude the existence of other objects. Note that the other objects are objects that are not described in this section and are described below. The objects that are not described in this section are derived from the description of the specification, the drawings, and the like and can be extracted as appropriate from the description by those skilled in the art. Note that one embodiment of the present invention is to achieve at least one of the objects listed above and the other objects. Note that one embodiment of the present invention does not necessarily achieve all the objects listed above and the other objects.

Means for Solving the Problems (1) One embodiment of the present invention is a semiconductor device including a columnar first conductor, a second conductor, a third conductor, a first insulator, a second insulator, a third insulator, a fourth insulator, a fifth insulator, a sixth insulator, a first material layer, a second material layer, and a third material layer. The first material layer includes a first region and a second region. The first insulator is positioned adjacent to the first conductor, and the first material layer is positioned adjacent to the first insulator. The second material layer is positioned adjacent to the first region of the first material layer, the second conductor is positioned adjacent to the second material layer, the second insulator is positioned adjacent to the second conductor, and the third insulator is positioned adjacent to the second insulator. The third material layer is positioned to cover the second material layer, the second conductor, the second insulator, the third insulator, and the second region of the first material layer; the fourth insulator is positioned adjacent to the third material layer; the sixth insulator is positioned adjacent to the fourth insulator; the fifth insulator is positioned adjacent to the sixth insulator; and the third conductor is positioned adjacent to the fifth insulator and in a region overlapping with the first region of the first material layer. The second insulator functions as a barrier insulating film that inhibits diffusion of oxygen into the second conductor; the fourth insulator functions as a tunnel insulating film; the sixth insulator functions as a charge accumulation layer; and the fifth insulator functions as a gate insulating film. The first material layer includes oxide containing indium, an element M (M is aluminum, gallium, tin, or titanium), and zinc; the second material layer includes oxide containing indium, the element M, and zinc; and the third material layer includes oxide containing indium, the element M, and zinc.

(2) One embodiment of the present invention is a semiconductor device including a columnar first conductor, a second conductor, a third conductor, a fourth conductor, a first insulator, a second insulator, a third insulator, a fourth insulator, a fifth insulator, a first material layer, a second material layer, and a third material layer. The first material layer includes a first region and a second region. The first insulator is positioned adjacent to the first conductor; the first material layer is positioned adjacent to the first insulator; the second material layer is positioned adjacent to the first region of the first material layer; the second conductor is positioned adjacent to the second material layer; the second insulator is positioned adjacent to the second conductor; and the third insulator is positioned adjacent to the second insulator. The third material layer is positioned to cover the second material layer, the second conductor, the second insulator, the third insulator, and the second region of the first material layer; the fourth insulator is positioned adjacent to the third material layer; the fourth conductor is positioned adjacent to the fourth insulator and in a region overlapping with the first region of the first material layer; the fifth insulator is positioned to cover the fourth conductor and the fourth insulator; and the third conductor is positioned adjacent to the fifth insulator and in a region overlapping with the first region of the first material layer. The second insulator functions as a barrier insulating film that inhibits diffusion of oxygen into the second conductor; the fourth insulator functions as a tunnel insulating film; the fourth conductor functions as a floating gate electrode; and the fifth insulator functions as a gate insulating film. The first material layer includes oxide containing indium, an element M (M is aluminum, gallium, tin, or titanium), and zinc; the second material layer includes oxide containing indium, the element M, and zinc; and the third material layer includes oxide containing indium, the element M, and zinc.

(3) In the structure of (1) or (2) above, the first material layer may include a fourth material layer and a fifth material layer. In particular, it is preferable that the fourth material layer be positioned adjacent to the first insulator, the fifth material layer be positioned adjacent to the fourth material layer, the first region of the first material layer be positioned in the fifth material layer, and the second region of the first material layer be positioned in the fifth material layer. The atomic ratio of the element M to indium contained in the second material layer is preferably higher than the atomic ratio of the element M to indium contained in the fifth material layer. The atomic ratio of the element M to indium contained in the fourth material layer is preferably higher than the atomic ratio of the element M to indium contained in the fifth material layer.

(4) In the structure of any one of (1) to (3) above, the second region of the first material layer may have a higher oxygen concentration than the first region of the first material layer.

(5) In the structure of any one of (1) to (4) above, the thickness of the second region of the first material layer may be smaller than the thickness of the first region of the first material layer.

(6) One embodiment of the present invention is a storage device including the semiconductor device in any one of (1) to (5) and a peripheral circuit.

(7) One embodiment of the present invention is an electronic device including the storage device in any one of (1) to (6) and a housing.

Note that in this specification and the like, a semiconductor device refers to a device that utilizes semiconductor characteristics, and means a circuit including a semiconductor element (a transistor, a diode, a photodiode, or the like), a device including the circuit, and the like. The semiconductor device also means all devices that can function by utilizing semiconductor characteristics. For example, an integrated circuit, a chip including an integrated circuit, and an electronic component including a chip in a package are examples of the semiconductor device. Moreover, a storage device, a display device, a light-emitting device, a lighting device, an electronic device, and the like themselves are semiconductor devices, or include semiconductor devices in some cases.

In the case where there is a description "X and Y are connected" in this specification and the like, the case where X and Y are electrically connected, the case where X and Y are functionally connected, and the case where X and Y are directly connected are regarded as being disclosed in this specification and the like. Accordingly, without being limited to a predetermined connection relationship, for example, a connection relationship shown in drawings or texts, a connection relationship other than one shown in drawings or texts is regarded as being disclosed in the drawings or the texts. Each of X and Y denotes an object (e.g., a device, an element, a circuit, a wiring, an electrode, a terminal, a conductive film, or a layer).

For example, in the case where X and Y are electrically connected, one or more elements that allow(s) electrical connection between X and Y (e.g., a switch, a transistor, a capacitor, an inductor, a resistor, a diode, a display device, a light-emitting device, and a load) can be connected between X and Y. Note that a switch has a function of being controlled to be turned on or off. That is, the switch has a function of being in a conduction state (on state) or a non-conduction state (off state) to control whether a current flows or not.

For example, in the case where X and Y are functionally connected, one or more circuits that allow(s) functional connection between X and Y (e.g., a logic circuit (an inverter, a NAND circuit, a NOR circuit, or the like); a signal converter circuit (a digital-analog converter circuit, an analog-digital converter circuit, a gamma correction circuit, or the like); a potential level converter circuit (a power supply circuit (a step-up circuit, a step-down circuit, or the like), a level shifter circuit for changing the potential level of a signal, or the like); a voltage source; a current source; a switching circuit; an amplifier circuit (a circuit that can increase signal amplitude, the amount of current, or the like, an operational amplifier, a differential amplifier circuit, a source follower circuit, a buffer circuit, or the like); a signal generation circuit; a memory circuit; or a control circuit) can be connected between X and Y. For example, even when another circuit is interposed between X and Y, X and Y are regarded as being functionally connected when a signal output from X is transmitted to Y.

Note that an explicit description, X and Y are electrically connected, includes the case where X and Y are electrically connected (i.e., the case where X and Y are connected with another element or another circuit interposed therebetween) and the case where X and Y are directly connected (i.e., the case where X and Y are connected without another element or another circuit interposed therebetween).

It can be expressed as, for example, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order". Alternatively, it can be expressed as "a source (or a first terminal or the like) of a transistor is electrically connected to X; a drain (or a second terminal or the like) of the transistor is electrically connected to Y; and X, the source (or the first terminal or the like) of the transistor, the drain (or the second terminal or the like) of the transistor, and Y are electrically connected to each other in this order". Alternatively, it can be expressed as "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided in this connection order". When the connection order in a circuit configuration is defined by an expression similar to the above examples, a source (or a first terminal or the like) and a drain (or a second terminal or the like) of a transistor can be distinguished from each other to specify the technical scope. Note that these expressions are examples and the expression is not limited to these expressions. Here, X and Y each denote an object (e.g., a device, an element, a circuit, a wiring, an electrode, a terminal, a conductive film, or a layer).

Even when independent components are electrically connected to each other in a circuit diagram, one component has functions of a plurality of components in some cases. For example, when part of a wiring also functions as an electrode, one conductive film has functions of both components: a function of the wiring and a function of the electrode. Thus, electrical connection in this specification includes, in its category, such a case where one conductive film has functions of a plurality of components.

In this specification and the like, a "resistor" can be, for example, a circuit element or a wiring having a resistance value higher than 0Ω. Therefore, in this specification and the like, a "resistor" sometimes includes a wiring having a resistance value, a transistor in which current flows between its source and drain, a diode, and a coil. Thus, the term "resistor" can be replaced with the terms "resistance", "load", "region having a resistance value", and the like; inversely, the terms "resistance", "load", and "region having a resistance value" can be replaced with the term "resistor" and the like. The resistance value can be, for example, preferably greater than or equal to 1 mΩ and less than or equal to 10Ω, further preferably greater than or equal to 5 mΩ and less than or equal to 5Ω, still further preferably greater than or equal to 10 mΩ and less than or equal to 1Ω. As another example, the resistance value may be greater than or equal to 1Ω and less than or equal to $1\times10^9$Ω.

In this specification and the like, a "capacitor" can be, for example, a circuit element having an electrostatic capacitance value higher than 0 F, a region of a wiring having an electrostatic capacitance value, parasitic capacitance, or gate capacitance of a transistor. Therefore, in this specification and the like, a "capacitor" includes a circuit element that has a pair of electrodes and a dielectric between the electrodes. The term "capacitor", "parasitic capacitance", "gate capacitance", or the like can be replaced with the term "capacitance" or the like in some cases. Conversely, the term "capacitance" can be replaced with the term "capacitor", "parasitic capacitance", "gate capacitance", or the like. The term a "pair of electrodes" of a "capacitor" can be replaced with a "pair of conductors", a "pair of conductive regions", a "pair of regions", or the like in some cases. Note that the electrostatic capacitance value can be greater than or equal to 0.05 fF and less than or equal to 10 pF, for example. Alternatively, the electrostatic capacitance value may be greater than or equal to 1 pF and less than or equal to 10 μF, for example.

In this specification and the like, a transistor includes three terminals called a gate, a source, and a drain. The gate functions as a control terminal for controlling the conduction state of the transistor. Two terminals functioning as the source and the drain are input/output terminals of the transistor. One of the two input/output terminals serves as the source and the other serves as the drain on the basis of the conductivity type (n-channel type or p-channel type) of the transistor and the levels of potentials applied to the three terminals of the transistor. Thus, in this specification and the like, the terms "source" and "drain" can be replaced with each other in some cases. In this specification and the like, expressions "one of a source and a drain" (or a first electrode or a first terminal) and "the other of the source and the drain" (or a second electrode or a second terminal) are used in description of the connection relationship of a transistor. Depending on the transistor structure, a transistor may include a back gate in addition to the above three terminals. In that case, in this specification and the like, one of the gate and the back gate of the transistor may be referred to as a first gate and the other of the gate and the back gate of the transistor may be referred to as a second gate. Moreover, the terms "gate" and "back gate" can be replaced with each other in one transistor in some cases. In the case where a transistor includes three or more gates, the gates may be referred to as a first gate, a second gate, and a third gate, for example, in this specification and the like.

In this specification and the like, a node can be referred to as a terminal, a wiring, an electrode, a conductive layer, a conductor, an impurity region, or the like depending on the circuit configuration, the device structure, or the like. Furthermore, a terminal, a wiring, or the like can be referred to as a node.

In this specification and the like, "voltage" and "potential" can be replaced with each other as appropriate. The "voltage" refers to a potential difference from a reference potential, and when the reference potential is a ground potential, for example, the "voltage" can be replaced with the "potential". Note that the ground potential does not necessarily mean 0 V. Moreover, potentials are relative values, and a potential supplied to a wiring, a potential applied to a circuit and the like, a potential output from a circuit and the like, for example, are changed with a change of the reference potential.

In this specification and the like, the term "high-level potential" or "low-level potential" does not mean a particular potential. For example, in the case where two wirings are both described as "functioning as a wiring for supplying a high-level potential", the levels of the high-level potentials supplied by the wirings are not necessarily equal to each other. Similarly, in the case where two wirings are both described as "functioning as a wiring for supplying a low-level potential", the levels of the low-level potentials supplied by the wirings are not necessarily equal to each other.

Note that "current" is a charge transfer (electrical conduction); for example, the description "electrical conduction of positively charged particles occurs" can be rephrased as "electrical conduction of negatively charged particles occurs in the opposite direction". Therefore, unless otherwise specified, "current" in this specification and the like refers to a charge transfer (electrical conduction) accompanied by carrier movement. Examples of a carrier here include an electron, a hole, an anion, a cation, and a complex ion, and the type of carrier differs between current flow systems (e.g., a semiconductor, a metal, an electrolyte solution, and a vacuum). The "direction of a current" in a wiring or the like refers to the direction in which a positive carrier moves, and the amount of current is expressed as a positive value. In other words, the direction in which a negative carrier moves is opposite to the direction of a current, and the amount of current is expressed as a negative value. Thus, in the case where the polarity of a current (or the direction of a current) is not specified in this specification and the like, the description "current flows from element A to element B" can be rephrased as "current flows from element B to element A", for example. The description "current is input to element A" can be rephrased as "current is output from element A", for example.

Ordinal numbers such as "first", "second", and "third" in this specification and the like are used to avoid confusion among components. Thus, the terms do not limit the number of components. In addition, the terms do not limit the order of components. In this specification and the like, for example, a "first" component in one embodiment can be referred to as a "second" component in other embodiments or the scope of claims. Furthermore, in this specification and the like, for example, a "first" component in one embodiment can be omitted in other embodiments or the scope of claims.

In this specification and the like, the terms for describing positioning, such as "over" or "above" and "under" or "below", are sometimes used for convenience to describe the positional relationship between components with reference to drawings. The positional relationship between components is changed as appropriate in accordance with a direction in which the components are described. Thus, the positional relationship is not limited to the terms described in the specification and the like, and can be described with another term as appropriate depending on the situation. For example, the expression "an insulator positioned over (on) a top surface of a conductor" can be replaced with the expression "an insulator positioned under (on) a bottom surface of a conductor" when the direction of a drawing showing these components is rotated by 180°.

Furthermore, the terms such as "over" or "above" and "under" or "below" do not necessarily mean that a component is placed directly over or directly under and in direct contact with another component. For example, the expression "electrode B over insulating layer A" does not necessarily mean that the electrode B is formed over and in direct contact with the insulating layer A, and does not exclude the case where another component is provided between the insulating layer A and the electrode B.

In this specification and the like, the terms "film", "layer", and the like can be interchanged with each other depending on the situation. For example, the term "conductive layer" can be changed into the term "conductive film" in some cases. Moreover, the term "insulating film" can be changed into the term "insulating layer" in some cases. Alternatively, the term "film", "layer", or the like is not used and can be interchanged with another term depending on the case or according to circumstances. For example, the term "conductive layer" or "conductive film" can be changed into the term "conductor" in some cases. Furthermore, for example, the term "insulating layer" or "insulating film" can be changed into the term "insulator" in some cases.

In this specification and the like, the term "electrode", "wiring", "terminal", or the like does not limit the function of a component. For example, an "electrode" is used as part of a "wiring" in some cases, and vice versa. Furthermore, the term "electrode" or "wiring" also includes the case where a plurality of "electrodes" or "wirings" are formed in an integrated manner, for example. For example, a "terminal" is used as part of a "wiring" or an "electrode" in some cases, and vice versa. Furthermore, the term "terminal" can also include the case where a plurality of "electrodes", "wirings", "terminals", or the like are formed in an integrated manner. Therefore, for example, an "electrode" can be part of a "wiring" or a "terminal", and a "terminal" can be part of a "wiring" or an "electrode". Moreover, the term "electrode", "wiring", "terminal", or the like is sometimes replaced with the term "region", for example.

In this specification and the like, the terms "wiring", "signal line", "power supply line", and the like can be interchanged with each other depending on the case or according to circumstances. For example, the term "wiring" can be changed into the term "signal line" in some cases. As another example, the term "wiring" can be changed into the term "power supply line" in some cases. Inversely, the term "signal line", "power supply line", or the like can be changed into the term "wiring" in some cases. The term "power supply line" or the like can be changed into the term "signal line" or the like in some cases. Inversely, the term "signal line" or the like can be changed into the term "power supply line" or the like in some cases. The term "potential" that is applied to a wiring can be changed into the term "signal" or the like depending on the case or according to circumstances. Inversely, the term "signal" or the like can be changed into the term "potential" in some cases.

In this specification and the like, an impurity in a semiconductor refers to an element other than a main component of a semiconductor layer, for example. For example, an element with a concentration of lower than 0.1 atomic % is an impurity. When an impurity is contained, for example, the density of defect states in a semiconductor may be increased, the carrier mobility may be decreased, or the crystallinity may be decreased. In the case where the semiconductor is an oxide semiconductor, examples of an impurity that changes characteristics of the semiconductor include Group 1 elements, Group 2 elements, Group 13 elements, Group 14 elements, Group 15 elements, and transition metals other than the main components; specific examples are hydrogen (contained also in water), lithium, sodium, silicon, boron, phosphorus, carbon, and nitrogen. Specifically, in the case where the semiconductor is a silicon layer, examples of an impurity that changes characteristics of the semiconductor include oxygen, Group 1 elements except hydrogen, Group 2 elements, Group 13 elements, and Group 15 elements.

In this specification and the like, a switch has a function of being in a conduction state (on state) or a non-conduction state (off state) to determine whether a current flows or not. Alternatively, a switch has a function of selecting and changing a current path. For example, an electrical switch or a mechanical switch can be used. That is, a switch can be any element capable of controlling a current, and is not limited to a particular element.

Examples of an electrical switch include a transistor (e.g., a bipolar transistor and a MOS transistor), a diode (e.g., a PN diode, a PIN diode, a Schottky diode, a MIM (Metal Insulator Metal) diode, a MIS (Metal Insulator Semiconductor) diode, and a diode-connected transistor), and a logic circuit in which such elements are combined. Note that in the case of using a transistor as a switch, a "conduction state" of the transistor refers to a state where a source electrode and a drain electrode of the transistor can be regarded as being electrically short-circuited. Furthermore, a "non-conduction state" of the transistor refers to a state where the source electrode and the drain electrode of the transistor can be regarded as being electrically disconnected. Note that in the case where a transistor operates just as a switch, there is no particular limitation on the polarity (conductivity type) of the transistor.

An example of a mechanical switch is a switch formed using a MEMS (micro electro mechanical system) technology. Such a switch includes an electrode that can be moved mechanically, and operates by controlling conduction and non-conduction with movement of the electrode.

In this specification, "parallel" indicates a state where two straight lines are placed at an angle greater than or equal to $-10°$ and less than or equal to $10°$. Thus, the case where the angle is greater than or equal to $-5°$ and less than or equal to $5°$ is also included. In addition, the term "approximately parallel" or "substantially parallel" indicates a state where two straight lines are placed at an angle greater than or equal to $-30°$ and less than or equal to $30°$. Moreover, "perpendicular" indicates a state where two straight lines are placed at an angle greater than or equal to $80°$ and less than or equal to $100°$. Thus, the case where the angle is greater than or equal to $85°$ and less than or equal to $95°$ is also included. Furthermore, "approximately perpendicular" or "substantially perpendicular" indicates a state where two straight lines are placed at an angle greater than or equal to $60°$ and less than or equal to $120°$.

Effect of the Invention

One embodiment of the present invention can provide a highly reliable semiconductor device. One embodiment of the present invention can provide a semiconductor device with large data capacity. One embodiment of the present invention can provide a novel semiconductor device. One embodiment of the present invention can apply a storage device including a novel semiconductor device. One embodiment of the present invention can provide an electronic device including the storage device.

Note that the effects of one embodiment of the present invention are not limited to the effects listed above. The effects listed above do not preclude the existence of other effects. Note that the other effects are effects that are not described in this section and will be described below. The effects that are not described in this section are derived from the descriptions of the specification, the drawings, and the like and can be extracted from these descriptions by those skilled in the art. Note that one embodiment of the present invention has at least one of the effects listed above and the other effects. Accordingly, depending on the case, one embodiment of the present invention does not have the effects listed above in some cases.

BRIEF DESCRIPTION OF THE DRAWINGS

FIG. 7A and FIG. 7B are cross-sectional views illustrating an example of manufacturing a semiconductor device.

FIG. 59A is a diagram showing classifications of crystal structures of IGZO, FIG. 59B is a diagram showing an XRD spectrum of crystalline IGZO, and FIG. 59C is a diagram showing nanobeam electron diffraction patterns of the crystalline IGZO.

FIG. 64A and FIG. 64B are timing charts showing operation examples of a semiconductor device.

FIG. 75A is a perspective view illustrating an example of a semiconductor wafer, FIG. 75B is a perspective view illustrating an example of a chip, and FIG. 75C and FIG. 75D are perspective views illustrating examples of electronic components.

MODE FOR CARRYING OUT THE INVENTION

Figure 1:
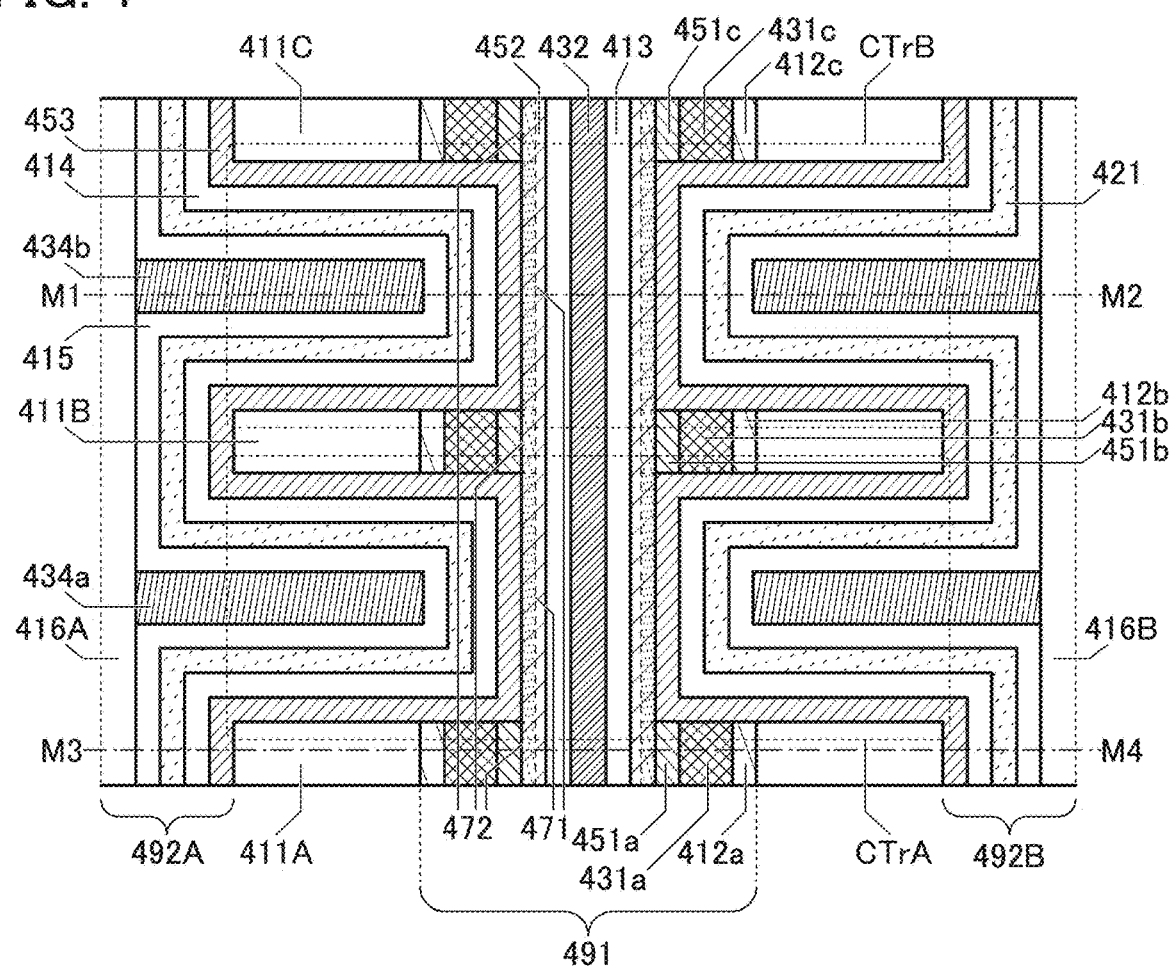
FIG. 1 is a cross-sectional view illustrating a structure example of a semiconductor device.

In this specification and the like, metal oxide is oxide of metal in a broad sense. Metal oxides are classified into an oxide insulator, an oxide conductor (including a transparent oxide conductor), an oxide semiconductor (also simply referred to as an OS), and the like. For example, in the case where metal oxide is used in an active layer of a transistor, the metal oxide is referred to as an oxide semiconductor in some cases. That is, when metal oxide can form a channel formation region of a transistor that has at least one of an amplifying function, a rectifying function, and a switching function, the metal oxide can be referred to as a metal oxide semiconductor. In the case where an OS transistor is mentioned, the OS transistor can also be referred to as a transistor including metal oxide or an oxide semiconductor.

Furthermore, in this specification and the like, metal oxide containing nitrogen is also collectively referred to as metal oxide in some cases. Metal oxide containing nitrogen may be referred to as metal oxynitride.

In this specification and the like, one embodiment of the present invention can be constituted by appropriately combining a structure described in an embodiment with any of the structures described in the other embodiments. In addition, in the case where a plurality of structure examples are described in one embodiment, the structure examples can be combined as appropriate.

Note that a content (or part of the content) described in one embodiment can be applied to, combined with, or replaced with at least one of another content (or part of the content) described in the embodiment and a content (or part of the content) described in one or a plurality of different embodiments.

Note that in each embodiment, a content described in the embodiment is a content described with reference to a variety of diagrams or a content described with text disclosed in the specification.

Note that by combining a diagram (or part thereof) described in one embodiment with at least one of another part of the diagram, a different diagram (or part thereof) described in the embodiment, and a diagram (or part thereof) described in one or a plurality of different embodiments, much more diagrams can be formed.

Embodiments described in this specification are described with reference to the drawings. Note that the embodiments can be implemented in many different modes, and it will be readily appreciated by those skilled in the art that modes and details can be changed in various ways without departing from the spirit and scope thereof. Therefore, the present invention should not be interpreted as being limited to the description in the embodiments. Note that in the structures of the invention in the embodiments, the same portions or portions having similar functions are denoted by the same reference numerals in different drawings, and repeated description thereof is omitted in some cases. In perspective views and the like, some components might not be illustrated for clarity of the drawings.

In this specification and the like, when a plurality of components are denoted by the same reference numerals, and in particular need to be distinguished from each other, an identification sign such as "_1", "[n]", or "[m,n]" is sometimes added to the reference numerals.

In the drawings in this specification, the size, the layer thickness, or the region is exaggerated for clarity in some cases. Therefore, they are not limited to the illustrated scale. The drawings are schematic views showing ideal examples, and embodiments of the present invention are not limited to shapes or values shown in the drawings. For example, variations in signal, voltage, or current due to noise, variations in signal, voltage, or current due to difference in timing, or the like can be included.

Embodiment 1

In this embodiment, structure examples of a semiconductor device of one embodiment of the present invention functioning as a storage device, and an example of a method of manufacturing the semiconductor device will be described. Note that in this embodiment, a semiconductor device including a cell transistor including a charge accumulation layer is discussed.

<Structure Example 1 of Semiconductor Device>

Figure 2A:
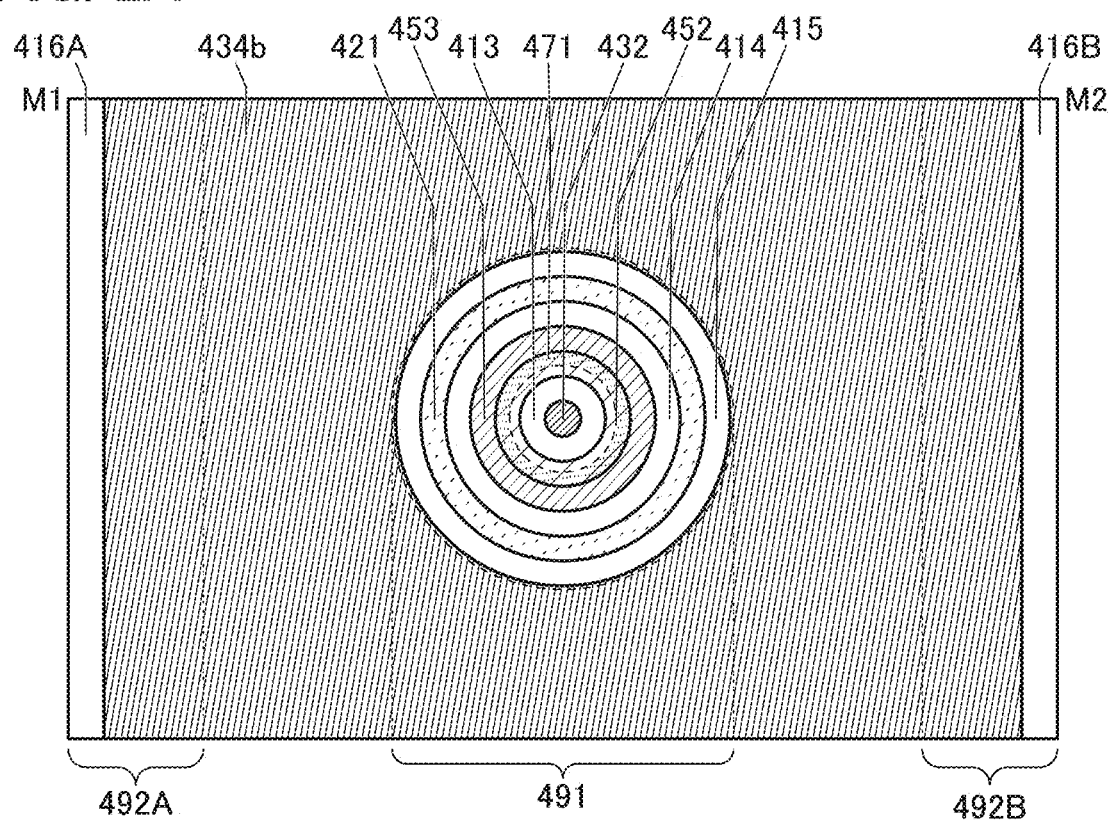
FIG. 2A and FIG. 2B are top views illustrating a structure example of a semiconductor device.
Figure 2B:
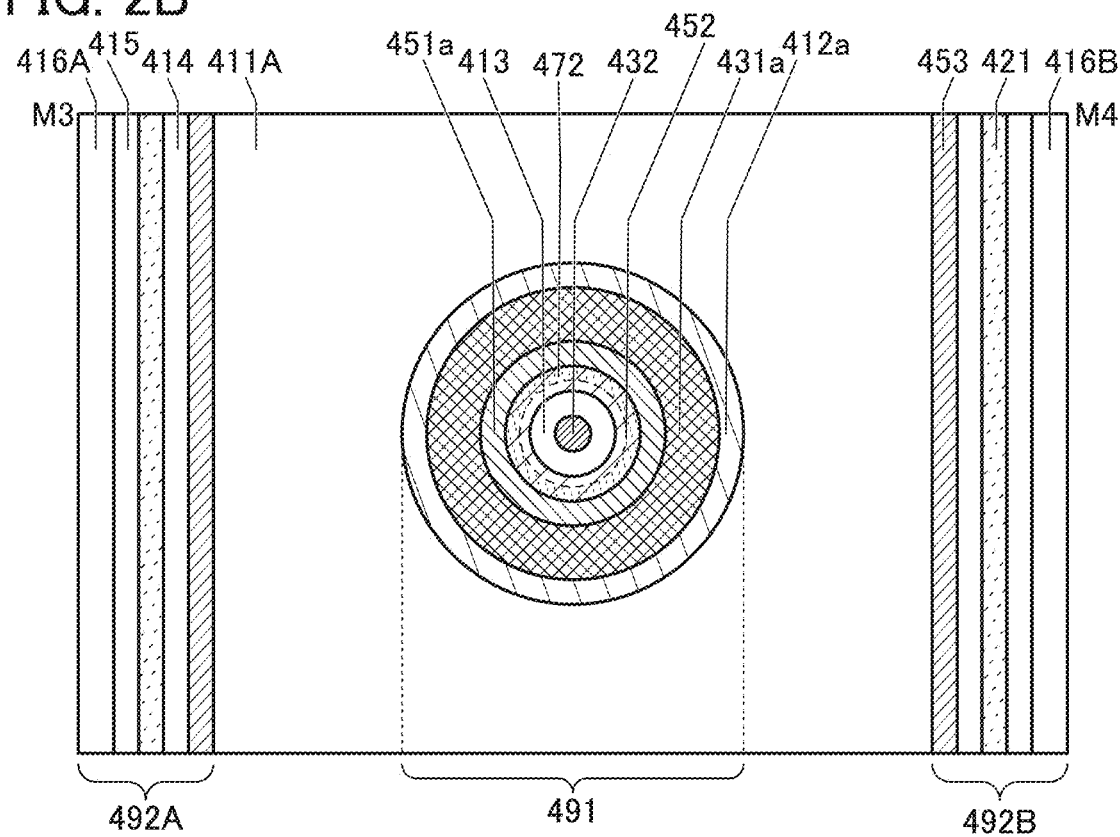

A structure of a semiconductor device including a cell transistor CTrA and a cell transistor CTrB is described with reference to FIG. 1, FIG. 2A, and FIG. 2B. FIG. 1 is a cross-sectional view of the semiconductor device. FIG. 2A is a top view taken along the dashed-dotted line M1-M2 in FIG. 1, and FIG. 2B is a top view taken along the dashed-dotted line M3-M4 in FIG. 1. Note that for simplification of the drawings, some components are omitted in the cross-sectional view of FIG. 1, the top view of FIG. 2A, and the top view of FIG. 2B.

The semiconductor device in FIG. 1 includes an insulator 411A placed above a substrate (not illustrated), an insulator 411B placed above the insulator 411A, and an insulator 411C placed above the insulator 411B.

Note that as the substrate, an insulator substrate, a semiconductor substrate, or a conductor substrate may be used, for example. Examples of the insulator substrate include a glass substrate, a quartz substrate, a sapphire substrate, a stabilized zirconia substrate (e.g., an yttria-stabilized zirconia substrate), and a resin substrate. Examples of the semiconductor substrate include a semiconductor substrate using silicon as a material, a semiconductor substrate using germanium as a material, and a compound semiconductor substrate using silicon carbide, silicon germanium, gallium arsenide, indium phosphide, zinc oxide, or gallium oxide as a material. Another example is a semiconductor substrate in which an insulator region is included in the semiconductor substrate, e.g., an SOI (Silicon On Insulator) substrate. Examples of the conductor substrate include a graphite substrate, a metal substrate, an alloy substrate, and a conductive resin substrate. Other examples include a substrate including metal nitride and a substrate including metal oxide. Other examples include an insulator substrate provided with a conductor or a semiconductor, a semiconductor substrate provided with a conductor or an insulator, and a conductor substrate provided with a semiconductor or an insulator. Alternatively, these substrates provided with elements may be used. Examples of the element provided for the substrate include a capacitor, a resistor, a switching element, a light-emitting element, and a memory element.

A flexible substrate may be used as the substrate. Note that as a method of providing a transistor over a flexible substrate, there is a method in which the transistor is fabricated over a non-flexible substrate and then the transistor is separated and transferred to a substrate which is a flexible substrate. In that case, a separation layer is preferably provided between the non-flexible substrate and the transistor. As the substrate, a sheet, a film, a foil, or the like in which a fiber is weaved may be used. In addition, the substrate may have elasticity. Furthermore, the substrate may have a property of returning to its original shape when bending or pulling is stopped. Alternatively, the substrate may have a property of not returning to its original shape. The substrate has a region with a thickness of, for example, greater than or equal to 5 μm and less than or equal to 700 μm, preferably greater than or equal to 10 μm and less than or equal to 500 μm, further preferably greater than or equal to 15 μm and less than or equal to 300 μm. When the substrate has a small thickness, the weight of the semiconductor device including the transistor can be reduced. Moreover, when the substrate has a small thickness, even in the case of using glass or the like, the substrate may have elasticity or a property of returning to its original shape when bending or pulling is stopped. Thus, an impact applied to a semiconductor device over the substrate, which is caused by dropping or the like, can be reduced, for example. That is, a durable semiconductor device can be provided.

For the substrate which is a flexible substrate, metal, an alloy, a resin, glass, or fiber thereof can be used, for example. The substrate which is a flexible substrate preferably has a lower coefficient of linear expansion because deformation due to an environment is inhibited. For the substrate which is a flexible substrate, a material whose coefficient of linear expansion is lower than or equal to $1\times10^{-3}$/K, lower than or equal to $5\times10^{-5}$/K, or lower than or equal to $1\times10^{-5}$/K can be used, for example. Examples of the resin include polyester, polyolefin, polyamide (nylon, aramid, or the like), polyimide, polycarbonate, and acrylic. In particular, aramid is preferable for the substrate which is a flexible substrate because of its low coefficient of linear expansion.

In the manufacture example described in this embodiment, heat treatment is included in the process; therefore, a material having high heat resistance and a low coefficient of thermal expansion is preferably used for the substrate.

The semiconductor device in FIG. 1, FIG. 2A, and FIG. 2B includes a region 491. The region 491 is a region where an opening is formed during a process of manufacturing the semiconductor device; in the opening, an insulator, a conductor, a semiconductor, and the like are formed through the process of manufacturing the semiconductor device. Note that the opening can be a cylindrical opening, as illustrated in FIG. 2A and FIG. 2B, for example. In the region 491 in FIG. 2B, for example, an insulator 412a (an insulator 412b and an insulator 412c), a conductor 431a (a conductor 431b and a conductor 431c), a material layer 451a (a material layer 451b and a material layer 451c), a material layer 452, an insulator 413, and a conductor 432 are placed in this order from a side surface of the opening.

The semiconductor device also includes a region 492A and a region 492B. The region 492A and the region 492B are regions where an opening is formed during the process of manufacturing the semiconductor device, and in the opening, an insulator, a conductor, and the like are formed through the process of manufacturing the semiconductor device. Note that the opening can be a slit-like opening, as illustrated in FIG. 2A and FIG. 2B, for example. The region 492A includes part of a material layer 453, part of an insulator 414, part of an insulator 421, part of an insulator 415, part of a conductor 434a, part of a conductor 434b, and an insulator 416A. The region 492B includes part of the material layer 453, part of the insulator 414, part of the insulator 421, part of the insulator 415, part of the conductor 434a, part of the conductor 434b, and an insulator 416B. In FIG. 1, part of the conductor 434a, part of the insulator 414, part of the insulator 421, and part of the insulator 415 are placed between the insulator 411A and the insulator 411B. Furthermore, part of a region of the conductor 434b, part of the insulator 414, part of the insulator 421, and part of the insulator 415 are placed between the insulator 411B and the insulator 411C.

The material layer 452 includes a region 471 and a region 472. The region 471 is positioned adjacent to the material layer 453, and the region 472 is positioned adjacent to the material layer 451a (the material layer 451b and the material layer 451c). Note that the region 471 becomes a channel formation region of the cell transistor CTrA (the cell transistor CTrB) through the process of manufacturing the semiconductor device, and the region 472 becomes a low-resistance region through the process of manufacturing the semiconductor device.

In the cell transistor CTrB, the conductor 434b functions as a first gate electrode and a word line that supplies a potential to the first gate electrode, the insulator 415 surrounded by the conductor 434b in FIG. 2A functions as a gate insulating film, the insulator 421 surrounded by the conductor 434b in FIG. 2A functions as a charge accumulation layer, and the insulator 414 surrounded by the conductor 434b functions as a tunnel insulating film. The conductor 431b functions as one of a source electrode and a drain electrode, and the conductor 431c functions as the other of the source electrode and the drain electrode. In FIG. 2A, a region in the material layer 452 surrounded by the conductor 434b functions as a channel formation region. Depending on a material contained in the material layer 453, a region in the material layer 453 which is in contact with the material layer 452 also functions as a channel formation region in some cases. The insulator 413 functions as a gate insulating film, and the conductor 432 functions as a second gate electrode and a wiring that supplies a potential to the second gate electrode.

FIG. 2A can be regarded as a top view of the cell transistor CTrA when the conductor 434b in FIG. 2A is replaced with the conductor 434a. In the cell transistor CTrA, the conductor 434a functions as a first gate electrode and a word line that supplies a potential to the first gate electrode, the insulator 415 surrounded by the conductor 434a in FIG. 2A functions as a first gate insulating film, the insulator 421 surrounded by the conductor 434a in FIG. 2A functions as a charge accumulation layer, and the insulator 414 surrounded by the conductor 434a in FIG. 2A functions as a tunnel insulating film. The conductor 431a functions as one of a source electrode and a drain electrode, and the conductor 431b functions as the other of the source electrode and the drain electrode. In FIG. 2A, a region in the material layer 452 surrounded by the conductor 434a functions as a channel formation region. Depending on a material contained in the material layer 453, a region in the material layer 453 which is in contact with the material layer 452 also functions as a channel formation region in some cases. The insulator 413 functions as a second gate insulating film, and the conductor 432 functions as a second gate electrode and a wiring that supplies a potential to the second gate electrode.

The insulator 412a has a function of, for example, a barrier insulating film that inhibits impurities from the insulator 411A (e.g., water molecules, hydrogen atoms, hydrogen molecules, oxygen atoms, oxygen molecules, nitrogen atoms, nitrogen molecules, nitrogen oxide molecules ($N_2O$, NO, $NO_2$, or the like) from diffusing into the conductor 431a. That is, the insulator 412a can suppress the influence of the impurities on the conductor 431a. Similarly, the insulator 412b has a function of, for example, a barrier insulating film that inhibits impurities from the insulator 411B from diffusing into the conductor 431b, and the insulator 412c has a function of, for example, a barrier insulating film that inhibits impurities from the insulator 411C from diffusing into the conductor 431c.

Note that in this specification and the like, a barrier insulating film refers to an insulating film having a barrier property. A barrier property in this specification means a function of inhibiting diffusion of a targeted substance (also referred to as having low permeability). Alternatively, a barrier property in this specification means a function of trapping and fixing (also referred to as gettering) a targeted substance.

Next, the material layer 451a (the material layer 451b and the material layer 451c), the material layer 452, and the material layer 453, which are included in the cell transistor CTrA and the cell transistor CTrB, are described.

The material layer 451a has a function of, for example, a barrier film that inhibits impurities (e.g., water molecules, hydrogen atoms, hydrogen molecules, oxygen atoms, oxygen molecules, nitrogen atoms, nitrogen molecules, nitrogen oxide molecules ($N_2O$, NO, $NO_2$, or the like) from diffusing into the material layer 452. The material layer 451a having a function of inhibiting the transmission of impurities is provided between the material layer 452 and the conductor 431a, whereby the electric resistance between the material layer 452 and the conductor 431a can be reduced. Similarly, the material layer 451b has a function of, for example, a barrier film that inhibits impurities from the material layer 452 from diffusing into the conductor 431b, and the material layer 451c has a function of, for example, a barrier film that inhibits impurities from the material layer 452 from diffusing into the conductor 431c.

In the case where the cell transistor CTrA and the cell transistor CTrB in FIG. 1 are OS transistors, for example, metal oxide that functions as an oxide semiconductor is preferably used for the material layer 452, and a material that contains a metal element in the metal oxide and oxygen is preferably used for the material layer 451a (the material layer 451b and the material layer 451c). For the material layer 453, a material that contains a metal element in the metal oxide and oxygen is preferably used, as well as for the material layer 451.

In the case where the cell transistor CTrA and the cell transistor CTrB in FIG. 1 are OS transistors, the region 471 functioning as a channel formation region in the material layer 452 includes less oxygen vacancies (in this specification and the like, an oxygen vacancy in metal oxide is referred to as $V_O$ in some cases) or has a lower impurity concentration than the region 472 functioning as a low-resistance region, whereby the region 471 is a high-resistance region with low carrier concentration. Thus, the region 471 can be regarded as being i-type (intrinsic) or substantially i-type.

A transistor using metal oxide is likely to change its electrical characteristics when impurities or oxygen vacancies ($V_O$) exist in a region of the metal oxide where a channel is formed, which might degrade the reliability. In some cases, hydrogen in the vicinity of an oxygen vacancy ($V_O$) forms a defect that is an oxygen vacancy ($V_O$) into which hydrogen enters (hereinafter sometimes referred to as $V_OH$), which generates an electron serving as a carrier. Therefore, when the region of the oxide semiconductor where a channel is formed includes oxygen vacancies, the transistor tends to have normally-on characteristics (the characteristics with which, even when no voltage is applied to the gate electrode, the channel exits and a current flows through the transistor). Therefore, the impurities, oxygen vacancies, and $V_OH$ are preferably reduced as much as possible in the region of the oxide semiconductor where a channel is formed.

Figure 3A:
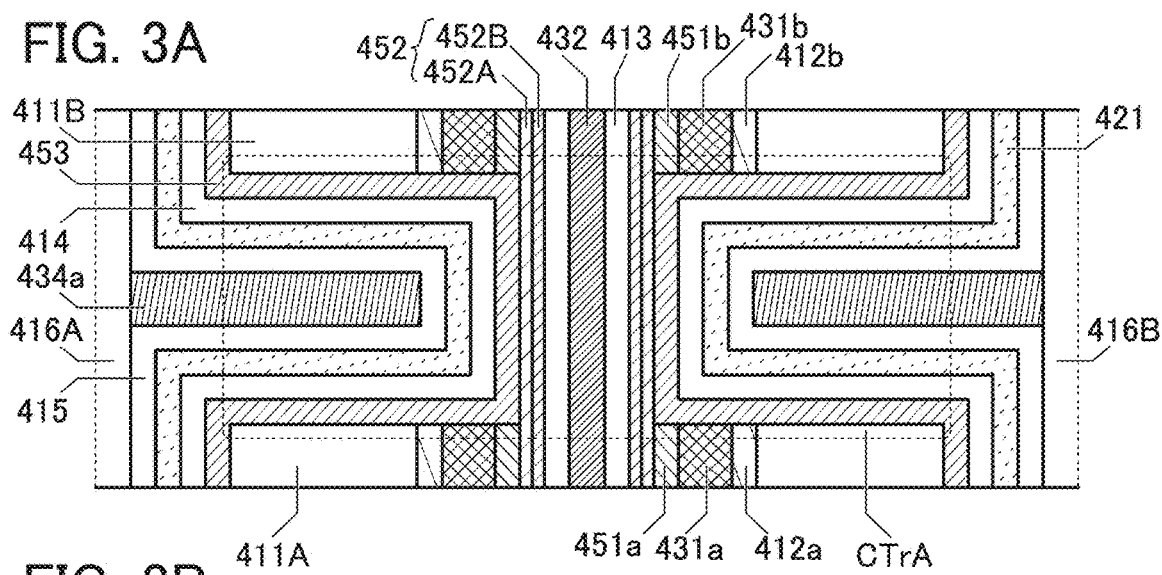
FIG. 3A to FIG. 3C are cross-sectional views illustrating structure examples of semiconductor devices.

In the case where the cell transistor CTrA and the cell transistor CTrB in FIG. 1 are OS transistors, the material layer 452 is preferably formed of a plurality of layers including a material layer 452A and a material layer 452B, as illustrated in FIG. 3A. Note that FIG. 3A is an enlarged view of a region where the cell transistor CTrA in FIG. 1 is formed.

For the material layer 451a (the material layer 451b and the material layer 451c), the material layer 452A, the material layer 452B, and the material layer 453 which is to be formed in a later step, for example, one or more materials selected from indium, an element M (the element M is, for example, aluminum, gallium, yttrium, tin, copper, vanadium, beryllium, boron, silicon, titanium, iron, nickel, germanium, zirconium, molybdenum, lanthanum, cerium, neodymium, hafnium, tantalum, tungsten, magnesium, or cobalt), and zinc can be used. In particular, metal oxide including indium, gallium, and zinc has a high band gap and functions as an intrinsic (also referred to as I-type) or substantially intrinsic semiconductor.

The cell transistor CTrA and the cell transistor CTrB which include the metal oxide in the channel formation regions have a characteristic of extremely small off-state current. That is, the leakage current of the cell transistor CTrA and the cell transistor CTrB in an off state can be small, so that power consumption of the semiconductor device can be reduced in some cases.

For the material layer 451a (the material layer 451b and the material layer 451c), metal oxide including the element M may be used, for example. The material layer 451a (the material layer 451b and the material layer 451c) preferably has a higher concentration of the element M than the material layer 452B. Alternatively, for the material layer 451a (the material layer 451b and the material layer 451c), gallium oxide may be used. Alternatively, for the material layer 451a (the material layer 451b and the material layer 451c), metal oxide such as In (indium)-M-Zn (zinc) oxide may be used. Specifically, the atomic ratio of the element M to In in the metal oxide used for the material layer 451a (the material layer 451b and the material layer 451c) is preferably higher than the atomic ratio of the element M to In in the metal oxide used for the material layer 452B. The thickness of the material layer 451a (the material layer 451b and the material layer 451c) is preferably larger than or equal to 0.5 nm and smaller than or equal to 5 nm, further preferably larger than or equal to 1 nm and smaller than or equal to 3 nm, still further preferably larger than or equal to 1 nm and smaller than or equal to 2 nm. The material layer 451a (the material layer 451b and the material layer 451c) preferably has crystallinity. In the case where the material layer 451a (the material layer 451b and the material layer 451c) has crystallinity, release of oxygen contained in the material layer 452A and the material layer 452B can be effectively inhibited. For example, when the material layer 451a (the material layer 451b and the material layer 451c) has a hexagonal crystal structure, release of oxygen contained in the material layer 452A and the material layer 452B can be prevented in some cases.

The material layer 452A and the material layer 452B are preferably oxides having different chemical compositions, for example. Specifically, the atomic ratio of the element M to the metal element that is a main component in the metal oxide used for the material layer 452B is preferably higher than the atomic ratio of the element M to the metal element that is a main component in the metal oxide used for the material layer 452A. The atomic ratio of the element M to In in the metal oxide used for the material layer 452B is preferably higher than the atomic ratio of the element M to In in the metal oxide used for the material layer 452A. For the material layer 452B, a composition similar to that of the material layer 451a (the material layer 451b and the material layer 451c) may be used.

In the material layer 453, for example, the atomic ratio of the element M to the metal element that is a main component may be higher than the atomic ratio of the element M to the metal element that is a main component in the metal oxide used for the material layer 452A. The atomic ratio of the element M to In in the metal oxide used for the material layer 453 may be higher than the atomic ratio of the element M to In in the metal oxide used for the material layer 452A. For the material layer 453, a composition similar to that of the material layer 452A may be used.

Figure 3B:
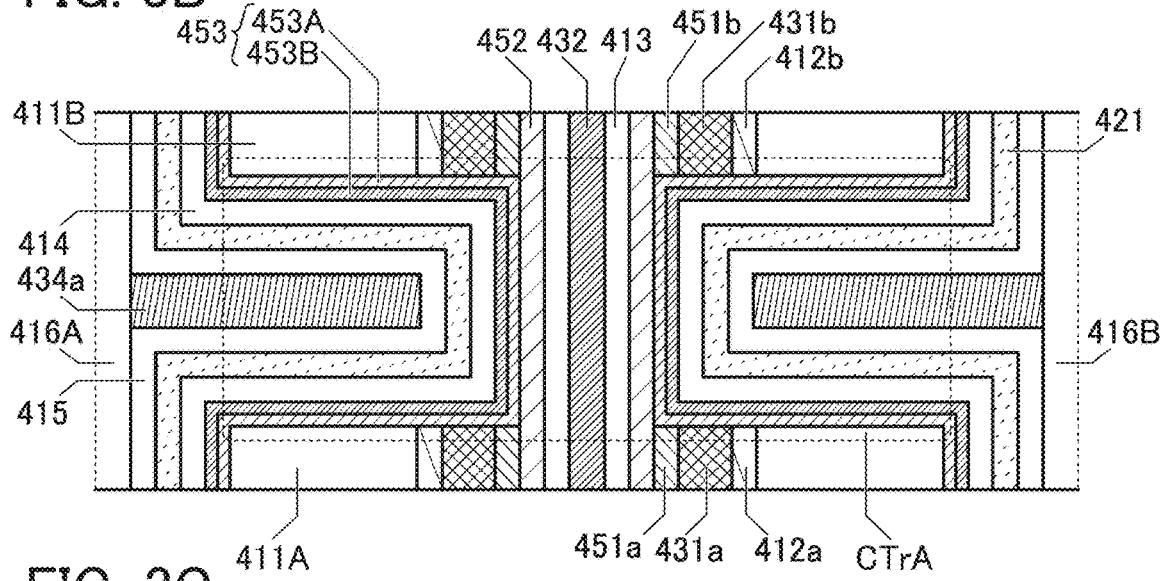

In the case where the cell transistor CTrA and the cell transistor CTrB in FIG. 1 are OS transistors, the material layer 453 may be formed of a plurality of layers including a material layer 453A and a material layer 453B, as illustrated in FIG. 3B. Note that FIG. 3B is an enlarged view of a region where the cell transistor CTrA in FIG. 1 is formed.

The material layer 453A and the material layer 453B are preferably oxides having different chemical compositions. Specifically, the atomic ratio of the element M to the metal element that is a main component in the metal oxide used for the material layer 453B is preferably higher than the atomic ratio of the element M to the metal element that is a main component in the metal oxide used for the material layer 453A. For the material layer 453B, a composition similar to that of the material layer 451a (the material layer 451b and the material layer 451c) may be used.

Figure 3C:
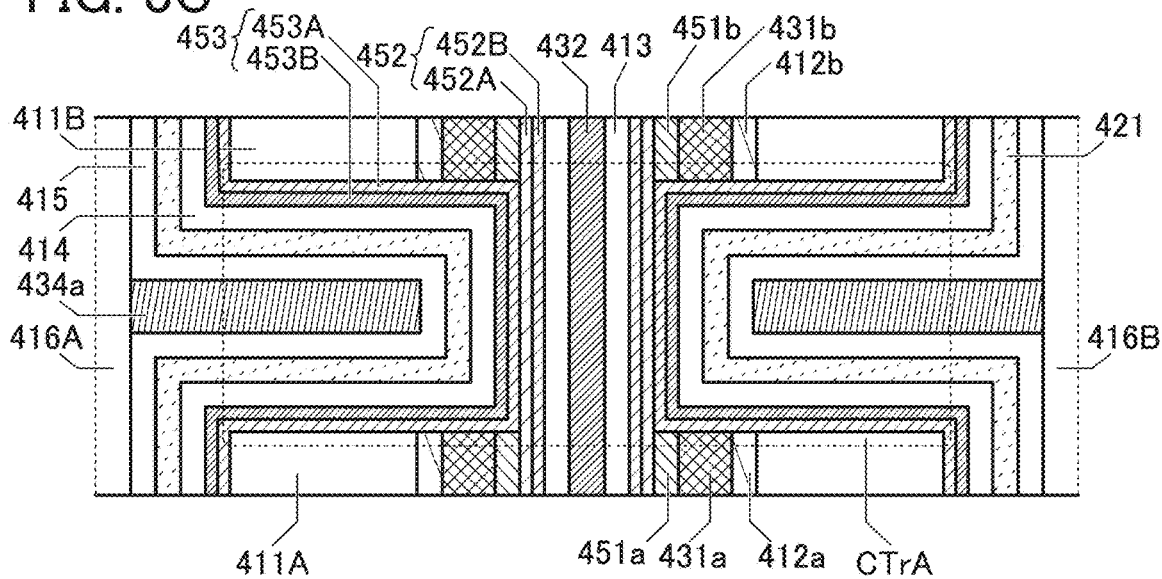

In the case where the material layer 452 of the cell transistor CTrA illustrated in FIG. 3B includes the material layer 452A and the material layer 452B as illustrated in FIG. 3A, that is, in the case where the material layer 452 includes the material layer 452A and the material layer 452B and the material layer 453 includes the material layer 453A and the material layer 453B as in the cell transistor CTrA illustrated in FIG. 3C, the atomic ratio of the element M to the metal element that is the main component in the metal oxide used for the material layer 452B is preferably higher than the atomic ratio of the element M to the metal element that is the main component in each of the metal oxides used for the material layer 452A and the material layer 453A. The atomic ratio of the element M to the metal element that is a main component in the metal oxide used for the material layer 453B is preferably higher than the atomic ratio of the element M to the metal element that is the main component in each of the metal oxides used for the material layer 452A and the material layer 453A. The atomic ratio of the element M to the metal element that is a main component in the metal oxide used for the material layer 451a (the material layer 451b and the material layer 451c) is preferably higher than the atomic ratio of the element M to the metal element that is the main component in each of the metal oxides used for the material layer 452A and the material layer 453A.

At this time, the compositions of the material layer 451a (the material layer 451b and the material layer 451c), the material layer 452B, and the material layer 453B may be equal to each other. The composition of the material layer 453A may be similar to that of the material layer 452A.

Here, when metal oxide contained in the material layer 452A, the material layer 452B, and the material layer 453 in the cell transistor CTrA illustrated in FIG. 3A or FIG. 3C is regarded as metal oxide that contains In, gallium (hereinafter referred to as Ga), and zinc (hereinafter referred to as Zn), specific examples of the atomic ratios of In to Ga and Zn in the metal oxides applicable to the material layer 452A, the material layer 452B, and the material layer 453 are described.

For the material layer 452B, for example, metal oxide with an atomic ratio of In:Ga:Zn=1:3:4 or In:Ga:Zn=1:1:0.5 may be used. For the material layer 452A, for example, metal oxide with an atomic ratio of In:Ga:Zn=4:2:3 or In:Ga:Zn=1:1:1 may be used. For the material layer 453, for example, metal oxide with an atomic ratio of In:Ga:Zn=1:3:4, Ga:Zn=2:1, or Ga:Zn=2:5 may be used.

As a specific example in the case where the material layer 453 has a stacked structure as in FIG. 3C, metal oxide with an atomic ratio of In:Ga:Zn=4:2:3 or a neighborhood thereof may be used for the material layer 453A and metal oxide with an atomic ratio of In:Ga:Zn=1:3:4 or a neighborhood thereof may be used for the material layer 453B. Alternatively, metal oxide with an atomic ratio of In:Ga:Zn=4:2:3 or a neighborhood thereof may be used for the material layer 453A and metal oxide with an atomic ratio of Ga:Zn=2:1 or a neighborhood thereof may be used for the material layer 453B. Alternatively, metal oxide with an atomic ratio of In:Ga:Zn=4:2:3 or a neighborhood thereof may be used for the material layer 453A and metal oxide with an atomic ratio of Ga:Zn=2:5 or a neighborhood thereof may be used for the material layer 453B. Alternatively, metal oxide with an atomic ratio of In:Ga:Zn=4:2:3 or a neighborhood thereof may be used for the material layer 453A and gallium oxide may be used for the material layer 453B.

For example, in the case where the atomic ratio of In to the element M in the metal oxide used for the material layer 452B is lower than the atomic ratio of In to the element M in the metal oxide used for the material layer 452A, an In—Ga—Zn oxide having a composition with an atomic ratio of In:Ga:Zn=5:1:6 or a neighborhood thereof, In:Ga:Zn=5:1:3 or a neighborhood thereof, In:Ga:Zn=10:1:3 or a neighborhood thereof can be used for the material layer 452A.

For the material layer 452A, it is also possible to use metal oxide having a composition of In:Zn=2:1, a composition of In:Zn=5:1, a composition of In:Zn=10:1, or a composition in the neighborhood of any one of these compositions, other than the above-described compositions. Alternatively, indium oxide can be used for the material layer 452A, for example.

The material layer 451a (the material layer 451b and the material layer 451c), the material layer 452A, the material layer 452B, and the material layer 453 (the material layer 453A and the material layer 453B) are preferably combined such that the above atomic ratios are satisfied. For example, in the case of the cell transistor CTrA in FIG. 3A, metal oxide having a composition of In:Ga:Zn=1:3:4 or a neighborhood thereof is preferably used for the material layer 452B and the material layer 453 and metal oxide having a composition of In:Ga:Zn=4:2:3 to 4:2:4.1 is preferably used for the material layer 452A. For example, in the case of the cell transistor CTrA in FIG. 3C, metal oxide having a composition of In:Ga:Zn=1:3:4 or a neighborhood thereof is preferably used for the material layer 452B and the material layer 453B and metal oxide having a composition of In:Ga:Zn=4:2:z or a neighborhood thereof is preferably used for the material layer 452A when z is greater than or equal to 3 and less than or equal to 4.1. Note that the above compositions represent the atomic ratio of oxide formed over a base or the atomic ratio of a sputtering target. Moreover, it is preferable that the proportion of In be increased in the composition of the material layer 452A, in which case the transistor can have a higher on-state current, higher field effect mobility, or the like.

Note that the expression "the composition of oxide containing In, Ga, and Zn at the atomic ratio, In:Ga:Zn=a:b:c (a+b+c=1), is in the neighborhood of the composition of oxide containing In, Ga, and Zn at the atomic ratio, In:Ga:Zn=A:B:C (A+B+C=1)" means that a, b, and c satisfy the following relation: $(a-A)^2+(b-B)^2+(c-C)^2$ and r can be 0.20, preferably 0.10, further preferably 0.05, for example.

Under such conditions, the material layer 452A is provided in contact with the material layer 452B; thus, impurities and oxygen can be inhibited from diffusing into the material layer 452A from the insulator 413 and/or the conductor 432 through the material layer 452B. Similarly, when the material layer 453B is provided in contact with the material layer 452B, impurities and oxygen can be inhibited from diffusing into the material layer 453A and the material layer 452A from the insulator 414, the insulator 421, the insulator 415, the conductor 434a (the conductor 434b), the insulator 416A, and the like through the material layer 453B. Similarly, when the material layer 451a (the material layer 451b and the material layer 451c) is provided in contact with the material layer 452A, impurities and oxygen can be inhibited from diffusing into the material layer 452A from the conductor 431a (the conductor 431b and the conductor 431c), the insulator 412a (the insulator 412b and the insulator 412c), the insulator 411A (the insulator 411B and the insulator 411C), and the like through the material layer 451a (the material layer 451b and the material layer 451c).

In the case where a transistor containing silicon in a channel formation region (hereinafter referred to as a Si transistor) is used as each of the cell transistor CTrA and the cell transistor CTrB in FIG. 1, amorphous silicon (referred to as hydrogenated amorphous silicon in some cases), microcrystalline silicon, polycrystalline silicon, single crystal silicon, or the like can be used for the material layer 452, for example.

In the case where Si transistors are used as the cell transistor CTrA and the cell transistor CTrB, the material layer 452 may be a plurality of layers as illustrated in FIG. 3A and FIG. 3C or may be a single layer. Note that in the manufacturing example in this specification and the like, description is made on the assumption that the material layer 452 is a single layer.

A material applicable to the material layer 453 can be metal oxide applicable to the material layer 451 and/or the material layer 452 or a material functioning as a tunnel insulating film; for example, a material applicable to the insulator 414 to be described later can be used. Note that the material layer 453 may be a plurality of layers as illustrated in FIG. 3B and FIG. 3C or may be a single layer.

In the case where the cell transistor CTrA and the cell transistor CTrB are Si transistors, the material layer 451 is preferably a conductor containing an impurity (an element or an ion) that diffuses into an interface between the material layer 452 and a formation surface of the material layer 451 and into a region near the interface, for example.

For the conductor, it is possible to use a material containing one or more kinds of metal elements selected from aluminum, chromium, copper, silver, gold, platinum, tantalum, nickel, titanium, molybdenum, tungsten, hafnium, vanadium, niobium, manganese, magnesium, zirconium, beryllium, indium, and ruthenium, for example.

In the case where the cell transistor CTrA and the cell transistor CTrB are n-channel transistors, an n-type impurity (donor) is used as the impurity. As the n-type impurity, phosphorus or arsenic can be used, for example. In this manufacturing method example, in the case where the cell transistor CTrA and the cell transistor CTrB are p-channel transistors, a p-type impurity (acceptor) is used as the impurity. As the p-type impurity, boron, aluminum, or gallium can be used, for example.

The material layer 451 may be a material that can form silicide at the interface between the material layer 452 and the formation surface of the material layer 451 and in the vicinity of the interface, for example. As the material that can form silicide, for example, nickel, cobalt, molybdenum, tungsten, or titanium can be used.

Note that in FIG. 1, FIG. 2A, and FIG. 2B, one region 491 is provided between the region 492A and the region 492B, but one embodiment of the present invention is not limited to this. For example, in one embodiment of the present invention, a plurality of regions 491 may be provided between the region 492A and the region 492B.

Figure 4A:
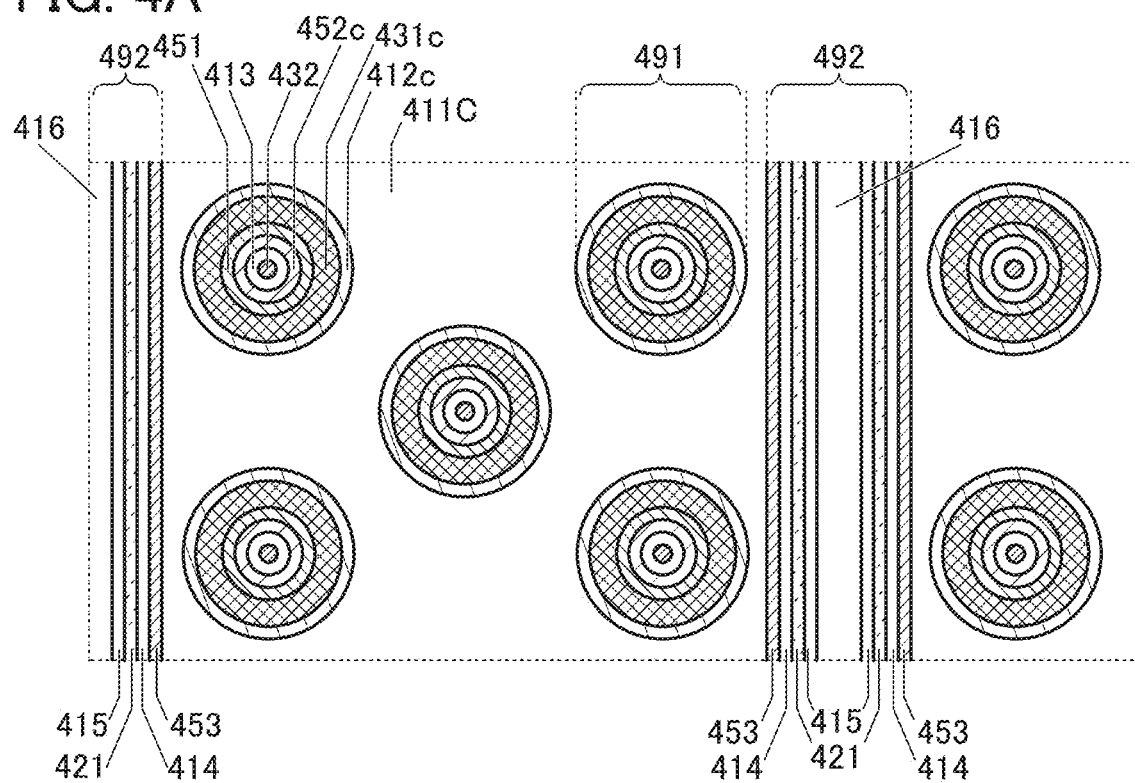
FIG. 4A and FIG. 4B are top views illustrating structure examples of a semiconductor device.
Figure 4B:
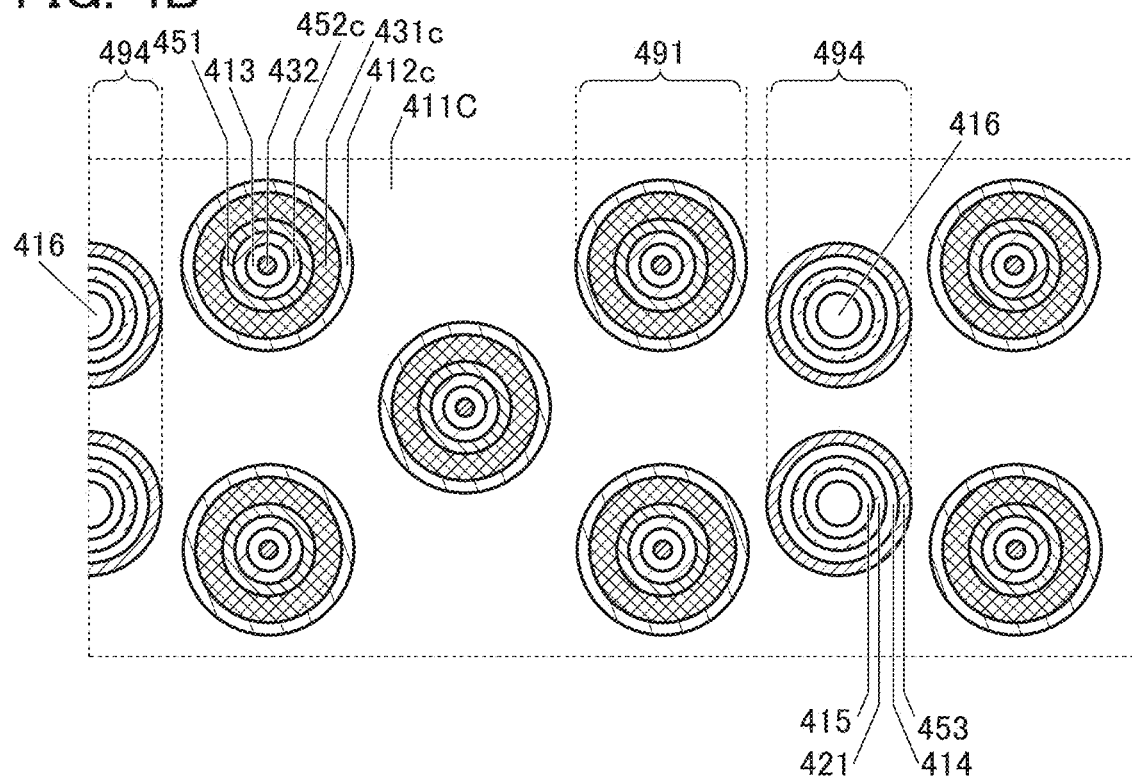

FIG. 4A illustrates a specific example of the structure. FIG. 4A is a top view of a semiconductor device provided with the plurality of regions 491. Note that this is a top view of the semiconductor device illustrated in FIG. 1 taken along the dashed-dotted line M3-M4, where the plurality of regions 491 are provided. The semiconductor device illustrated in FIG. 4A includes a plurality of slit-like regions 492, and the plurality of regions 491 are provided between the adjacent regions 492. As an arrangement of the plurality of regions 491, for example, the regions 491 may be provided in a line in a direction with an angle with respect to the slit-like region 492. As another arrangement, the plurality of regions 491 may be staggered. Note that the region 492 does not necessarily have a slit-like shape and may have a cylindrical shape, for example. In FIG. 4B, a cylindrical opening is provided in the region 494 instead of the slit-like opening formed in the region 492, and the material layer 453, the insulator 414 to an insulator 416 are formed in the region 494. Note that the shape of the region 494 is not limited to a cylindrical shape, and may be a columnar shape whose bottom shape is any of two-dimensional shapes, such as an elliptical shape or a polygonal shape. The regions 494 may be provided along lines in two or more different directions instead of being provided along lines in one direction as in the region 492 in FIG. 4A. Alternatively, the regions 494 may be formed without the regularity as describe above.

<<Manufacturing Example 1 of Semiconductor Device>>

Next, an example of manufacturing the semiconductor device illustrated in FIG. 1, FIG. 2A, and FIG. 2B will be described.

Figure 5A:
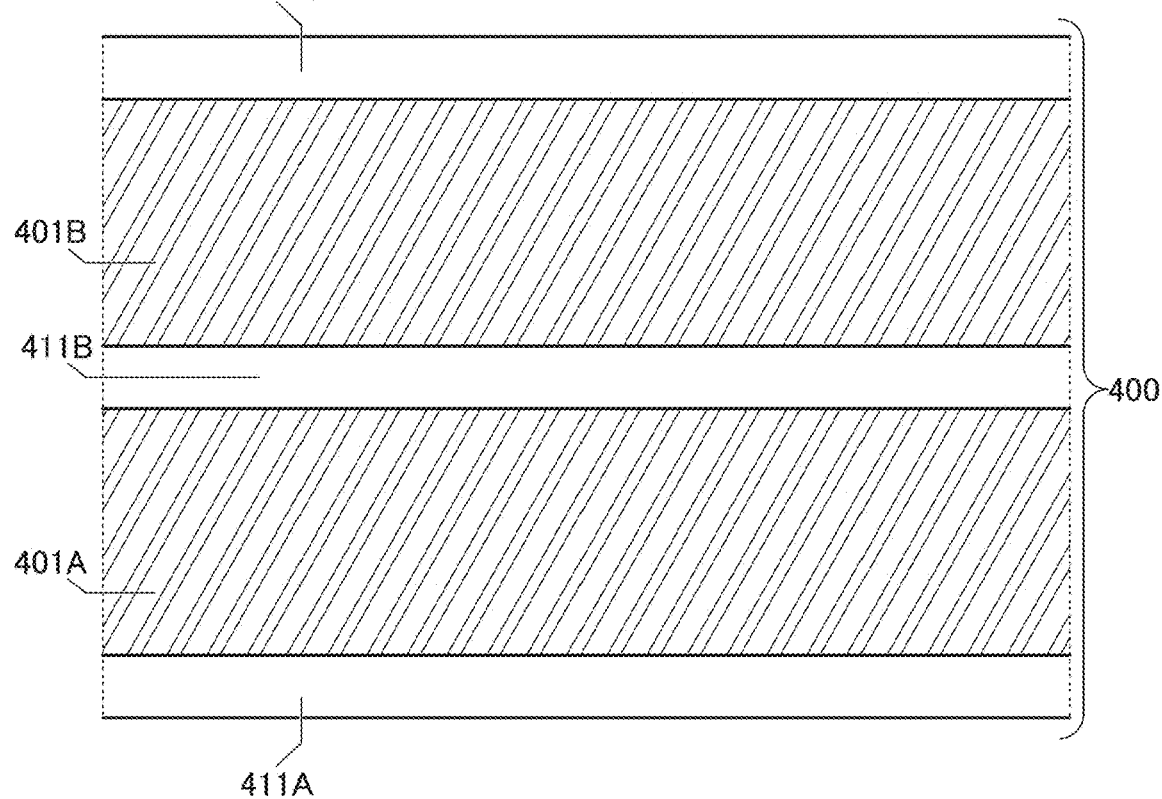
FIG. 5A and FIG. 5B are cross-sectional views illustrating an example of manufacturing a semiconductor device.

First, a stack 400 illustrated in FIG. 5A is manufactured. The stack 400 includes the insulator 411A, a sacrificial layer 401A, the insulator 411B, a sacrificial layer 401B, and the insulator 411C, for example. The insulator 411A is placed over a substrate (not illustrated), the sacrificial layer 401A is placed over the insulator 411A, the insulator 411B is placed over the sacrificial layer 401A, the sacrificial layer 401B is placed over the insulator 411B, and the insulator 411C is placed over the sacrificial layer 401B.

A variety of materials can be used for the sacrificial layer 401A and the sacrificial layer 401B. For example, as an insulator, silicon nitride, silicon oxide, or aluminum oxide may be used. Alternatively, as a semiconductor, silicon, gallium, germanium, or the like may be used. Alternatively, as a conductor, aluminum, copper, titanium, tungsten, tantalum, or the like may be used. That is, for the sacrificial layer 401A and the sacrificial layer 401B, a material that can have etching selectivity to the material used in the other part may be used.

The insulator 411A to the insulator 411C are preferably materials with a low concentration of impurities such as water or hydrogen. The amount of hydrogen released from the insulator 411A to the insulator 411C, which is converted into hydrogen molecules per area of one of the insulator 411A to the insulator 411C, is less than or equal to $2 \times 10^{15}$ molecules/cm$^2$, preferably less than or equal to $1 \times 10^{15}$ molecules/cm$^2$, further preferably less than or equal to $5 \times 10^{14}$ molecules/cm$^2$ in thermal desorption spectroscopy (TDS) in the range from 50° C. to 500° C., for example. The insulator 411A to the insulator 411C may be formed using an insulator from which oxygen is released by heating. Note that the materials usable for the insulator 411A to the insulator 411C are not limited to the above description.

For the insulator 411A to the insulator 411C, for example, a single layer or a stacked layer of an insulator including one or more materials selected from boron, carbon, nitrogen, oxygen, fluorine, magnesium, aluminum, silicon, phosphorus, chlorine, argon, gallium, germanium, yttrium, zirconium, lanthanum, neodymium, hafnium, and tantalum can be used in some cases. For example, a material containing silicon oxide or silicon oxynitride can be used in some cases. Note that the materials that can be used for the insulator 411A to the insulator 411C are not limited to the above description.

Note that in this specification, silicon oxynitride refers to a material that contains oxygen at a higher proportion than nitrogen, and silicon nitride oxide refers to a material that contains nitrogen at a higher proportion than oxygen. Furthermore, in this specification, aluminum oxynitride refers to a material that contains oxygen at a higher proportion than nitrogen, and aluminum nitride oxide refers to a material that contains nitrogen at a higher proportion than oxygen.

Figure 5B:
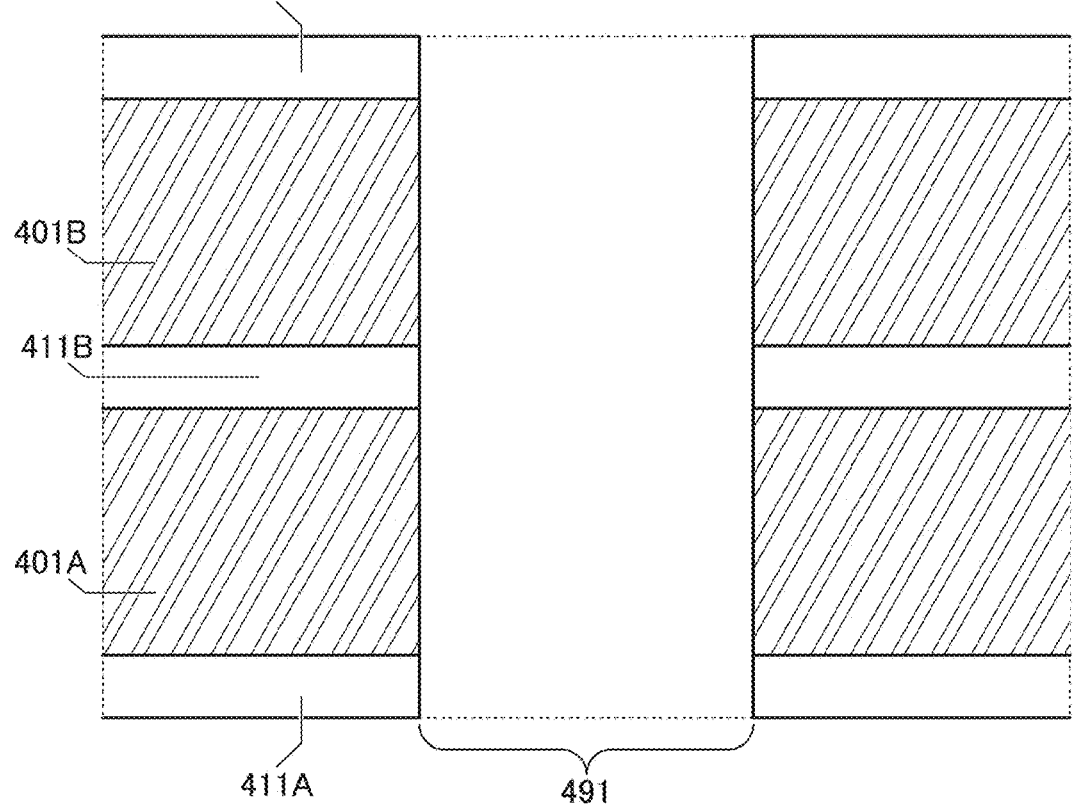

In the next step, as illustrated in FIG. 5B, an opening is formed in the region 491 in the stack 400 illustrated in FIG. 5A through formation of a resist mask and etching treatment, or the like.

The formation of the resist mask can be performed by a lithography method, a printing method, an inkjet method, or the like as appropriate. The formation of the resist mask by an inkjet method needs no photomask; thus, manufacturing cost can be reduced in some cases. For the etching treatment, either a dry etching method or a wet etching method or both of them may be used.

Figure 6A:
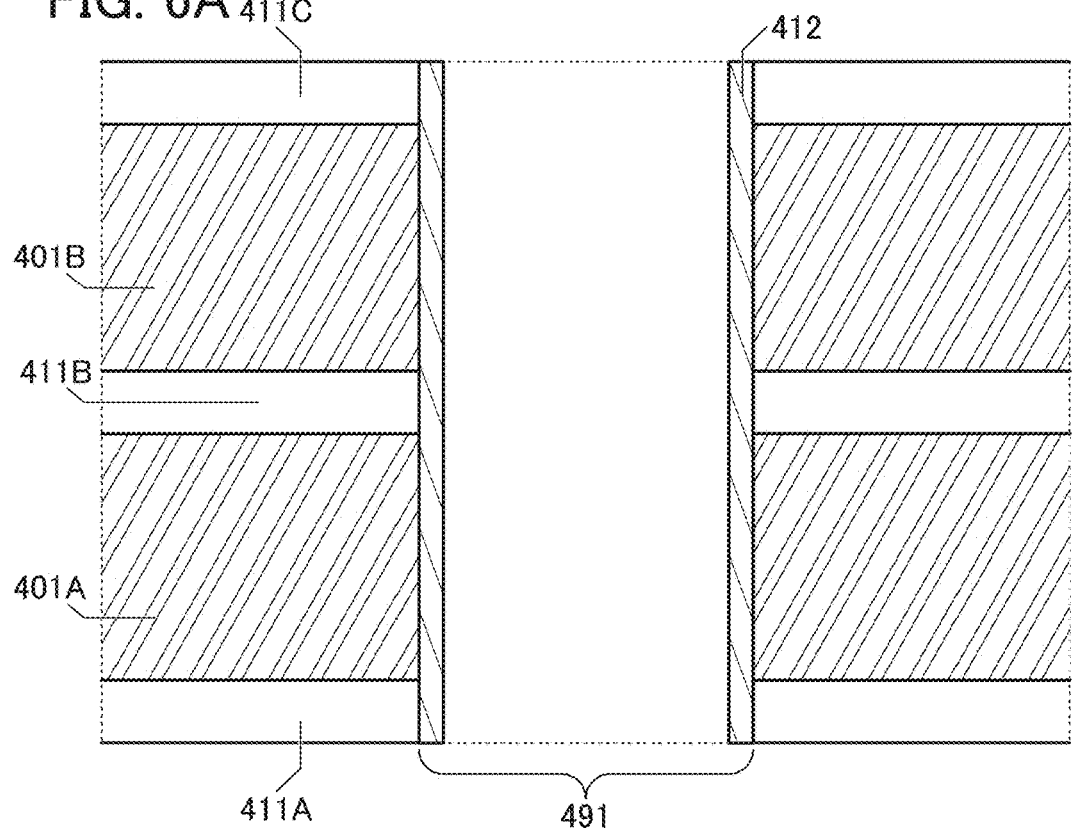
FIG. 6A and FIG. 6B are cross-sectional views illustrating an example of manufacturing a semiconductor device.

Next, as illustrated in FIG. 6A, an insulator 412 is formed on the side surface of the opening in the region 491 to cover the insulator 411A to the insulator 411C, the sacrificial layer 401A, and the sacrificial layer 401B.

The insulator 412 functions as a film for forming the insulator 412a, the insulator 412b, and the insulator 412c in FIG. 1 in a later step. Therefore, in the description in this specification and the like, the insulator 412 can be replaced with the insulator 412a, the insulator 412b, and the insulator 412c as appropriate.

As described above, the insulator 412 preferably functions as a barrier insulating film that inhibits impurities (e.g., water molecules, hydrogen atoms, hydrogen molecules, oxygen atoms, oxygen molecules, nitrogen atoms, nitrogen molecules, or nitrogen oxide molecules ($N_2O$, NO, $NO_2$, or the like) from the insulator 411A (the insulator 411B and the insulator 411C) from diffusing into the material layer 452. It is particularly preferable that the insulator 412 be a barrier insulating film that inhibits transmission of an oxygen atom or an oxygen molecule.

For the insulator 412, aluminum oxide, hafnium oxide, gallium oxide, indium gallium zinc oxide, silicon nitride, silicon nitride oxide, or the like can be used, for example. In particular, in the case where an oxide semiconductor to be described later is used for the material layer 452, for example, it is preferable to use aluminum oxide or the like which has high capability of trapping hydrogen and fixing hydrogen as the insulator 412. Thus, in FIG. 1, an impurity such as water or hydrogen can be inhibited from diffusing into the material layer 452 from the insulator 411A (the insulator 411B and the insulator 411C) side through the conductor 431a (the conductor 431b and the conductor 431c) and the material layer 451a (the material layer 451b and the material layer 451c).

Although the insulator 412 is illustrated as a single layer in FIG. 1, FIG. 2B, and FIG. 6A, one embodiment of the present invention is not limited to this. The insulator 412 illustrated in FIG. 1, FIG. 2B, and FIG. 6A may have a stacked structure of the above-described materials, for example. For example, in FIG. 1 and FIG. 2B, silicon oxide may be used for the insulator 412 in contact with the conductor 431a (the conductor 431b and the conductor 431c), and aluminum oxide, hafnium oxide, or the like may be used for the insulator 412 in contact with the insulator 411A (the insulator 411B and the insulator 411C).

Figure 6B:
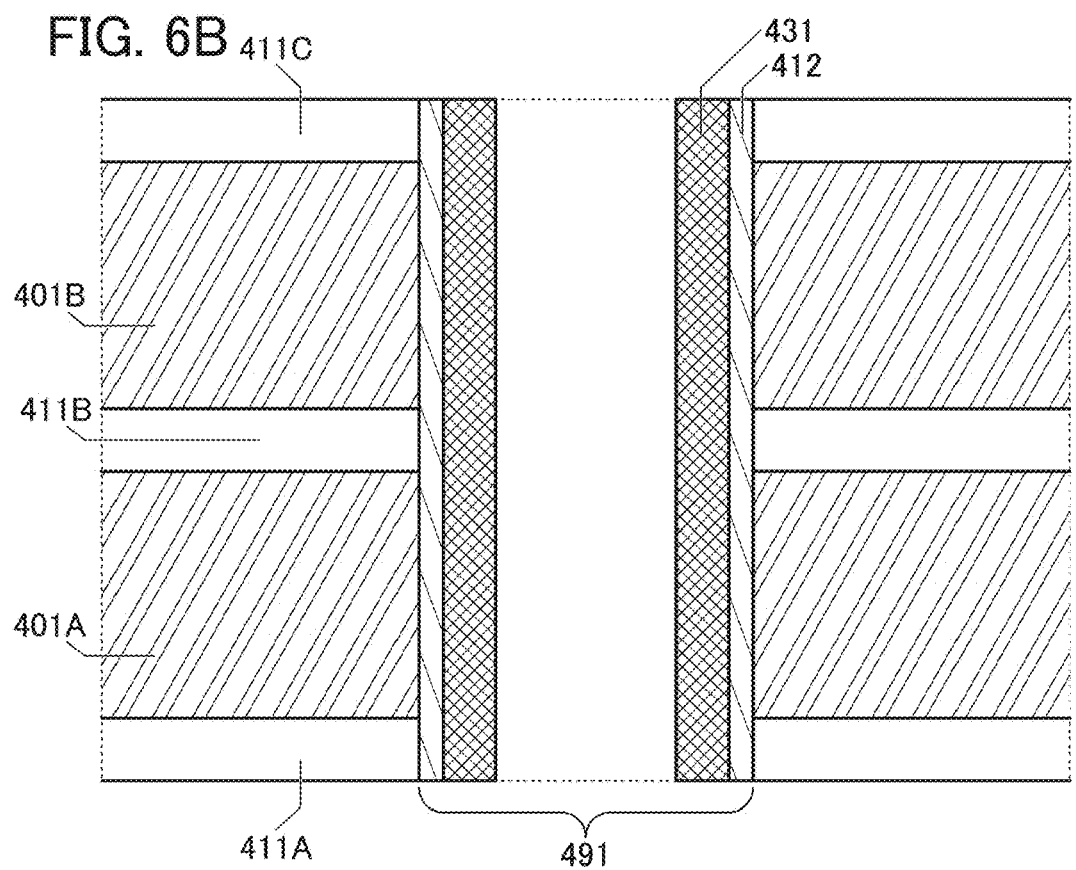

Then, a conductor 431 is formed on the formation surface of the insulator 412 as illustrated in FIG. 6B.

The conductor 431 functions as a film for forming the conductor 431a, the conductor 431b, and the conductor 431c in FIG. 1 in a later step. Therefore, in the description in this specification and the like, the conductor 431 can be replaced with the conductor 431a, the conductor 431b, and the conductor 431c as appropriate.

Since the conductor 431 functions as a film for forming the conductor 431a, the conductor 431b, and the conductor 431c as described above, the conductor 431 becomes a source electrode and a drain electrode of each of the cell transistor CTrA and the cell transistor CTrB in FIG. 1, in a later step.

The conductor 431 is preferably a material having high conductivity. For the conductor 431, for example, nitride containing tantalum, nitride containing titanium, nitride containing molybdenum, nitride containing tungsten, nitride containing tantalum and aluminum, nitride containing titanium and aluminum, or the like is preferably used. In one embodiment of the present invention, nitride containing tantalum is particularly preferable. As another example, ruthenium oxide, ruthenium nitride, oxide containing strontium and ruthenium, or oxide containing lanthanum and nickel may be used. These materials are preferable because they are conductive materials that are not easily oxidized or materials that maintain the conductivity even when absorbing oxygen.

In the case where an oxide semiconductor to be described later is used for the material layer 452, a conductive material having a function of inhibiting transmission of impurities such as water and hydrogen is preferably used for the conductor 431, for example. In that case, tantalum, tantalum nitride, titanium, titanium nitride, ruthenium, ruthenium oxide, or the like is preferably used for the conductor 431.

Although the conductor 431 is illustrated as a single layer in FIG. 1, FIG. 2B, and FIG. 6, one embodiment of the present invention is not limited to this. The conductor 431 illustrated in FIG. 1, FIG. 2B, and FIG. 6 may have a stacked structure of the above-described materials, for example. Specifically, for example, a conductive material having a function of inhibiting transmission of impurities such as water and hydrogen may be used for the first layer of the conductor 431, and a conductive material that is not easily oxidized or a material that maintains the conductivity even after absorbing oxygen may be used for the second layer.

As illustrated in FIG. 7A, the material layer 451 is formed on the formation surface of the conductor 431.

The material layer 451 functions as a film for forming the material layer 451a, the material layer 451b, and the material layer 451c in FIG. 1 in a later step. Therefore, in the description in this specification and the like, the material layer 451 can be replaced with the material layer 451a, the material layer 451b, and the material layer 451c as appropriate.

When the material layer 451 is formed in contact with the formation surface of the conductor 431, a low-resistance region is sometimes formed in the vicinity of an interface between the material layer 451 and the conductor 431. At this time, by adding heat treatment, a component contained in the material layer 451 and a component contained in the conductor 431 form a compound in some cases. Note that in this manufacturing example, an appropriate material is selected for each of the conductor 431 and the material layer 451 such that the compound has low resistance.

Note that for a material that can be used for the material layer 451, description of the material layer 451a (the material layer 451b and the material layer 451c) in Structure example 1 of semiconductor device is referred to.

Next, as illustrated in FIG. 7B, the material layer 452 is formed on the formation surface of the material layer 451.

Part of the region of the layer 452 functions as the channel formation region of the cell transistor CTrA and the cell transistor CTrB in FIG. 1 as described above.

Note that for a material that can be used for the material layer 452, description in Structure example 1 of semiconductor device is referred to.

Figure 8A:
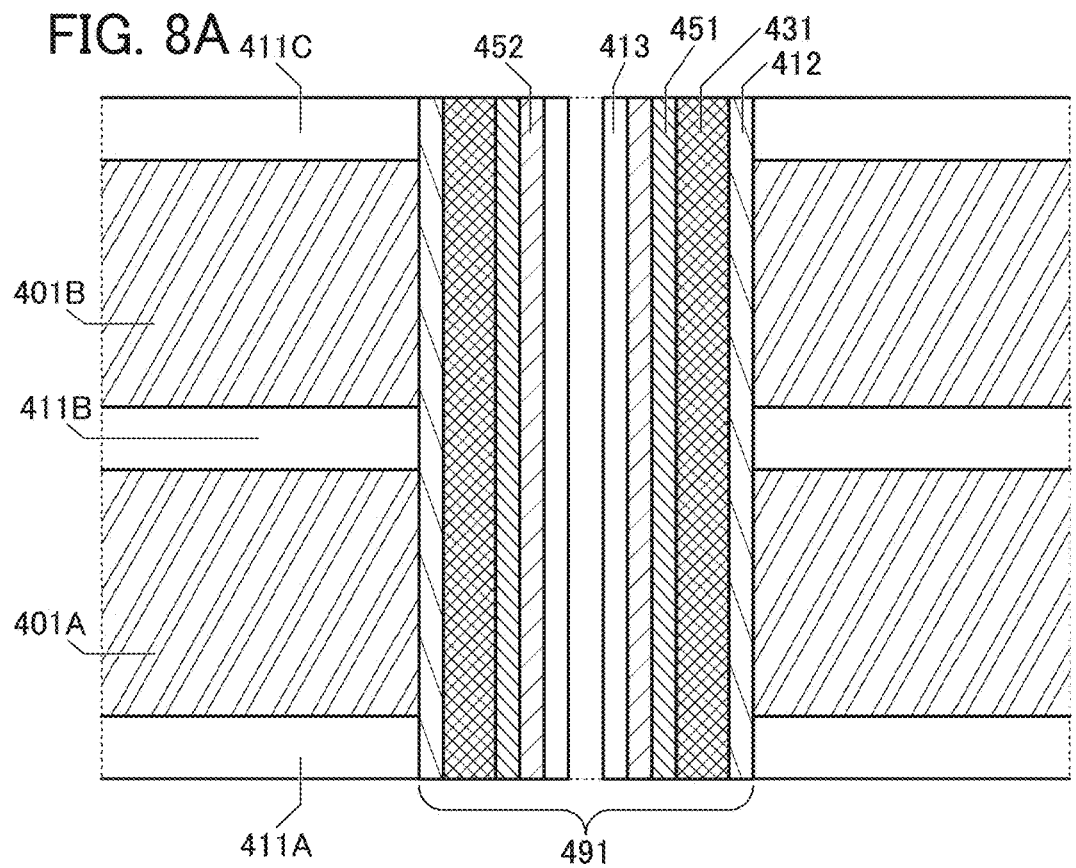
FIG. 8A and FIG. 8B are cross-sectional views illustrating an example of manufacturing a semiconductor device.

Next, as illustrated in FIG. 8A, the insulator 413 is formed on the formation surface of the material layer 452.

The insulator 413 functions as the second gate insulating film of each of the cell transistor CTrA and the cell transistor CTrB in FIG. 1, as described above.

It is preferable to use silicon oxide or silicon oxynitride for the insulator 413, for example. Alternatively, for the insulator 413, aluminum oxide, hafnium oxide, or oxide containing aluminum and hafnium can be used, for example.

Like the insulator 412, the insulator 413 preferably functions as a barrier insulating film that inhibits transmission of impurities (e.g., water molecules, hydrogen atoms, hydrogen molecules, oxygen atoms, oxygen molecules, nitrogen atoms, nitrogen molecules, and nitrogen oxide molecules ($N_2O$, $NO$, $NO_2$, or the like).

Accordingly, in the case where the cell transistor CTrA and the cell transistor CTrB in FIG. 1 are OS transistors, that is, in the case where, for example, metal oxide functioning as an oxide semiconductor is used for the material layer 452, an insulating material having a function of inhibiting transmission of oxygen, for example, is preferably used for the insulator 413. For the insulator 413, silicon nitride, silicon nitride oxide, silicon oxynitride, aluminum nitride, aluminum nitride oxide, or the like is preferably used, for example. When such the insulator 413 is formed, oxygen is prevented from releasing from the material layer 452 and diffusing into the insulator 413. This can prevent a reduction in the resistance of the material layer 452 due to release of oxygen from the material layer 452.

Moreover, for example, an insulating material having a function of inhibiting transmission of impurities such as water or hydrogen is preferably used for the insulator 412.

For example, for the insulator 412, aluminum oxide can be used. Note that a material that can be used for the insulator 412 is not limited to the above material; for example, for the insulator 412, any of the above materials that can be used for the insulator 411A to the insulator 411C can be used as a film with a low concentration of impurities such as water and hydrogen.

Although the insulator 413 is illustrated as a single layer in FIG. 1, FIG. 2B, and FIG. 8A, one embodiment of the present invention is not limited to this. The insulator 413 illustrated in FIG. 1, FIG. 2B, and FIG. 8A may have a stacked structure of the above-described materials, for example. For example, in FIG. 1 and FIG. 2B, silicon oxide may be used for the insulator 412 in contact with the material layer 452, and aluminum oxide, hafnium oxide, or the like may be used for the insulator 412 in contact with the conductor 432.

Specifically, the case where metal oxide functioning as an oxide semiconductor, for example, is used for the material layer 452 is considered. For example, when aluminum oxide is deposited by a sputtering method, oxygen is supplied to the insulator 413 and the oxygen supplied to the insulator 413 is supplied to the material layer 452. The supply of oxygen to the material layer 452 increases oxygen included in the oxide semiconductor, whereby a reduction in the resistance of the oxide semiconductor can be prevented.

Figure 8B:
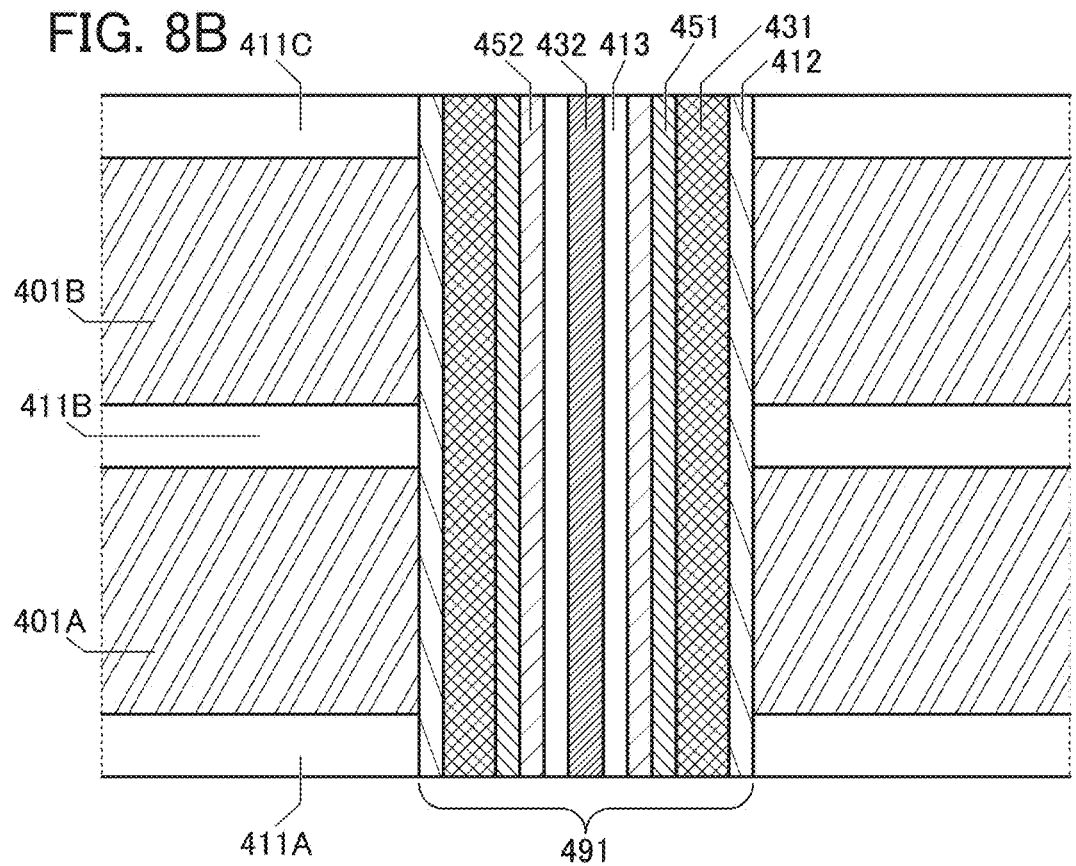

As illustrated in FIG. 8B, the conductor 432 is deposited on the formation surface of the insulator 413 so as to fill the remaining opening in the region 491.

The conductor 432 functions as a second gate electrode of each of the cell transistor CTrA and the cell transistor CTrB in FIG. 1 and a wiring that supplies a potential to the second gate electrodes, as described above.

For the conductor 432, it is possible to use a material containing one or more kinds of metal elements selected from aluminum, chromium, copper, silver, gold, platinum, tantalum, nickel, titanium, molybdenum, tungsten, hafnium, vanadium, niobium, manganese, magnesium, zirconium, beryllium, indium, and ruthenium, for example. Alternatively, it is also possible to use, for the conductor 432, a semiconductor having high electrical conductivity, typified by polycrystalline silicon containing an impurity element such as phosphorus, or silicide such as a nickel silicide.

For example, for the conductor 432, a conductive material containing oxygen and a metal element contained in metal oxide usable for the material layer 451 or the material layer 452 may be used. A conductive material containing the above metal element and nitrogen may be used. For example, a conductive material containing nitrogen, such as titanium nitride or tantalum nitride, can be used. Furthermore, indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon is added can be used. Furthermore, indium gallium zinc oxide containing nitrogen can be used. Using such a material in some cases allows capture of hydrogen entering from a surrounding insulator or the like.

Moreover, a conductive material having a function of inhibiting transmission of impurities such as water or hydrogen is preferably used for the conductor 432, for example. For example, tantalum, tantalum nitride, titanium, titanium nitride, ruthenium, or ruthenium oxide is preferably used, and a single layer or a stacked layer can be used.

A plurality of the above materials may be stacked for the conductor 432. For example, a stacked-layer structure combining a material containing the above metal element and a conductive material containing oxygen may be employed. A stacked-layer structure combining a material containing the above metal element and a conductive material containing nitrogen may be employed. A stacked-layer structure combining a material containing the above metal element, a conductive material containing oxygen, and a conductive material containing nitrogen may be employed. When an insulator including an excess-oxygen region is used as the insulator in contact with the surrounding of the conductor, oxygen is in some cases diffused into a region of the conductor in contact with the insulator. Accordingly, a stacked-layer structure combining a material containing the metal element and a conductive material containing oxygen can be formed in some cases. Similarly, when an insulator including an excess-nitrogen region is used as the insulator in contact with the surrounding of the conductor, nitrogen is in some cases diffused into a region of the conductor in contact with the insulator. Accordingly, a stacked-layer structure combining a material containing the metal element and a conductive material containing nitrogen can be formed in some cases.

Figure 9A:
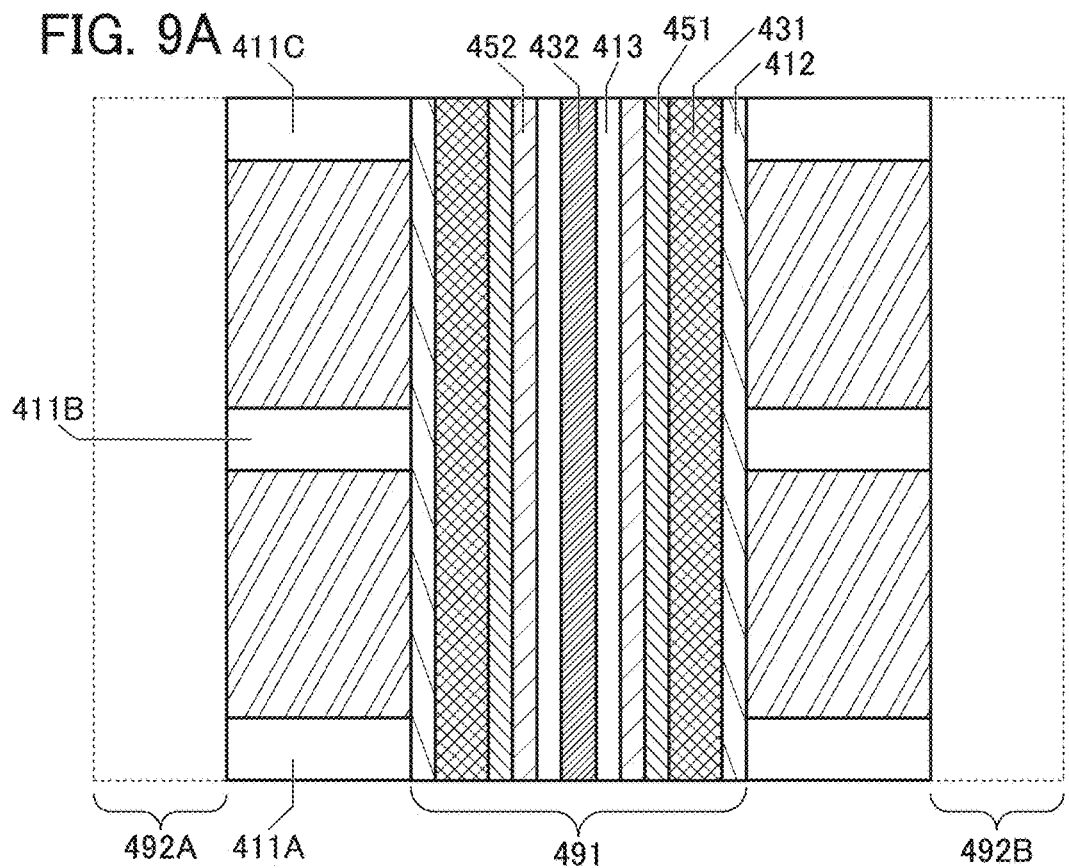
FIG. 9A and FIG. 9B are cross-sectional views illustrating an example of manufacturing a semiconductor device.

In the subsequent step, for example, formation of a resist mask, etching treatment, and the like are performed on the stack 400, whereby a slit-like opening is formed in the region 492A and the region 492B, as illustrated in FIG. 9A. Note that in this step, the openings in the region 492A and the region 492B have a slit-like shape, but the openings in the region 492A and the region 492B may be cylindrical as illustrated in FIG. 4B.

Note that the description of FIG. 5B is referred to for the resist mask formation, the etching treatment, and the like.

Figure 9B:
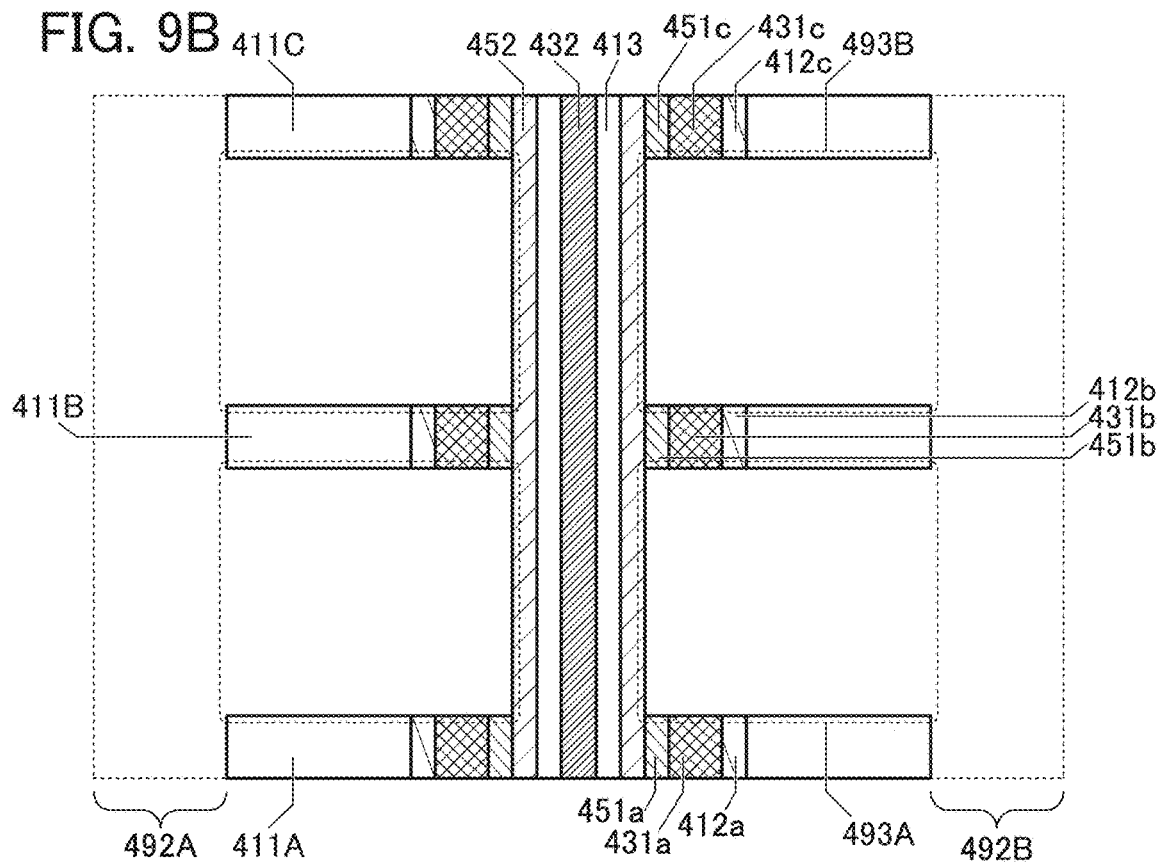

In the step illustrated in FIG. 9B, by etching treatment or the like, the sacrificial layer 401A and the sacrificial layer 401B are eliminated from side surfaces of the openings formed in the region 492A and the region 492B, and regions of the insulator 412, the conductor 431, and the material layer 451 which are surrounded by the sacrificial layer 401A and regions of the insulator 412, the conductor 431, and the material layer 451 which are surrounded by the sacrificial layer 401B are also eliminated, whereby a depressed portion 493A and a depressed portion 493B are formed in the stack 400. Accordingly, the insulator 412a (the insulator 412b and the insulator 412c), the conductor 431a (the conductor 431b and the conductor 431c), and the material layer 451a (the material layer 451b and the material layer 451c) are formed in a region where the material layer 452 overlaps with the region 472.

Note that the depressed portion 493A and the depressed portion 493B sometimes can be formed at the same time as the openings in the region 492A and the region 492B in the manufacturing step of the semiconductor device illustrated in FIG. 9A. Steps of eliminating the sacrificial layer 401A and the sacrificial layer 401B, a region of the insulator 412, a region of the conductor 431, a region of the material layer 451c may have different conditions such as different etching treatment conditions. Therefore, in the step illustrated in FIG. 9B, conditions such as etching treatment conditions may be changed depending on the material to be eliminated.

Figure 10A:
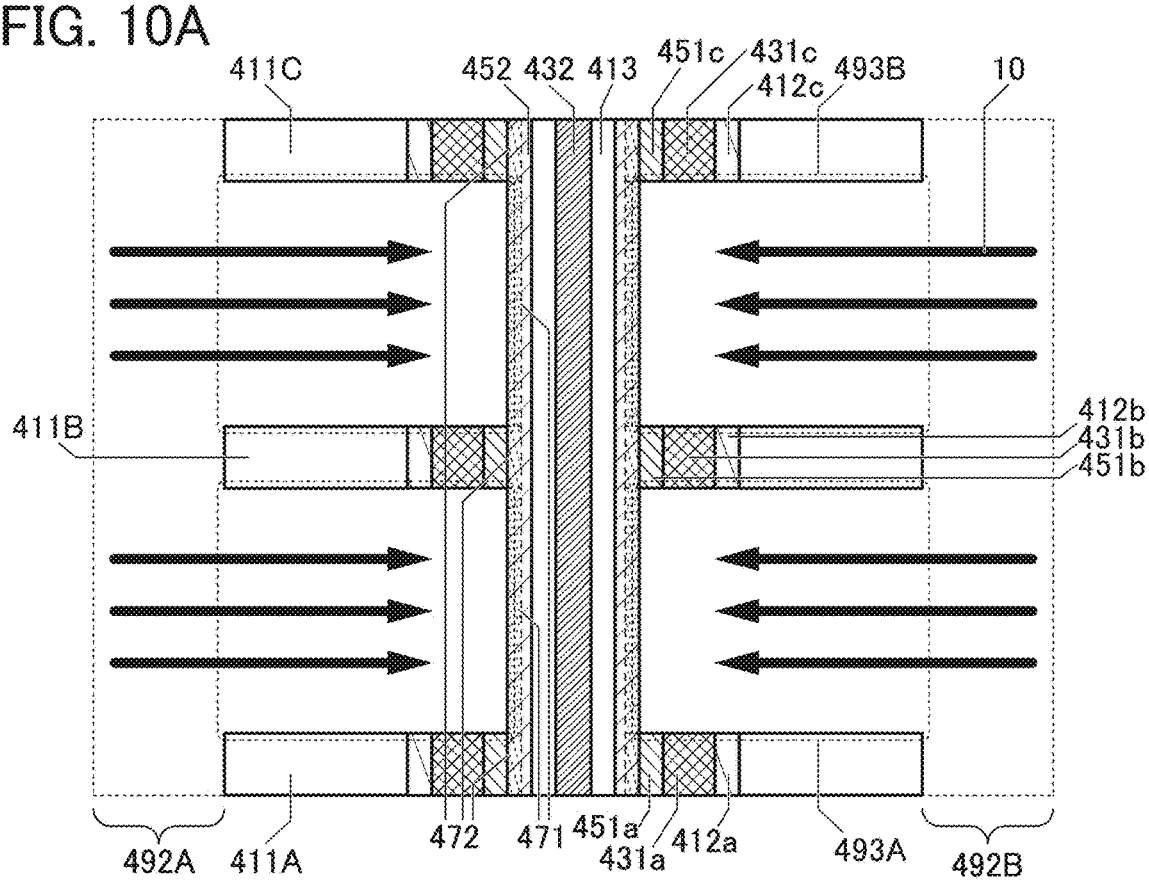
FIG. 10A is a cross-sectional view illustrating an example of manufacturing a semiconductor device and FIG. 10B is a perspective view illustrating the example of manufacturing a semiconductor device.

In the case where a material including metal oxide is used for the material layer 452, that is, in the case where the cell transistor CTrA and the cell transistor CTrB in FIG. 1 are OS transistors, after the openings in the region 492A and the region 492B, the depressed portion 493A, and the depressed portion 493B are formed, treatment of supplying oxygen from the openings in the region 492A and the region 492B may be performed on the region 471 of the material layer 452 exposed in the depressed portion 493A and the depressed portion 493B. In that case, FIG. 10A illustrates a state in which oxygen is supplied to the region 471 as the treatment 10. Examples of the treatment of supplying oxygen include heat treatment in an oxygen atmosphere.

As the treatment 10 of supplying oxygen, for example, microwave treatment in an atmosphere containing oxygen can be employed. In that case, a microwave or a high-frequency wave such as an RF wave, oxygen plasma, oxygen radicals, or the like is applied to the region 471. For the microwave treatment, a microwave treatment apparatus including a power source for generating high-density plasma using a microwave is preferably used, for example. The microwave treatment apparatus may include a power source for applying RF to the substrate side. The use of high-density plasma enables high-density oxygen radicals to be generated. Furthermore, application of RF to the substrate side allows oxygen ions generated by the high-density plasma to be efficiently introduced into the material layer 452. The microwave treatment is preferably performed under reduced pressure, and the pressure is set to 60 Pa or higher, preferably 133 Pa or higher, further preferably 200 Pa or higher, still further preferably 400 Pa or higher. Furthermore, the oxygen flow rate ratio ($O_2/O_2+Ar$) is lower than or equal to 50%, preferably higher than or equal to 10% and lower than or equal to 30%. The treatment temperature is lower than or equal to 750° C., preferably lower than or equal to 500° C., and is approximately 400° C., for example. Heat treatment may be successively performed without exposure to the air after the oxygen plasma treatment.

When the microwave treatment is performed in an atmosphere containing oxygen as the treatment 10 of supplying oxygen, an oxygen gas is made into plasma with a microwave or a high-frequency wave such as RF, and the oxygen plasma can act on the region 471 of the material layer 452 (the material layer 452A in the case where the cell transistor CTrA and the cell transistor CTrB have a structure of FIG. 3A or FIG. 3C). At this time, the region 471 can be irradiated with a microwave or a high-frequency wave such as RF. In other words, a microwave, the high-frequency wave such as RF, the oxygen plasma, or the like can act on the region 472 in FIG. 10A. The effect of the plasma, the microwave, or the like enables $V_OH$ in the region 471 to be cut, and hydrogen H to be removed from the region 471. That is, the reaction "$V_OH \rightarrow H + V_O$" and then the reaction "$V_O + O \rightarrow null$" occur in the region 471, whereby the hydrogen concentration in the region 471 can be reduced. As a result, oxygen vacancies and $V_OH$ in the region 471 can be reduced to lower the carrier concentration.

In FIG. 10A, the conductor 431a (the conductor 431b and the conductor 431c) is provided to overlap with the region 472. The conductor 431a (the conductor 431b and the conductor 431c) blocks the effects of a microwave, the high-frequency wave such as RF, the oxygen plasma, and the like, and thus the effects of these do not reach the region 472. Hence, a reduction in $V_OH$ and supply of an excess amount of oxygen due to the microwave treatment do not occur in the region 472, preventing a reduction in carrier concentration.

Oxygen vacancies and $V_OH$ in the region 471 of the material layer 452 are selectively eliminated in this way, whereby the region 471 can be i-type or substantially i-type. Furthermore, supply of an excess amount of oxygen to the region 472 functioning as a source region or a drain region can be inhibited and the n-type can be maintained. Accordingly, a change in the electrical characteristics of the cell transistor CTrA and the cell transistor CTrB can be prevented, so that variations in electrical characteristics of the cell transistors in the semiconductor device can be prevented.

In the case where a material including silicon is used for the material layer 452, that is, in the case where the cell transistor CTrA and the cell transistor CTrB in FIG. 1 are Si transistors, after the openings in the region 492A and the region 492B, the depressed portion 493A, and the depressed portion 493B are formed, treatment of supplying an impurity from the openings in the region 492A and the region 492B may be performed on the region 471 of the material layer 452 exposed in the depressed portion 493A and the depressed portion 493B. In that case, FIG. 9A illustrates a state in which impurities are supplied to the material layer 452, which is exposed in the depressed portion 493A and the depressed portion 493B, as the treatment 10. Note that heat treatment is preferably performed on the semiconductor device during the treatment 10. In the case where the cell transistor CTrA and the cell transistor CTrB are n-channel transistors, a p-type impurity (an acceptor) is used as the impurity so as to make the region 471 a p-type channel formation region. As the p-type impurity, boron, aluminum, or gallium can be used, for example. In the case where the cell transistor CTr is a p-channel transistor, an n-type impurity (a donor) is used as the impurity so as to make the region 471 an n-type channel formation region. As the n-type impurity, phosphorus or arsenic can be used, for example.

Note that a region of the material layer 452 which is not exposed in the depressed portion 493A and the depressed portion 493B, that is, the region 472 in contact with the material layer 451a, the material layer 451b, and the material layer 451c has a lower resistance than the region 471 in some cases. This is because, for example, a component contained in the conductor 431a (the conductor 431b and the conductor 431c) and a component of the material layer 452 near an interface with the material layer 451a (the material layer 451b and the material layer 451c) sometimes form a low-resistance compound. Alternatively, the region 471 has higher resistance than the region 472 through the treatment 10. Thus, the region 472 functions as a low-resistance region of the cell transistor CTrA and the cell transistor CTrB.

Figure 10B:
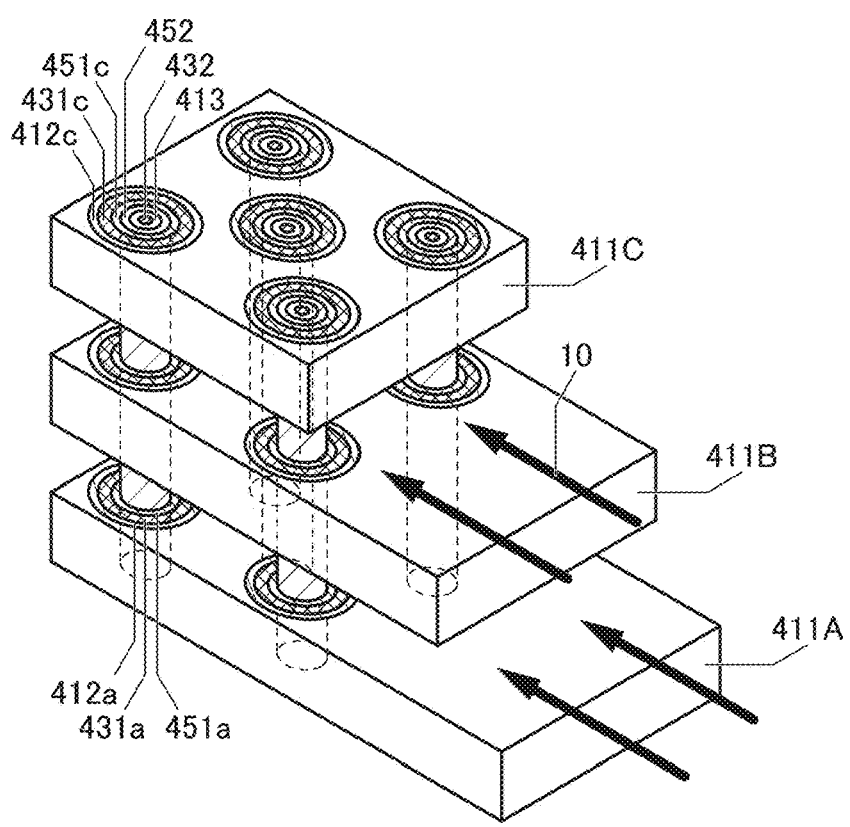

As described above, in the treatment of supplying oxygen or impurities to the material layer 452, oxygen supply may be performed from a terminal extraction portion as illustrated in FIG. 10B, not from the openings in the region 492A and the region 492B. As the treatment of supplying oxygen to the material layer 452, oxygen supply from the openings in the region 492A and the region 492B in FIG. 10A and oxygen supply from the terminal extraction portion in FIG. 10B may be combined. Note that FIG. 10B is a perspective view of the structure body illustrated in FIG. 10A.

Figure 11A:
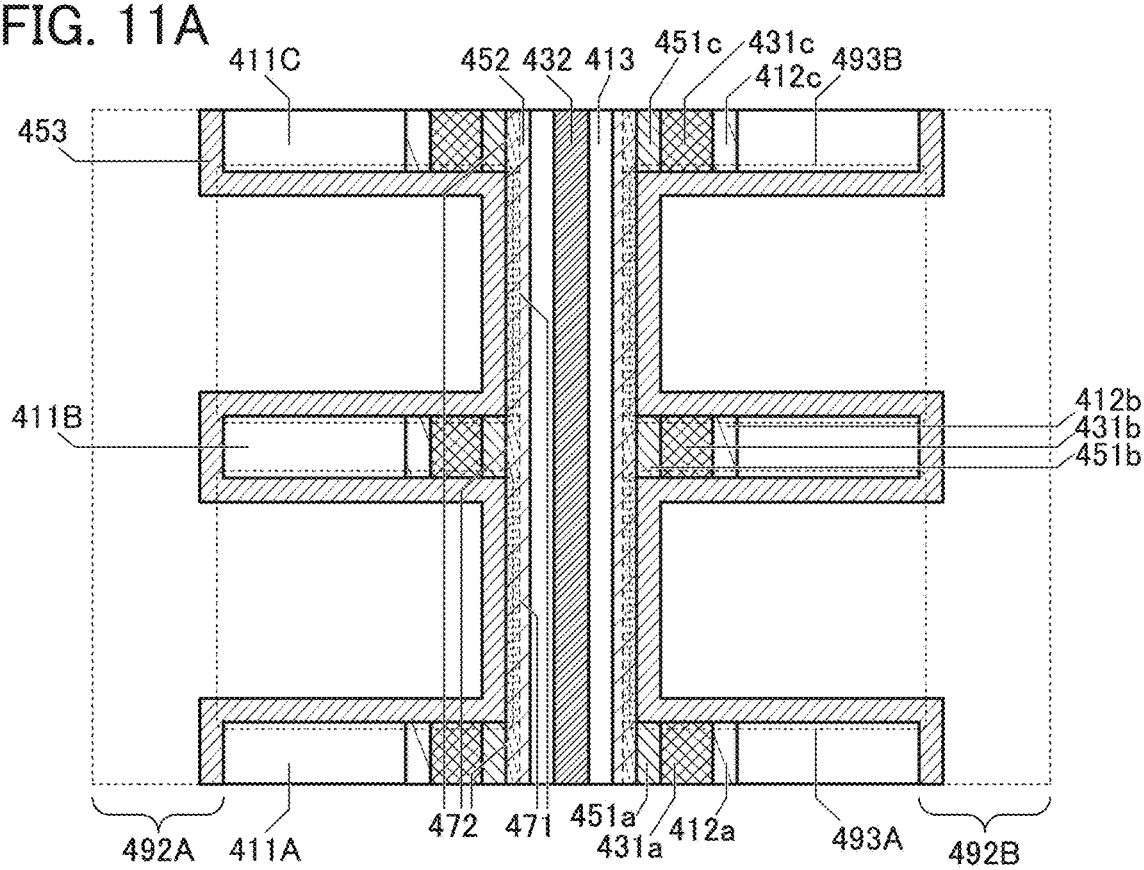
FIG. 11A and FIG. 11B are cross-sectional views illustrating an example of manufacturing a semiconductor device.

In the subsequent step, the material layer 453 is formed on the side surfaces of the openings in the region 492A and the region 492B in FIG. 9B (side surfaces of the insulator 411A to the insulator 411C), the depressed portion 493A, and the depressed portion 493B as illustrated in FIG. 11A.

In the case where a material containing metal oxide is used for the material layer 452, that is, in the case where the cell transistor CTrA and the cell transistor CTrB in FIG. 1 are OS transistors, a material that can be used for the material layer 453 is preferably metal oxide that can be used for the material layer 451 and/or the material layer 452. For the metal oxide, description of the material layer 451 and the material layer 452, which are formed in the steps illustrated in FIG. 7A and FIG. 7B, is referred to.

The material layer 453 may have a stacked-layer structure of a plurality of metal oxides that can be used for the material layer 451 and/or the material layer 452.

After the formation of the material layer 453, as in the step illustrated in FIG. 10A and FIG. 10B, oxygen may be supplied to the material layer 453 and a region of the material layer 452 in contact with the material layer 453 by microwave treatment or the like as the treatment 10 (not illustrated).

In the case where a material containing silicon is used for the material layer 452, that is, in the case where the cell transistor CTrA and the cell transistor CTrB in FIG. 1 are Si transistors, a material that can be used for the material layer 453 can be metal oxide that can be used for the material layer 451 and/or the material layer 452 or a material that can be used for the insulator 414 to be described later.

Note that although the material layer 453 and the material layer 451c illustrated in FIG. 11A have the same thickness, the semiconductor device of one embodiment of the present invention is not limited to this. The thickness of the material layer 453 may be larger or smaller than the thickness of the material layer 451c.

Figure 11B:
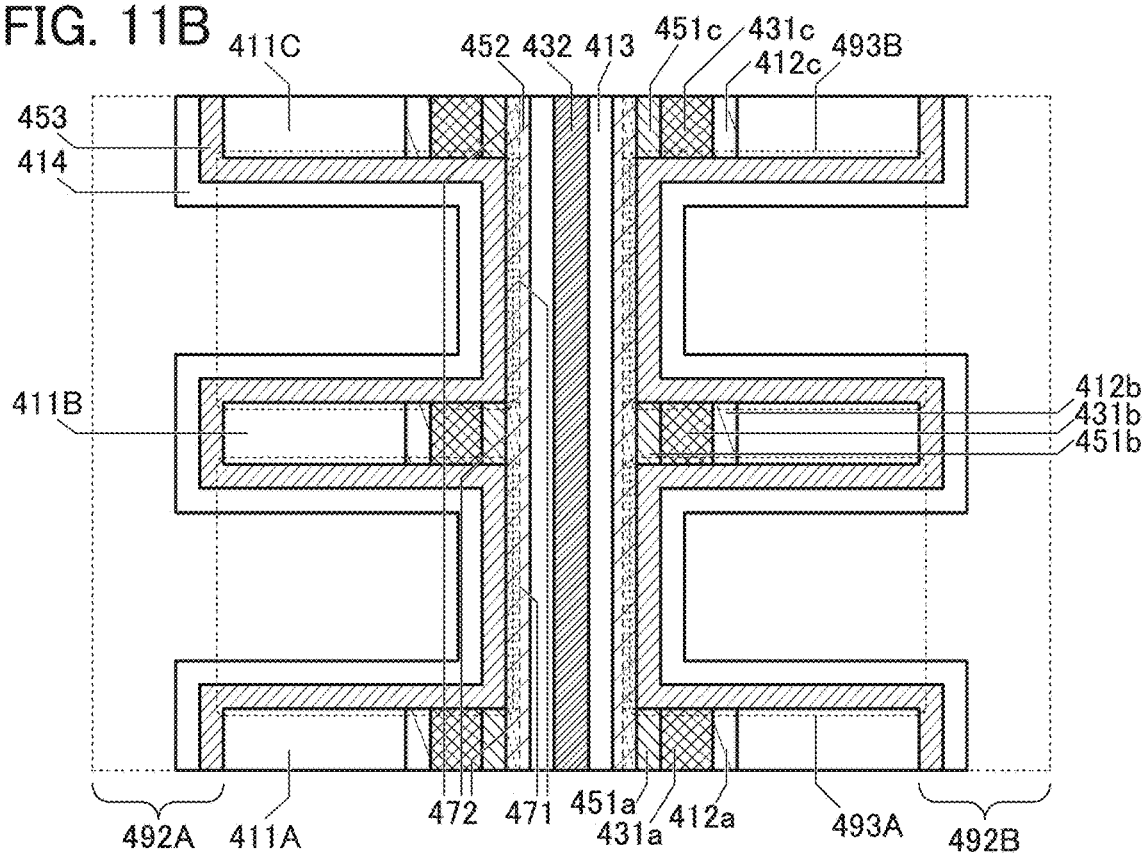

In the subsequent step, as illustrated in FIG. 11B, the insulator 414 is formed on side surfaces of the openings in the region 492A and the region 492B and in the formed depressed portions illustrated in FIG. 11A. In other words, the insulator 414 is formed on the formation surface of the material layer 453.

The insulator 414 functions as a tunnel insulating film of the cell transistor CTrA and the cell transistor CTrB as described above.

It is preferable to use silicon oxide or silicon oxynitride for the insulator 414, for example. Alternatively, for the insulator 414, aluminum oxide, hafnium oxide, or oxide containing aluminum and hafnium may be used, for example. The insulator 414 may be an insulator including a stack of any of the above.

After the formation of the insulator 414, as in the step illustrated in FIG. 10A and FIG. 10B, oxygen may be supplied to the material layer 453 and a region of the material layer 452 in contact with the material layer 453, through the insulator 414 by microwave treatment or the like as the treatment 10 (not illustrated).

In the case where at least one of the material layer 451 to the material layer 453 is a material containing metal oxide, the insulator 414 can be an insulator in which the material that can be used for the insulator 413 is stacked on the above material. In particular, when a material having a function of inhibiting transmission of oxygen or impurities such as water and hydrogen is used for the insulator 414, diffusion of water or hydrogen into the material layer 451 to the material layer 453 and release of oxygen from the material layer 451 to the material layer 453 can be prevented in some cases. Note that in the case where microwave treatment is performed as the treatment 10, for example, the insulator 414 may be formed in such a manner that silicon oxide or silicon oxynitride is deposited on the formation surface of the material layer 453, the microwave treatment is performed, and then a material having a function of inhibiting transmission of oxygen or impurities such as water and hydrogen is deposited.

Figure 12A:
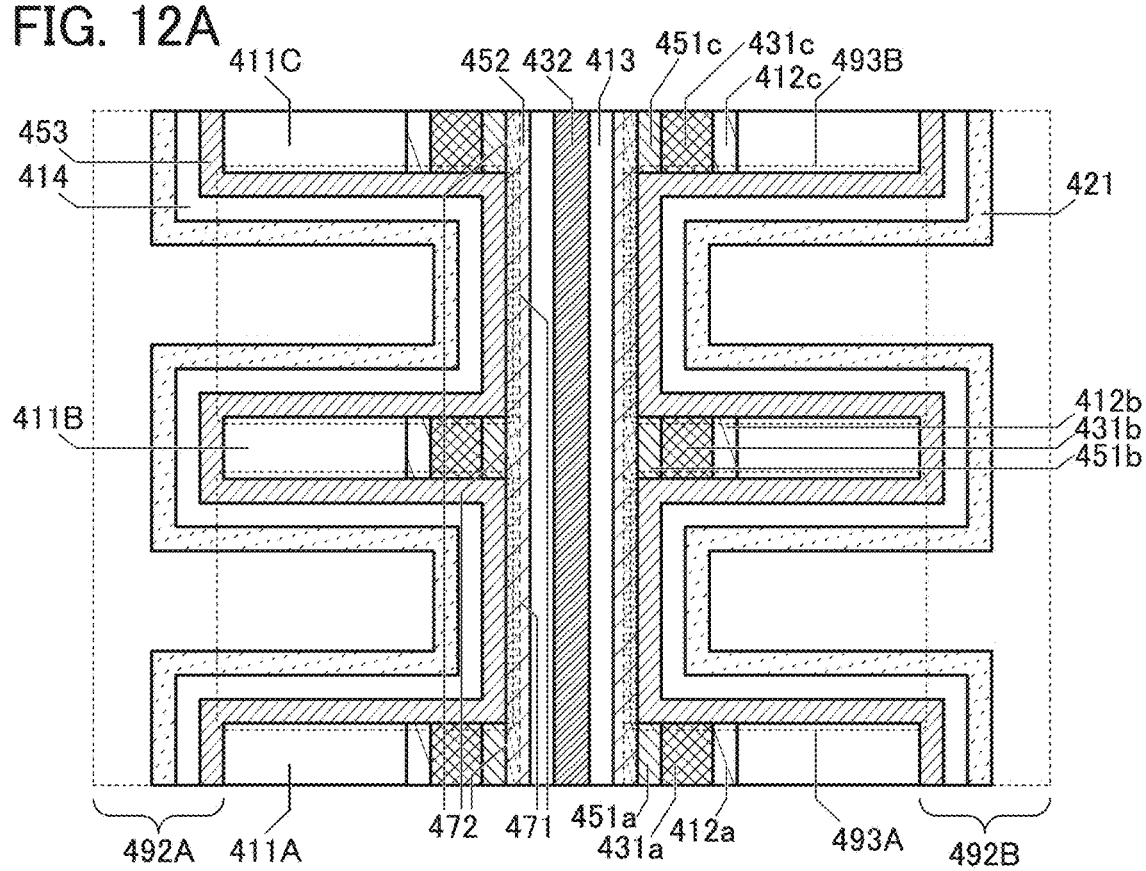
FIG. 12A and FIG. 12B are cross-sectional views illustrating an example of manufacturing a semiconductor device.

In the subsequent step, as illustrated in FIG. 12A, the insulator 421 is formed on side surfaces of the openings in the region 492A and the region 492B and in the formed depressed portions illustrated in FIG. 11B. That is, the insulator 421 is formed on the formation surface of the insulator 414.

The insulator 421 functions as a charge accumulation layer of the cell transistor CTrA and the cell transistor CTrB as described above.

Silicon nitride or silicon nitride oxide can be used for the insulator 421, for example. Note that a material that can be used for the insulator 421 is not limited to these. A conductor, a semiconductor, or the like can be used as an alternative to the insulator 421 in some cases.

Note that although the thickness of the insulator 421 illustrated in FIG. 12A is substantially equal to the thickness of, for example, the material layer 451a (the material layer 451b and the material layer 451c), the conductor 431a (the conductor 431b and the conductor 431c), or the insulator 412a (the insulator 412b and the insulator 412c), the semiconductor device of one embodiment of the present invention is not limited to this. In the subsequent step, the insulator 421 that partly fills the depressed portion 493A and the depressed portion 493B may have a large thickness as long as the insulator 415, the conductor 434a, and the conductor 434b are formed in the depressed portion 493A and the depressed portion 493B. The insulator 421 may have a small thickness as long as the insulator 421 functions as a charge accumulation layer.

Figure 12B:
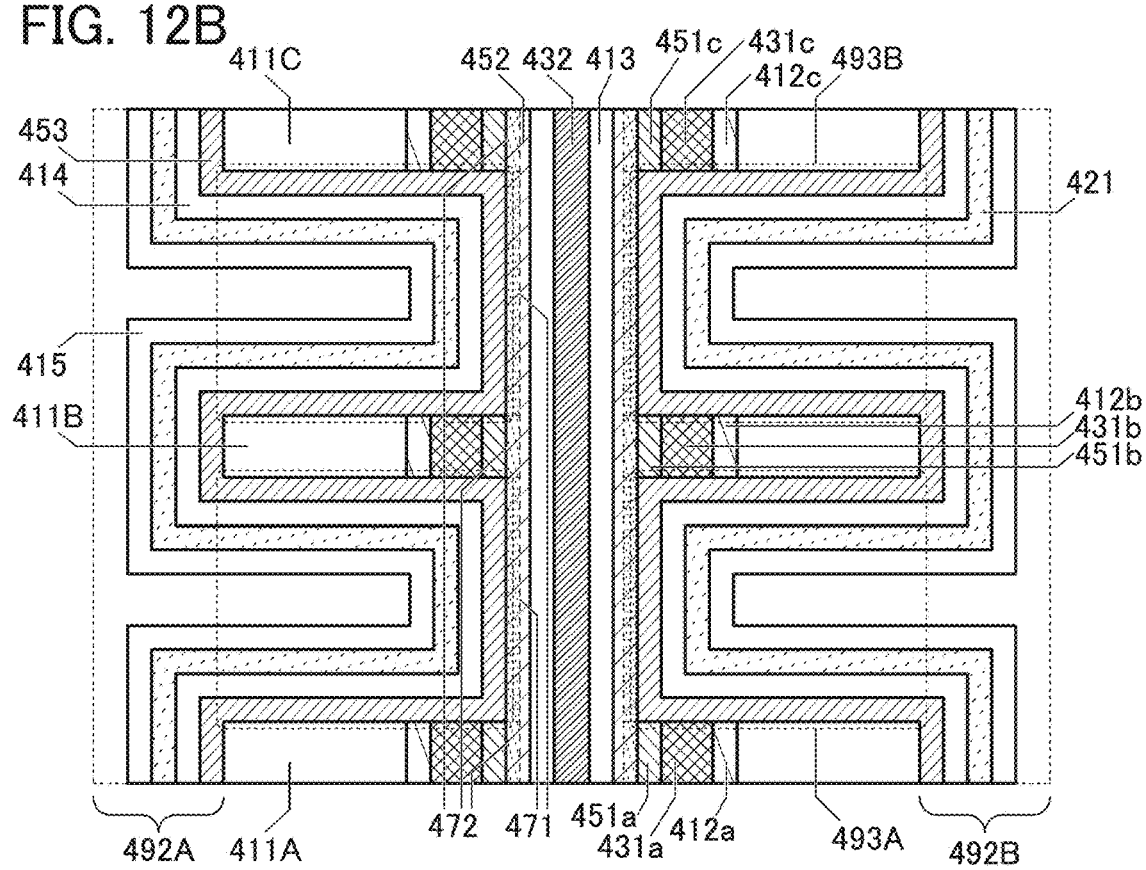

In the subsequent step, as illustrated in FIG. 12B, the insulator 415 is formed on side surfaces of the openings in the region 492A and the region 492B and in the formed depressed portions illustrated in FIG. 12A. In other words, the insulator 415 is formed on the formation surface of the insulator 421.

The insulator 415 functions as a gate insulating film of the cell transistor CTrA and the cell transistor CTrB as described above.

It is preferable to use silicon oxide or silicon oxynitride for the insulator 415, for example. Alternatively, for the insulator 415, aluminum oxide, hafnium oxide, or oxide containing aluminum and hafnium can be used, for example. The insulator 415 may be an insulator including a stack of any of the above. The insulator 415 is preferably thicker than the insulator 414. When the insulator 415 is made thicker than the insulator 414, charge can be moved from the material layer 453 to the insulator 421 through the insulator 414.

Figure 13A:
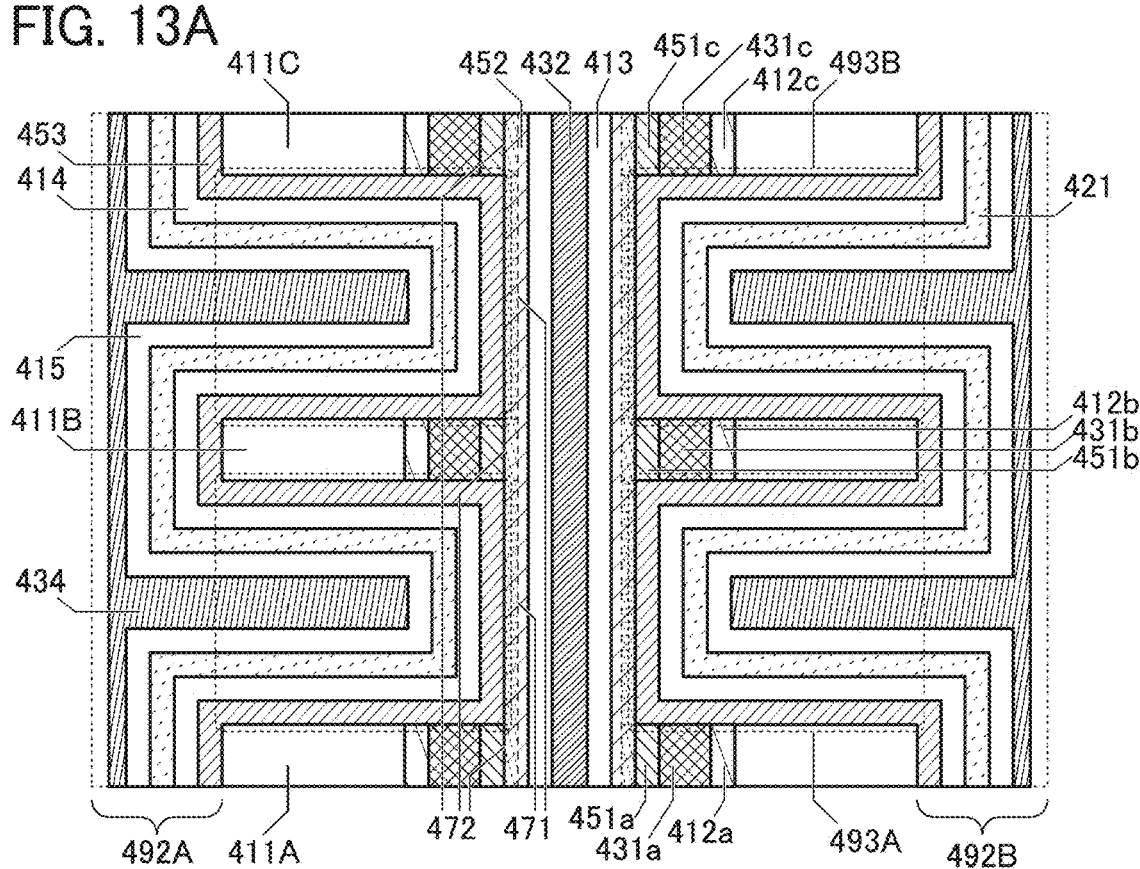
FIG. 13A and FIG. 13B are cross-sectional views illustrating an example of manufacturing a semiconductor device.

In the subsequent step, as illustrated in FIG. 13A, the conductor 434 is formed on side surfaces of the openings in the region 492A and the region 492B and in the formed depressed portions illustrated in FIG. 12B. That is, the conductor 434 is formed on the formation surface of the insulator 415.

For the conductor 434, any of the materials usable for the aforementioned conductor 432 can be used, for example.

Figure 13B:
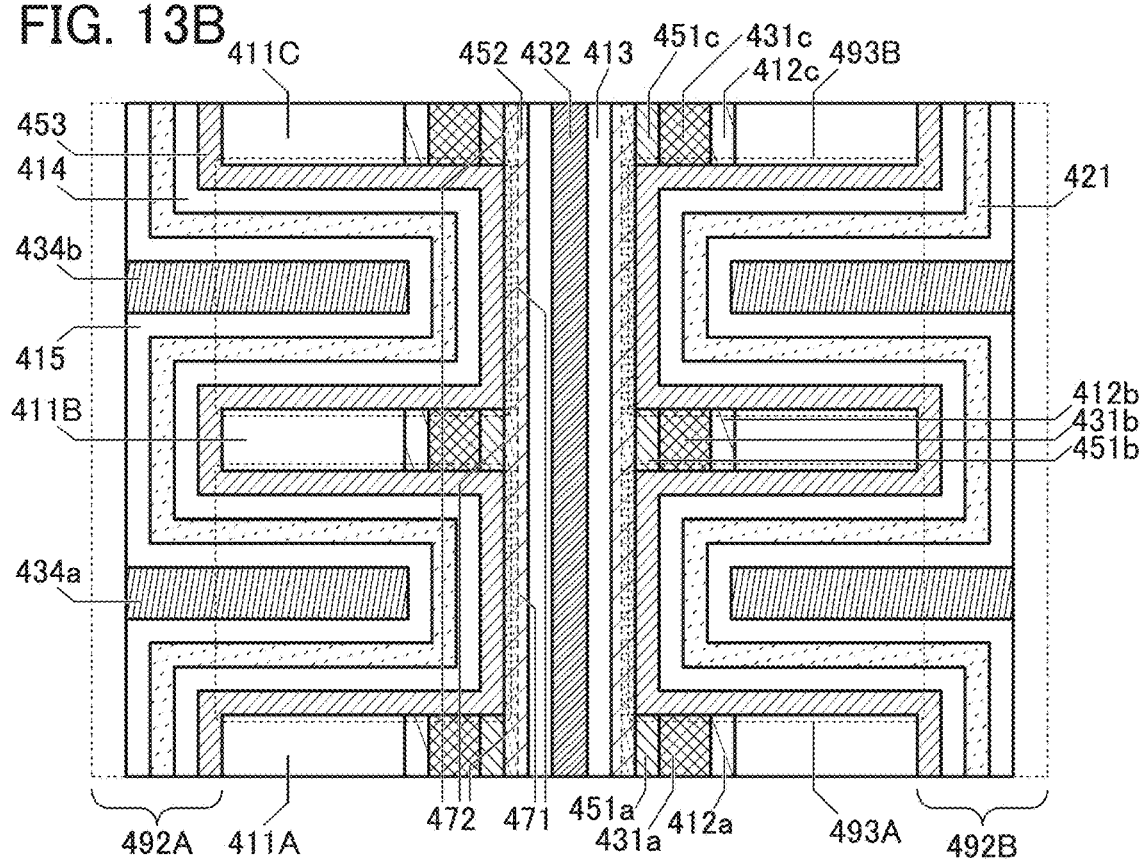

In the next step, as illustrated in FIG. 13B, the conductor 434 included in the region 492A and the region 492B is removed by resist mask formation, etching treatment, and the like such that the conductor 434 remains only in the aforementioned depressed portions. Thus, the conductor 434a and the conductor 434b are formed. At this time, an exposed portion of the insulator 415 may be removed.

Note that the description of FIG. 5B is referred to for the resist mask formation, the etching treatment, and the like.

The conductor 434a functions as a gate electrode of the cell transistor CTrA and a word line that supplies a potential to the gate electrode, as described above. The conductor 434b functions as a gate electrode of the cell transistor CTrB and a word line that supplies a potential to the gate electrode, as described above.

In the subsequent step, the insulator 416A is deposited to fill the opening in the region 492A, and the insulator 416B is deposited to fill the opening in the region 492B, as illustrated in FIG. 1A.

Any of the above materials usable for the insulators 413 can be used for the insulator 416A and the insulator 416B, for example.

Through the above steps, the semiconductor device illustrated in FIG. 1A can be manufactured.

<Structure Example 2 of Semiconductor Device>

A structure example of the semiconductor device of one embodiment of the present invention which functions as a storage device is not limited to the structure illustrated in FIG. 1, FIG. 2A, and FIG. 2B. The semiconductor device can have a structure which is changed from the structure illustrated in FIG. 1, FIG. 2A, and FIG. 2B as appropriate depending on the case, the circumstances, or the necessity.

Figure 14A:
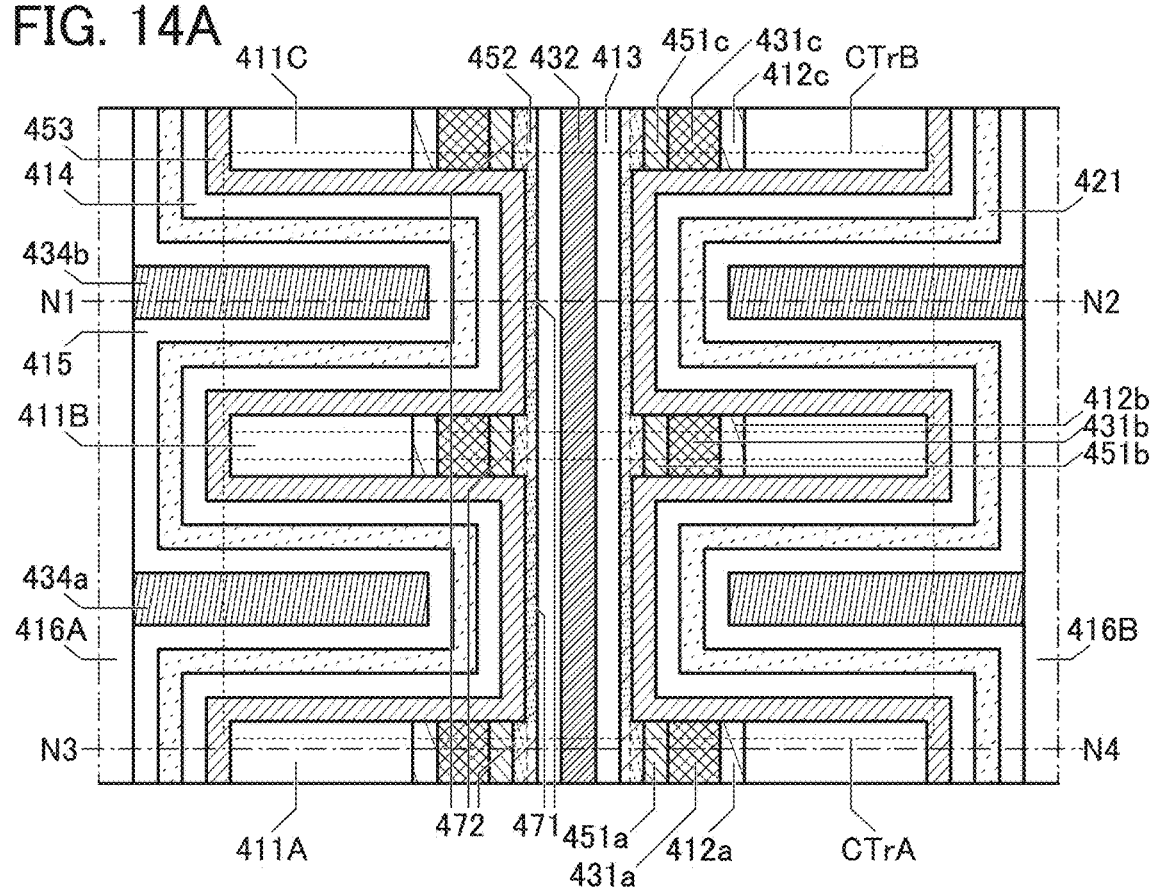
FIG. 14A is a cross-sectional view illustrating a structure example of a semiconductor device and FIG. 14B is a cross-sectional view illustrating an example of manufacturing a semiconductor device.
Figure 14B:
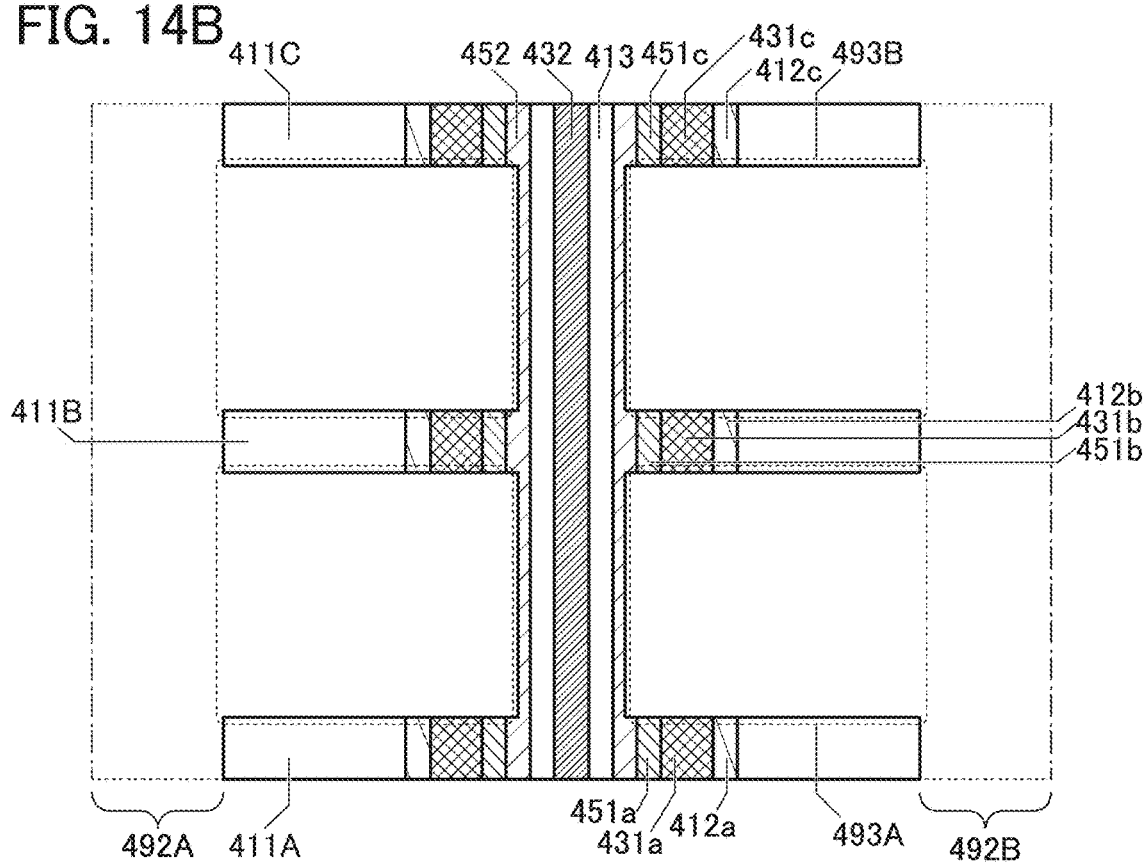
Figure 15A:
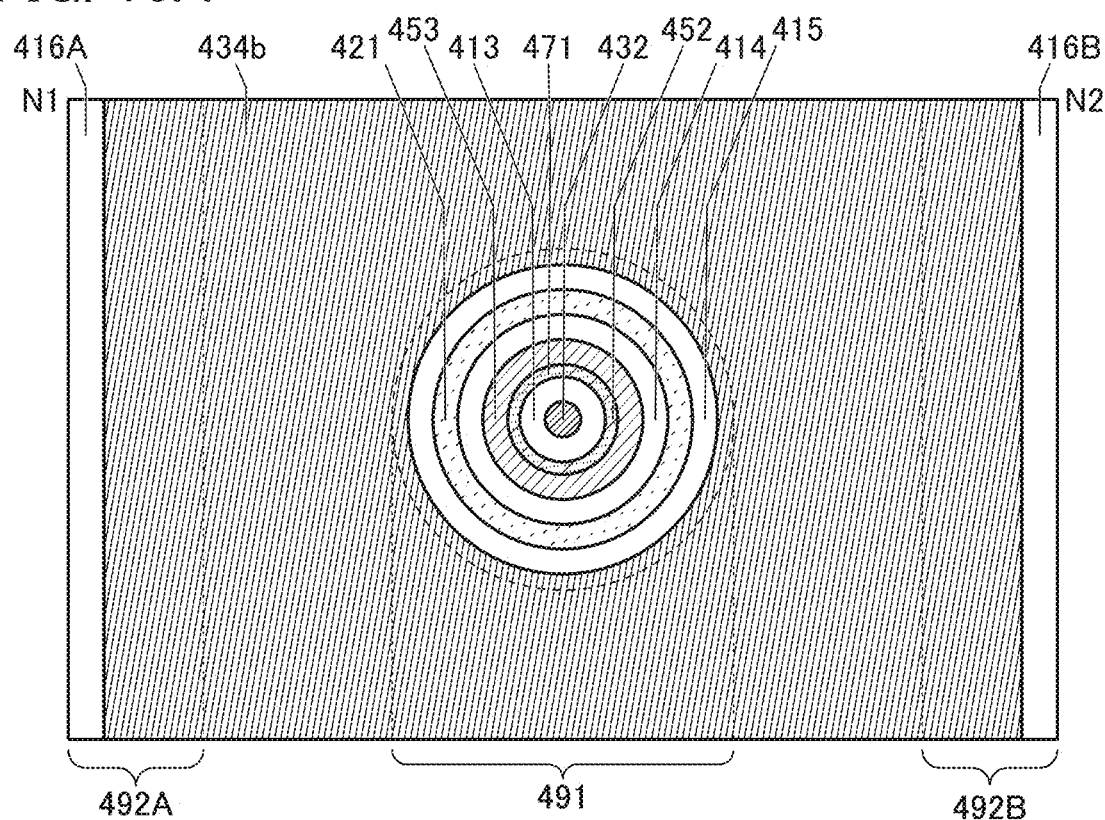
FIG. 15A and FIG. 15B are top views illustrating a structure example of a semiconductor device.
Figure 15B:
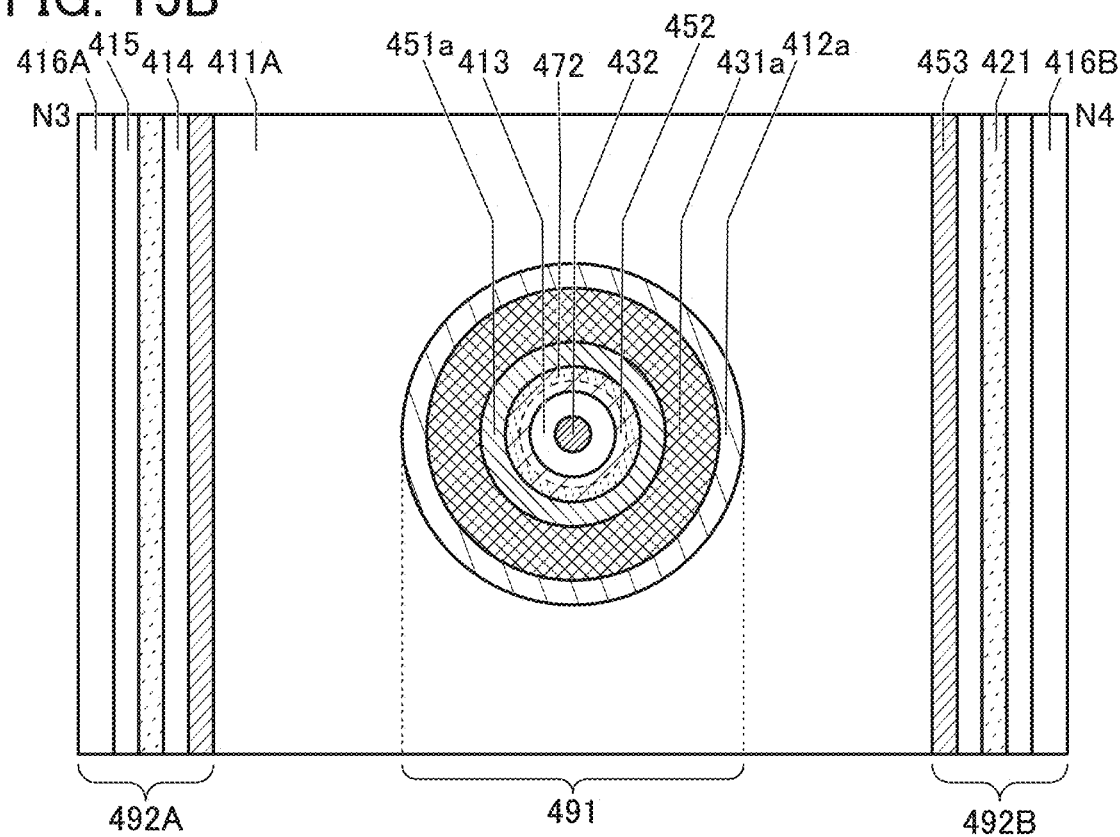

For example, the structure of the semiconductor device in FIG. 1, FIG. 2A, and FIG. 2B may be changed to the structure of the semiconductor device illustrated in FIG. 14A, FIG. 15A, and FIG. 15B. FIG. 14A is a cross-sectional view of a semiconductor device having a structure different from that in FIG. 1, FIG. 2A, and FIG. 2B. FIG. 15A is a top view taken along the dashed-dotted line N1-N2 in FIG. 14, and FIG. 15B is a top view taken along the dashed-dotted line N3-N4 in FIG. 14. Note that for simplification of the drawings, some components are omitted in the cross-sectional view of FIG. 14, the top view of FIG. 15A, and the top view of FIG. 15B.

The step illustrated in FIG. 14B is performed instead of the step illustrated in FIG. 9B for the semiconductor device in FIG. 14A, FIG. 15A, and FIG. 15B, and the material layer 452 is partly removed by etching treatment or the like as long as the insulator 413 is not exposed in the depressed portion 493A and the depressed portion 493B. Thus, the material layer 452 in the semiconductor device of one embodiment of the present invention may have different thicknesses in the region 471 of the material layer 452 where the depressed portion 493A and the depressed portion 493B are formed and the region 472 of the material layer 452 which overlaps with the conductor 431a (the conductor 431b and the conductor 431c).

<Structure Example 3 Semiconductor Device>

Figure 16:
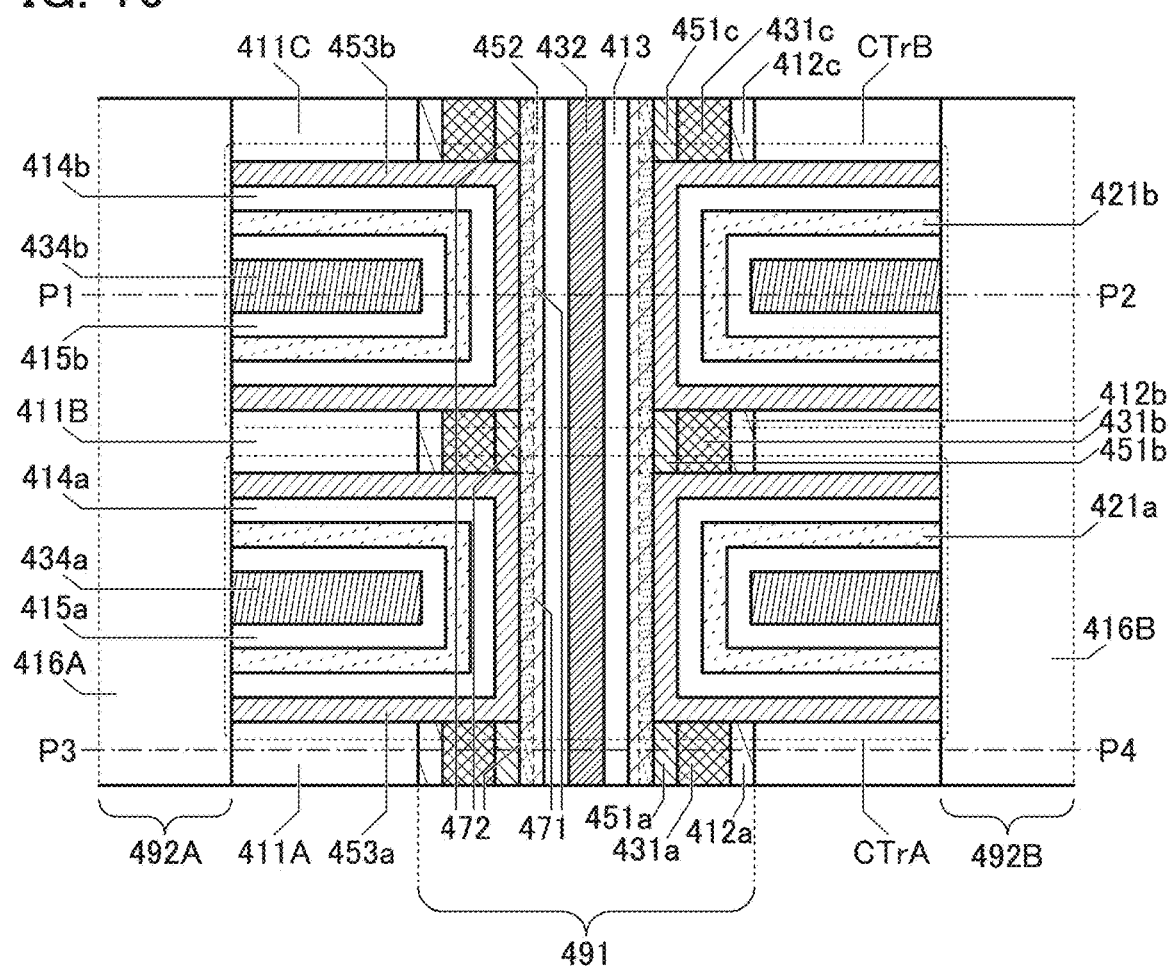
FIG. 16 is a cross-sectional view illustrating a structure example of a semiconductor device.
Figure 17A:
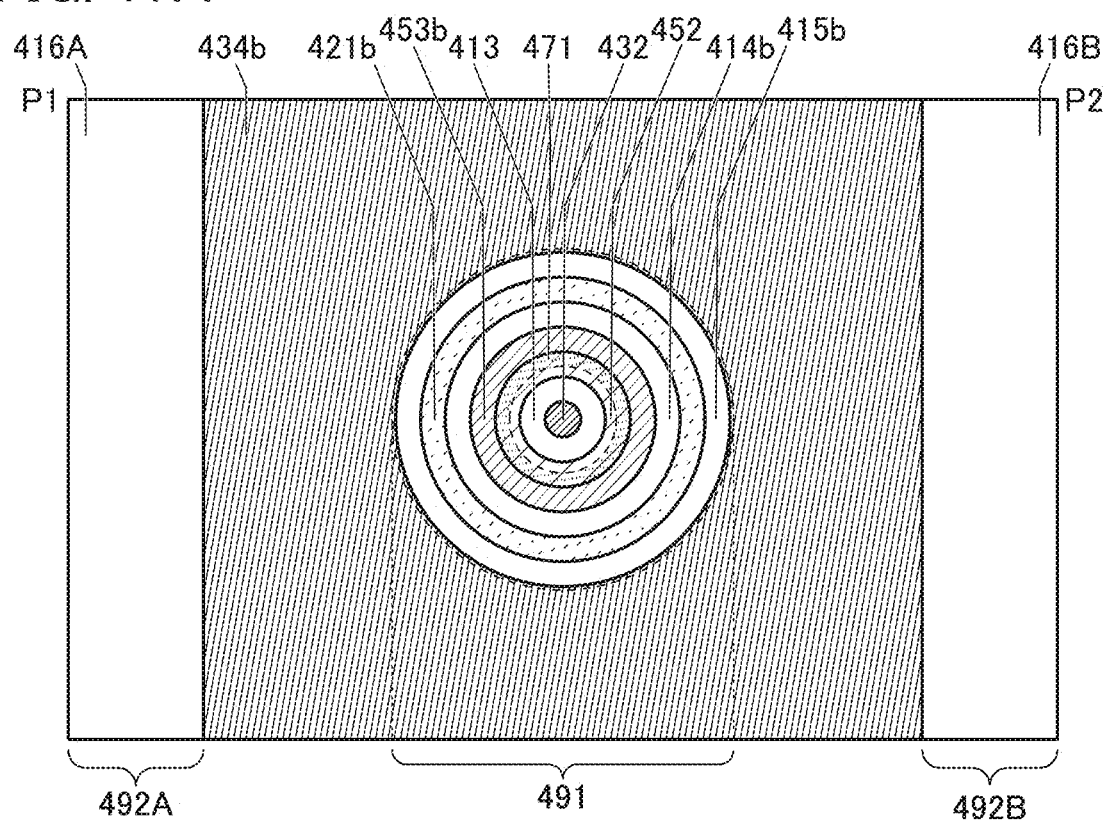
FIG. 17A and FIG. 17B are top views illustrating a structure example of a semiconductor device.
Figure 17B:
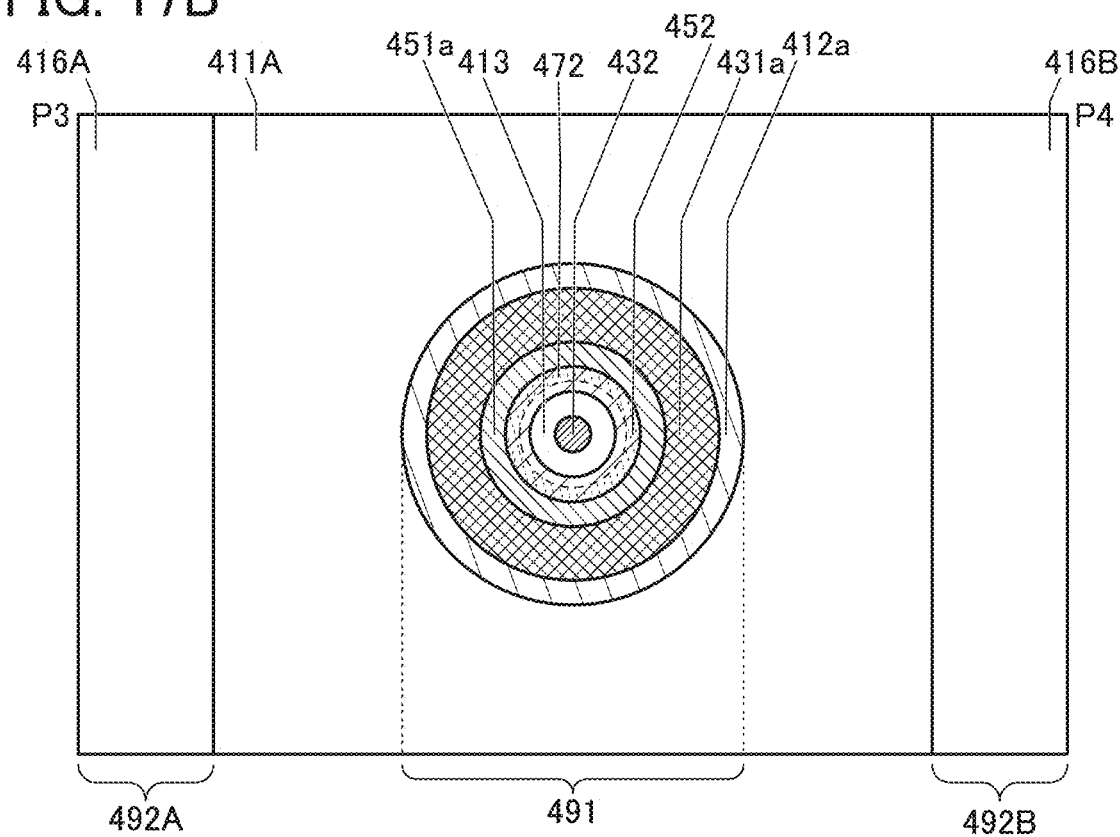

For example, the structure of the semiconductor device in FIG. 1, FIG. 2A, and FIG. 2B may be changed to the structure of the semiconductor device illustrated in FIG. 16, FIG. 17A, and FIG. 17B. FIG. 16 is a cross-sectional view of a semiconductor device having a structure different from that in FIG. 1, FIG. 2A, and FIG. 2B. FIG. 17A is a top view taken along the dashed-dotted line P1-P2 in FIG. 16, and FIG. 17B is a top view taken along the dashed-dotted line P3-P4 in FIG. 16. Note that for simplification of the drawings, some components are omitted in the cross-sectional view of FIG. 16, the top view of FIG. 17A, and the top view of FIG. 17B.

In the semiconductor device in FIG. 16, FIG. 17A, and FIG. 17B, after the step illustrated in FIG. 13B, the material layer 453, the insulator 414, the insulator 421, the insulator 415, and the conductor 434 included in the region 492A and the region 492B are removed by resist mask formation, etching treatment, or the like, and the insulator 416A is deposited to fill the opening in the region 492A and the insulator 416B is deposited to fill the opening in the region 492B.

That is, in the semiconductor device in FIG. 16, FIG. 17A, and FIG. 17B, after the step illustrated in FIG. 13B, the insulator 414, the insulator 421, the insulator 415, and the material layer 453 are removed such that the conductor 434a and the conductor 434b are left. At this time, the insulator 411A to the insulator 411C may be partly removed. Note that FIG. 16 illustrates a structure in which a material layer 453a, an insulator 414a, an insulator 421a, an insulator 415a, and the conductor 434a are formed in the depressed portion 493A and a material layer 453b, an insulator 414b, an insulator 421b, an insulator 415b, and the conductor 434b are formed in the depressed portion 493B.

Note that etching treatment or the like after the step illustrated in FIG. 13B may be performed until part of the insulator 415 is removed and the insulator 414 is exposed in the opening in the region 492A or until part of the insulator 414 is removed and the material layer 453 is exposed in the opening in the region 492A, and the insulator 416A and the insulator 416B in FIG. 1 may be formed on the side surfaces of the openings in the region 492A and the region 492B (not illustrated).

Note that the description of FIG. 5B is referred to for the resist mask formation, the etching treatment, and the like.

<Structure Example 4 of Semiconductor Device>

Figure 18:
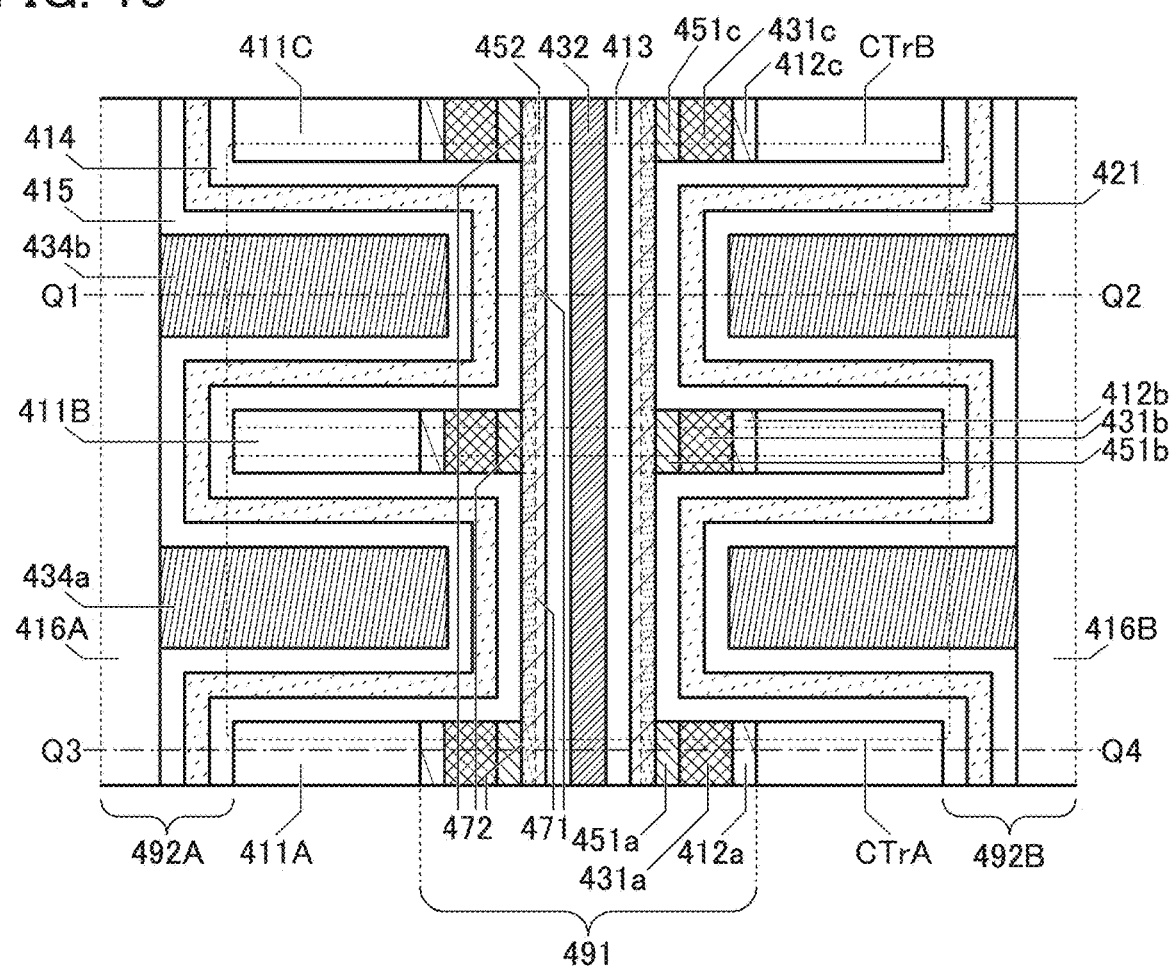
FIG. 18 is a cross-sectional view illustrating a structure example of a semiconductor device.
Figure 19A:
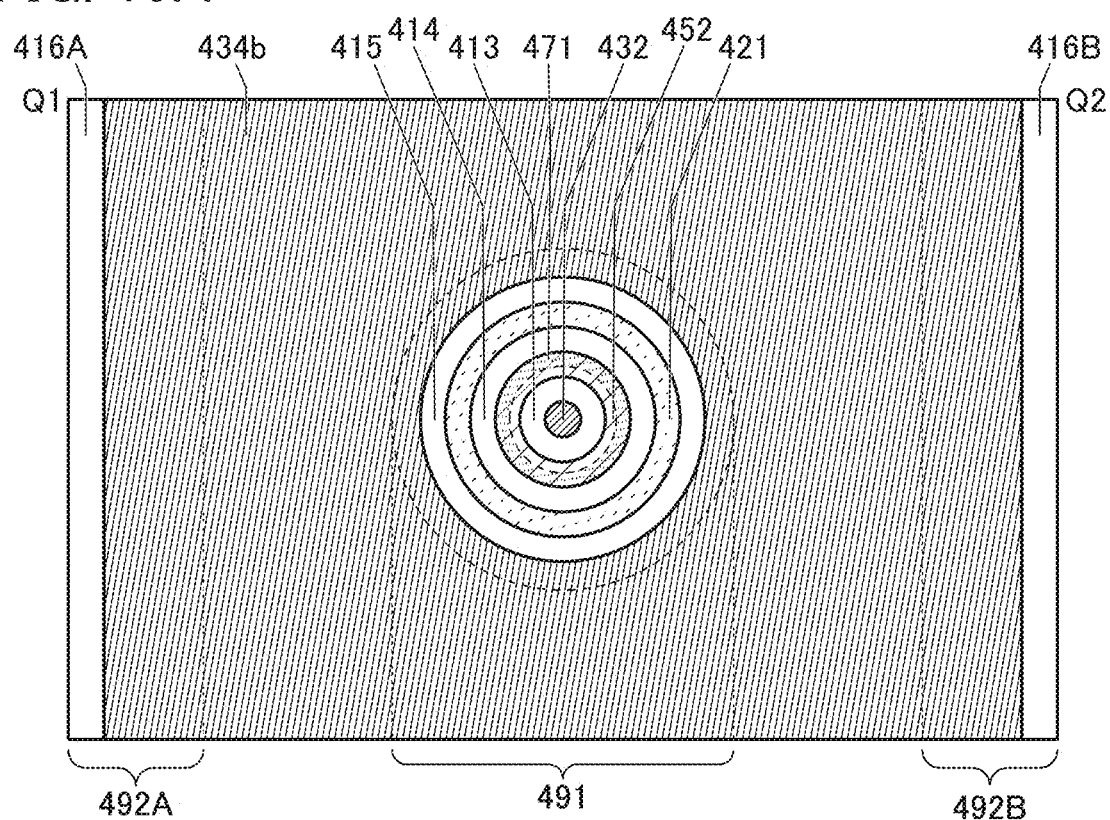
FIG. 19A and FIG. 19B are top views illustrating a structure example of a semiconductor device.
Figure 19B:
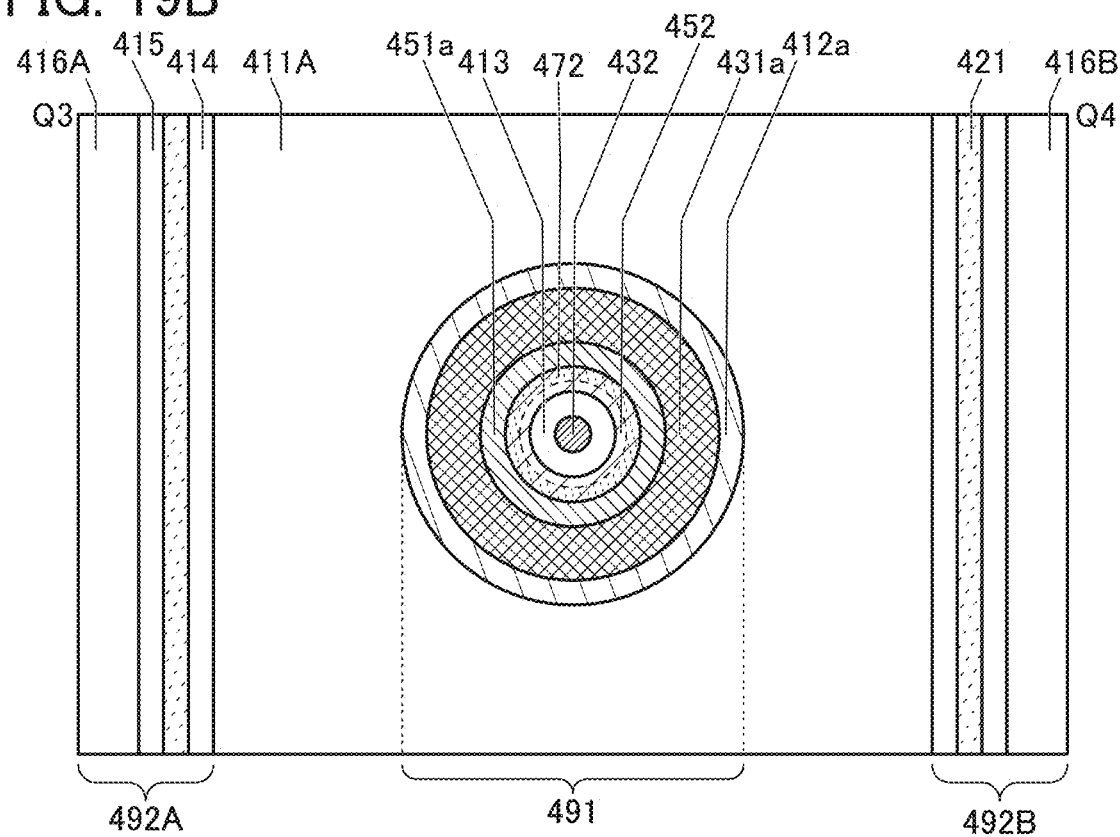

For example, the structure of the semiconductor device in FIG. 1, FIG. 2A, and FIG. 2B may be changed to the structure of the semiconductor device illustrated in FIG. 18, FIG. 19A, and FIG. 19B. FIG. 18 is a cross-sectional view of a semiconductor device having a structure different from that in FIG. 1, FIG. 2A, and FIG. 2B. FIG. 19A is a top view taken along the dashed-dotted line Q1-Q2 in FIG. 18, and FIG. 19B is a top view taken along the dashed-dotted line Q3-Q4 in FIG. 18. Note that for simplification of the drawings, some components are omitted in the cross-sectional view of FIG. 18, the top view of FIG. 19A, and the top view of FIG. 19B.

For the semiconductor device in FIG. 18, FIG. 19A, and FIG. 19B, in the step illustrated in FIG. 9B or FIG. 10A, the step in FIG. 11B and the subsequent steps are performed without performing a step of forming the material layer 453 in FIG. 11A. In the case where the insulator 414 adequately functions as a barrier insulating film to prevent impurities from diffusing into the material layer 452, the material layer 453 is not necessarily provided. In that case, there is no need to provide the material layer 453; thus, the process of manufacturing the semiconductor device can be shortened.

<Structure Example 5 of Semiconductor Device>

Figure 20:
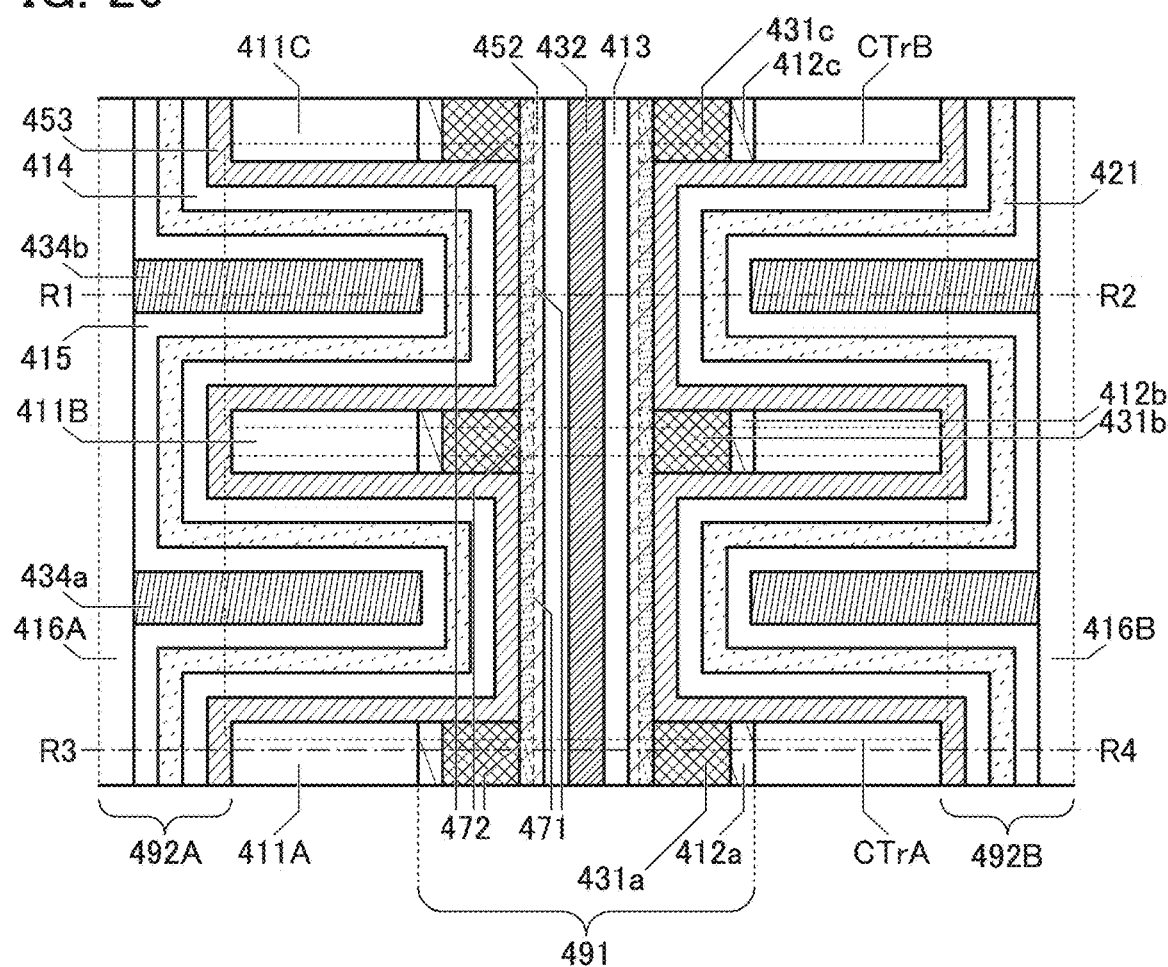
FIG. 20 is a cross-sectional view illustrating a structure example of a semiconductor device.
Figure 21:
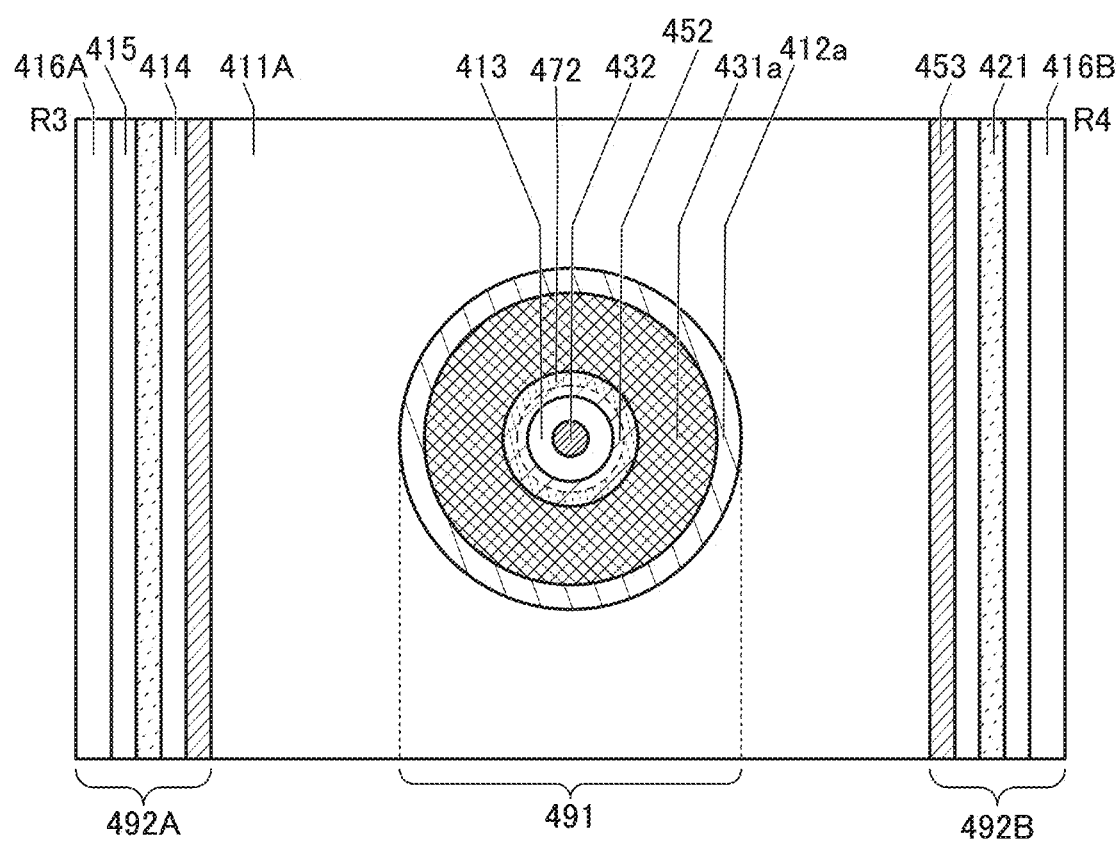
FIG. 21 is a top view illustrating a structure example of a semiconductor device.

For example, the structure of the semiconductor device in FIG. 1, FIG. 2A, and FIG. 2B may be changed to the structure of the semiconductor device illustrated in FIG. 20 and FIG. 21. FIG. 20 is a cross-sectional view of a semiconductor device having a structure different from that in FIG. 1, FIG. 2A, and FIG. 2B. FIG. 21 is a top view of a portion taken along the dashed-dotted line R3-R4 in FIG. 20. Note that the top view of the portion taken along the dashed-dotted line R1-R2 in FIG. 20 has substantially the same structure as that of FIG. 2A in some cases. Note that for clarity of the drawing, some components are not illustrated in the cross-sectional view of FIG. 20 and the top view of FIG. 21.

For the semiconductor device in FIG. 20 and FIG. 21, in the step illustrated in FIG. 6B, the step in FIG. 7B and the subsequent steps are performed without performing a step of forming the material layer 451 in FIG. 7A. In the case where a component, impurities, and the like contained in the material layer 452 do not diffuse into the conductor 431a (the conductor 431b and the conductor 431c) and thus the conductivity of the conductor 431a (the conductor 431b and the conductor 431c) does not decrease, the material layer 451 which functions as a barrier film with respect to the component and the impurities is not necessarily provided. In that case, there is no need to provide the material layer 451; thus, the process of manufacturing the semiconductor device can be shortened.

<Structure Example 6 of Semiconductor Device>

Figure 22:
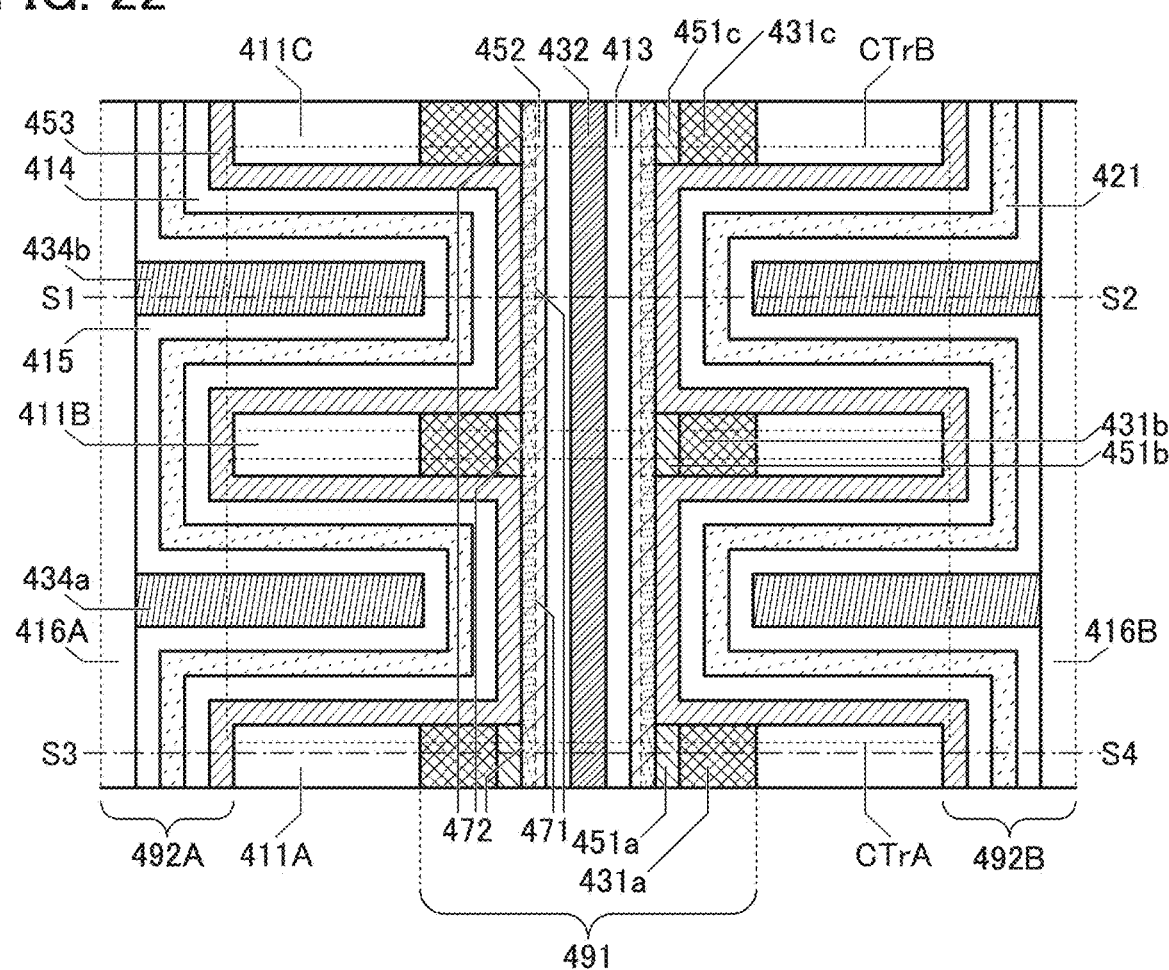
FIG. 22 is a cross-sectional view illustrating a structure example of a semiconductor device.
Figure 23:
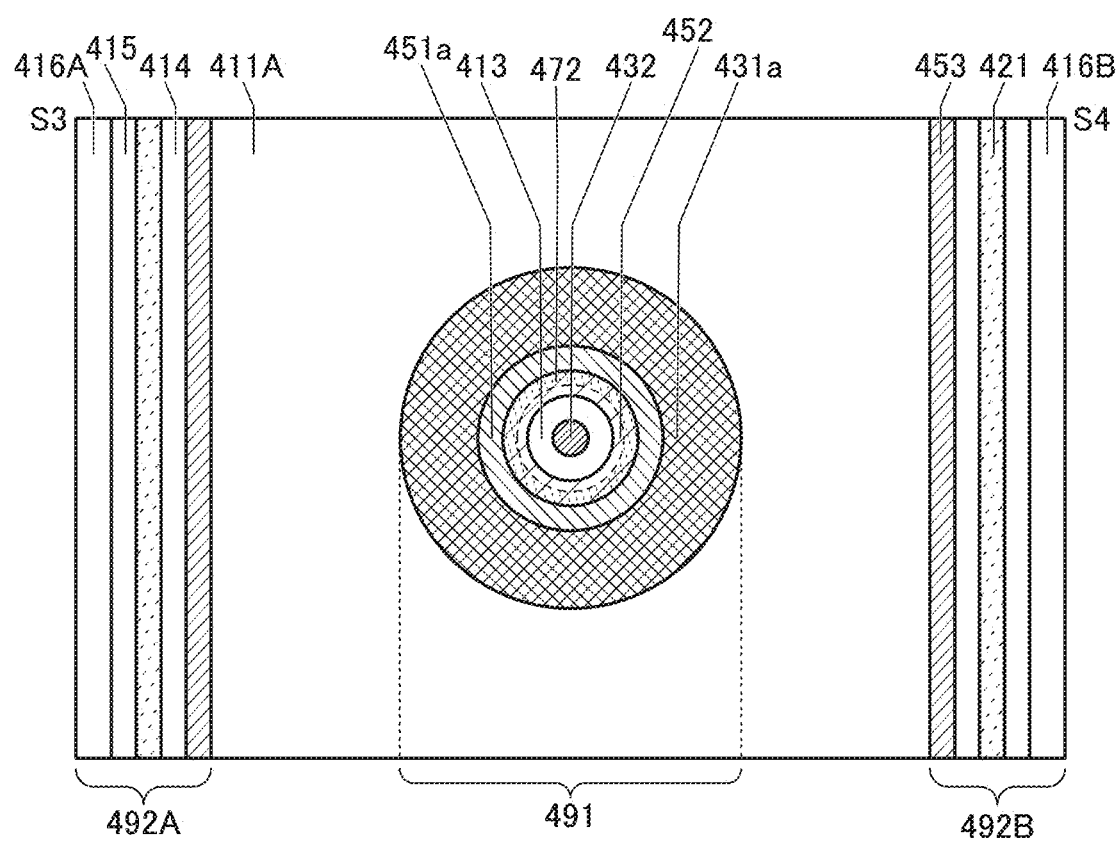
FIG. 23 is a top view illustrating a structure example of a semiconductor device.

For example, the structure of the semiconductor device in FIG. 1, FIG. 2A, and FIG. 2B may be changed to the structure of the semiconductor device illustrated in FIG. 22 and FIG. 23. FIG. 22 is a cross-sectional view of a semiconductor device having a structure different from that in FIG. 1, FIG. 2A, and FIG. 2B. FIG. 23 is a top view of a portion taken along the dashed-dotted line S3-S4 in FIG. 22. Note that the top view of the portion taken along the dashed-dotted line S1-S2 in FIG. 22 has substantially the same structure as that of FIG. 2A in some cases. Note that for clarity of the drawing, some components are not illustrated in the cross-sectional view of FIG. 22 and the top view of FIG. 23.

For the semiconductor device in FIG. 22 and FIG. 23, in the step illustrated in FIG. 5B, the step in FIG. 6B and the subsequent steps are performed without performing a step of forming the insulator 412 in FIG. 6A. In the case where a component, impurities, and the like contained in the insulator 411A (the insulator 411B and the insulator 411C) do not diffuse into the conductor 431a (the conductor 431b and the conductor 431c) and thus the conductivity of the conductor 431a (the conductor 431b and the conductor 431c) does not decrease, the insulator 412 which functions as a barrier insulating film with respect to the component and the impurities is not necessarily provided. In that case, there is no need to provide the insulator 412; thus, the process of manufacturing the semiconductor device can be shortened.

<Structure Example 7 of Semiconductor Device>

Figure 24:
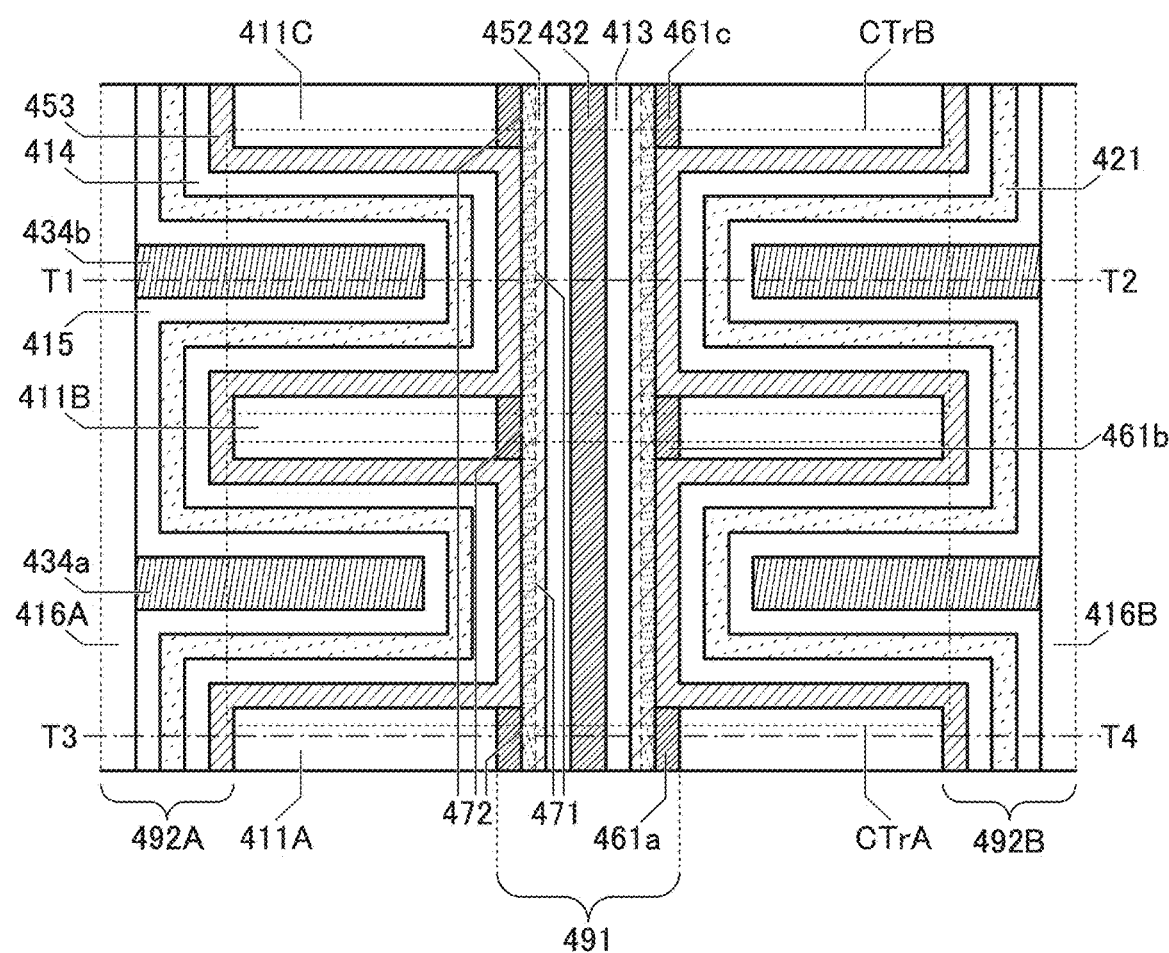
FIG. 24 is a cross-sectional view illustrating a structure example of a semiconductor device.
Figure 25:
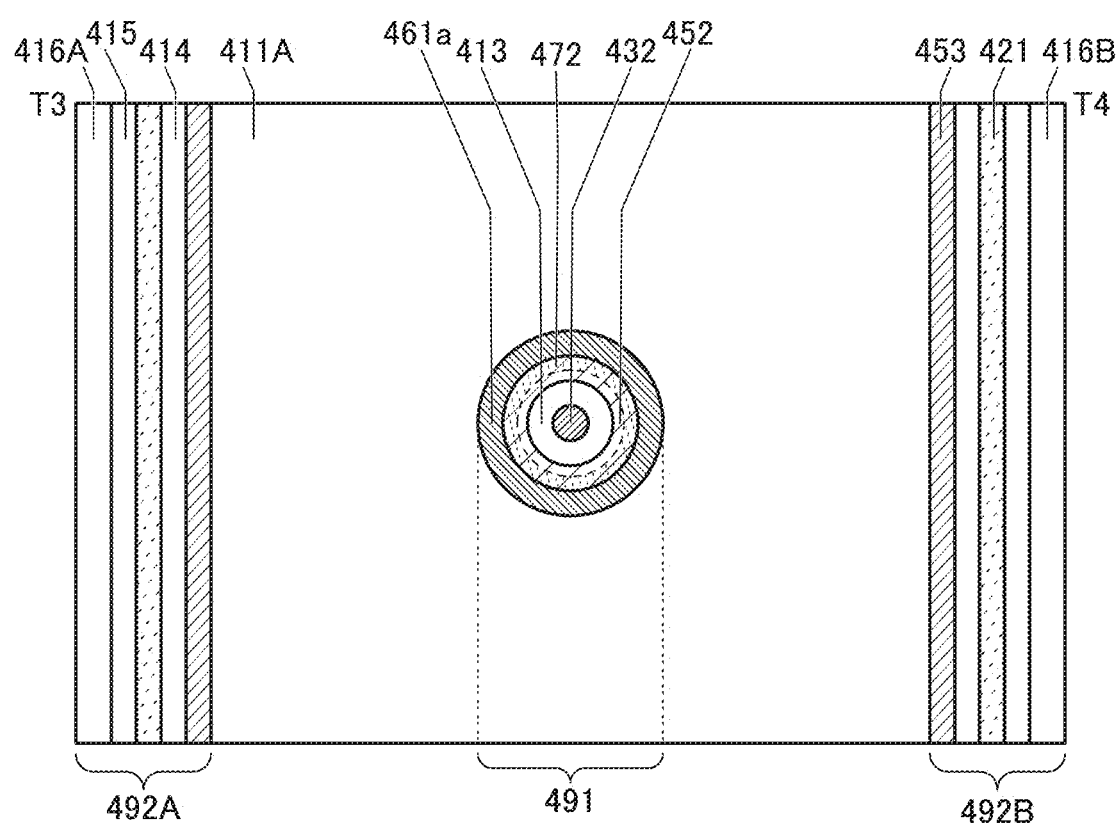
FIG. 25 is a top view illustrating a structure example of a semiconductor device.

For example, the structure of the semiconductor device in FIG. 1, FIG. 2A, and FIG. 2B may be changed to the structure of the semiconductor device illustrated in FIG. 24 and FIG. 25. FIG. 24 is a cross-sectional view of a semiconductor device having a structure different from that in FIG. 1, FIG. 2A, and FIG. 2B. FIG. 25 is a top view of a portion taken along the dashed-dotted line T3-T4 in FIG. 24. Note that the top view of the portion taken along the dashed-dotted line T1-T2 in FIG. 24 has substantially the same structure as that of FIG. 2A in some cases. Note that for clarity of the drawing, some components are not illustrated in the cross-sectional view of FIG. 24 and the top view of FIG. 25.

For the semiconductor device in FIG. 24 and FIG. 25, a conductor is formed on the side surface of the opening in the region 491 in the step illustrated in FIG. 5B, and the step in FIG. 7B and the subsequent steps are performed without performing the steps from FIG. 6A to FIG. 7A. Note that a region in the conductor is removed in the step of forming the depressed portion 493A and the depressed portion 493B in FIG. 9B. Thus, a conductor 461a, a conductor 461b, and a conductor 461c illustrated in FIG. 24 are formed.

For the conductor 461a, the conductor 461b, and the conductor 461c, a conductive material that forms a low-resistance region in the vicinity of an interface with the material layer 452 is preferably used.

In the case where a material containing metal oxide is, for example, used for the material layer 452, metal, nitride containing a metal element, or oxide containing a metal element with a resistance value lower than or equal to $2.4 \times 10^3 [\Omega/sq.]$, preferably lower than or equal to $1.0 \times 10^3 [\Omega/sq.]$ is used for the conductor 461a, the conductor 461b, and the conductor 461c. For the conductive material, it is possible to use, for example, a metal film of aluminum, ruthenium, titanium, tantalum, tungsten, or chromium, a nitride film containing a metal element, such as Al—Ti nitride or titanium nitride, or an oxide film containing a metal element, such as indium tin oxide or In—Ga—Zn oxide.

The conductor 461a, the conductor 461b, and the conductor 461c are not limited to the above-described conductive materials as long as the material has a function of reducing the resistance of the material layer 452. For example, an insulator such as silicon nitride can be used as alternatives to the conductor 461a, the conductor 461b, and the conductor 461c in some cases.

When heat treatment is performed after the step in FIG. 9B of forming the depressed portion 493A and the depressed portion 493B together with the conductor 461a, the conductor 461b, and the conductor 461c, in a region of the material layer 452 in contact with the conductor 461a, the conductor 461b, and the conductor 461c, components contained in the conductor 461a, the conductor 461b, and the conductor 461c and a component contained in the material layer 452 sometimes form a compound in the vicinity of an interface between the material layer 452 and the conductor 461a, the conductor 461b, and the conductor 461c. This compound reduces the resistance of the region 472 of the material layer 452 in contact with the conductor 461a, the conductor 461b, and the conductor 461c.

The heat treatment may be performed in an atmosphere containing nitrogen. By the heat treatment, a metal element that is a component of the conductor 461a (the conductor 461b and the conductor 461c) might diffuse from the conductor 461a (the conductor 461b and the conductor 461c) to the material layer 452, or a metal element that is a component of the material layer 452 might diffuse to the conductor 461a (the conductor 461b and the conductor 461c), so that the material layer 452 and the conductor 461a, the conductor 461b, and the conductor 461c might form a metal compound. At this time, the metal element of the material layer 452 and the metal element of the conductor 461a, the conductor 461b, and the conductor 461c may be alloyed. When the metal element of the material layer 452 and the metal element of the conductor 461a, the conductor 461b, and the conductor 461c are alloyed, the metal elements become comparatively stable; thus, a highly reliable semiconductor device can be provided.

By the heat treatment, hydrogen in the material layer 452 diffuses into the region 472 of the material layer 452 in contact with the conductor 461a, the conductor 461b, and the conductor 461c, and becomes comparatively stable when entering oxygen vacancies in the region. Furthermore, by heat treatment at 250° C. or higher, hydrogen in the oxygen vacancies in the region 471 of the material layer 452 exposed in the depressed portion 493A and the depressed portion 493B is released from the oxygen vacancies, diffuses into the region 472, and enters oxygen vacancies in the region 472 of the material layer 452 to become comparatively stable. Thus, by the heat treatment, the resistance of the region 472 is further reduced, and the resistance of the region 471 is further increased by high purification (reduction of impurities such as water or hydrogen).

In the case where, for example, a material containing silicon is used for the material layer 452 and the material layer 452 is in contact with the conductor 461a, the conductor 461b, and the conductor 461c, impurities (elements, ions, or the like) contained in the conductor 461a, the conductor 461b, and the conductor 461c diffuse into the material layer 452 in some cases. At this time, depending on the circumstances or the case, heat treatment is preferably performed after the step in FIG. 9B of forming the depressed portion 493A and the depressed portion 493B together with the conductor 461a, the conductor 461b, and the conductor 461c. That is, an impurity region is formed at a surface of the material layer 452 in contact with the conductor 461a, the conductor 461b, and the conductor 461c and in the vicinity of the interface.

In the case where an impurity contained in the conductor 461a, the conductor 461b, and the conductor 461c is an n-type impurity (a donor), an n-type impurity region is sometimes formed in the region 472 of the material layer 452 or in the vicinity of the interface between the material layer 452 and the conductor 461a, the conductor 461b, and the conductor 461c. In contrast, in the case where an impurity contained in the conductor 461a, the conductor 461b, and the conductor 461c is a p-type impurity (an acceptor), a p-type impurity region is sometimes formed in the region 472 of the material layer 452 or in the vicinity of the interface between the material layer 452 and the conductor 461a, the conductor 461b, and the conductor 461c. Accordingly, carriers are formed in the region 472 of the material layer 452 or in the vicinity of an interface between the region 472 of the material layer 452 and the conductor 461a, the conductor 461b, and the conductor 461c, and the resistance of the region 472 is reduced in some cases.

By the heat treatment, the conductive material contained in the conductor 461a, the conductor 461b, and the conductor 461c and the component contained in the material layer 452 sometimes form metal silicide in the vicinity of the interface between the region 472 of the material layer 452 and the conductor 461a, the conductor 461b, and the conductor 461c. The metal silicide formed in the vicinity of the interface between the region 472 of the material layer 452 and the conductor 461a, the conductor 461b, and the conductor 461c sometimes reduces the resistance in the vicinity of the interface between the region 472 of the material layer 452 and the conductor 461a, the conductor 461b, and the conductor 461c.

Note that in the case where the semiconductor device in FIG. 24 and FIG. 25 is manufactured, it is preferable that heat treatment not be performed before the step in FIG. 9B of forming the depressed portion 493A and the depressed portion 493B together with the conductor 461a, the conductor 461b, and the conductor 461c. This is because a conductor for forming the conductor 461a, the conductor 461b, and the conductor 461c is deposited on the material layer 452 in the step illustrated in FIG. 5B, and if heat treatment is performed in this step, a reduction in resistance might occur in a region of the material layer 452 in contact with the conductor. Therefore, in the case where the semiconductor device in FIG. 24 and FIG. 25 is manufactured, the heat treatment is preferably performed after the step in FIG. 9B of forming the depressed portion 493A and the depressed portion 493B together with the conductor 461a, the conductor 461b, and the conductor 461c.

<Structure Example 8 of Semiconductor Device>

Figure 26:
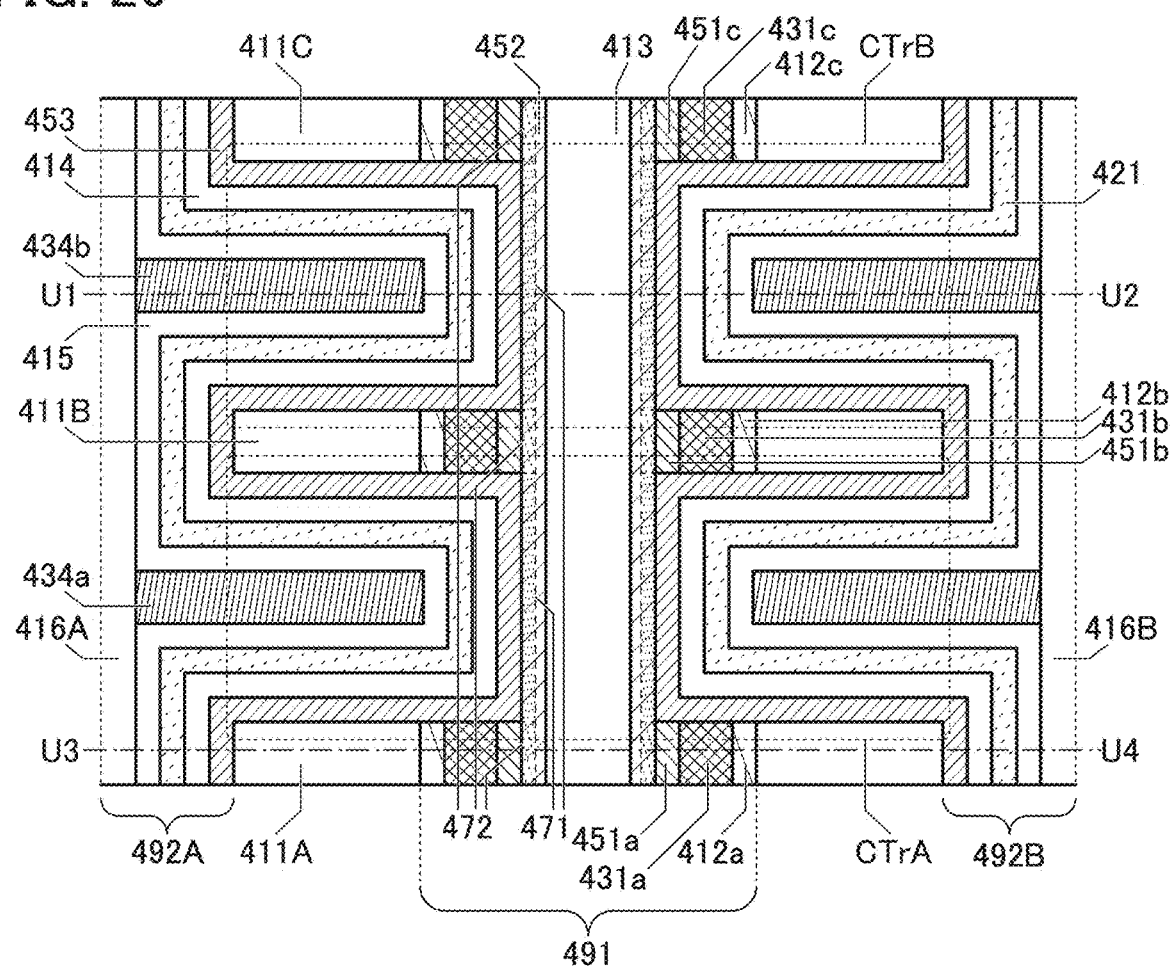
FIG. 26 is a cross-sectional view illustrating a structure example of a semiconductor device.
Figure 27A:
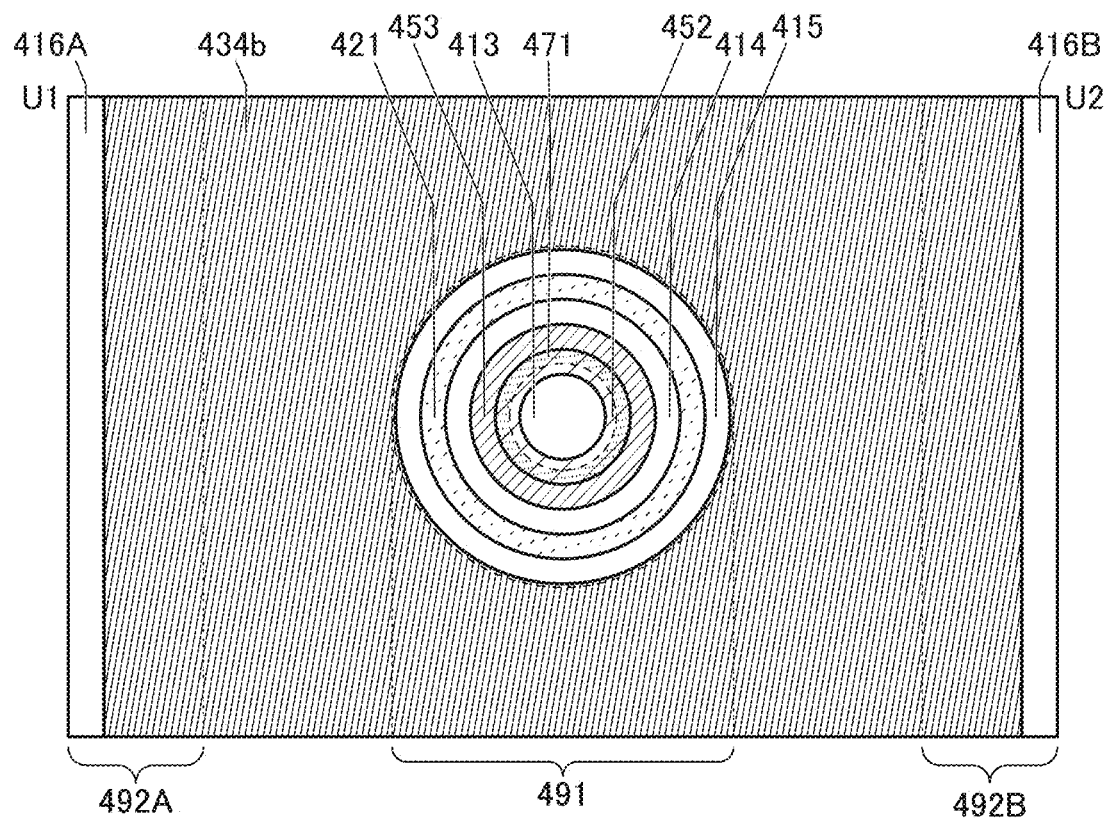
FIG. 27A and FIG. 27B are top views illustrating a structure example of a semiconductor device.
Figure 27B:
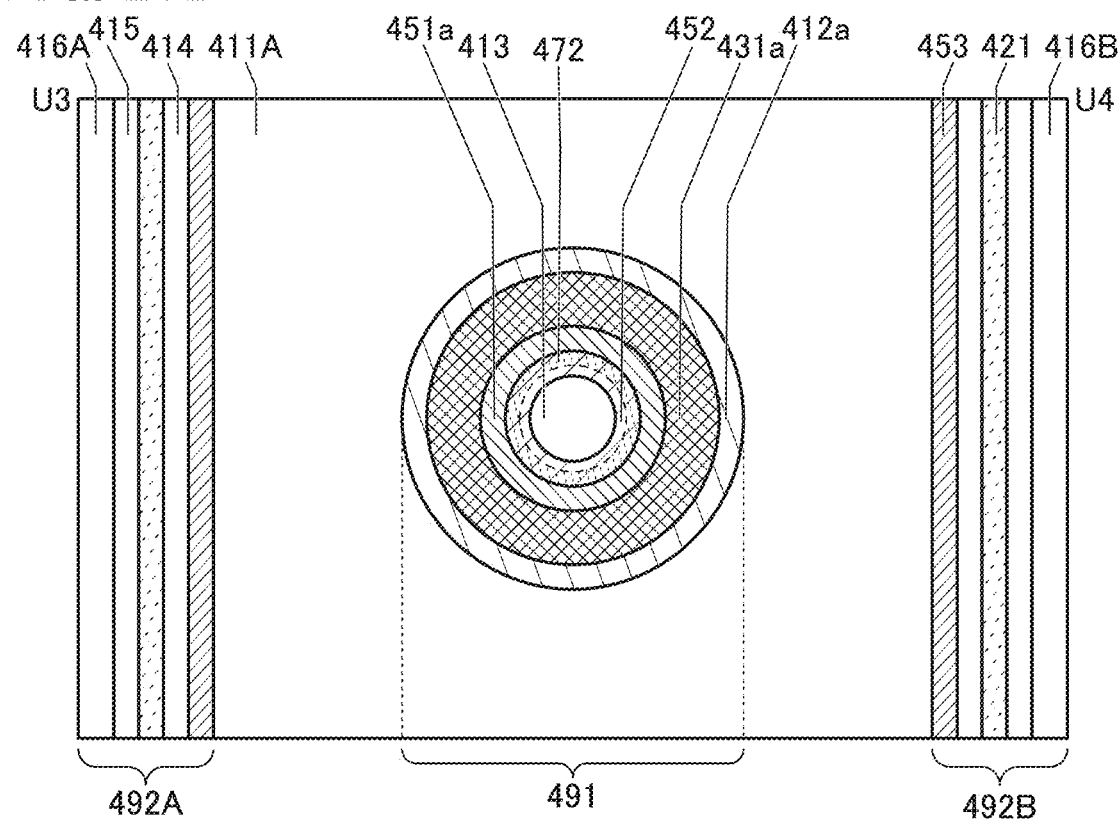

For example, the structure of the semiconductor device in FIG. 1, FIG. 2A, and FIG. 2B may be changed to the structure of the semiconductor device illustrated in FIG. 26, FIG. 27A, and FIG. 27B. FIG. 26 is a cross-sectional view of a semiconductor device having a structure different from that in FIG. 1, FIG. 2A, and FIG. 2B. FIG. 27A is a top view taken along the dashed-dotted line U1-U2 in FIG. 26, and FIG. 27B is a top view taken along the dashed-dotted line U3-U4 in FIG. 26. Note that for simplification of the drawings, some components are omitted in the cross-sectional view of FIG. 26, the top view of FIG. 27A, and the top view of FIG. 27B.

For the semiconductor device in FIG. 26, FIG. 27A, and FIG. 27B, in the step illustrated in FIG. 8A, the step in FIG. 9A and the subsequent steps are performed without performing a step of forming the conductor 432 in FIG. 8B.

That is, in the semiconductor device in FIG. 26, FIG. 27A, and FIG. 27B, a second gate electrode and a wiring supplying a potential to the second gate electrode are not provided.

Note that as a structure example of the semiconductor device of one embodiment of the present invention which functions as a storage device, the aforementioned structure examples 1 to 8 of the semiconductor devices may be combined as appropriate.

Note that the insulators, the conductors, the semiconductors, the material layers, and the like disclosed in this specification and the like can be formed by a PVD (Physical Vapor Deposition) method or a CVD (Chemical Vapor Deposition) method. Examples of the PVD method include a sputtering method, a resistance heating evaporation method, an electron beam evaporation method, and a PLD (Pulsed Laser Deposition) method. Examples of the CVD method include a plasma CVD method and a thermal CVD method. In particular, examples of the thermal CVD method include a MOCVD (Metal Organic Chemical Vepor Deposition) method and an ALD (Atomic Layer Deposition) method.

A thermal CVD method, which is a deposition method not using plasma, has an advantage that no defect due to plasma damage is generated.

Deposition by a thermal CVD method may be performed in such a manner that a source gas and an oxidizer are supplied to a chamber at a time and made to react with each other in the vicinity of the substrate or over the substrate, and the reactant is deposited on the substrate while the pressure in the chamber is set to an atmospheric pressure or a reduced pressure.

Deposition by an ALD method may be performed in such a manner that the pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching respective switching valves (also referred to as high-speed valves); in order to avoid mixing of the plurality of kinds of source gases, an inert gas (argon, nitrogen, or the like) or the like is introduced at the same time as or after the introduction of a first source gas and then a second source gas is introduced. Note that in the case where the first source gas and the inert gas are introduced at a time, the inert gas serves as a carrier gas, and the inert gas may also be introduced at the same time as the introduction of the second source gas. Alternatively, the second source gas may be introduced after the first source gas is exhausted by vacuum evacuation instead of the introduction of the inert gas. The first source gas is adsorbed on the surface of the substrate to form a first thin layer; then the second source gas is introduced to react with the first thin layer; as a result, a second thin layer is stacked over the first thin layer, so that a thin film is formed. The sequence of the gas introduction is controlled and repeated a plurality of times until a desired thickness is obtained, whereby a thin film with excellent step coverage can be formed. The thickness of the thin film can be adjusted by the number of repetition times of the sequence of the gas introduction; therefore, an ALD method makes it possible to accurately adjust a thickness and is thus suitable for manufacturing a minute FET.

A variety of films such as the metal film, the semiconductor film, and the inorganic insulating film disclosed in the above-described embodiment can be formed by a thermal CVD method such as an MOCVD method or an ALD method; for example, in the case of forming an In—Ga—Zn—O film, trimethylindium ($In(CH_3)_3$), trimethylgallium ($Ga(CH_3)_3$), and dimethylzinc ($Zn(CH_3)_2$) are used. Without limitation to the above combination, triethylgallium ($Ga(C_2H_5)_3$) can also be used instead of trimethylgallium, and diethylzinc ($Zn(C_2H_5)_2$) can also be used instead of dimethylzinc.

For example, in the case where a hafnium oxide film is formed with a deposition apparatus using an ALD method, two kinds of gases, ozone ($O_3$) as an oxidizer and a source gas which is obtained by vaporizing liquid containing a solvent and a hafnium precursor compound (hafnium alkoxide or hafnium amide such as tetrakis(dimethylamide)hafnium (TDMAH, $Hf[N(CH_3)_2]_4$)), are used. Furthermore, examples of another material include tetrakis(ethylmethylamide)hafnium.

For example, in the case where an aluminum oxide film is formed with a deposition apparatus using an ALD method, two kinds of gases, $H_2O$ as an oxidizer and a source gas which is obtained by vaporizing liquid containing a solvent and an aluminum precursor compound (trimethylaluminum (TMA, $Al(CH_3)_3$) or the like) are used. Furthermore, examples of another material include tris(dimethylamide)aluminum, triisobutylaluminum, and aluminum tris(2,2,6,6-tetramethyl-3,5-heptanedionate).

For example, in the case where a silicon oxide film is formed with a deposition apparatus using an ALD method, hexachlorodisilane is adsorbed on a surface on which a film is to be formed, and radicals of an oxidizing gas ($O_2$ or dinitrogen monoxide) are supplied to react with the adsorbate.

For example, in the case where a tungsten film is formed with a deposition apparatus using an ALD method, a $WF_6$ gas and a $B_2H_6$ gas are sequentially and repeatedly introduced to form an initial tungsten film, and then a $WF_6$ gas and an $H_2$ gas are sequentially and repeatedly introduced to form a tungsten film. Note that an $SiH_4$ gas may be used instead of a $B_2H_6$ gas.

For example, in the case where an oxide semiconductor film, for example, an In—Ga—Zn—O film, is formed with a deposition apparatus using an ALD method, an $In(CH_3)_3$ gas and an $O_3$ gas are sequentially and repeatedly introduced to form an In—O layer, a $Ga(CH_3)_3$ gas and an $O_3$ gas are sequentially and repeatedly introduced to form a GaO layer, and then a $Zn(CH_3)_2$ gas and an $O_3$ gas are sequentially and repeatedly introduced to form a ZnO layer. Note that the order of these layers is not limited to this example. A mixed oxide layer such as an In—Ga—O layer, an In—Zn—O layer, or a Ga—Zn—O layer may be formed with use of these gases. Note that although an $H_2O$ gas which is obtained by bubbling water with an inert gas such as Ar may be used instead of an $O_3$ gas, it is preferable to use an $O_3$ gas which does not contain H. Furthermore, instead of an $In(CH_3)_3$ gas, an $In(C_2H_5)_3$ gas may be used. Furthermore, instead of a $Ga(CH_3)_3$ gas, a $Ga(C_2H_5)_3$ gas may be used. Furthermore, a $Zn(CH_3)_2$ gas may be used.

Note that this embodiment can be combined with the other embodiments described in this specification as appropriate.

Embodiment 2

In this embodiment, structure examples of a semiconductor device of one embodiment of the present invention functioning as a storage device, which are different from those in Embodiment 1, and an example of a method of manufacturing the semiconductor device will be described. Note that in this embodiment, a semiconductor device including a cell transistor including a floating gate electrode is discussed.

<Structure Example 9 of Semiconductor Device>

Figure 28:
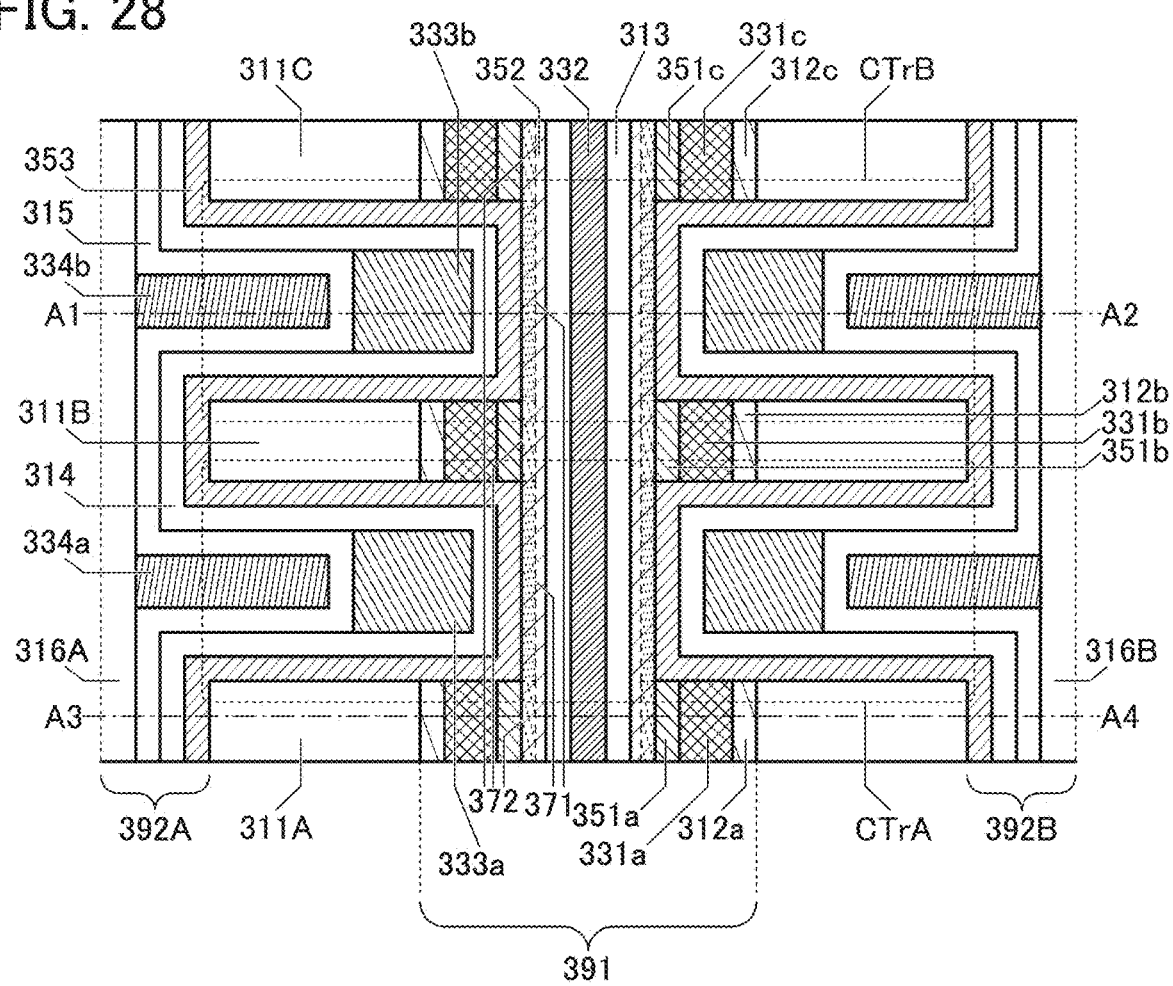
FIG. 28 is a cross-sectional view illustrating a structure example of a semiconductor device.
Figure 29A:
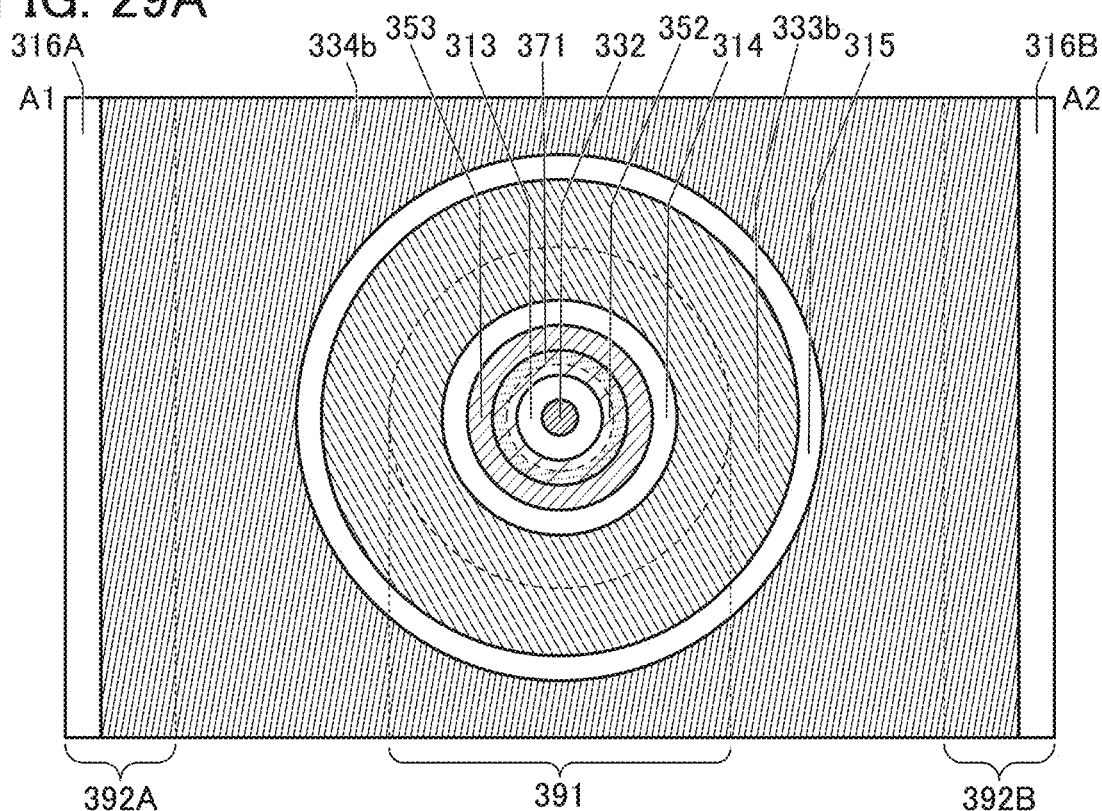
FIG. 29A and FIG. 29B are top views illustrating a structure example of a semiconductor device.
Figure 29B:
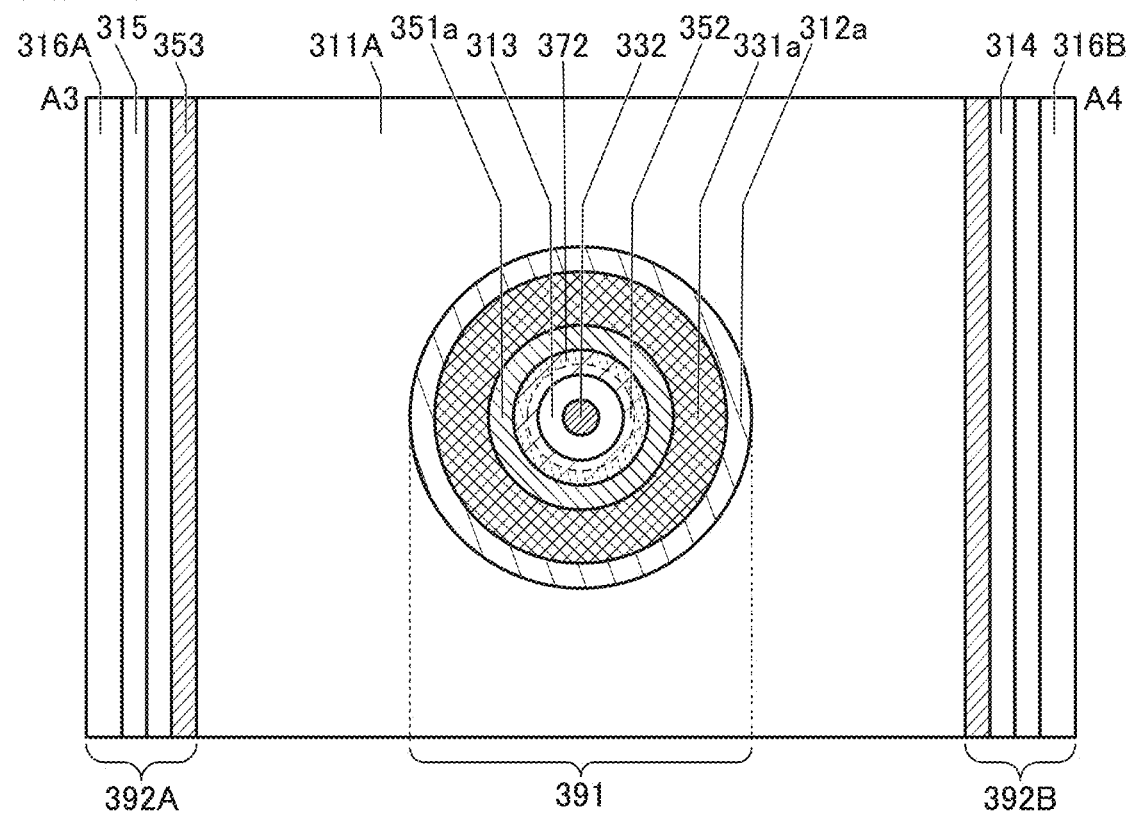

A structure of a semiconductor device including a cell transistor CTrA and a cell transistor CTrB is described with reference to FIG. 28, FIG. 29A, and FIG. 29B. FIG. 28 is a cross-sectional view of the semiconductor device. FIG. 29A is a top view taken along the dashed-dotted line A1-A2 in FIG. 28, and FIG. 29B is a top view taken along the dashed-dotted line A3-A4 in FIG. 28. Note that for simplification of the drawings, some components are omitted in the cross-sectional view of FIG. 28, the top view of FIG. 29A, and the top view of FIG. 29B.

The semiconductor device in FIG. 28 includes an insulator 311A placed above a substrate (not illustrated), an insulator 311B placed above the insulator 311A, and an insulator 311C placed above the insulator 311B.

For the substrate, the substrate described in Embodiment 1 is referred to, for example.

The semiconductor device in FIG. 28, FIG. 29A, and FIG. 29B includes a region 391. The region 391 is a region where an opening is formed during a process of manufacturing the semiconductor device; in the opening, an insulator, a conductor, a semiconductor, and the like are formed through the process of manufacturing the semiconductor device. Note that the opening can be a cylindrical opening, as illustrated in FIG. 29A and FIG. 29B, for example. In the region 391 in FIG. 29B, for example, an insulator 312a (an insulator 312b and an insulator 312c), a conductor 331a (a conductor 331b and a conductor 331c), a material layer 351a (a material layer 351b and a material layer 351c), a material layer 352, an insulator 313, and a conductor 332 are placed in this order from a side surface of the opening.

The semiconductor device also includes a region 392A and a region 392B. The region 392A and the region 392B are regions where an opening is formed during the process of manufacturing the semiconductor device, and in the opening, an insulator, a conductor, and the like are formed through the process of manufacturing the semiconductor device. Note that the opening can be a slit-like opening, as illustrated in FIG. 29A and FIG. 29B, for example. The region 392A includes part of a material layer 353, part of an insulator 314, part of an insulator 315, part of a conductor 334a, part of a conductor 334b, and an insulator 316A. The region 392B includes part of the material layer 353, part of the insulator 314, part of the insulator 315, part of the conductor 334a, part of the conductor 334b, and an insulator 316B. In FIG. 28, the conductor 333a, part of the conductor 334a, part of the insulator 314, and part of the insulator 315 are placed between the insulator 311A and the insulator 311B. Furthermore, the conductor 333b, part of a region of the conductor 334b, part of the insulator 314, and part of the insulator 315 are placed between the insulator 311B and the insulator 311C.

The material layer 352 includes a region 371 and a region 372. The region 371 is positioned adjacent to the material layer 351a (the material layer 351b and the material layer 351c), and the region 372 is positioned adjacent to the material layer 353. Note that the region 371 becomes a channel formation region of the cell transistor CTrA (the cell transistor CTrB) through the process of manufacturing the semiconductor device, and the region 372 becomes a low-resistance region through the process of manufacturing the semiconductor device.

In the cell transistor CTrB, the conductor 334b functions as a first gate electrode and a word line that supplies a potential to the first gate electrode, the insulator 315 surrounded by the conductor 334b in FIG. 29A functions as a gate insulating film, the conductor 333b functions as a floating gate electrode, and the insulator 314 surrounded by the conductor 333b in FIG. 29A functions as a tunnel insulating film. The conductor 331b functions as one of a source electrode and a drain electrode, and the conductor 331c functions as the other of the source electrode and the drain electrode. In FIG. 29A, a region in the material layer 352 surrounded by the conductor 334b functions as a channel formation region. Depending on a material contained in the material layer 353, a region in the material layer 353 which is in contact with the material layer 352 also functions as a channel formation region in some cases. The insulator 313 functions as a gate insulating film, and the conductor 332 functions as a second gate electrode and a wiring that supplies a potential to the second gate electrode.

When the conductor 333b is replaced with the conductor 333a and the conductor 334b is replaced with the conductor 334a in FIG. 29A, FIG. 29A can be regarded as a top view of the cell transistor CTrA. In the cell transistor CTrA, the conductor 334a functions as a first gate electrode and a word line that supplies a potential to the first gate electrode, the insulator 315 surrounded by the conductor 334a in FIG. 29A functions as a first gate insulating film, the conductor 333a functions as a floating gate electrode, and the insulator 314 surrounded by the conductor 333a in FIG. 29A functions as a tunnel insulating film. The conductor 331a functions as one of a source electrode and a drain electrode, and the conductor 331b functions as the other of the source electrode and the drain electrode. In FIG. 29A, a region in the material layer 352 surrounded by the conductor 334a functions as a channel formation region. Depending on a material contained in the material layer 353, a region in the material layer 353 which is in contact with the material layer 352 also functions as a channel formation region in some cases. The insulator 313 functions as a second gate insulating film, and the conductor 332 functions as a second gate electrode and a wiring that supplies a potential to the second gate electrode.

The insulator 312a has a function of, for example, a barrier insulating film that inhibits impurities from the insulator 311A (e.g., water molecules, hydrogen atoms, hydrogen molecules, oxygen atoms, oxygen molecules, nitrogen atoms, nitrogen molecules, nitrogen oxide molecules ($N_2O$, NO, $NO_2$, or the like) from diffusing into the conductor 331a. That is, the insulator 312a can inhibit the impurities of the conductor 331a. Similarly, the insulator 312b has a function of, for example, a barrier insulating film that inhibits impurities from the insulator 311B from diffusing into the conductor 331b, and the insulator 312c has a function of, for example, a barrier insulating film that inhibits impurities from the insulator 311C from diffusing into the conductor 331c.

Next, the material layer 351a (the material layer 351b and the material layer 351c), the material layer 352, and the material layer 353, which are included in the cell transistor CTrA and the cell transistor CTrB, are described.

The material layer 351a has a function of, for example, a barrier film that inhibits impurities (e.g., water molecules, hydrogen atoms, hydrogen molecules, oxygen atoms, oxygen molecules, nitrogen atoms, nitrogen molecules, nitrogen oxide molecules ($N_2O$, NO, $NO_2$, or the like) from diffusing into the material layer 352. The material layer 351a having a function of inhibiting the transmission of impurities is provided between the material layer 352 and the conductor 331a, whereby the electric resistance between the material layer 352 and the conductor 331a can be reduced. Similarly, the material layer 351b has a function of, for example, a barrier film that inhibits impurities from the material layer 352 from diffusing into the conductor 331b, and the material layer 351c has a function of, for example, a barrier film that inhibits impurities from the material layer 352 from diffusing into the conductor 331c.

In the case where the cell transistor CTrA and the cell transistor CTrB in FIG. 28 are OS transistors, for example, metal oxide that functions as an oxide semiconductor is preferably used for the material layer 352, and a material that contains a metal element in the metal oxide and oxygen is preferably used for the material layer 351a (the material layer 351b and the material layer 351c). For the material layer 353, a material that contains a metal element in the metal oxide and oxygen is preferably used, as well as for the material layer 351.

In the case where the cell transistor CTrA and the cell transistor CTrB in FIG. 28 are OS transistors, the region 371 functioning as a channel formation region in the material layer 352 includes less oxygen vacancies ($V_O$) or has a lower impurity concentration than the region 372 functioning as a low-resistance region, whereby the region 371 is a high-resistance region with a low carrier concentration. Thus, the region 371 can be regarded as being i-type (intrinsic) or substantially i-type.

Figure 30A:
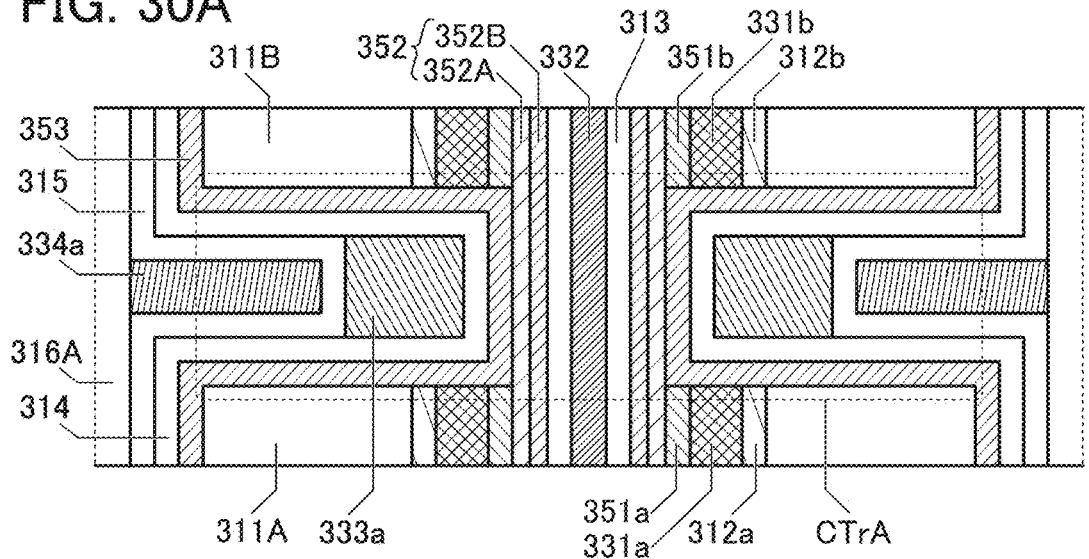
FIG. 30A to FIG. 30C are cross-sectional views illustrating structure examples of a semiconductor device.

In the case where the cell transistor CTrA and the cell transistor CTrB in FIG. 28 are OS transistors, the material layer 352 is preferably formed of a plurality of layers including a material layer 352A and a material layer 352B, as illustrated in FIG. 30A. Note that FIG. 30A is an enlarged view of a region where the cell transistor CTrA in FIG. 28 is formed.

For the material layer 351a (the material layer 351b and the material layer 351c), the material layer 352A, the material layer 352B, and the material layer 353 which is to be formed in a later step, for example, one or more materials selected from indium, an element M (the element M is, for example, aluminum, gallium, yttrium, tin, copper, vanadium, beryllium, boron, silicon, titanium, iron, nickel, germanium, zirconium, molybdenum, lanthanum, cerium, neodymium, hafnium, tantalum, tungsten, magnesium, or cobalt), and zinc can be used. In particular, metal oxide including indium, gallium, and zinc has a high band gap and functions as an intrinsic (also referred to as I-type) or substantially intrinsic semiconductor.

The cell transistor CTrA and the cell transistor CTrB which include the metal oxide in the channel formation regions have a characteristic of extremely small off-state current. That is, the leakage current of the cell transistor CTrA and the cell transistor CTrB in an off state can be small, so that power consumption of the semiconductor device can be reduced in some cases.

For the material layer 351a (the material layer 351b and the material layer 351c), metal oxide including the element M may be used, for example. The material layer 351a (the material layer 351b and the material layer 351c) preferably has a higher concentration of the element M than the material layer 352B. Alternatively, for the material layer 351a (the material layer 351b and the material layer 351c), gallium oxide may be used. Alternatively, for the material layer 351a (the material layer 351b and the material layer 351c), metal oxide such as In (indium)-M-Zn (zinc) oxide may be used. Specifically, the atomic ratio of the element M to In in the metal oxide used for the material layer 351a (the material layer 351b and the material layer 351c) is preferably higher than the atomic ratio of the element M to In in the metal oxide used for the material layer 352B. The thickness of the material layer 351a (the material layer 351b and the material layer 351c) is preferably larger than or equal to 0.5 nm and smaller than or equal to 5 nm, further preferably larger than or equal to 1 nm and smaller than or equal to 3 nm, still further preferably larger than or equal to 1 nm and smaller than or equal to 2 nm. The material layer 351a (the material layer 351b and the material layer 351c) preferably has crystallinity. In the case where the material layer 351a (the material layer 351b and the material layer 351c) has crystallinity, release of oxygen contained in the material layer 352A and the material layer 352B can be effectively inhibited. For example, when the material layer 351a (the material layer 351b and the material layer 351c) has a hexagonal crystal structure, release of oxygen contained in the material layer 352A and the material layer 352B can be prevented in some cases.

The material layer 352A and the material layer 352B are preferably oxides having different chemical compositions, for example. Specifically, the atomic ratio of the element M to the metal element that is a main component in the metal oxide used for the material layer 352B is preferably higher than the atomic ratio of the element M to the metal element that is a main component in the metal oxide used for the material layer 352A. The atomic ratio of the element M to In in the metal oxide used for the material layer 352B is preferably higher than the atomic ratio of the element M to In in the metal oxide used for the material layer 352A. For the material layer 352B, a composition similar to that of the material layer 351a (the material layer 351b and the material layer 351c) may be used.

In the material layer 353, for example, the atomic ratio of the element M to the metal element that is a main component may be higher than the atomic ratio of the element M to the metal element that is a main component in the metal oxide used for the material layer 352A. The atomic ratio of the element M to In in the metal oxide used for the material layer 353 may be higher than the atomic ratio of the element M to In in the metal oxide used for the material layer 352A. For the material layer 353, a composition similar to that of the material layer 352A may be used.

Figure 30B:
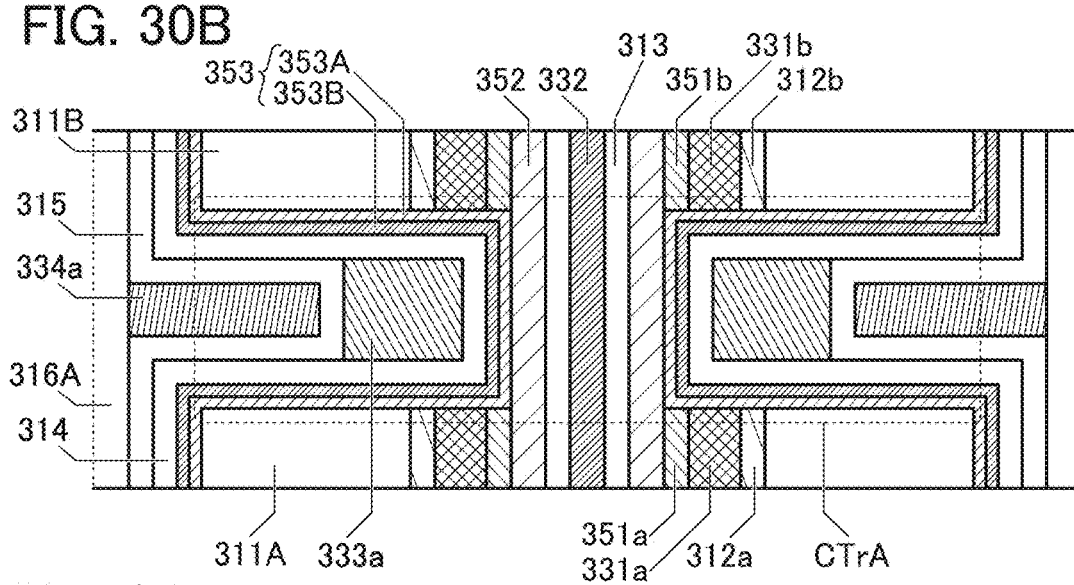

In the case where the cell transistor CTrA and the cell transistor CTrB in FIG. 28 are OS transistors, the material layer 353 may be formed of a plurality of layers including a material layer 353A and a material layer 353B, as illustrated in FIG. 30B. Note that FIG. 30B is an enlarged view of a region where the cell transistor CTrA in FIG. 28 is formed.

The material layer 353A and the material layer 353B are preferably oxides having different chemical compositions. Specifically, the atomic ratio of the element M to the metal element that is a main component in the metal oxide used for the material layer 353B is preferably higher than the atomic ratio of the element M to the metal element that is a main component in the metal oxide used for the material layer 353A. For the material layer 353B, a composition similar to that of the material layer 351a (the material layer 351b and the material layer 351c) may be used.

Figure 30C:
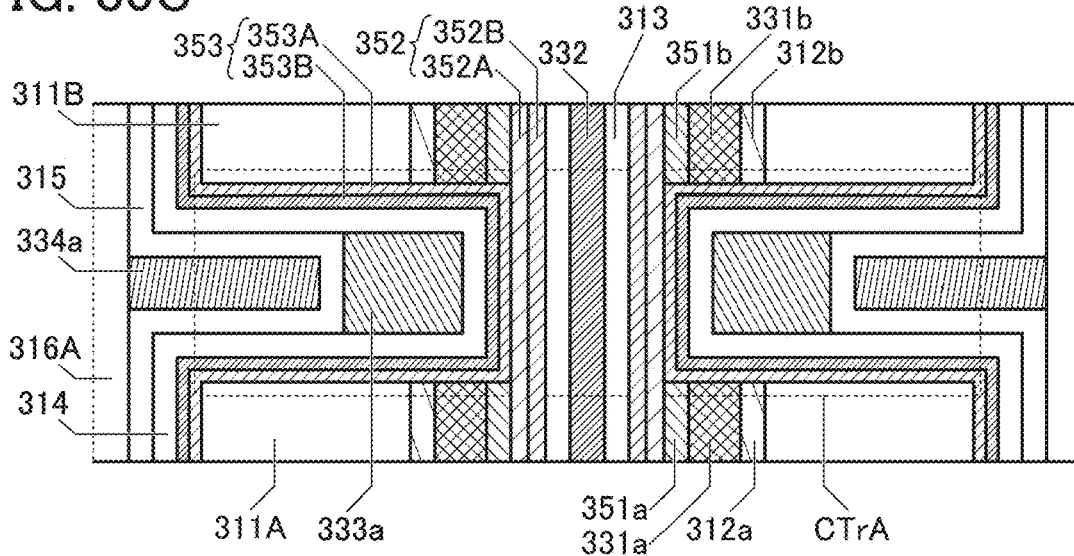

In the case where the material layer 352 of the cell transistor CTrA illustrated in FIG. 30B includes the material layer 352A and the material layer 352B as illustrated in FIG. 30A, that is, in the case where the material layer 352 includes the material layer 352A and the material layer 352B and the material layer 353 includes the material layer 353A and the material layer 353B as in the cell transistor CTrA illustrated in FIG. 30C, the atomic ratio of the element M to the metal element that is the main component in the metal oxide used for the material layer 352B is preferably higher than the atomic ratio of the element M to the metal element that is the main component in each of the metal oxides used for the material layer 352A and the material layer 353A. The atomic ratio of the element M to the metal element that is a main component in the metal oxide used for the material layer 353B is preferably higher than the atomic ratio of the element M to the metal element that is the main component in each of the metal oxides used for the material layer 352A and the material layer 353A. The atomic ratio of the element M to the metal element that is a main component in the metal oxide used for the material layer 351a (the material layer 351b and the material layer 351c) is preferably higher than the atomic ratio of the element M to the metal element that is the main component in each of the metal oxides used for the material layer 352A and the material layer 353A.

At this time, the compositions of the material layer 351a (the material layer 351b and the material layer 351c), the material layer 352B, and the material layer 353B may be equal to each other. The composition of the material layer 353A may be similar to that of the material layer 352A.

Here, when metal oxide contained in the material layer 352A, the material layer 352B, and the material layer 353 in the cell transistor CTrA illustrated in FIG. 30A or FIG. 30C is regarded as metal oxide that contains In, gallium (hereinafter referred to as Ga), and zinc (hereinafter referred to as Zn), specific examples of the atomic ratios of In to Ga and Zn in the metal oxides applicable to the material layer 352A, the material layer 352B, and the material layer 353 are described.

For the material layer 352B, metal oxide in which an atomic ratio of In to Ga and Zn is In:Ga:Zn=1:3:4 or In:Ga:Zn=1:1:0.5 may be used, for example. For the material layer 352A, metal oxide in which an atomic ratio of In to Ga and Zn is In:Ga:Zn=4:2:3 or In:Ga:Zn=1:1:1 may be used. For the material layer 353, metal oxide in which an atomic ratio of In to Ga and Zn is In:Ga:Zn=1:3:4 or metal oxide in which an atomic ratio of Ga to Zn is Ga:Zn=2:1 or Ga:Zn=2:5 may be used.

As a specific example in the case where the material layer 353 has a stacked structure as in FIG. 30C, metal oxide with an atomic ratio of In:Ga:Zn=4:2:3 or a neighborhood thereof may be used for the material layer 353A and metal oxide with an atomic ratio of In:Ga:Zn=1:3:4 or a neighborhood thereof may be used for the material layer 353B. Alternatively, metal oxide with an atomic ratio of In:Ga:Zn=4:2:3 or a neighborhood thereof may be used for the material layer 353A and metal oxide with an atomic ratio of Ga:Zn=2:1 or a neighborhood thereof may be used for the material layer 353B. Alternatively, metal oxide with an atomic ratio of In:Ga:Zn=4:2:3 or a neighborhood thereof may be used for the material layer 353A and metal oxide with an atomic ratio of Ga:Zn=2:5 or a neighborhood thereof may be used for the material layer 353B. Alternatively, metal oxide with an atomic ratio of In:Ga:Zn=4:2:3 or a neighborhood thereof may be used for the material layer 353A and gallium oxide may be used for the material layer 353B.

For example, in the case where the atomic ratio of In to the element M in the metal oxide used for the material layer 352B is lower than the atomic ratio of In to the element M in the metal oxide used for the material layer 352A, an In—Ga—Zn oxide having a composition with an atomic ratio of In:Ga:Zn=5:1:6 or a neighborhood thereof, In:Ga:Zn=5:1:3 or a neighborhood thereof, In:Ga:Zn=10:1:3 or a neighborhood thereof can be used for the material layer 352A.

For the material layer 352A, it is also possible to use metal oxide having a composition of In:Zn=2:1, a composition of In:Zn=5:1, a composition of In:Zn=10:1, or a composition in the neighborhood of any one of these compositions, other than the above-described compositions. Alternatively, indium oxide can be used for the material layer 352A, for example.

The material layer 351a (the material layer 351b and the material layer 351c), the material layer 352A, the material layer 352B, and the material layer 353 (the material layer 353A and the material layer 353B) are preferably combined such that the above atomic ratios are satisfied. For example, in the case of the cell transistor CTrA in FIG. 30A, metal oxide having a composition of In:Ga:Zn=1:3:4 or a neighborhood thereof is preferably used for the material layer 352B and the material layer 353 and metal oxide having a composition of In:Ga:Zn=4:2:3 to 4:2:4.1 is preferably used for the material layer 352A. For example, in the case of the cell transistor CTrA in FIG. 30C, metal oxide having a composition of In:Ga:Zn=1:3:4 or a neighborhood thereof is preferably used for the material layer 352B and the material layer 353B and metal oxide having a composition of In:Ga:Zn=4:2:3 to 4:2:4.1 or a neighborhood thereof is preferably used for the material layer 352A. Note that the above compositions represent the atomic ratio of oxide formed over a base or the atomic ratio of a sputtering target. Moreover, it is preferable that the proportion of In be increased in the composition of the material layer 352A, in which case the transistor can have a higher on-state current, higher field effect mobility, or the like.

Note that the expression "the composition of oxide containing In, Ga, and Zn at the atomic ratio, In:Ga:Zn=a:b:c (a+b+c=1), is in the neighborhood of the composition of oxide containing In, Ga, and Zn at the atomic ratio, In:Ga:Zn=A:B:C (A+B+C=1)" means that a, b, and c satisfy the following relation: $(a-A)^2+(b-B)^2+(c-C)^2$ and r can be 0.20, preferably 0.10, further preferably 0.05, for example.

Under such conditions, the material layer 352A is provided in contact with the material layer 352B; thus, impurities and oxygen can be inhibited from diffusing into the material layer 352A from the insulator 313 and/or the conductor 332 through the material layer 352B. Similarly, when the material layer 353B is provided in contact with the material layer 352B, impurities and oxygen can be inhibited from diffusing into the material layer 353A and the material layer 352A from the insulator 314, the conductor 333a (the conductor 333b), the insulator 315, the conductor 334a (the conductor 334b), the insulator 316A, and the like through the material layer 353B. Similarly, when the material layer 351a (the material layer 351b and the material layer 351c) is provided in contact with the material layer 352A, impurities and oxygen can be inhibited from diffusing into the material layer 352A from the conductor 331a (the conductor 331b and the conductor 331c), the insulator 312a (the insulator 312b and the insulator 312c), the insulator 311A (the insulator 311B and the insulator 311C), and the like through the material layer 351a (the material layer 351b and the material layer 351c).

In the case where Si transistors are used as the cell transistor CTrA and the cell transistor CTrB in FIG. 28, amorphous silicon (referred to as hydrogenated amorphous silicon), microcrystalline silicon, polycrystalline silicon, single crystal silicon, or the like can be used for the material layer 352, for example.

In the case where Si transistors are used as the cell transistor CTrA and the cell transistor CTrB, the material layer 352 may be a plurality of layers as illustrated in FIG. 30A and FIG. 30C or may be a single layer. Note that in the manufacturing example in this specification and the like, description is made on the assumption that the material layer 352 is a single layer.

A material applicable to the material layer 353 can be metal oxide applicable to the material layer 351 and/or the material layer 352 or a material functioning as a tunnel insulating film; for example, a material applicable to the insulator 314 to be described later can be used. Note that the material layer 353 may be a plurality of layers as illustrated in FIG. 30B and FIG. 30C or may be a single layer.

In the case where the cell transistor CTrA and the cell transistor CTrB are Si transistors, the material layer 351 is preferably a conductor containing an impurity (an element or an ion) that diffuses into an interface between the material layer 352 and a formation surface of the material layer 351 and into a region near the interface, for example.

For the conductor, it is possible to use a material containing one or more kinds of metal elements selected from aluminum, chromium, copper, silver, gold, platinum, tantalum, nickel, titanium, molybdenum, tungsten, hafnium, vanadium, niobium, manganese, magnesium, zirconium, beryllium, indium, and ruthenium, for example.

In the case where the cell transistor CTrA and the cell transistor CTrB are n-channel transistors, an n-type impurity (donor) is used as the impurity. As the n-type impurity, phosphorus or arsenic can be used, for example. In this manufacturing method example, in the case where the cell transistor CTrA and the cell transistor CTrB are p-channel transistors, a p-type impurity (acceptor) is used as the impurity. As the p-type impurity, boron, aluminum, or gallium can be used, for example.

The material layer 351 may be a material that can form silicide at the interface between the material layer 352 and the formation surface of the material layer 351 and in the vicinity of the interface, for example. As the material that can form silicide, for example, nickel, cobalt, molybdenum, tungsten, or titanium can be used.

Note that in FIG. 28, FIG. 29A, and FIG. 29B, one region 391 is provided between the region 392A and the region 392B, but one embodiment of the present invention is not limited to this. For example, in one embodiment of the present invention, a plurality of regions 391 may be provided between the region 392A and the region 392B.

Figure 31A:
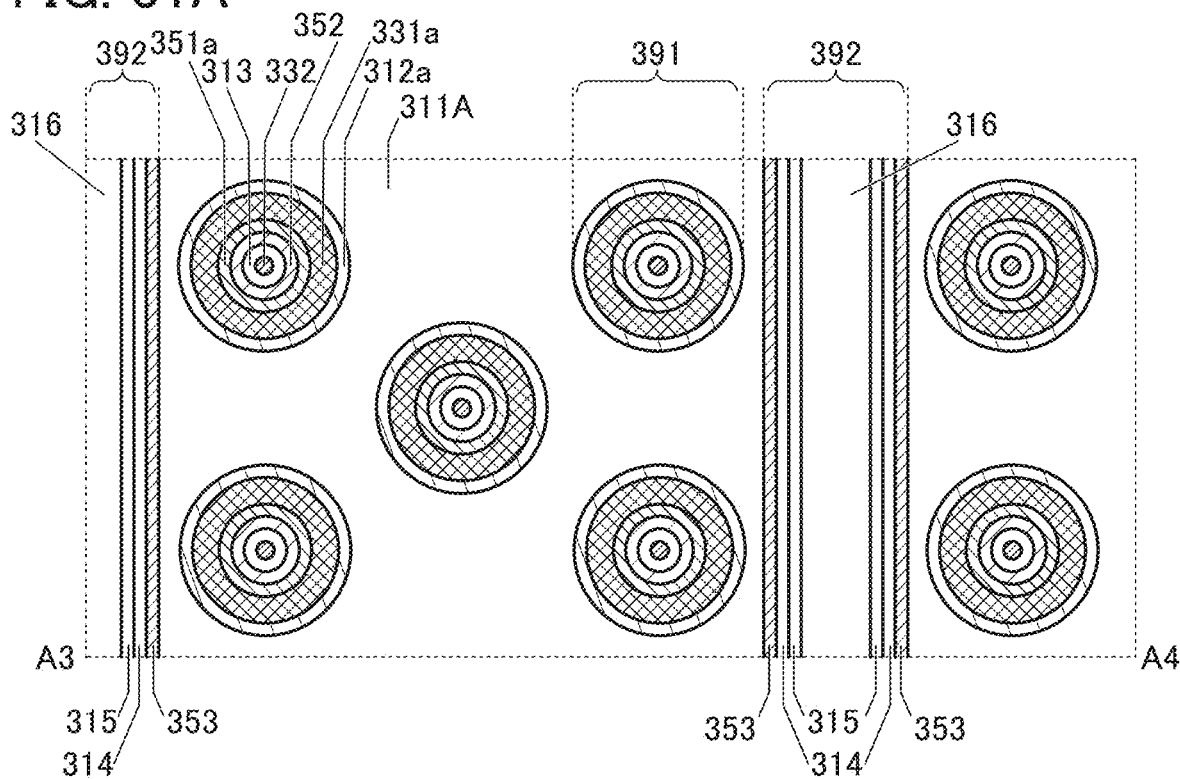
FIG. 31A and FIG. 31B are top views illustrating a structure example of a semiconductor device.
Figure 31B:
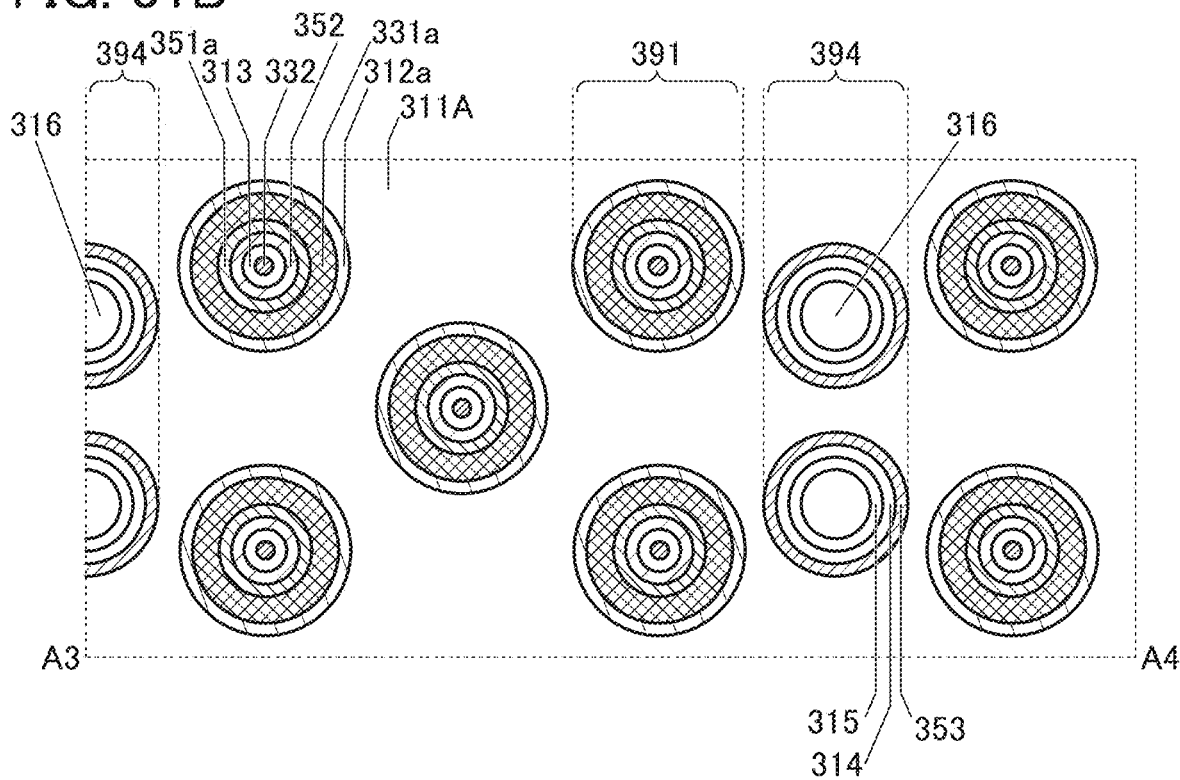

FIG. 31A illustrates a specific example of the structure. FIG. 31A is a top view of a semiconductor device provided with the plurality of regions 391. Note that this is a top view of the semiconductor device illustrated in FIG. 28 taken along the dashed-dotted line A3-A4, where the plurality of regions 391 are provided. The semiconductor device illustrated in FIG. 31A includes a plurality of slit-like regions 392, and the plurality of regions 391 are provided between the adjacent regions 392. As an arrangement of the plurality of regions 391, for example, the plurality of regions 391 may be provided in a line or as a plurality of lines in a direction with an angle with respect to the slit-like region 392. As another arrangement, for example, the plurality of regions 391 may be staggered. Note that the region 392 does not necessarily have a slit-like shape and may have a cylindrical shape, for example. In FIG. 31B, a cylindrical opening is provided in the region 394 instead of the slit-like opening formed in the region 392, and the material layer 353, the insulator 314 to an insulator 316 are formed in the region 394. Note that the shape of the region 394 is not limited to a cylindrical shape, and may be a columnar shape whose bottom shape is any of two-dimensional shapes, such as an elliptical shape or a polygonal shape. The regions 394 may be provided along lines in two or more different directions instead of being provided along lines in one direction as in the region 392 in FIG. 31A. Alternatively, the regions 394 may be formed without the regularity as describe above.

<<Manufacturing Example 2 of Semiconductor Device>>

Next, an example of manufacturing the semiconductor device illustrated in FIG. 28, FIG. 29A, and FIG. 29B will be described.

Figure 32A:
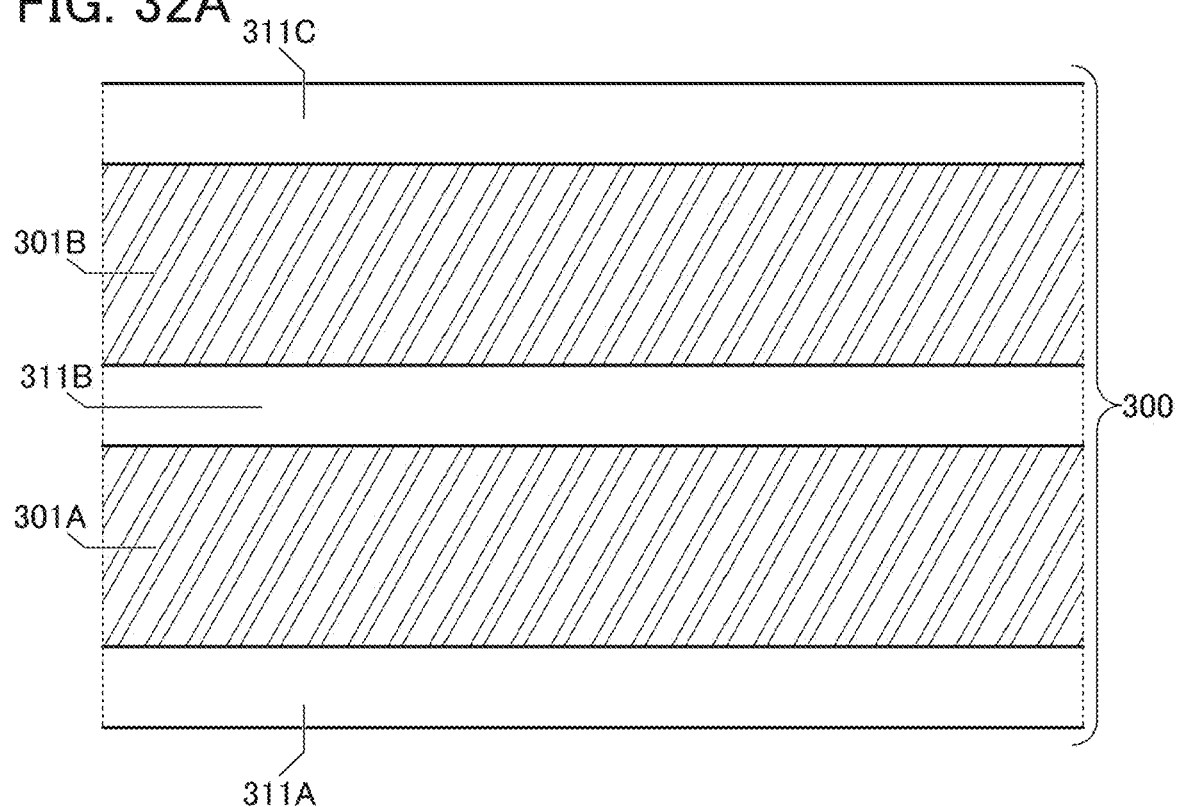
FIG. 32A and FIG. 32B are cross-sectional views illustrating an example of manufacturing a semiconductor device.

First, a stack 300 illustrated in FIG. 32A is manufactured. The stack 300 includes the insulator 311A, a sacrificial layer 301A, the insulator 311B, a sacrificial layer 301B, and the insulator 311C, for example. The insulator 311A is placed over a substrate (not illustrated), the sacrificial layer 301A is placed over the insulator 311A, the insulator 311B is placed over the sacrificial layer 301A, the sacrificial layer 301B is placed over the insulator 311B, and the insulator 311C is placed over the sacrificial layer 301B.

A variety of materials can be used for the sacrificial layer 301A and the sacrificial layer 301B. For example, as an insulator, silicon nitride, silicon oxide, or aluminum oxide may be used. Alternatively, as a semiconductor, silicon, gallium, germanium, or the like may be used. Alternatively, as a conductor, aluminum, copper, titanium, tungsten, tantalum, or the like may be used. That is, for the sacrificial layer 301A and the sacrificial layer 301B, a material that can have etching selectivity to the material used in the other part may be used.

The insulator 311A to the insulator 311C are preferably materials with a low concentration of impurities such as water or hydrogen. The amount of hydrogen released from the insulator 311A to the insulator 311C, which is converted into hydrogen molecules per area of one of the insulator 311A to the insulator 311C, is less than or equal to $2\times10^{15}$ molecules/cm$^2$, preferably less than or equal to $1\times10^{15}$ molecules/cm$^2$, further preferably less than or equal to $5\times10^{14}$ molecules/cm$^2$ in thermal desorption spectroscopy (TDS) in the range from 50° C. to 500° C., for example. The insulator 311A to the insulator 311C may be formed using an insulator from which oxygen is released by heating. Note that the materials usable for the insulator 311A to the insulator 311C are not limited to the above description.

For the insulator 311A to the insulator 311C, for example, a single layer or a stacked layer of an insulator including one or more materials selected from boron, carbon, nitrogen, oxygen, fluorine, magnesium, aluminum, silicon, phosphorus, chlorine, argon, gallium, germanium, yttrium, zirconium, lanthanum, neodymium, hafnium, and tantalum can be used in some cases. For example, a material containing silicon oxide or silicon oxynitride can be used in some cases. Note that the materials that can be used for the insulator 311A to the insulator 311C are not limited to the above description.

Figure 32B:
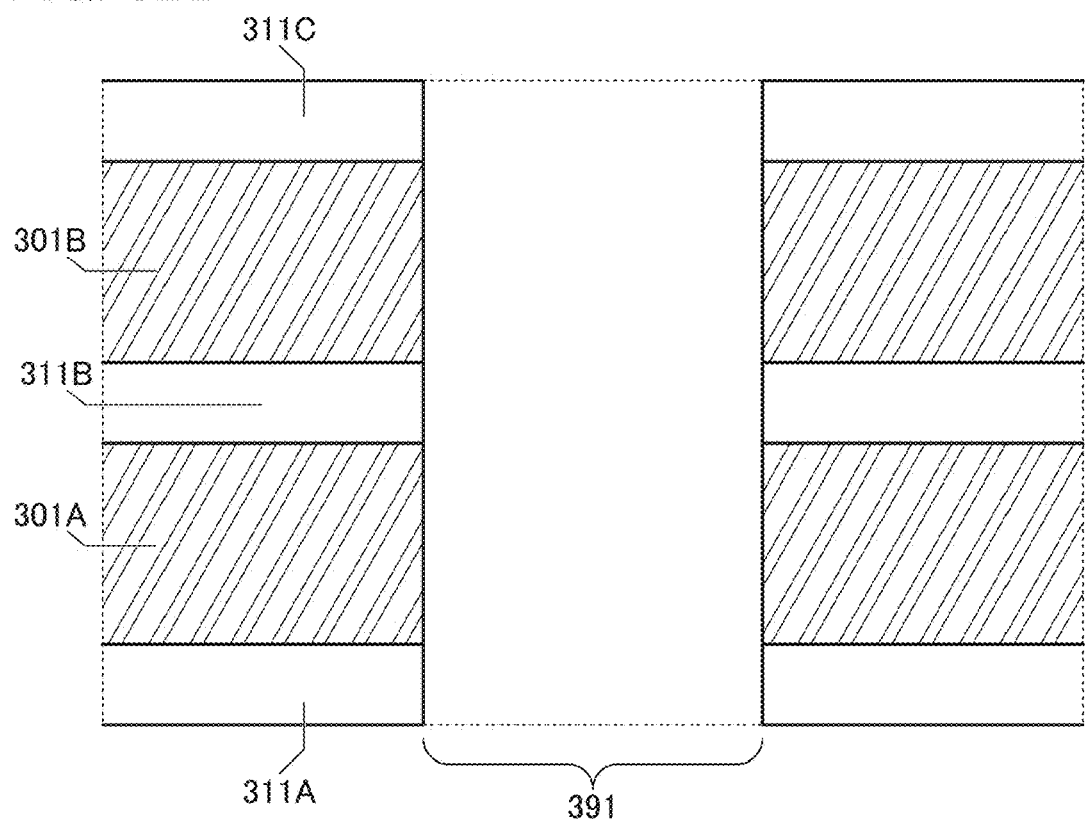

In the next step, as illustrated in FIG. 32B, an opening is formed in the region 391 in the stack 300 illustrated in FIG. 32A through formation of a resist mask and etching treatment, or the like.

The formation of the resist mask can be performed by a lithography method, a printing method, an inkjet method, or the like as appropriate. The formation of the resist mask by an inkjet method needs no photomask; thus, manufacturing cost can be reduced in some cases. For the etching treatment, either a dry etching method or a wet etching method or both of them may be used.

Figure 33A:
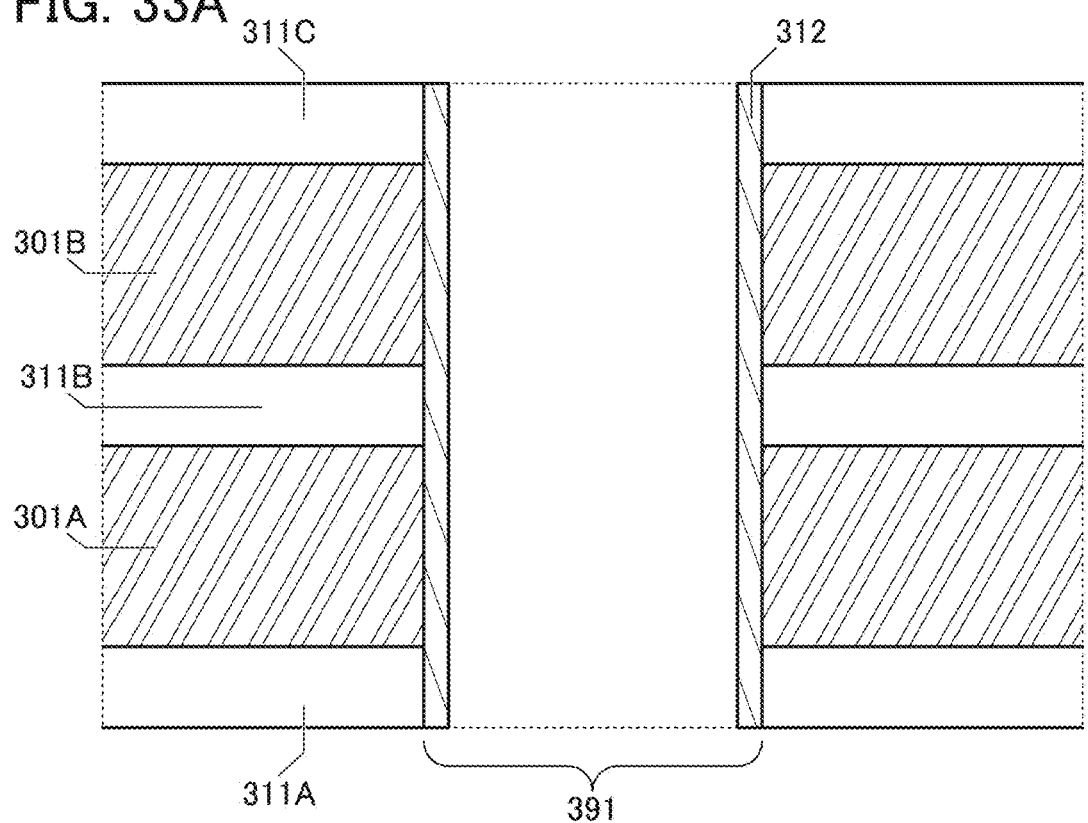
FIG. 33A and FIG. 33B are cross-sectional views illustrating an example of manufacturing a semiconductor device.

Next, as illustrated in FIG. 33A, an insulator 312 is formed on the side surface of the opening in the region 391 to cover the insulator 311A to the insulator 311C, the sacrificial layer 301A, and the sacrificial layer 301B.

The insulator 312 functions as a film for forming the insulator 312a, the insulator 312b, and the insulator 312c in FIG. 28 in a later step. Therefore, in the description in this specification and the like, the insulator 312 can be replaced with the insulator 312a, the insulator 312b, and the insulator 312c as appropriate.

As described above, the insulator 312 preferably functions as a barrier insulating film that inhibits impurities (e.g., water molecules, hydrogen atoms, hydrogen molecules, oxygen atoms, oxygen molecules, nitrogen atoms, nitrogen molecules, or nitrogen oxide molecules ($N_2O$, NO, $NO_2$, or the like) from the insulator 311A (the insulator 311B and the insulator 311C) from diffusing into the material layer 352. It is particularly preferable that the insulator 312 be a barrier insulating film that inhibits transmission of an oxygen atom or an oxygen molecule.

For the insulator 312, aluminum oxide, hafnium oxide, gallium oxide, indium gallium zinc oxide, silicon nitride, silicon nitride oxide, or the like can be used, for example. In particular, in the case where an oxide semiconductor to be described later is used for the material layer 352, for example, it is preferable to use aluminum oxide or the like which has high capability of trapping hydrogen and fixing hydrogen as the insulator 312. Thus, in FIG. 28, an impurity such as water or hydrogen can be inhibited from diffusing into the material layer 352 from the insulator 311A (the insulator 311B and the insulator 311C) side through the conductor 331a (the conductor 331b and the conductor 331c) and the material layer 351a (the material layer 351b and the material layer 351c).

Although the insulator 312 is illustrated as a single layer in FIG. 28, FIG. 29B, and FIG. 33A, one embodiment of the present invention is not limited to this. The insulator 312 illustrated in FIG. 28, FIG. 29B, and FIG. 33A may have a stacked structure of the above-described materials, for example. For example, in FIG. 28 and FIG. 29B, silicon oxide may be used for the insulator 312 in contact with the conductor 331a (the conductor 331b and the conductor 331c), and aluminum oxide, hafnium oxide, or the like may be used for the insulator 312 in contact with the insulator 311A (the insulator 311B and the insulator 311C).

Figure 33B:
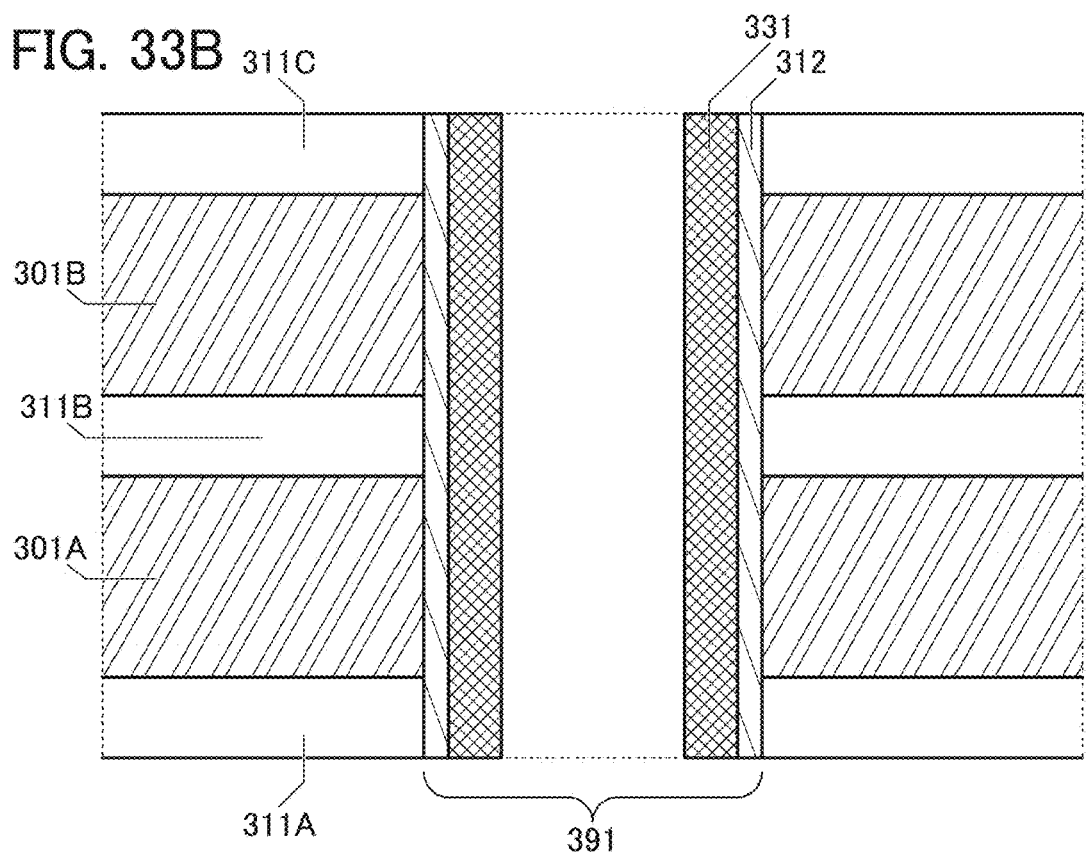

Then, a conductor 331 is formed on the formation surface of the insulator 312 as illustrated in FIG. 33B.

The conductor 331 functions as a film for forming the conductor 331a, the conductor 331b, and the conductor 331c in FIG. 28 in a later step. Therefore, in the description in this specification and the like, the conductor 331 can be replaced with the conductor 331a, the conductor 331b, and the conductor 331c as appropriate.

Since the conductor 331 functions as a film for forming the conductor 331a, the conductor 331b, and the conductor 331c as described above, the conductor 331 becomes a source electrode and a drain electrode of each of the cell transistor CTrA and the cell transistor CTrB in FIG. 28, in a later step.

The conductor 331 is preferably a material having high conductivity. For the conductor 331, for example, nitride containing tantalum, nitride containing titanium, nitride containing molybdenum, nitride containing tungsten, nitride containing tantalum and aluminum, nitride containing titanium and aluminum, or the like is preferably used. In one embodiment of the present invention, nitride containing tantalum is particularly preferable. As another example, ruthenium oxide, ruthenium nitride, oxide containing strontium and ruthenium, or oxide containing lanthanum and nickel may be used. These materials are preferable because they are conductive materials that are not easily oxidized or materials that maintain the conductivity even when absorbing oxygen.

In the case where an oxide semiconductor to be described later is used for the material layer 352, a conductive material having a function of inhibiting transmission of impurities such as water and hydrogen is preferably used for the conductor 331, for example. In that case, tantalum, tantalum nitride, titanium, titanium nitride, ruthenium, ruthenium oxide, or the like is preferably used for the conductor 331.

Although the conductor 331 is illustrated as a single layer in FIG. 28, FIG. 29B, and FIG. 33, one embodiment of the present invention is not limited to this. The conductor 331 illustrated in FIG. 28, FIG. 29B, and FIG. 33 may have a stacked structure of the above-described materials, for example. Specifically, for example, a conductive material having a function of inhibiting transmission of impurities such as water and hydrogen may be used for the first layer of the conductor 331, and a conductive material that is not easily oxidized or a material that maintains the conductivity even after absorbing oxygen may be used for the second layer.

Figure 34A:
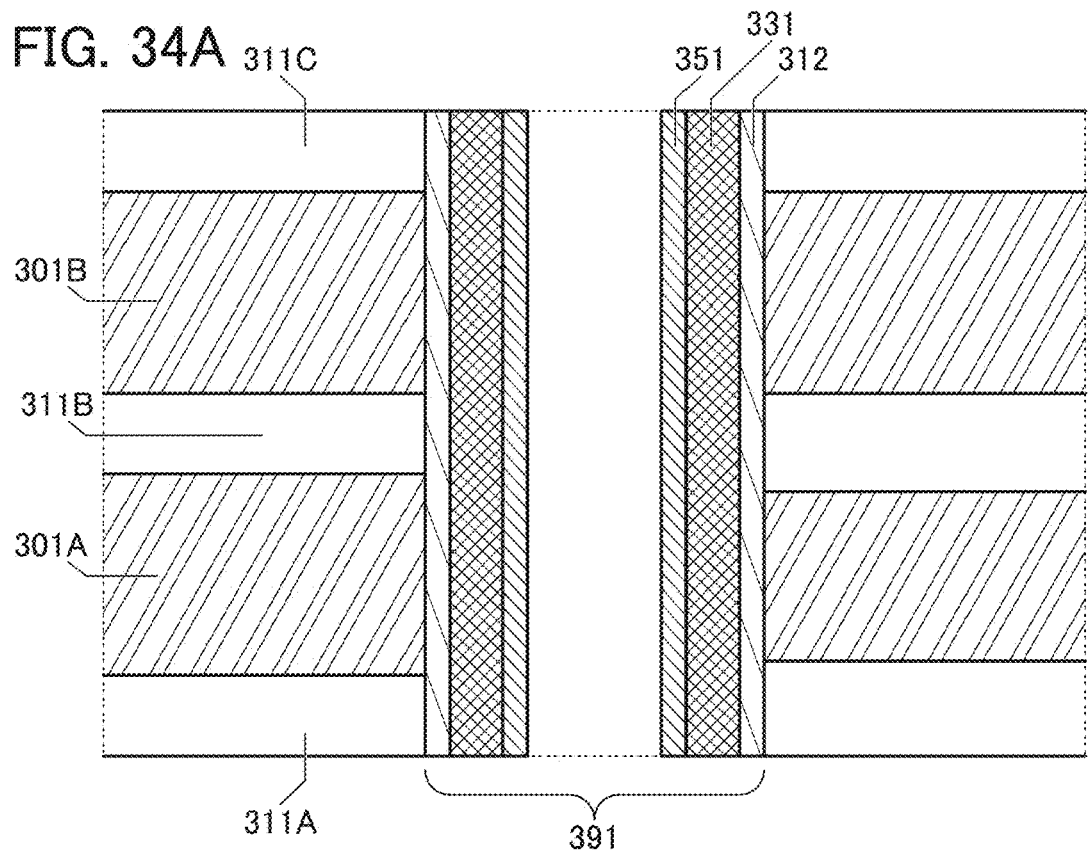
FIG. 34A and FIG. 34B are cross-sectional views illustrating an example of manufacturing a semiconductor device.

As illustrated in FIG. 34A, the material layer 351 is formed on the formation surface of the conductor 331.

The material layer 351 functions as a film for forming the material layer 351a, the material layer 351b, and the material layer 351c in FIG. 28 in a later step. Therefore, in the description in this specification and the like, the material layer 351 can be replaced with the material layer 351a, the material layer 351b, and the material layer 351c as appropriate.

When the material layer 351 is formed in contact with the formation surface of the conductor 331, a low-resistance region is sometimes formed in the vicinity of an interface between the material layer 351 and the conductor 331. At this time, by adding heat treatment, a component contained in the material layer 351 and a component contained in the conductor 331 form a compound in some cases. Note that in this manufacturing example, an appropriate material is selected for each of the conductor 331 and the material layer 351 such that the compound has low resistance.

Note that for a material that can be used for the material layer 351, description of the material layer 351a (the material layer 351b and the material layer 351c) in Structure example 9 of semiconductor device is referred to.

Figure 34B:
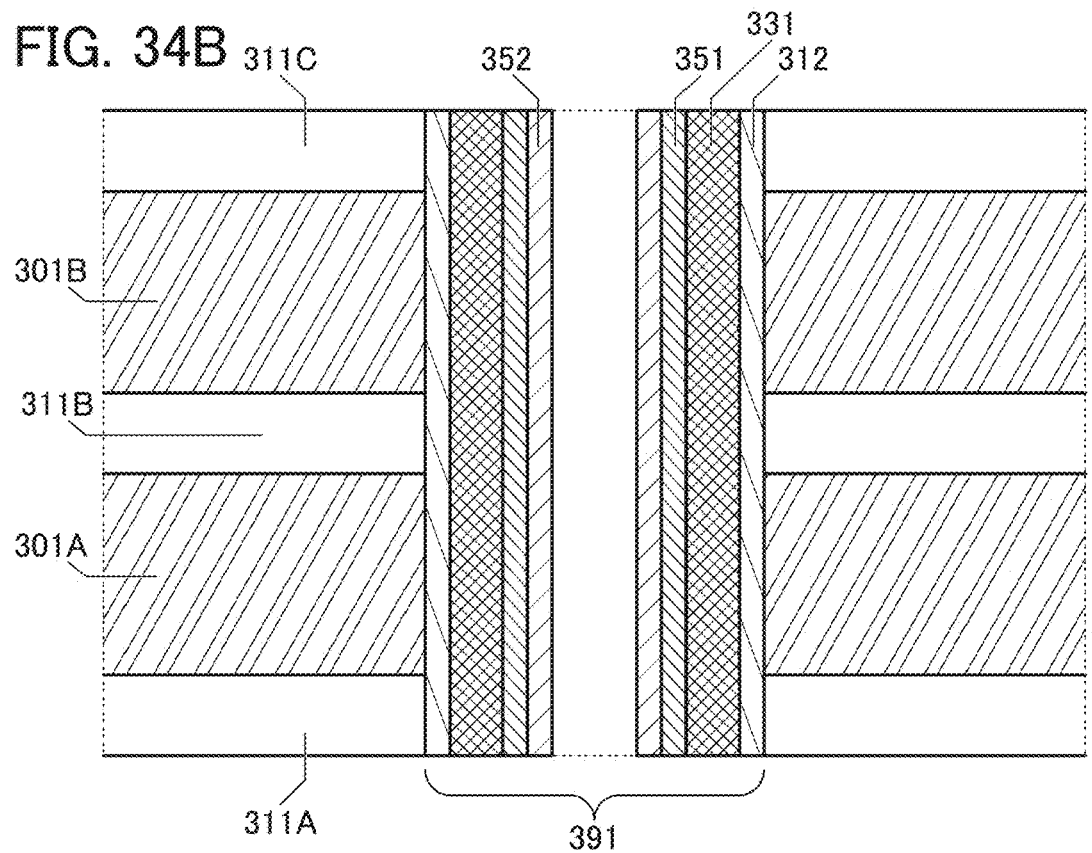

Next, as illustrated in FIG. 34B, the material layer 352 is formed on the formation surface of the material layer 351. Part of the region of the layer 352 functions as the channel formation region of the cell transistor CTrA and the cell transistor CTrB in FIG. 28 as described above.

Note that for a material that can be used for the material layer 352, description in Structure example 9 of semiconductor device is referred to.

Figure 35A:
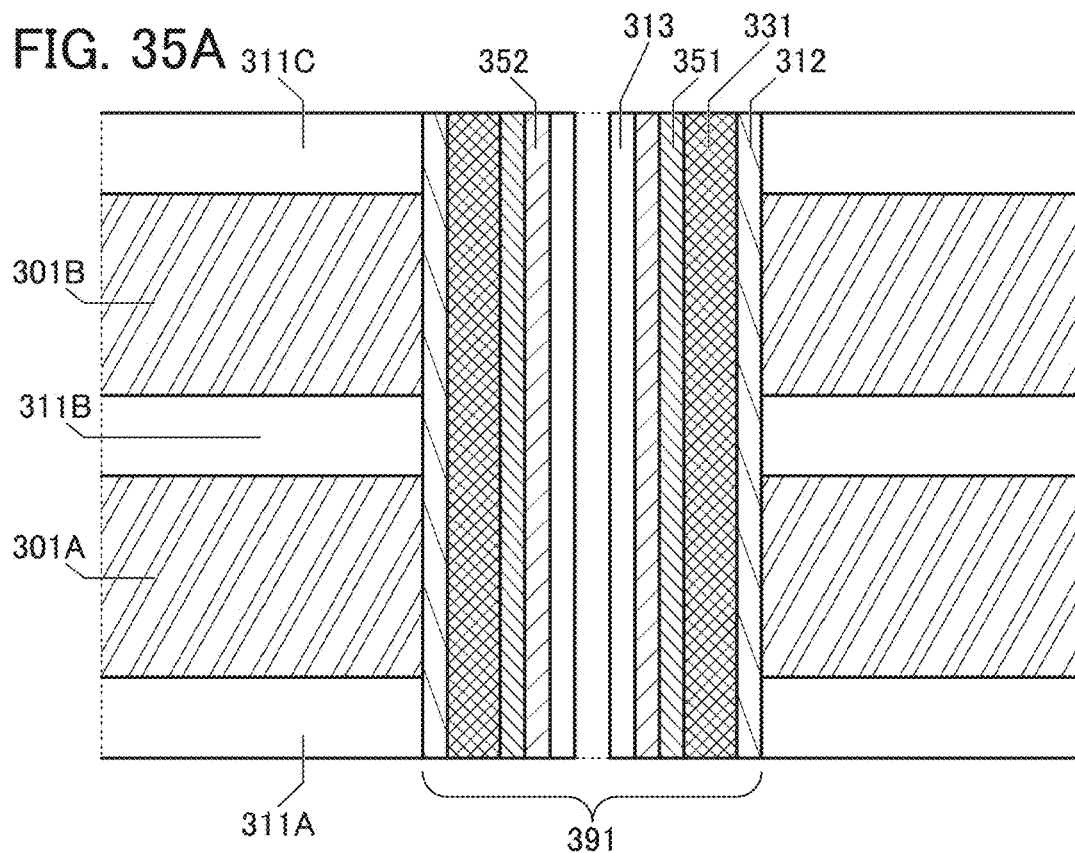
FIG. 35A and FIG. 35B are cross-sectional views illustrating an example of manufacturing a semiconductor device.

Next, as illustrated in FIG. 35A, the insulator 313 is formed on the formation surface of the material layer 352.

The insulator 313 functions as the second gate insulating film of each of the cell transistor CTrA and the cell transistor CTrB in FIG. 28, as described above.

It is preferable to use silicon oxide or silicon oxynitride for the insulator 313, for example. Alternatively, for the insulator 313, aluminum oxide, hafnium oxide, or oxide containing aluminum and hafnium can be used, for example.

Like the insulator 312, the insulator 313 preferably functions as a barrier insulating film that inhibits transmission of impurities (e.g., water molecules, hydrogen atoms, hydrogen molecules, oxygen atoms, oxygen molecules, nitrogen atoms, nitrogen molecules, and nitrogen oxide molecules ($N_2O$, NO, $NO_2$, or the like).

Accordingly, in the case where the cell transistor CTrA and the cell transistor CTrB in FIG. 28 are OS transistors, that is, in the case where, for example, metal oxide functioning as an oxide semiconductor is used for the material layer 352, an insulating material having a function of inhibiting transmission of oxygen, for example, is preferably used for the insulator 313. For the insulator 313, silicon nitride, silicon nitride oxide, silicon oxynitride, aluminum nitride, aluminum nitride oxide, or the like is preferably used, for example. When such the insulator 313 is formed, oxygen is prevented from releasing from the material layer 352 and diffusing into the insulator 313. This can prevent a reduction in the resistance of the material layer 352 due to release of oxygen from the material layer 352.

Moreover, for example, an insulating material having a function of inhibiting transmission of impurities such as water or hydrogen is preferably used for the insulator 312. For example, for the insulator 312, aluminum oxide can be used. Note that a material that can be used for the insulator 312 is not limited to the above material; for example, for the insulator 312, any of the above materials that can be used for the insulator 311A to the insulator 311C can be used as a film with a low concentration of impurities such as water and hydrogen.

Although the insulator 313 is illustrated as a single layer in FIG. 28, FIG. 29B, and FIG. 35A, one embodiment of the present invention is not limited to this. The insulator 313 illustrated in FIG. 28, FIG. 29B, and FIG. 35A may have a stacked structure of the above-described materials, for example. For example, in FIG. 28 and FIG. 29B, silicon oxide may be used for the insulator 312 in contact with the material layer 352, and aluminum oxide, hafnium oxide, or the like may be used for the insulator 312 in contact with the conductor 332.

Specifically, the case where metal oxide functioning as an oxide semiconductor, for example, is used for the material layer 352 is considered. For example, when aluminum oxide is deposited by a sputtering method, oxygen is supplied to the insulator 313 and the oxygen supplied to the insulator 313 is supplied to the material layer 352. The supply of oxygen to the material layer 352 increases oxygen included in the oxide semiconductor, whereby a reduction in the resistance of the oxide semiconductor can be prevented.

Figure 35B:
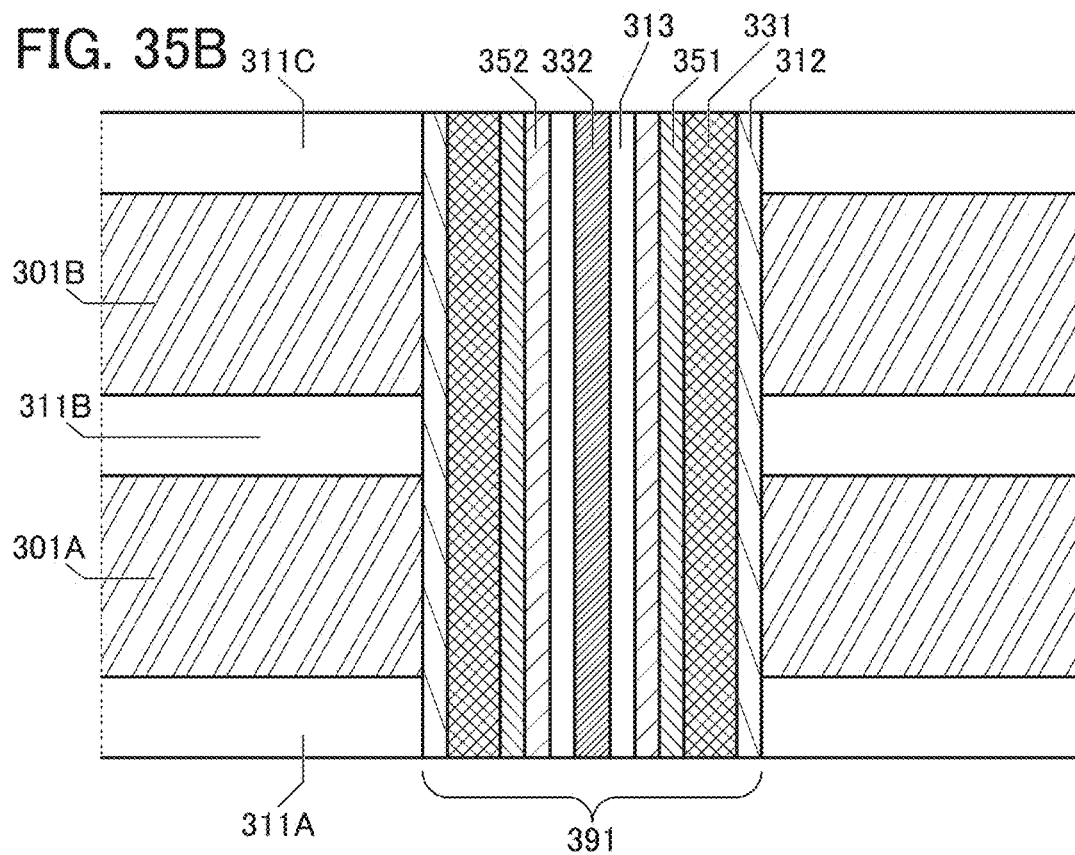

As illustrated in FIG. 35B, the conductor 332 is deposited on the formation surface of the insulator 313 so as to fill the remaining opening in the region 391.

The conductor 332 functions as a second gate electrode of each of the cell transistor CTrA and the cell transistor CTrB in FIG. 28 and a wiring that supplies a potential to the second gate electrodes, as described above.

For the conductor 332, it is possible to use a material containing one or more kinds of metal elements selected from aluminum, chromium, copper, silver, gold, platinum, tantalum, nickel, titanium, molybdenum, tungsten, hafnium, vanadium, niobium, manganese, magnesium, zirconium, beryllium, indium, and ruthenium, for example. Alternatively, it is also possible to use, for the conductor 332, a semiconductor having high electrical conductivity, typified by polycrystalline silicon containing an impurity element such as phosphorus, or silicide such as a nickel silicide.

For example, for the conductor 332, a conductive material containing oxygen and a metal element contained in metal oxide usable for the material layer 351 or the material layer 352 may be used. A conductive material containing the above metal element and nitrogen may be used. For example, a conductive material containing nitrogen, such as titanium nitride or tantalum nitride, can be used. Furthermore, indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon is added can be used. Furthermore, indium gallium zinc oxide containing nitrogen can be used. Using such a material in some cases allows capture of hydrogen entering from a surrounding insulator or the like.

Moreover, a conductive material having a function of inhibiting transmission of impurities such as water or hydrogen is preferably used for the conductor 332, for example. For example, tantalum, tantalum nitride, titanium, titanium nitride, ruthenium, or ruthenium oxide is preferably used, and a single layer or a stacked layer can be used.

A plurality of the above materials may be stacked for the conductor 332. For example, a stacked-layer structure combining a material containing the above metal element and a conductive material containing oxygen may be employed. A stacked-layer structure combining a material containing the above metal element and a conductive material containing nitrogen may be employed. A stacked-layer structure combining a material containing the above metal element, a conductive material containing oxygen, and a conductive material containing nitrogen may be employed. When an insulator including an excess-oxygen region is used as the insulator in contact with the surrounding of the conductor, oxygen is in some cases diffused into a region of the conductor in contact with the insulator. Accordingly, a stacked-layer structure combining a material containing the metal element and a conductive material containing oxygen can be formed in some cases. Similarly, when an insulator including an excess-nitrogen region is used as the insulator in contact with the surrounding of the conductor, nitrogen is in some cases diffused into a region of the conductor in contact with the insulator. Accordingly, a stacked-layer structure combining a material containing the metal element and a conductive material containing nitrogen can be formed in some cases.

Figure 36A:
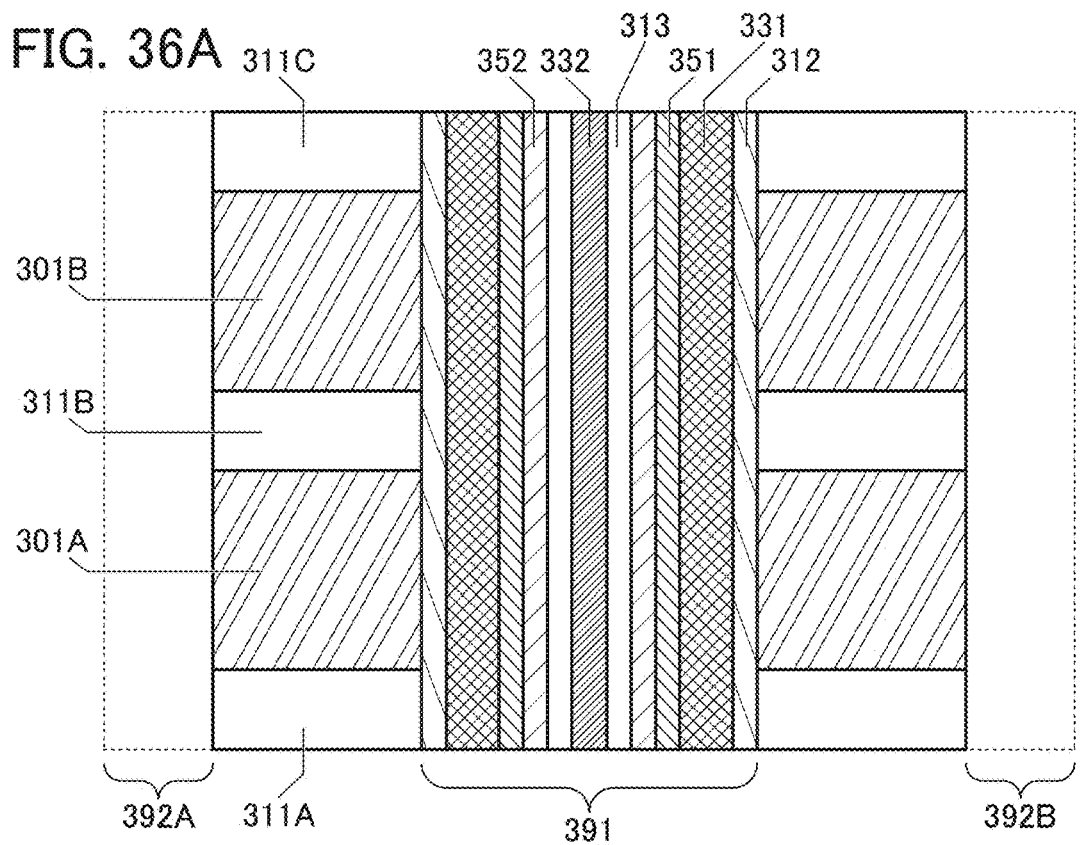
FIG. 36A and FIG. 36B are cross-sectional views illustrating an example of manufacturing a semiconductor device.

In the subsequent step, for example, formation of a resist mask, etching treatment, and the like are performed on the stack 300, whereby a slit-like opening is formed in the region 392A and the region 392B, as illustrated in FIG. 36A. Note that in this step, the openings in the region 392A and the region 392B have a slit-like shape, but the openings in the region 392A and the region 392B may be cylindrical as illustrated in FIG. 31B.

Note that the description of FIG. 32B is referred to for the resist mask formation, the etching treatment, and the like.

Figure 36B:
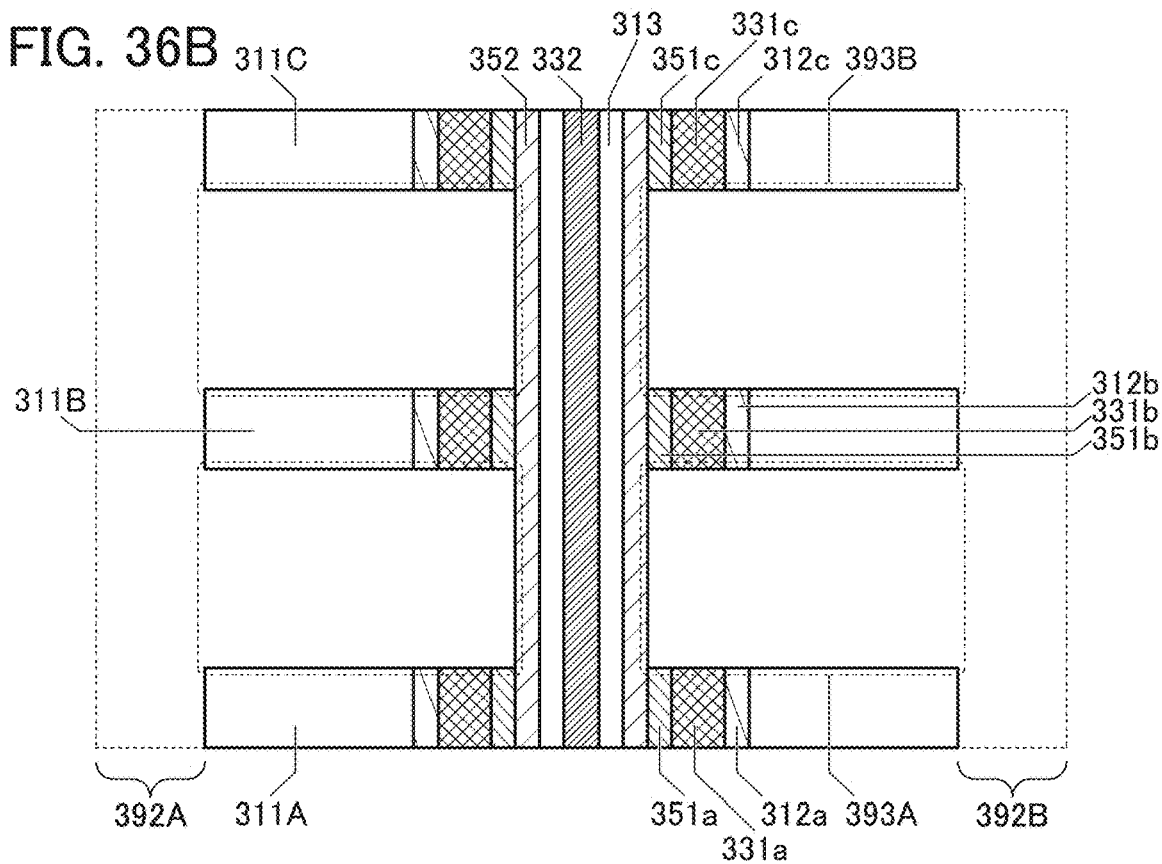

In the step illustrated in FIG. 36B, by etching treatment or the like, the sacrificial layer 301A and the sacrificial layer 301B are eliminated from side surfaces of the openings formed in the region 392A and the region 392B, and regions of the insulator 312, the conductor 331, and the material layer 351 which are surrounded by the sacrificial layer 301A and regions of the insulator 312, the conductor 331, and the material layer 351 which are surrounded by the sacrificial layer 301B are also eliminated, whereby a depressed portion 393A and a depressed portion 393B are formed in the stack 300. Accordingly, the insulator 312a (the insulator 312b and the insulator 312c), the conductor 331a (the conductor 331b and the conductor 331c), and the material layer 351a (the material layer 351b and the material layer 351c) are formed in a region where the material layer 352 overlaps with the region 372.

Note that the depressed portion 393A and the depressed portion 393B sometimes can be formed at the same time as the openings in the region 392A and the region 392B in the manufacturing step of the semiconductor device illustrated in FIG. 36A. Steps of eliminating the sacrificial layer 301A and the sacrificial layer 301B, a region of the insulator 312, a region of the conductor 331, a region of the material layer 351c may have different conditions such as different etching treatment conditions. Therefore, in the step illustrated in FIG. 36B, conditions such as etching treatment conditions may be changed depending on the material to be eliminated.

Figure 37A:
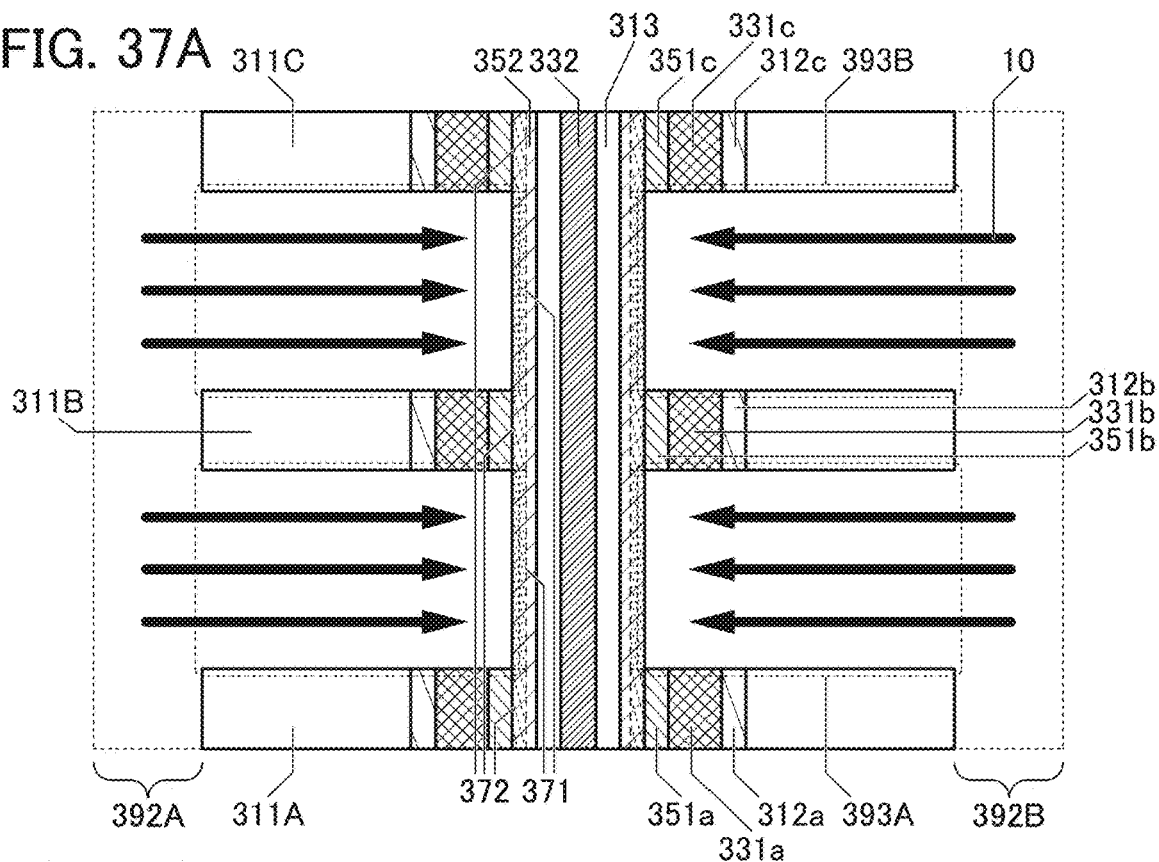
FIG. 37A is a cross-sectional view illustrating an example of manufacturing a semiconductor device and FIG. 37B is a perspective view illustrating the example of manufacturing a semiconductor device.

In the case where a material including metal oxide is used for the material layer 352, that is, in the case where the cell transistor CTrA and the cell transistor CTrB in FIG. 28 are OS transistors, after the openings in the region 392A and the region 392B, the depressed portion 393A, and the depressed portion 393B are formed, treatment of supplying oxygen from the openings in the region 392A and the region 392B may be performed on the region 371 of the material layer 352 exposed in the depressed portion 393A and the depressed portion 393B. In that case, FIG. 37A illustrates a state in which oxygen is supplied to the region 371 as the treatment 10. Examples of the treatment of supplying oxygen include heat treatment in an oxygen atmosphere.

As the treatment 10 of supplying oxygen, for example, microwave treatment in an atmosphere containing oxygen can be employed. In that case, a microwave or a high-frequency wave such as an RF wave, oxygen plasma, oxygen radicals, or the like is applied to the region 371. For the microwave treatment, a microwave treatment apparatus including a power source for generating high-density plasma using a microwave is preferably used, for example. The microwave treatment apparatus may include a power source for applying RF to the substrate side. The use of high-density plasma enables high-density oxygen radicals to be generated. Furthermore, application of RF to the substrate side allows oxygen ions generated by the high-density plasma to be efficiently introduced into the material layer 352. The microwave treatment is preferably performed under reduced pressure, and the pressure is set to 60 Pa or higher, preferably 133 Pa or higher, further preferably 200 Pa or higher, still further preferably 400 Pa or higher. Furthermore, the oxygen flow rate ratio ($O_2/O_2+Ar$) is lower than or equal to 50%, preferably higher than or equal to 10% and lower than or equal to 30%. The treatment temperature is lower than or equal to 750° C., preferably lower than or equal to 500° C., and is approximately 400° C., for example. Heat treatment may be successively performed without exposure to the air after the oxygen plasma treatment.

When the microwave treatment is performed in an atmosphere containing oxygen as the treatment 10 of supplying oxygen, an oxygen gas is made into plasma with a microwave or a high-frequency wave such as RF, and the oxygen plasma can act on the region 371 of the material layer 352 (the material layer 352A in the case where the cell transistor CTrA and the cell transistor CTrB have a structure of FIG. 30A or FIG. 30C). At this time, the region 371 can be irradiated with a microwave or a high-frequency wave such as RF. In other words, a microwave, the high-frequency wave such as RF, the oxygen plasma, or the like can act on the region 372 in FIG. 37A. The effect of the plasma, the microwave, or the like enables $V_OH$ in the region 371 to be cut, and hydrogen H to be removed from the region 371. That is, the reaction "$V_OH \rightarrow H+V_O$" and then the reaction "$V_O+O \rightarrow null$" occur in the region 371, whereby the hydrogen concentration in the region 371 can be reduced. As a result, oxygen vacancies and $V_OH$ in the region 371 can be reduced to lower the carrier concentration.

In FIG. 37A, the conductor 331a (the conductor 331b and the conductor 331c) is provided to overlap with the region 372. The conductor 331a (the conductor 331b and the conductor 331c) blocks the effects of a microwave or the high-frequency wave such as RF, the oxygen plasma, and the like, and thus the effects of these do not reach the region 372. Hence, a reduction in $V_OH$ and supply of an excess amount of oxygen due to the microwave treatment do not occur in the region 372, preventing a reduction in carrier concentration.

Oxygen vacancies and $V_OH$ in the region 371 of the material layer 352 are selectively eliminated in this way, whereby the region 371 can be i-type or substantially i-type. Furthermore, supply of an excess amount of oxygen to the region 372 functioning as a source region or a drain region can be inhibited and the n-type can be maintained. Accordingly, a change in the electrical characteristics of the cell transistor CTrA and the cell transistor CTrB can be prevented, so that variations in electrical characteristics of the cell transistors in the semiconductor device can be prevented.

In the case where a material including silicon is used for the material layer 352, that is, in the case where the cell transistor CTrA and the cell transistor CTrB in FIG. 28 are Si transistors, after the openings in the region 392A and the region 392B, the depressed portion 393A, and the depressed portion 393B are formed, treatment of supplying an impurity from the openings in the region 392A and the region 392B may be performed on the region 371 of the material layer 352 exposed in the depressed portion 393A and the depressed portion 393B. In that case, FIG. 36A illustrates a state in which impurities are supplied to the material layer 352, which is exposed in the depressed portion 393A and the depressed portion 393B, as the treatment 10. Note that heat treatment is preferably performed on the semiconductor device during the treatment 10. In the case where the cell transistor CTrA and the cell transistor CTrB are n-channel transistors, a p-type impurity (an acceptor) is used as the impurity so as to make the region 371 a p-type channel formation region. As the p-type impurity, boron, aluminum, or gallium can be used, for example. In the case where the cell transistor CTr is a p-channel transistor, an n-type impurity (a donor) is used as the impurity so as to make the region 371 an n-type channel formation region. As the n-type impurity, phosphorus or arsenic can be used, for example.

Note that a region of the material layer 352 which is not exposed in the depressed portion 393A and the depressed portion 393B, that is, the region 372 in contact with the material layer 351a, the material layer 351b, and the material layer 351c has a lower resistance than the region 371 in some cases. This is because, for example, a component contained in the conductor 331a (the conductor 331b and the conductor 331c) and a component of the material layer 352 near an interface with the material layer 351a (the material layer 351b and the material layer 351c) sometimes form a low-resistance compound. Alternatively, the region 371 has higher resistance than the region 372 through the treatment 10. Thus, the region 372 functions as a low-resistance region of the cell transistor CTrA and the cell transistor CTrB.

Figure 37B:
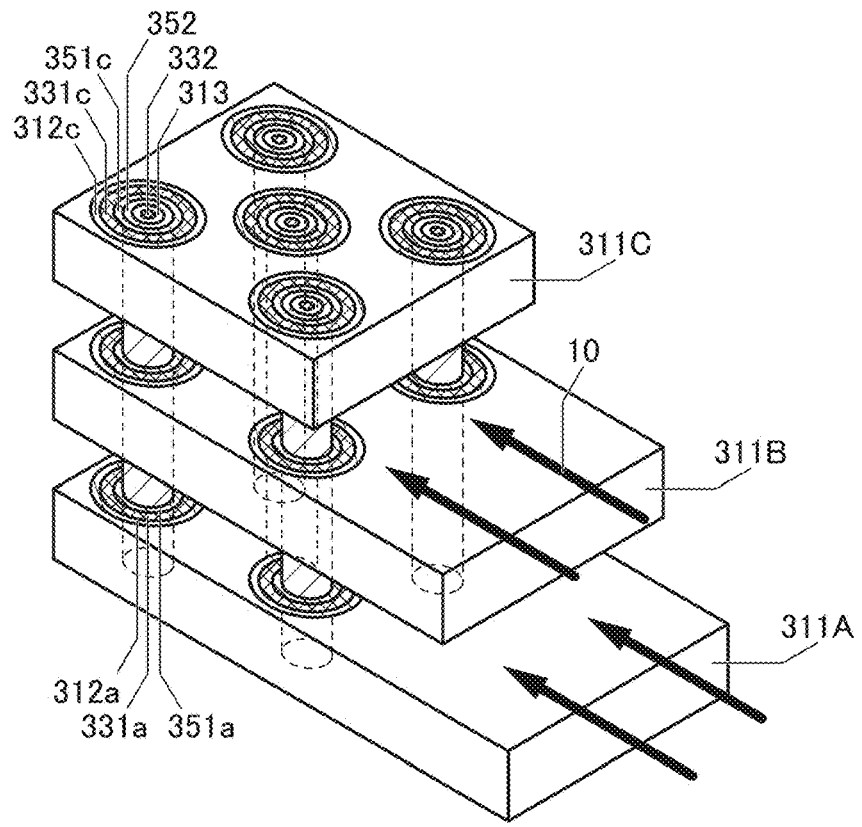

As described above, in the treatment of supplying oxygen or impurities to the material layer 352, oxygen supply may be performed from a terminal extraction portion as illustrated in FIG. 37B, not from the openings in the region 392A and the region 392B. As the treatment of supplying oxygen to the material layer 352, oxygen supply from the openings in the region 392A and the region 392B in FIG. 37A and oxygen supply from the terminal extraction portion in FIG. 37B may be combined. Note that FIG. 37B is a perspective view of the structure body illustrated in FIG. 37A.

Figure 38A:
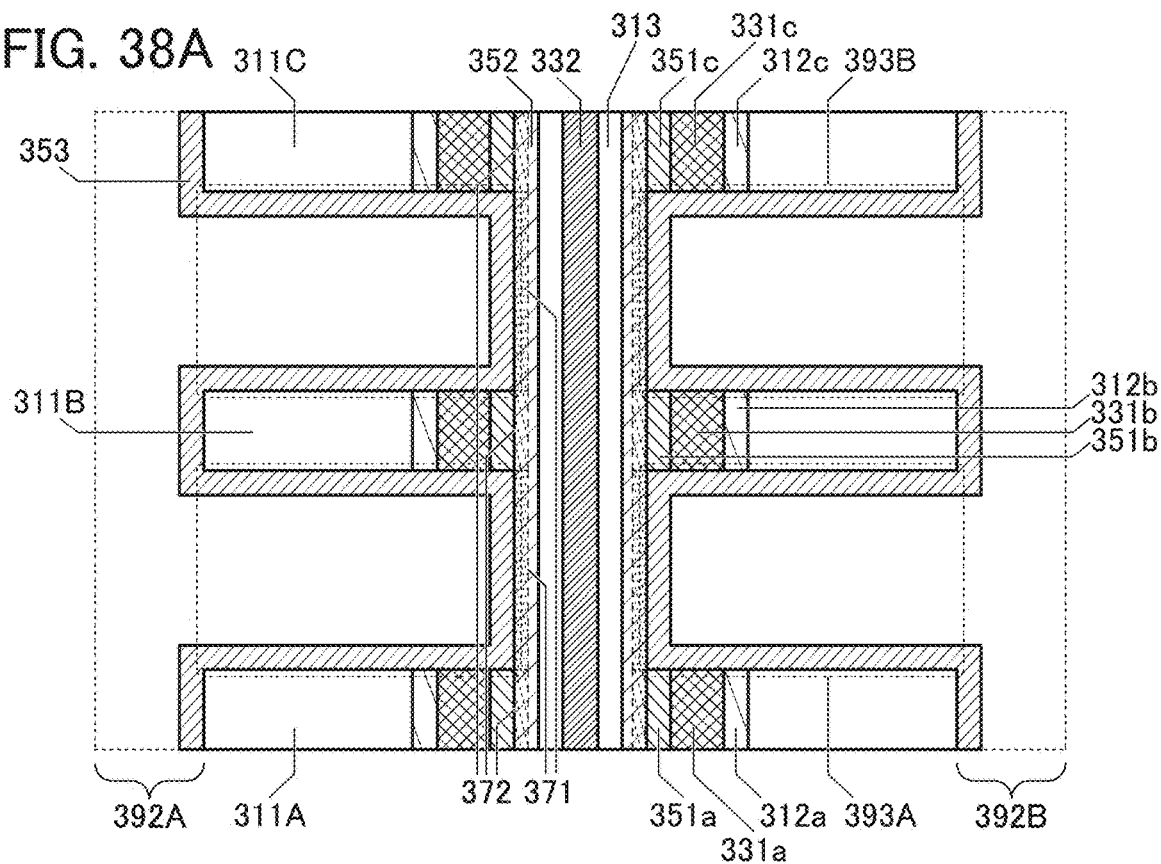
FIG. 38A and FIG. 38B are cross-sectional views illustrating an example of manufacturing a semiconductor device.

In the subsequent step, the material layer 353 is formed on the side surfaces of the openings in the region 392A and the region 392B in FIG. 36B (side surfaces of the insulator 311A to the insulator 311C), the depressed portion 393A, and the depressed portion 393B as illustrated in FIG. 38A.

In the case where a material containing metal oxide is used for the material layer 352, that is, in the case where the cell transistor CTrA and the cell transistor CTrB in FIG. 28 are OS transistors, a material that can be used for the material layer 353 is preferably metal oxide that can be used for the material layer 351 and/or the material layer 352. For the metal oxide, description of the material layer 351 and the material layer 352, which are formed in the steps illustrated in FIG. 34A and FIG. 34B, is referred to.

The material layer 353 may have a stacked-layer structure of a plurality of metal oxides that can be used for the material layer 351 and/or the material layer 352.

After the formation of the material layer 353, as in the step illustrated in FIG. 37A and FIG. 37B, oxygen may be supplied to the material layer 353 and a region of the material layer 352 in contact with the material layer 353 by microwave treatment or the like as the treatment 10 (not illustrated).

In the case where a material containing silicon is used for the material layer 352, that is, in the case where the cell transistor CTrA and the cell transistor CTrB in FIG. 28 are Si transistors, a material that can be used for the material layer 353 can be metal oxide that can be used for the material layer 351 and/or the material layer 352 or a material that can be used for the insulator 314 to be described later.

Note that although the material layer 353 and the material layer 351c illustrated in FIG. 38A have the same thickness, the semiconductor device of one embodiment of the present invention is not limited to this. The thickness of the material layer 353 may be larger or smaller than the thickness of the material layer 351c.

Figure 38B:
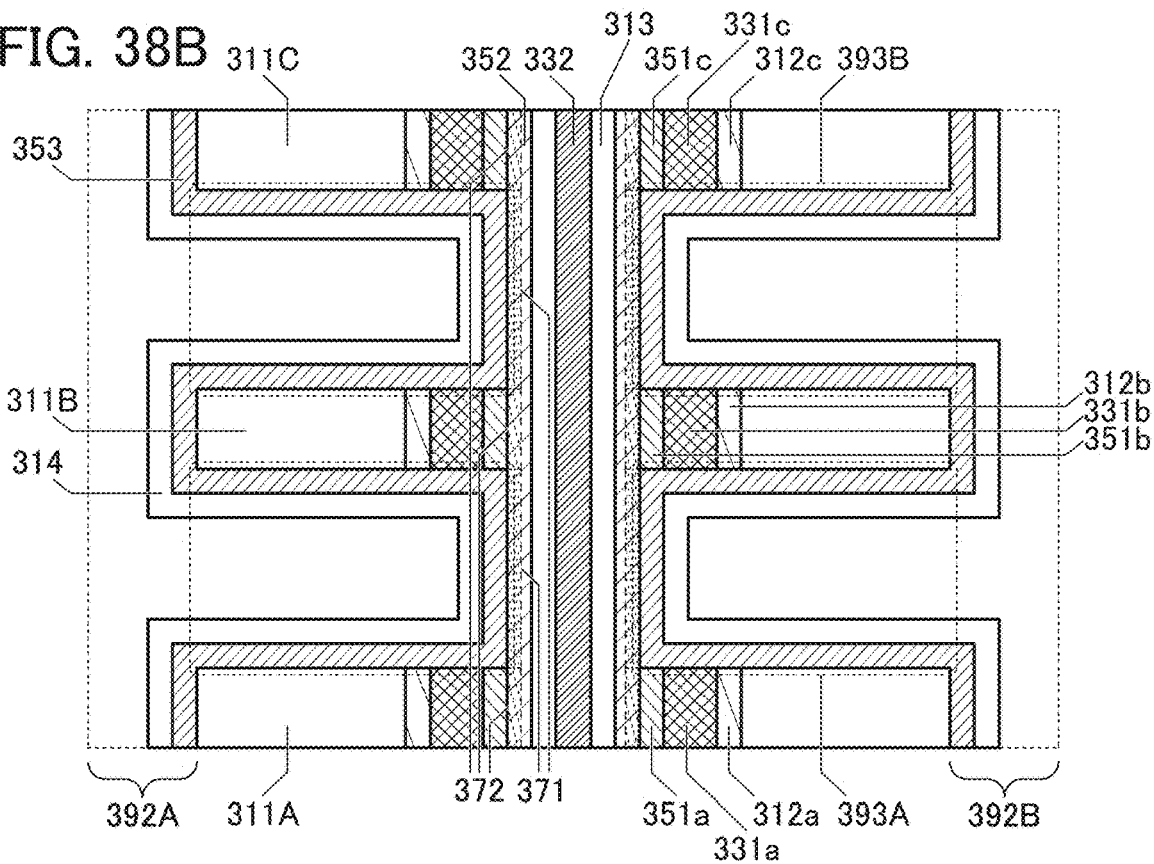

In the subsequent step, as illustrated in FIG. 38B, the insulator 314 is formed on side surfaces of the openings in the region 392A and the region 392B and in the formed depressed portions illustrated in FIG. 38A. In other words, the insulator 314 is formed on the formation surface of the material layer 353.

The insulator 314 functions as a tunnel insulating film of the cell transistor CTrA and the cell transistor CTrB as described above.

It is preferable to use silicon oxide or silicon oxynitride for the insulator 314, for example. Alternatively, for the insulator 314, aluminum oxide, hafnium oxide, or oxide containing aluminum and hafnium may be used, for example. The insulator 314 may be an insulator including a stack of any of the above.

After the formation of the insulator 314, as in the step illustrated in FIG. 37A and FIG. 37B, oxygen may be supplied to the material layer 353 and a region of the material layer 352 in contact with the material layer 353, through the insulator 314 by microwave treatment or the like as the treatment 10 (not illustrated).

In the case where at least one of the material layer 351 to the material layer 353 is a material containing metal oxide, the insulator 314 can be an insulator in which the material that can be used for the insulator 313 is stacked on the above material. In particular, when a material having a function of inhibiting transmission of oxygen or impurities such as water and hydrogen is used for the insulator 314, diffusion of water or hydrogen into the material layer 351 to the material layer 353 and release of oxygen from the material layer 351 to the material layer 353 can be prevented in some cases. Note that in the case where microwave treatment is performed as the treatment 10, for example, the insulator 314 may be formed in such a manner that silicon oxide or silicon oxynitride is deposited on the formation surface of the material layer 353, the microwave treatment is performed, and then a material having a function of inhibiting transmission of oxygen or impurities such as water and hydrogen is deposited.

Figure 39A:
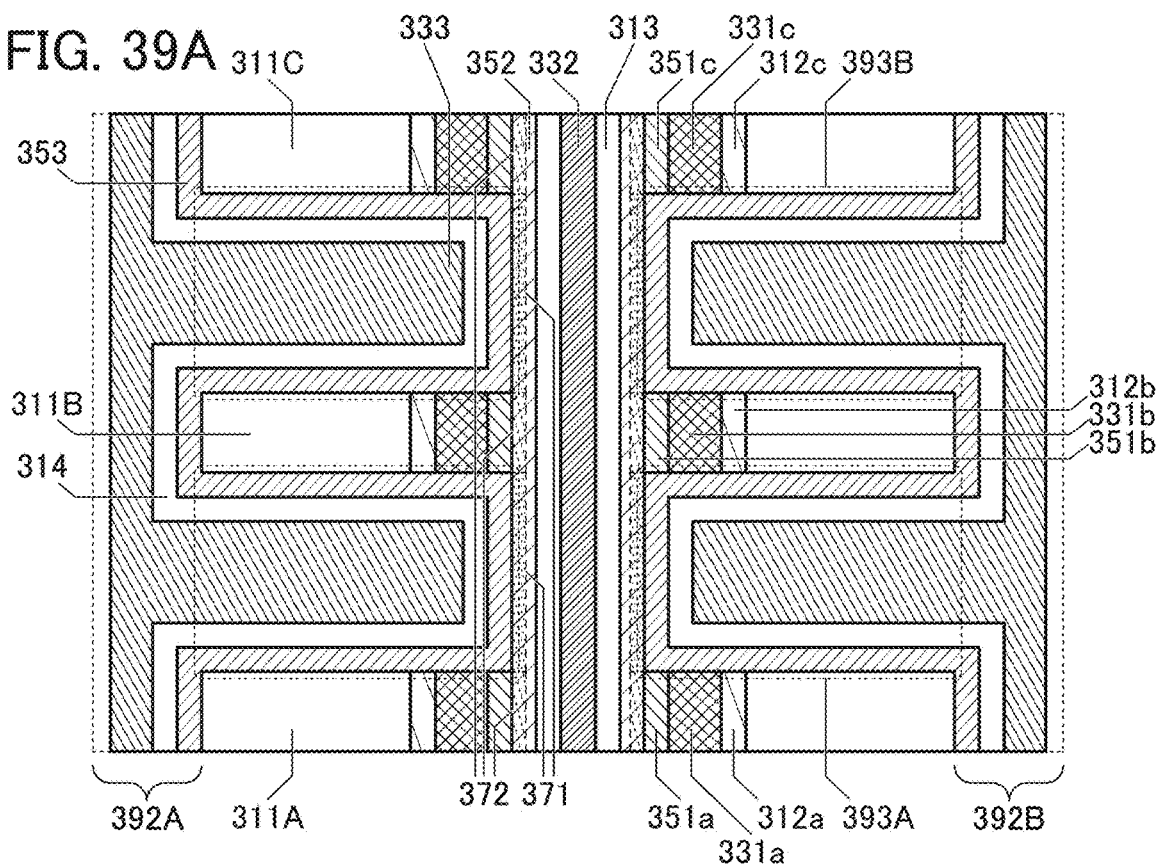
FIG. 39A and FIG. 39B are cross-sectional views illustrating an example of manufacturing a semiconductor device.

In the subsequent step, as illustrated in FIG. 39A, the conductor 333 is formed on side surfaces of the openings in the region 392A and the region 392B and in the formed depressed portions illustrated in FIG. 38B. That is, the conductor 333 is formed on the formation surface of the insulator 314.

For the conductor 333, any of the materials usable for the aforementioned conductor 332 can be used, for example. Note that a material usable for the conductor 333 is not limited thereto. An insulator, a semiconductor, or the like can be used as an alternative to the conductor 333 in some cases.

Figure 39B:
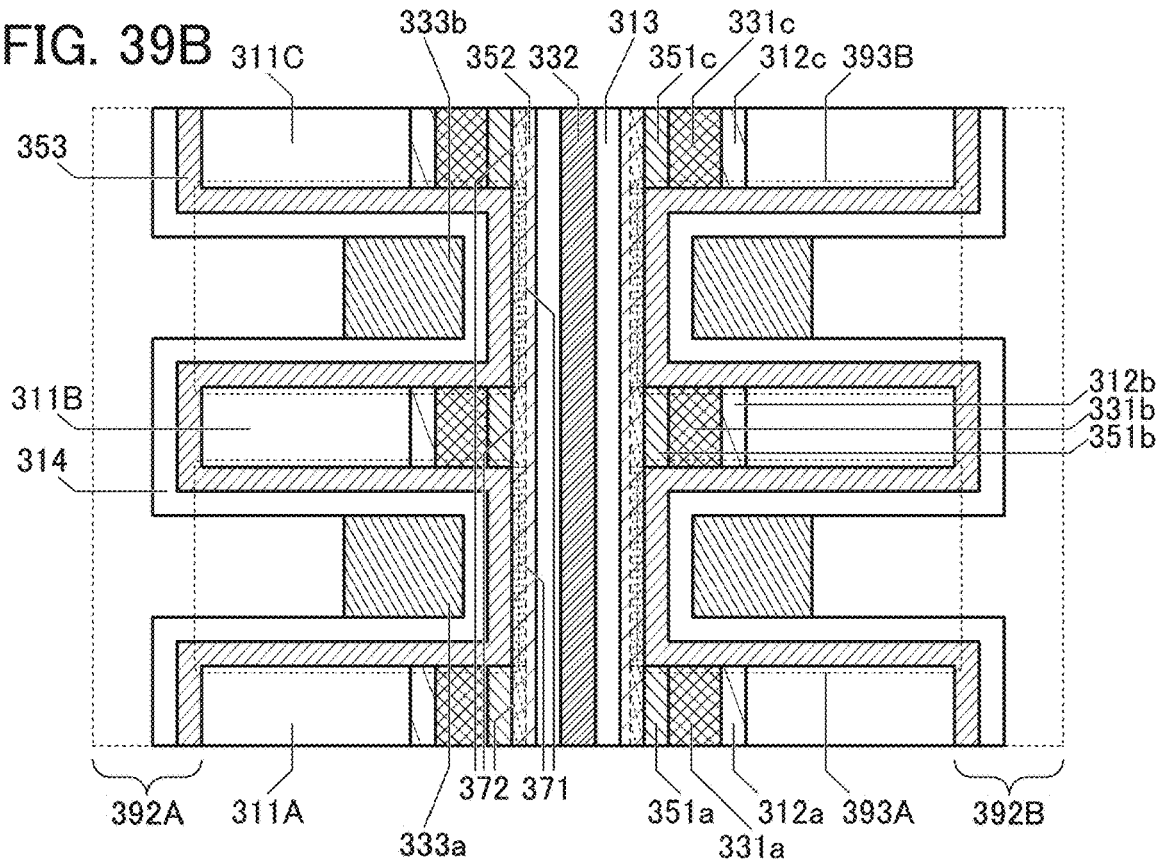

In the subsequent step, as illustrated in FIG. 39B, in order that the conductor 333 is left in parts of the aforementioned depressed portion 393A and depressed portion 393B, the conductor 333 in the other part of the depressed portion 393A and the depressed portion 393B and the conductor 333 included in the region 392A and the region 392B are removed by formation of a resist mask, etching treatment, and the like. Thus, the conductor 333a is formed in the depressed portion 393A and the conductor 333b is formed in the depressed portion 393B.

The conductor 333a functions as a floating gate electrode of the cell transistor CTrA, as described above. The conductor 333b functions as a floating gate electrode of the cell transistor CTrB, as described above.

Note that the description of FIG. 32B is referred to for the resist mask formation, the etching treatment, or the like.

Note that in FIG. 39B, each of the thicknesses of the conductor 333a and the conductor 333b is illustrated larger than each of the thicknesses of the material layer 351a (the material layer 351b and the material layer 351c), the conductor 331a (the conductor 331b and the conductor 331c), and the insulator 312a (the insulator 312b and the insulator 312c), for example, but the semiconductor device of one embodiment of the present invention is not limited to this. In the subsequent step, the thickness of the conductor 333a for filling part of the depressed portion 393A may be increased as long as the insulator 315 and the conductor 334a are formed in the depressed portion 393A. In addition, the thickness of the conductor 333a may be reduced as long as the conductor 333a functions as a floating gate electrode. Similarly, in the subsequent step, the thickness of the conductor 333b for filling part of the depressed portion 393B may be increased as long as the insulator 315 and the conductor 334b are formed in the depressed portion 393B, and the thickness of the conductor 333b may be reduced as long as the conductor 333b functions as a floating gate electrode.

Figure 40A:
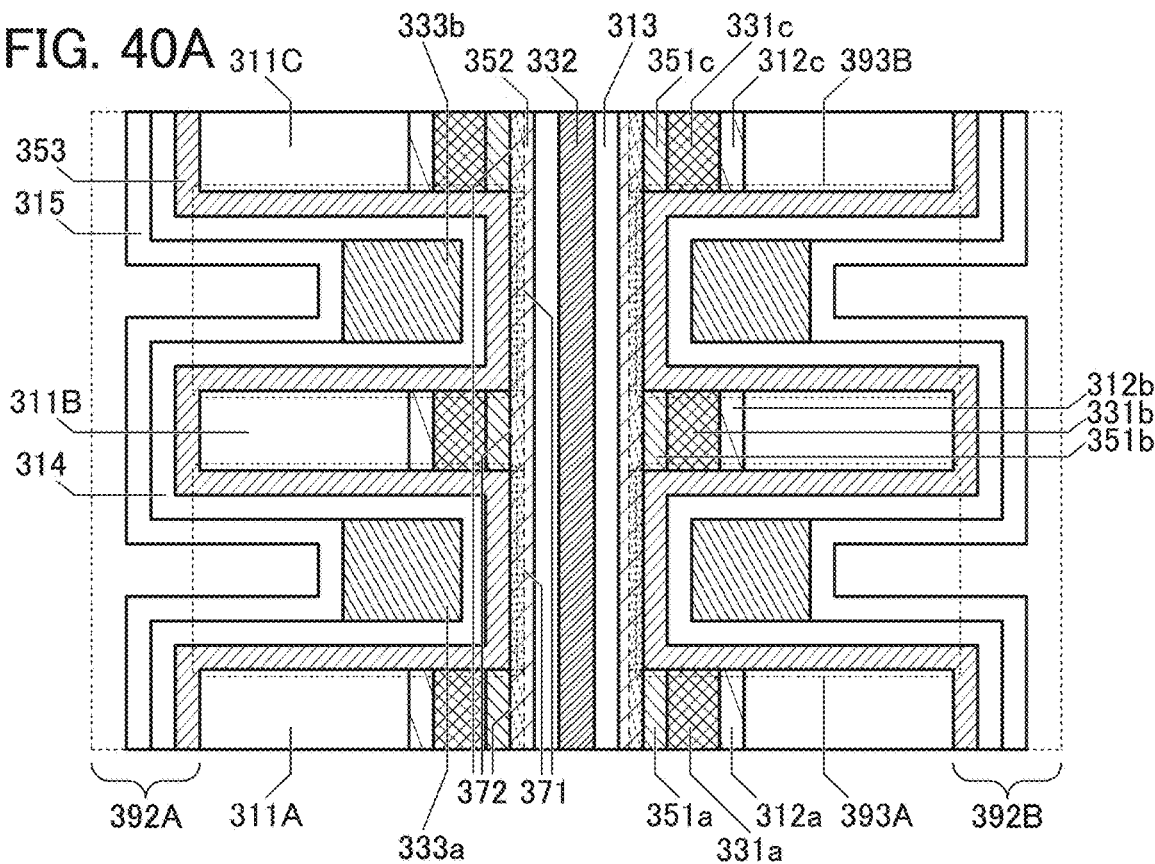
FIG. 40A and FIG. 40B are cross-sectional views illustrating an example of manufacturing a semiconductor device.

In the subsequent step, as illustrated in FIG. 40A, the insulator 315 is formed on side surfaces of the openings in the region 392A and the region 392B and in the formed depressed portions illustrated in FIG. 39B. That is, the insulator 315 is formed on the formation surface of the conductor 333a, the formation surface of the conductor 333b, and the formation surface of the insulator 314.

The insulator 315 functions as the gate insulating film of the cell transistor CTrA and the cell transistor CTrB as described above.

It is preferable to use silicon oxide or silicon oxynitride for the insulator 315, for example. Alternatively, for the insulator 315, aluminum oxide, hafnium oxide, or oxide containing aluminum and hafnium can be used, for example. The insulator 315 may be an insulator including a stack of any of the above. The insulator 315 is preferably thicker than the insulator 314. When the insulator 315 is made thicker than the insulator 314, charge can be moved from the material layer 353 to the conductor 333a and the conductor 333b through the insulator 314.

Figure 40B:
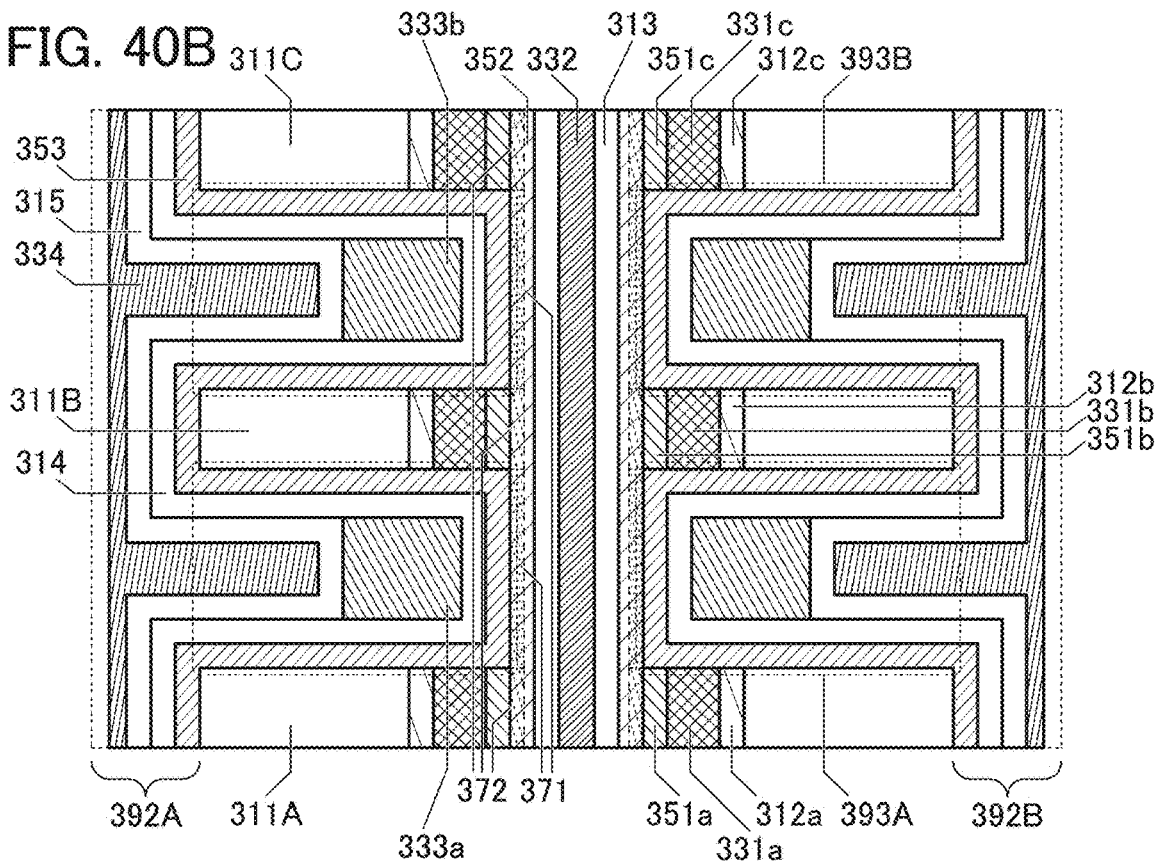

In the subsequent step, as illustrated in FIG. 40B, the conductor 334 is formed on side surfaces of the openings in the region 392A and the region 392B and in the formed depressed portions illustrated in FIG. 39A. That is, the conductor 334 is formed on the formation surface of the insulator 315.

For the conductor 334, any of the materials usable for the aforementioned conductor 332 can be used, for example.

Figure 41:
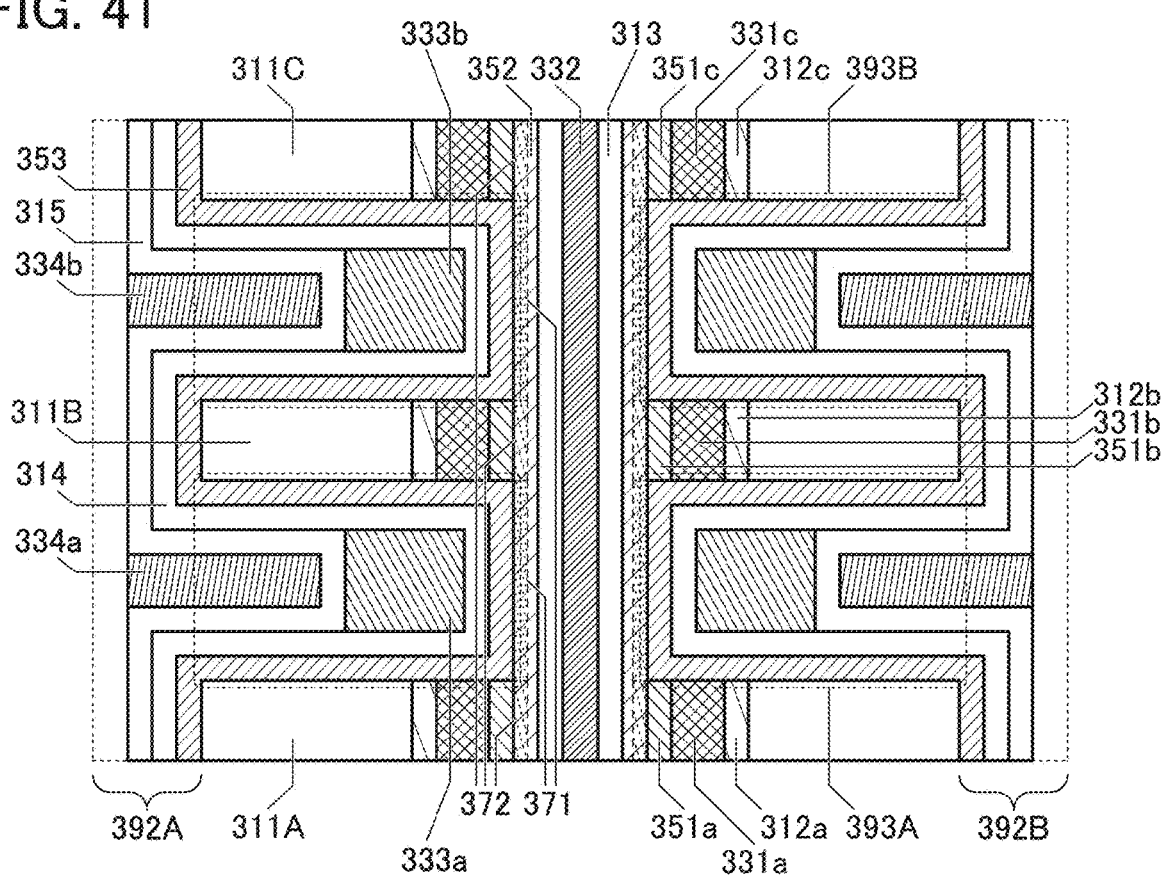
FIG. 41 is a cross-sectional view illustrating an example of manufacturing a semiconductor device.

In the next step, as illustrated in FIG. 41, the conductor 334 included in the region 392A and the region 392B is removed by resist mask formation, etching treatment, and the like such that the conductor 334 remains only in the aforementioned depressed portions. Thus, the conductor 334a and the conductor 334b are formed. At this time, an exposed portion of the insulator 315 may be removed.

Note that the description of FIG. 32B is referred to for the resist mask formation, the etching treatment, and the like.

The conductor 334a functions as a gate electrode of the cell transistor CTrA and a word line that supplies a potential to the gate electrode, as described above. The conductor 334b functions as a gate electrode of the cell transistor CTrB and a word line that supplies a potential to the gate electrode, as described above.

In the subsequent step, the insulator 316A is deposited to fill the opening in the region 392A, and the insulator 316B is deposited to fill the opening in the region 392B, as illustrated in FIG. 28A.

Any of the above materials usable for the insulators 313 can be used for the insulator 316A and the insulator 316B, for example.

Through the above steps, the semiconductor device illustrated in FIG. 28A can be manufactured.

<Structure Example 10 of Semiconductor Device>

A structure example of the semiconductor device of one embodiment of the present invention which functions as a storage device is not limited to the structure illustrated in FIG. 28, FIG. 29A, and FIG. 29B. The semiconductor device can have a structure which is changed from the structure illustrated in FIG. 28, FIG. 29A, and FIG. 29B as appropriate depending on the case, the circumstances, or the necessity.

Figure 42A:
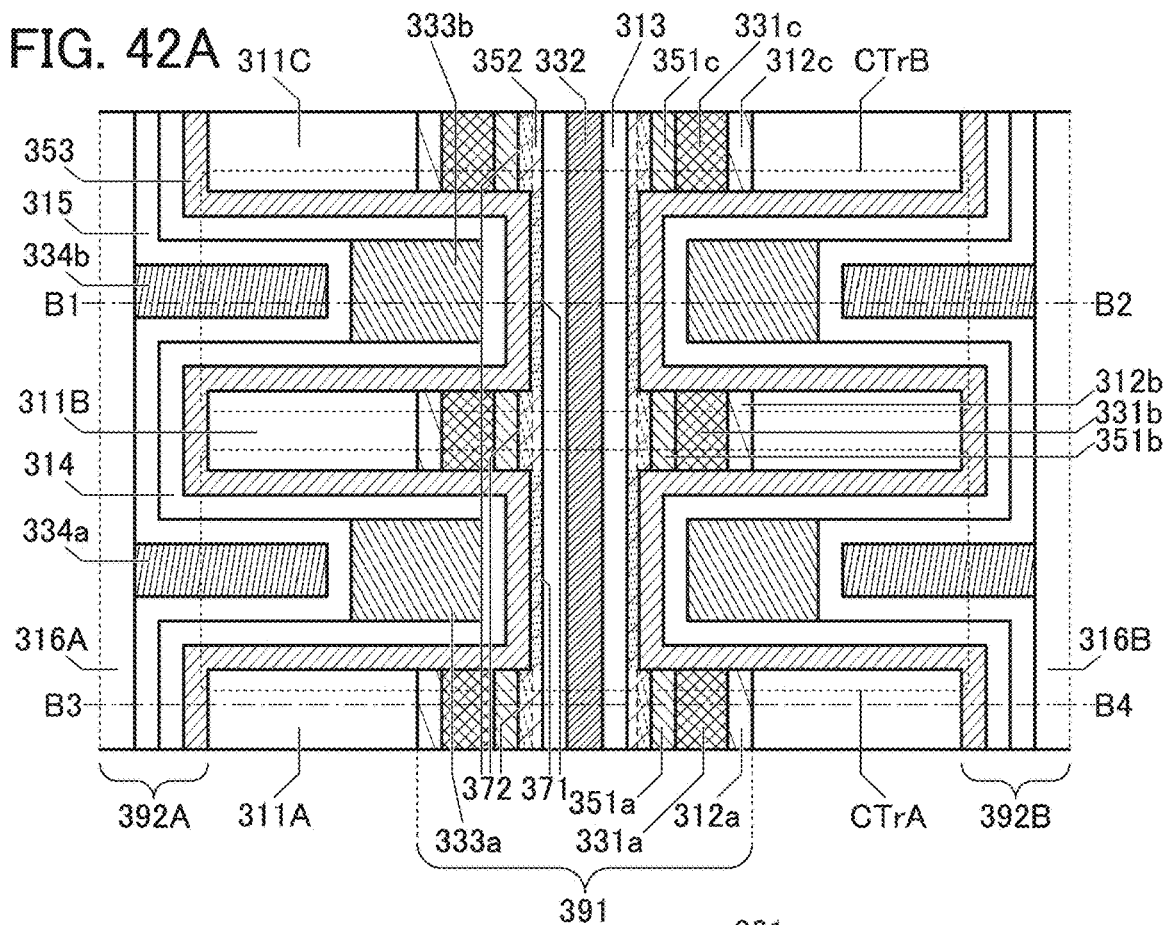
FIG. 42A is a cross-sectional view illustrating a structure example of a semiconductor device and FIG. 42B is a cross-sectional view illustrating an example of manufacturing a semiconductor device.
Figure 42B:
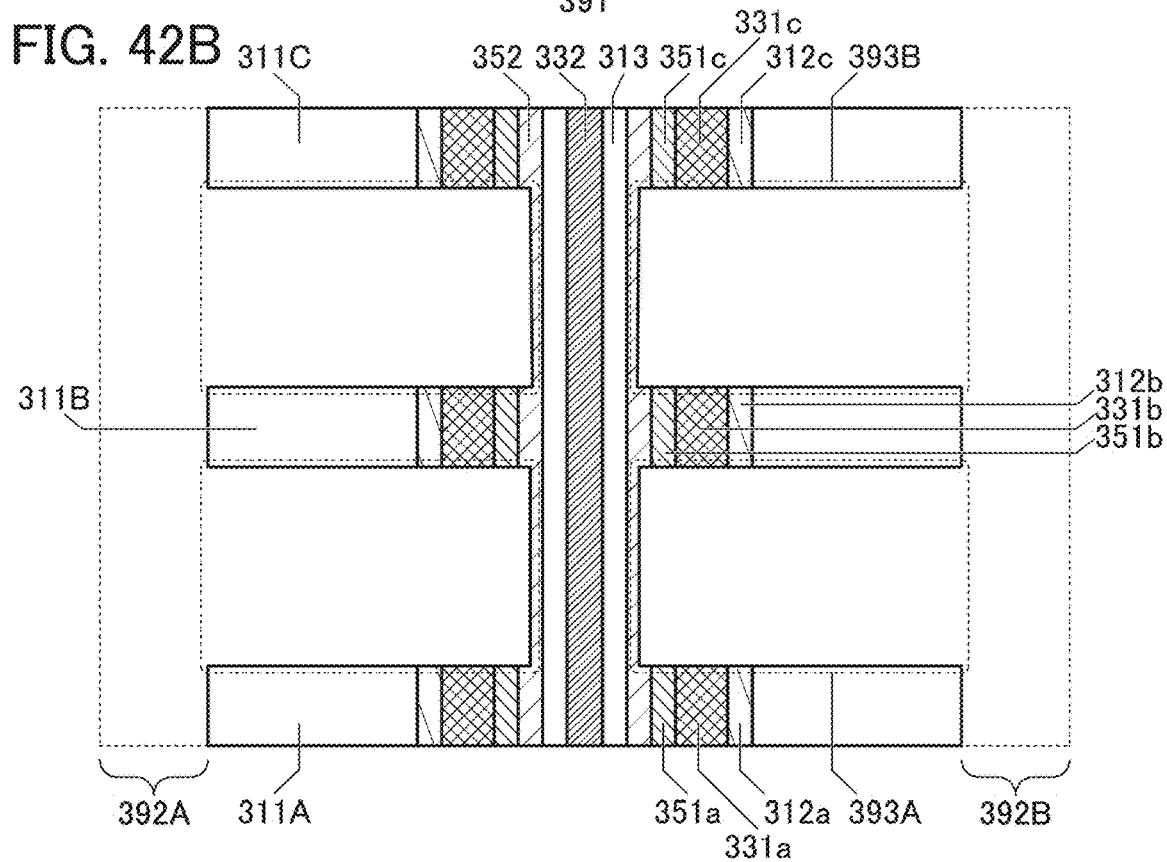
Figure 43A:
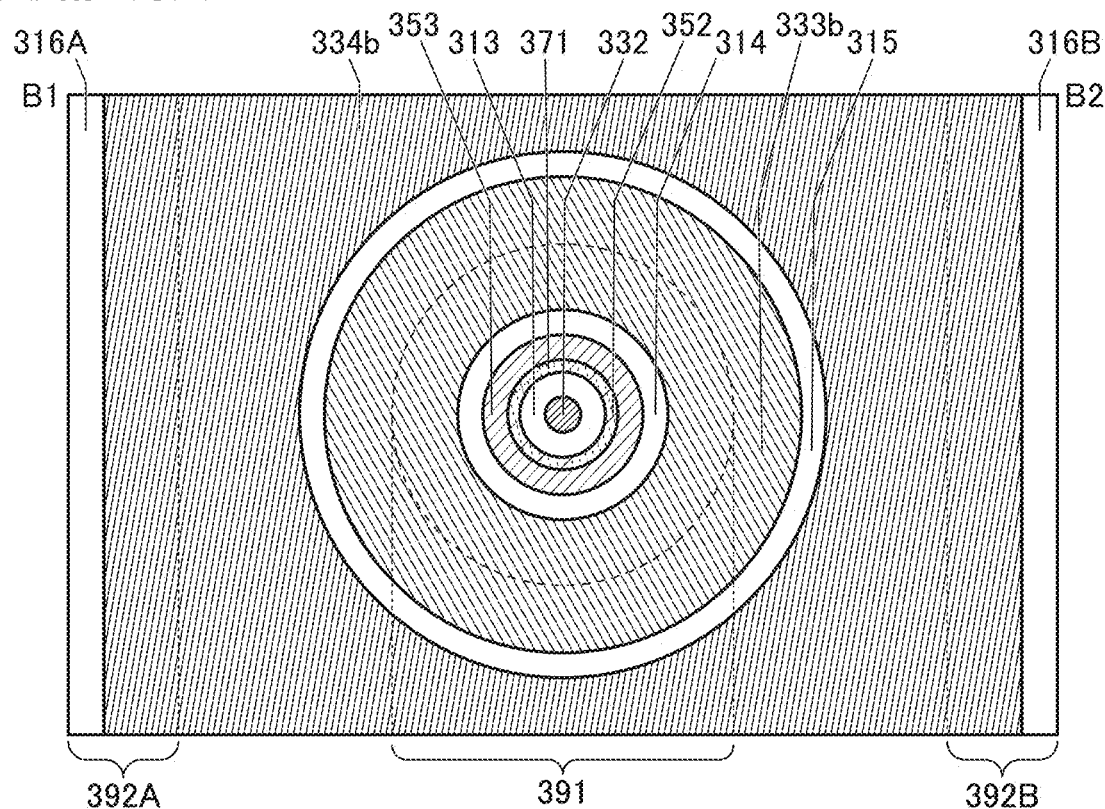
FIG. 43A and FIG. 43B are top views illustrating a structure example of a semiconductor device.
Figure 43B:
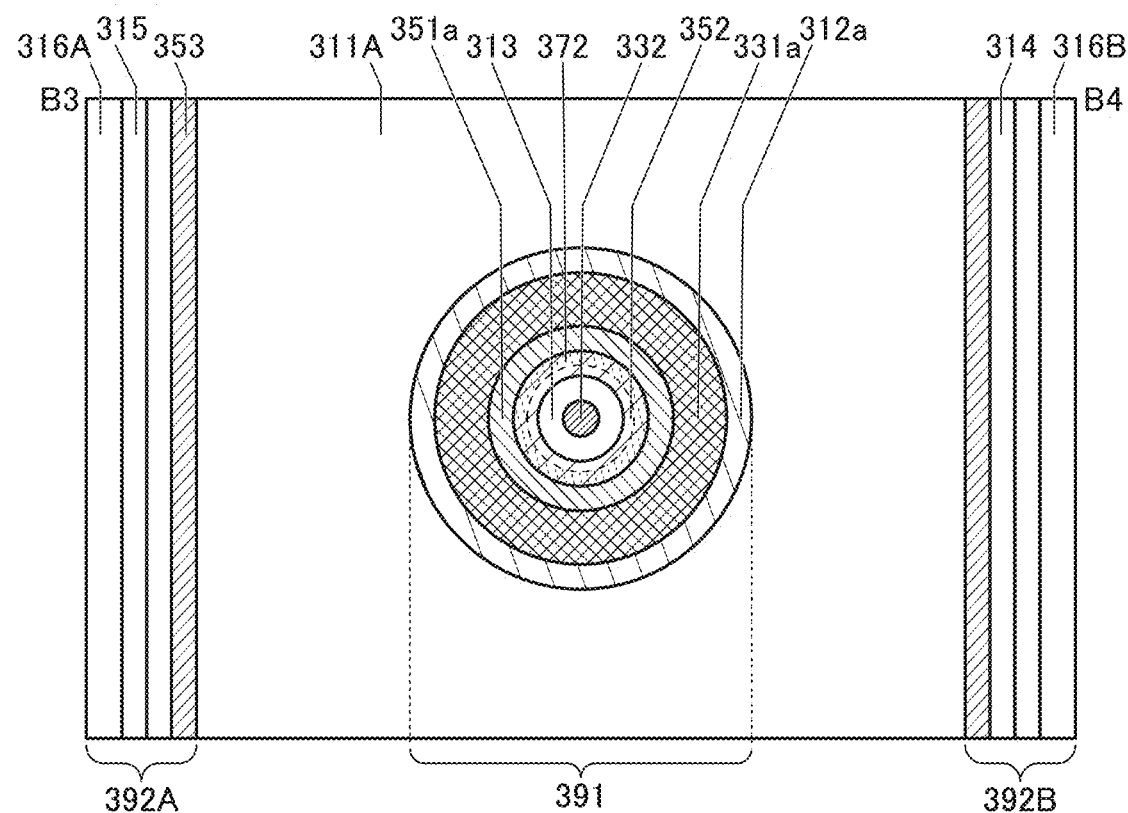

For example, the structure of the semiconductor device in FIG. 28, FIG. 29A, and FIG. 29B may be changed to the structure of the semiconductor device illustrated in FIG. 42A, FIG. 43A, and FIG. 43B. FIG. 42A is a cross-sectional view of a semiconductor device having a structure different from that in FIG. 28, FIG. 29A, and FIG. 29B. FIG. 43A is a top view taken along the dashed-dotted line B1-B2 in FIG. 42, and FIG. 43B is a top view taken along the dashed-dotted line B3-B4 in FIG. 42. Note that for simplification of the drawings, some components are omitted in the cross-sectional view of FIG. 42, the top view of FIG. 43A, and the top view of FIG. 43B.

The step illustrated in FIG. 42B is performed instead of the step illustrated in FIG. 36B for the semiconductor device in FIG. 42A, FIG. 43A, and FIG. 43B, and the material layer 352 is partly removed by etching treatment or the like as long as the insulator 313 is not exposed in the depressed portion 393A and the depressed portion 393B. Thus, the material layer 352 in the semiconductor device of one embodiment of the present invention may have different thicknesses in the region 371 of the material layer 352 where the depressed portion 393A and the depressed portion 393B are formed and the region 372 of the material layer 352 which overlaps with the conductor 331a (the conductor 331b and the conductor 331c).

<Structure Example 11 Semiconductor Device>

Figure 44:
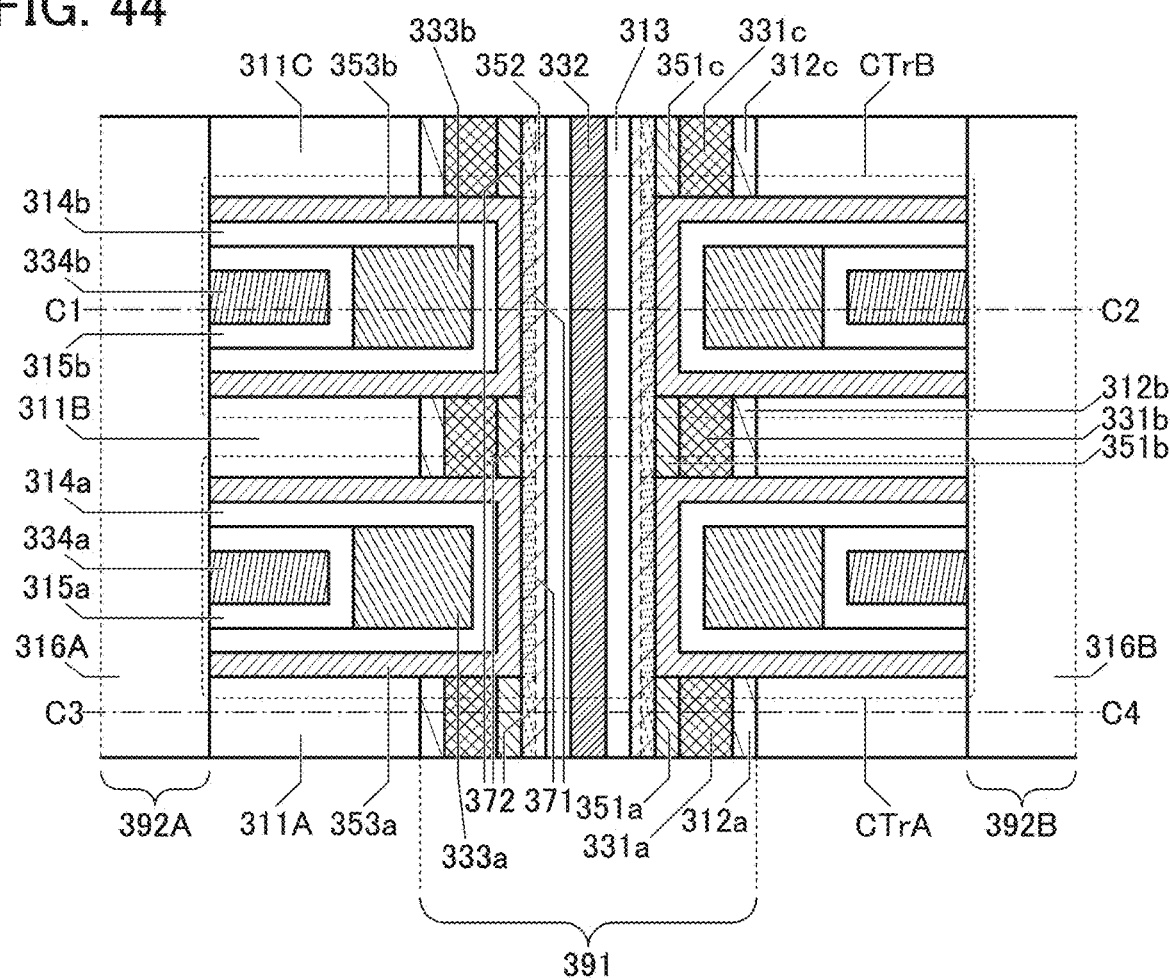
FIG. 44 is a cross-sectional view illustrating a structure example of a semiconductor device.
Figure 45A:
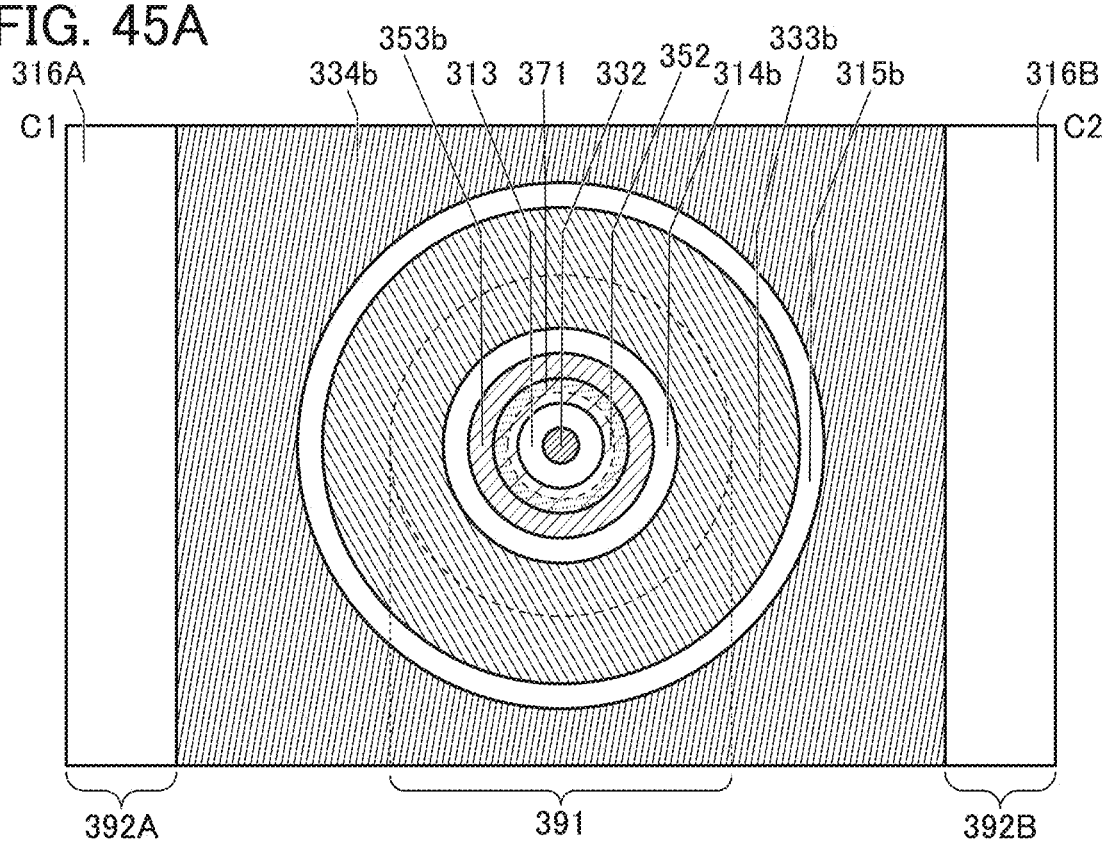
FIG. 45A and FIG. 45B are top views illustrating a structure example of a semiconductor device.
Figure 45B:
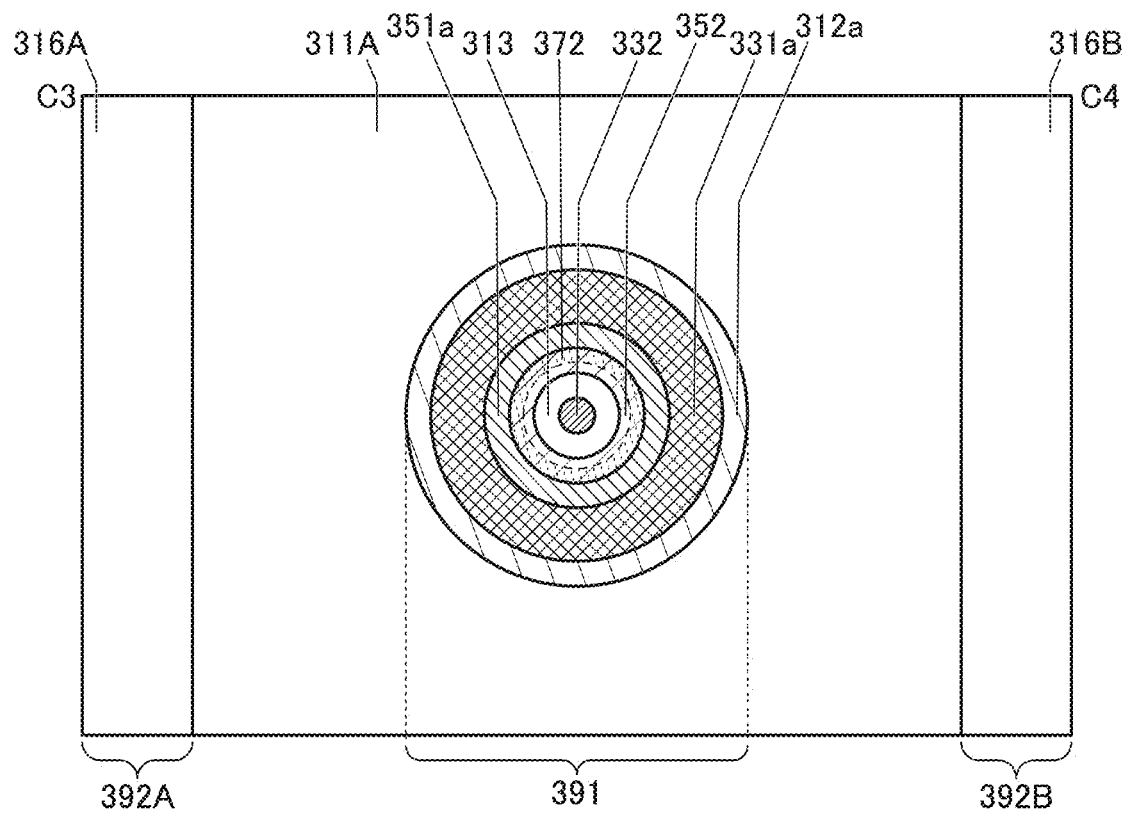

For example, the structure of the semiconductor device in FIG. 28, FIG. 29A, and FIG. 29B may be changed to the structure of the semiconductor device illustrated in FIG. 44, FIG. 45A, and FIG. 45B. FIG. 44 is a cross-sectional view of a semiconductor device having a structure different from that in FIG. 28, FIG. 29A, and FIG. 29B. FIG. 45A is a top view taken along the dashed-dotted line C1-C2 in FIG. 44, and FIG. 45B is a top view taken along the dashed-dotted line C3-C4 in FIG. 44. Note that for simplification of the drawings, some components are omitted in the cross-sectional view of FIG. 44, the top view of FIG. 45A, and the top view of FIG. 45B.

In the semiconductor device in FIG. 44, FIG. 45A, and FIG. 45B, after the step illustrated in FIG. 40B, the material layer 353, the insulator 314, the insulator 315, and the conductor 334 included in the region 392A and the region 392B are removed by resist mask formation, etching treatment, or the like, and the insulator 316A is deposited to fill the opening in the region 392A and the insulator 316B is deposited to fill the opening in the region 392B.

That is, in the semiconductor device in FIG. 44, FIG. 45A, and FIG. 45B, after the step illustrated in FIG. 40B, the insulator 314, the insulator 315, and the material layer 353 are removed such that the conductor 334a and the conductor 334b are left. At this time, the insulator 311A to the insulator 311C may be partly removed. Note that FIG. 44 illustrates a structure in which a material layer 353a, an insulator 314a, an insulator 315a, and the conductor 334a are formed in the depressed portion 393A and a material layer 353b, an insulator 314b, an insulator 315b, and the conductor 334b are formed in the depressed portion 393B.

Note that etching treatment or the like after the step illustrated in FIG. 40B may be performed until part of the insulator 315 is removed and the insulator 314 is exposed in the opening in the region 392A or until part of the insulator 314 is removed and the material layer 353 is exposed in the opening in the region 392A, and the insulator 316A and the insulator 316B in FIG. 28 may be formed on the side surfaces of the openings in the region 392A and the region 392B (not illustrated).

Note that the description of FIG. 32B is referred to for the resist mask formation, the etching treatment, and the like.

<Structure Example 12 of Semiconductor Device>

Figure 46:
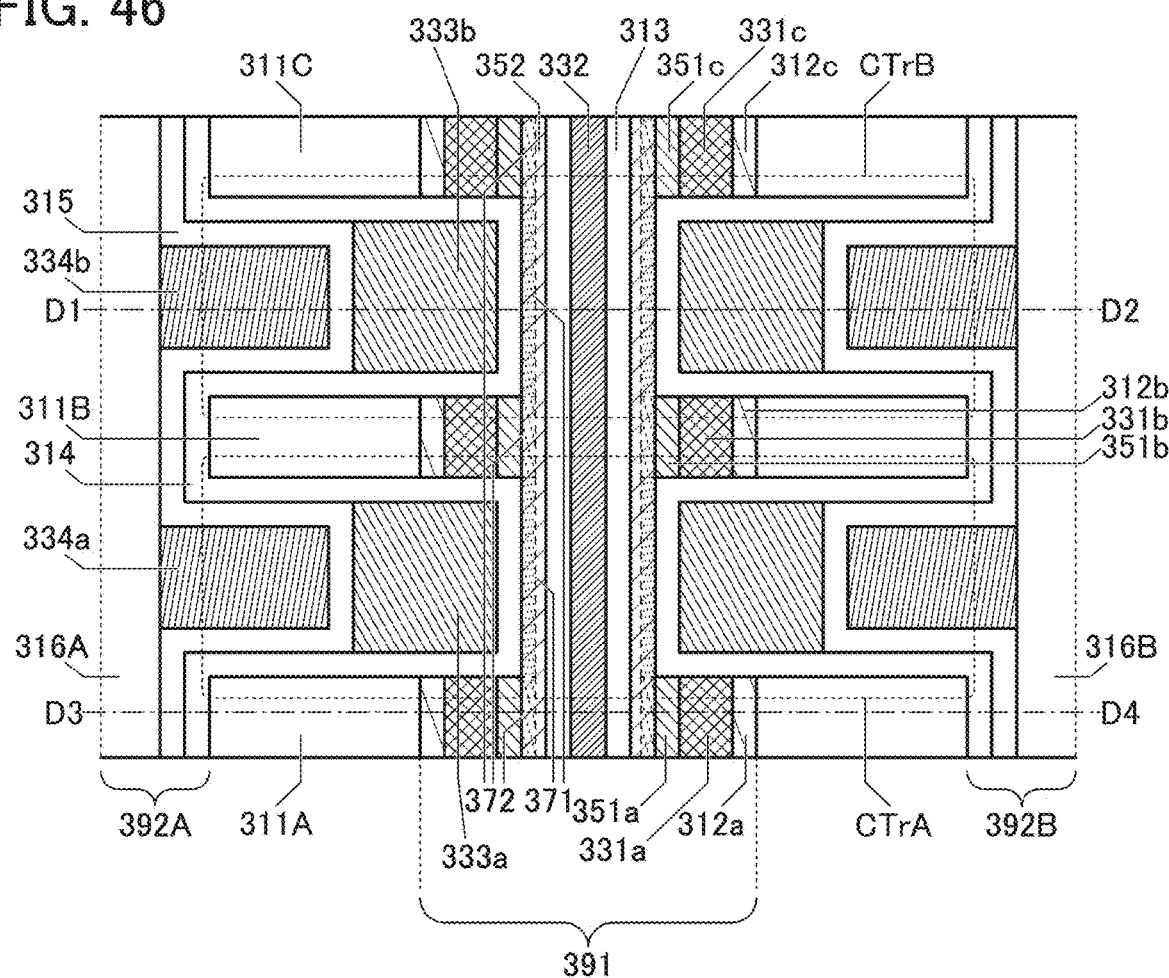
FIG. 46 is a cross-sectional view illustrating a structure example of a semiconductor device.
Figure 47A:
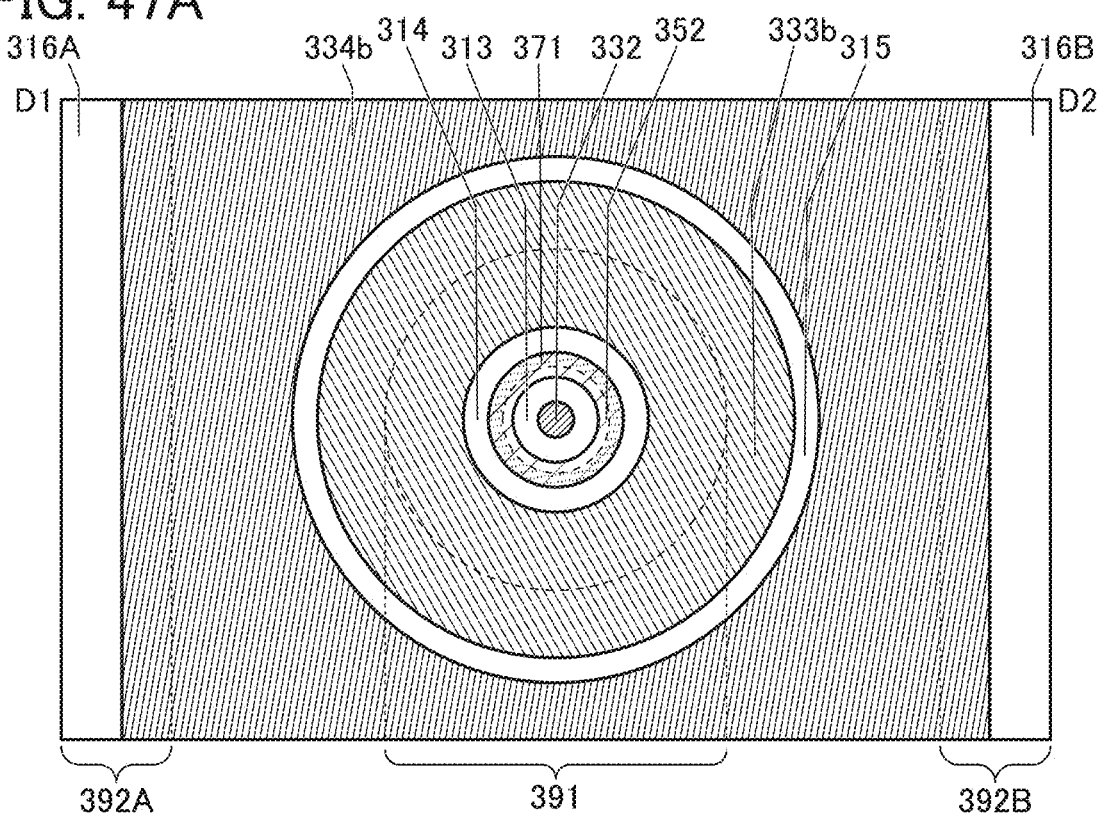
FIG. 47A and FIG. 47B are top views illustrating a structure example of a semiconductor device.
Figure 47B:
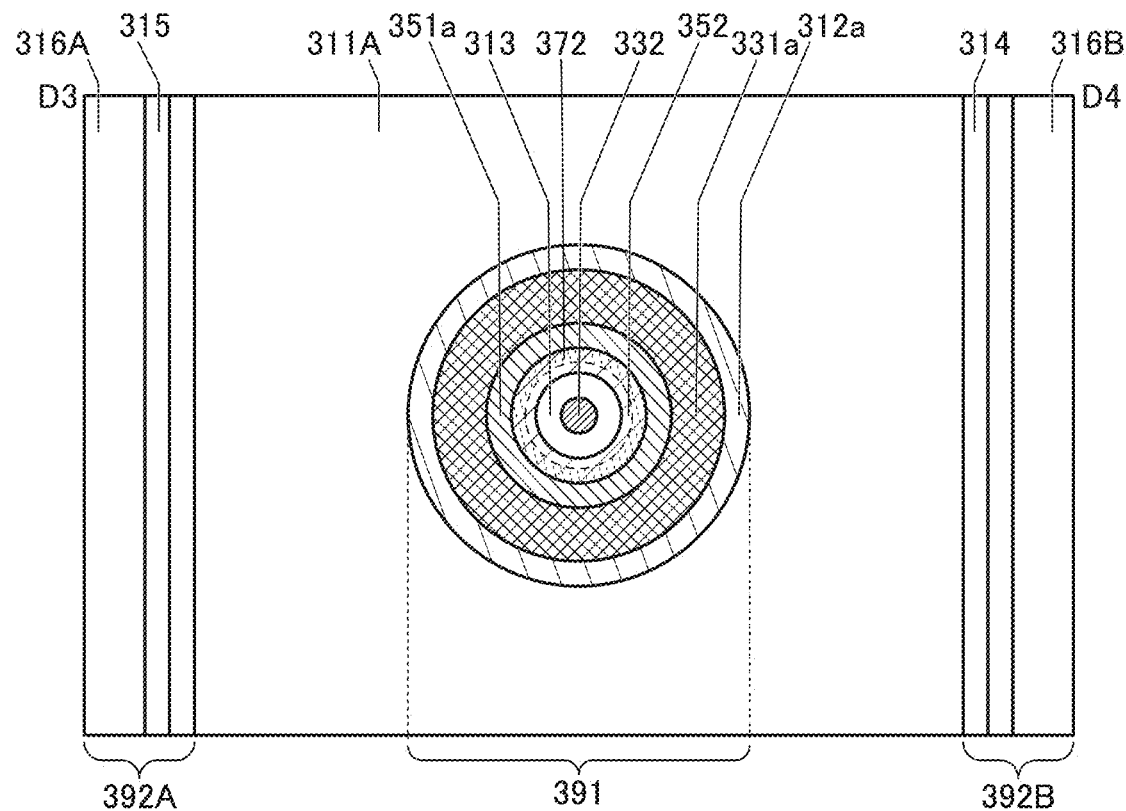

For example, the structure of the semiconductor device in FIG. 28, FIG. 29A, and FIG. 29B may be changed to the structure of the semiconductor device illustrated in FIG. 46, FIG. 47A, and FIG. 47B. FIG. 46 is a cross-sectional view of a semiconductor device having a structure different from that in FIG. 28, FIG. 29A, and FIG. 29B. FIG. 47A is a top view taken along the dashed-dotted line D1-D2 in FIG. 46, and FIG. 47B is a top view taken along the dashed-dotted line D3-D4 in FIG. 46. Note that for simplification of the drawings, some components are omitted in the cross-sectional view of FIG. 46, the top view of FIG. 47A, and the top view of FIG. 47B.

For the semiconductor device in FIG. 46, FIG. 47A, and FIG. 47B, in the step illustrated in FIG. 36B or FIG. 37A, the step in FIG. 38B and the subsequent steps are performed without performing a step of forming the material layer 353 in FIG. 37A. In the case where the insulator 314 adequately functions as a barrier insulating film to prevent impurities from diffusing into the material layer 352, the material layer 353 is not necessarily provided. In that case, there is no need to provide the material layer 353; thus, the process of manufacturing the semiconductor device can be shortened.

<Structure Example 13 of Semiconductor Device>

Figure 48:
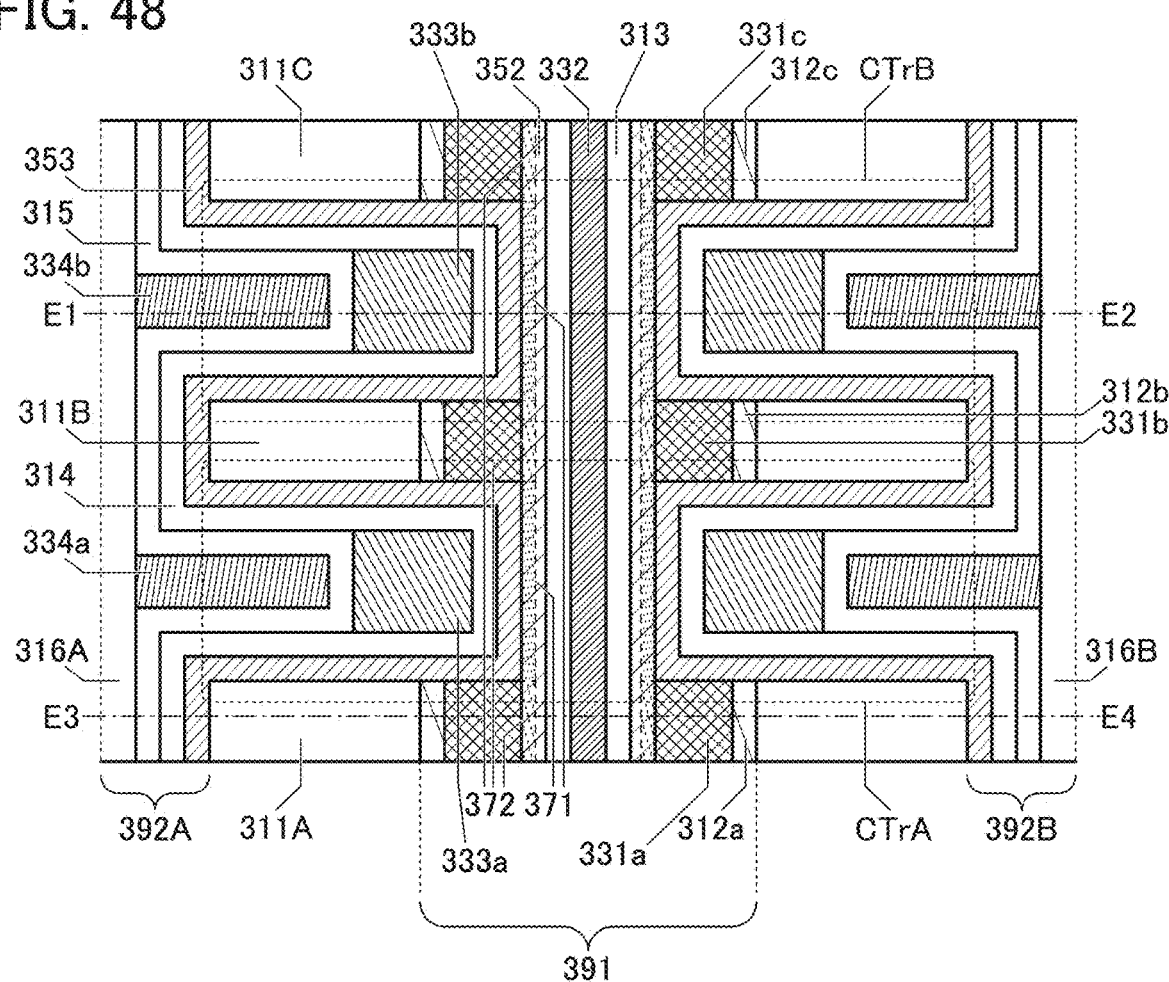
FIG. 48 is a cross-sectional view illustrating a structure example of a semiconductor device.
Figure 49:
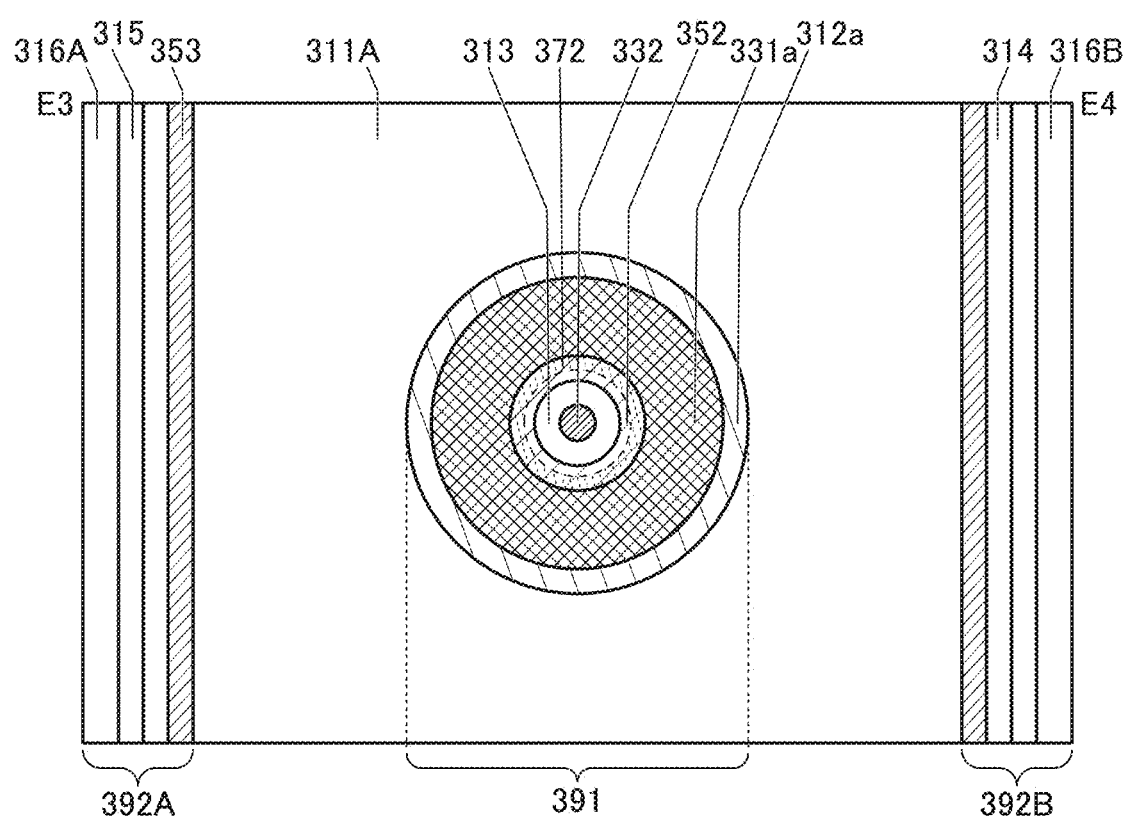
FIG. 49 is a top view illustrating a structure example of a semiconductor device.

For example, the structure of the semiconductor device in FIG. 28, FIG. 29A, and FIG. 29B may be changed to the structure of the semiconductor device illustrated in FIG. 48 and FIG. 49. FIG. 48 is a cross-sectional view of a semiconductor device having a structure different from that in FIG. 28, FIG. 29A, and FIG. 29B. FIG. 49 is a top view of a portion taken along the dashed-dotted line E3-E4 in FIG. 48. Note that the top view of the portion taken along the dashed-dotted line E1-E2 in FIG. 48 has substantially the same structure as that of FIG. 29A in some cases. Note that for clarity of the drawing, some components are not illustrated in the cross-sectional view of FIG. 48 and the top view of FIG. 49.

For the semiconductor device in FIG. 48 and FIG. 49, in the step illustrated in FIG. 33B, the step in FIG. 34B and the subsequent steps are performed without performing a step of forming the material layer 351 in FIG. 34A. In the case where a component, impurities, and the like contained in the material layer 352 do not diffuse into the conductor 331a (the conductor 331b and the conductor 331c) and thus the conductivity of the conductor 331a (the conductor 331b and the conductor 331c) does not decrease, the material layer 351 which functions as a barrier film with respect to the component and the impurities is not necessarily provided. In that case, there is no need to provide the material layer 351; thus, the process of manufacturing the semiconductor device can be shortened.

<Structure Example 14 of Semiconductor Device>

Figure 50:
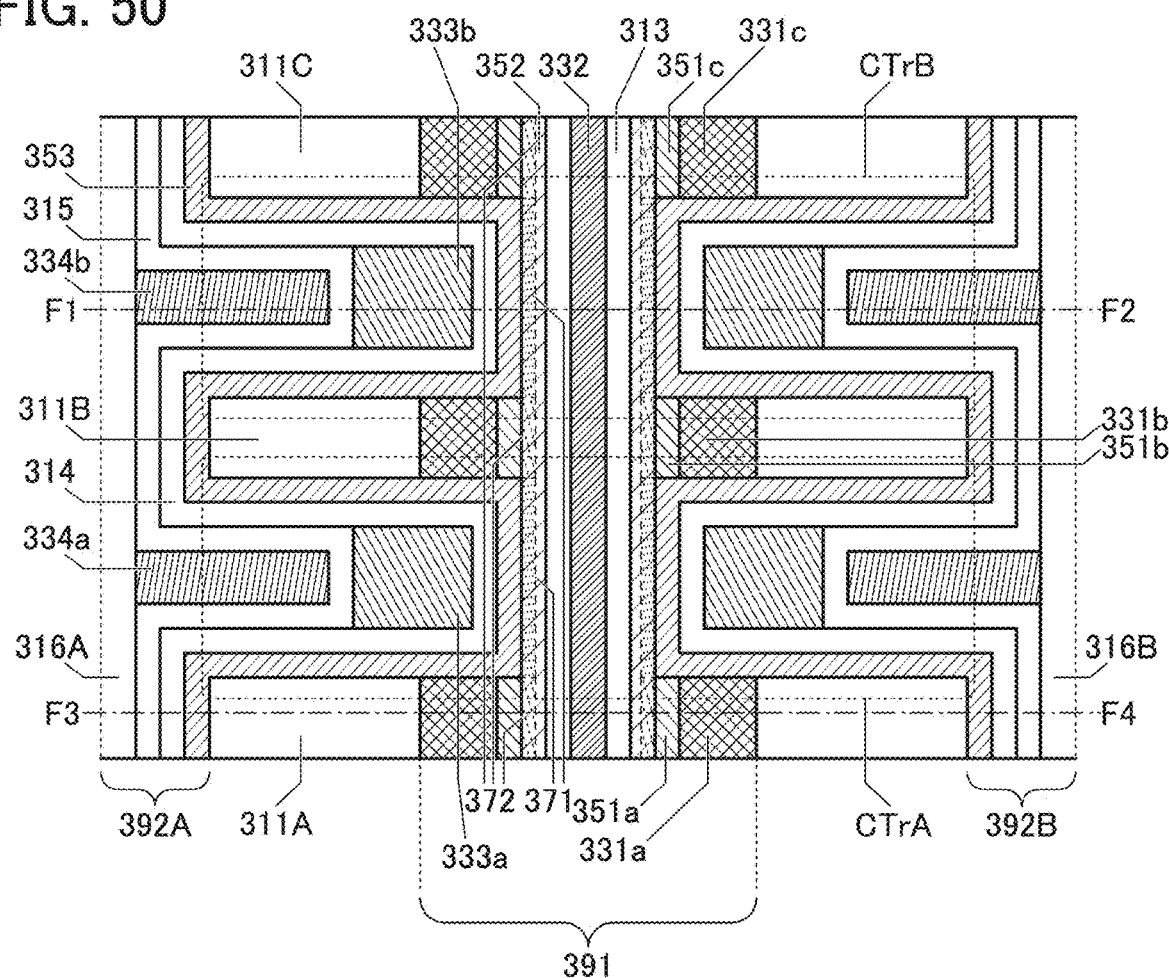
FIG. 50 is a cross-sectional view illustrating a structure example of a semiconductor device.
Figure 51:
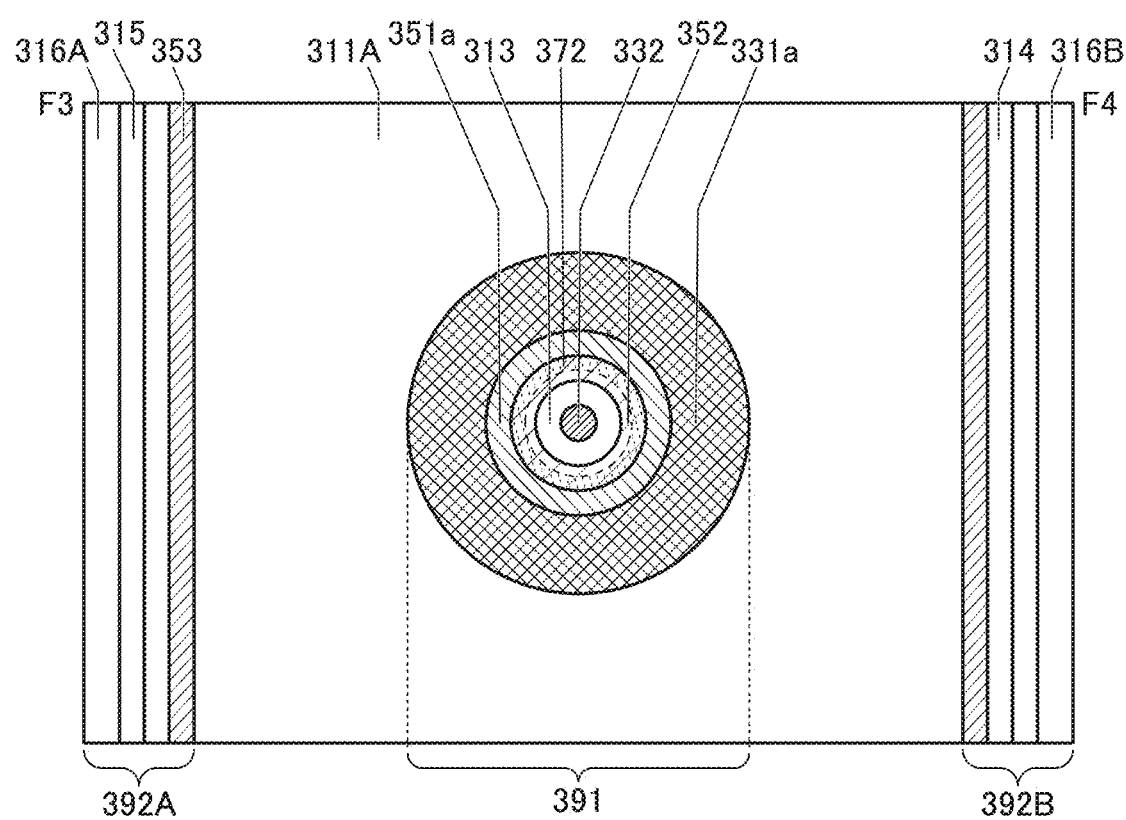
FIG. 51 is a top view illustrating a structure example of a semiconductor device.

For example, the structure of the semiconductor device in FIG. 28, FIG. 29A, and FIG. 29B may be changed to the structure of the semiconductor device illustrated in FIG. 50 and FIG. 51. FIG. 50 is a cross-sectional view of a semiconductor device having a structure different from that in FIG. 28, FIG. 29A, and FIG. 29B. FIG. 51 is a top view of a portion taken along the dashed-dotted line F3-F4 in FIG. 50. Note that the top view of the portion taken along the dashed-dotted line F1-F2 in FIG. 50 has substantially the same structure as that of FIG. 29A in some cases. Note that for clarity of the drawing, some components are not illustrated in the cross-sectional view of FIG. 50 and the top view of FIG. 51.

For the semiconductor device in FIG. 50 and FIG. 51, in the step illustrated in FIG. 32B, the step in FIG. 33B and the subsequent steps are performed without performing a step of forming the insulator 312 in FIG. 33A. In the case where a component, impurities, and the like contained in the insulator 311A (the insulator 311B and the insulator 311C) do not diffuse into the conductor 331a (the conductor 331b and the conductor 331c) and thus the conductivity of the conductor 331a (the conductor 331b and the conductor 331c) does not decrease, the insulator 312 which functions as a barrier insulating film with respect to the component and the impurities is not necessarily provided. In that case, there is no need to provide the insulator 312; thus, the process of manufacturing the semiconductor device can be shortened.

<Structure Example 15 of Semiconductor Device>

Figure 52:
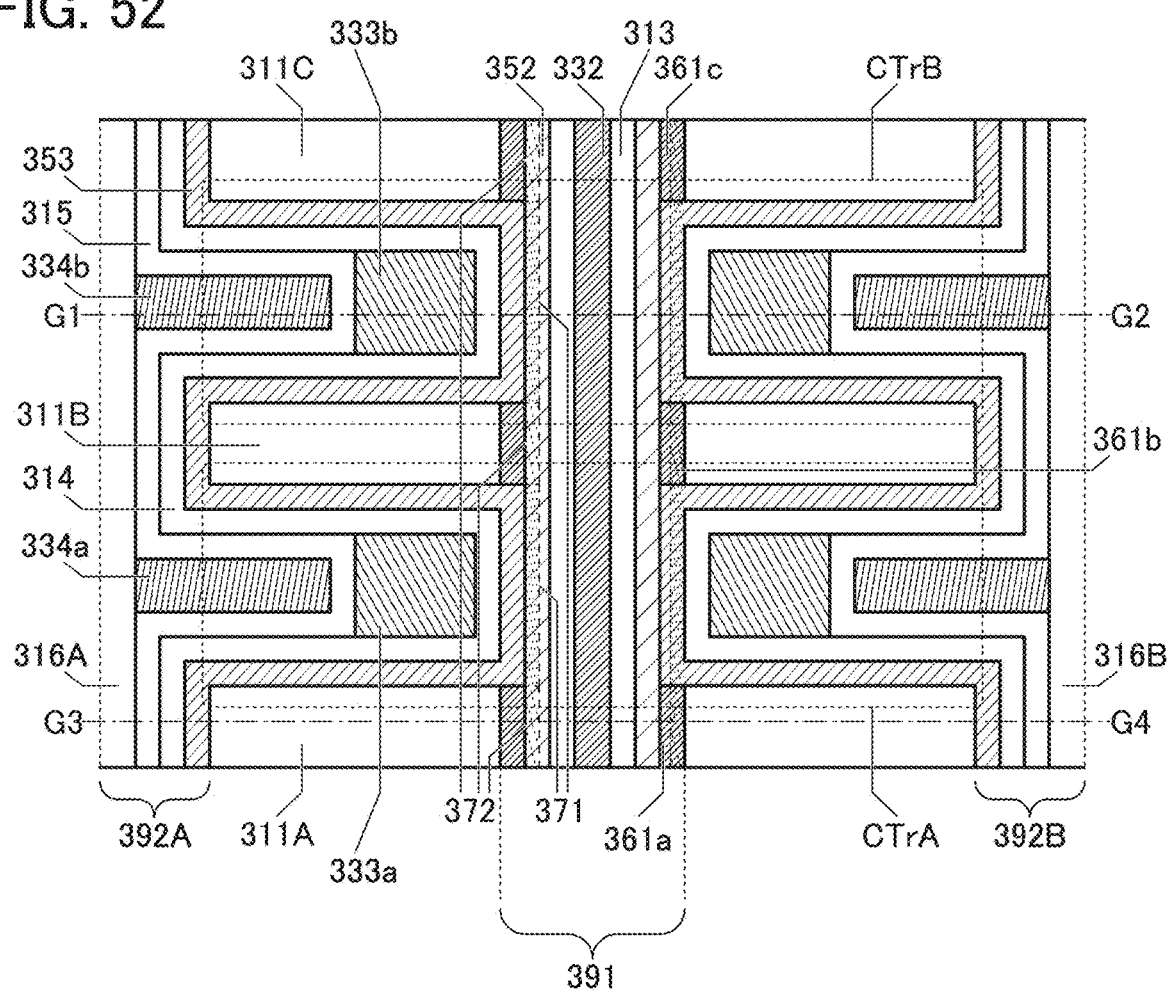
FIG. 52 is a cross-sectional view illustrating a structure example of a semiconductor device.
Figure 53:
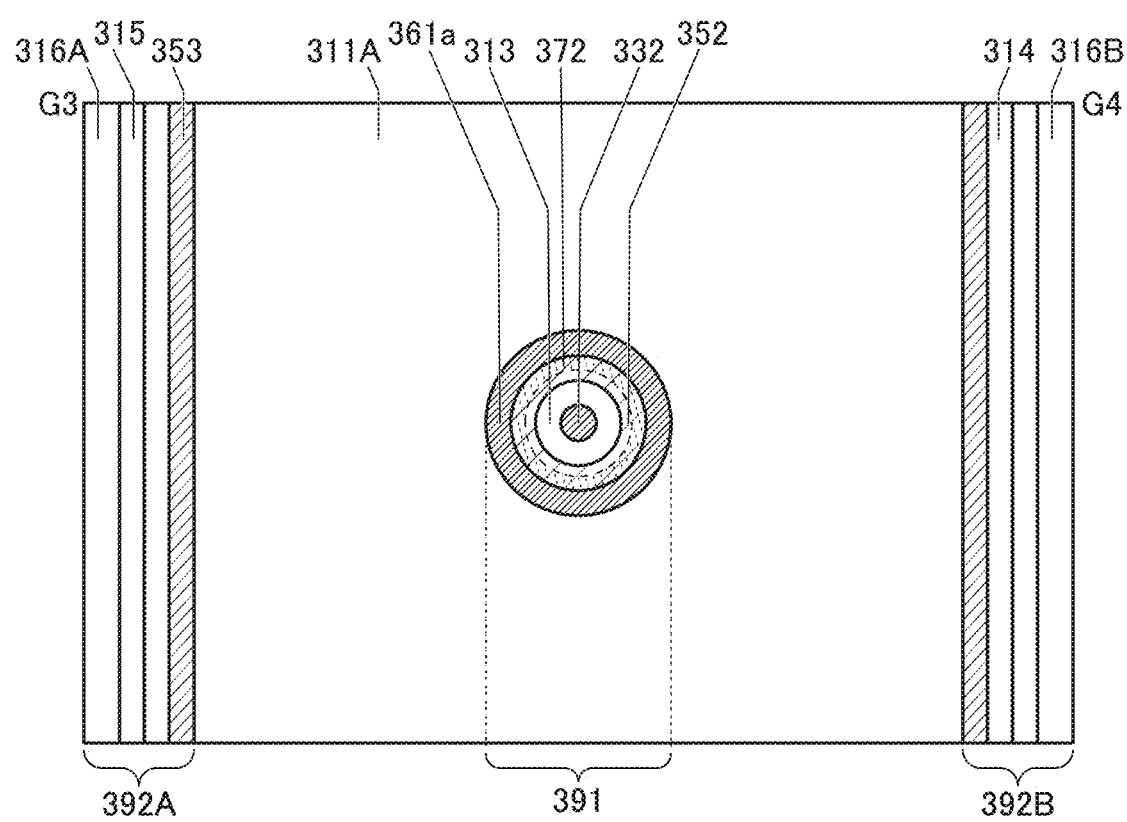
FIG. 53 is a top view illustrating a structure example of a semiconductor device.

For example, the structure of the semiconductor device in FIG. 28, FIG. 29A, and FIG. 29B may be changed to the structure of the semiconductor device illustrated in FIG. 52 and FIG. 53. FIG. 52 is a cross-sectional view of a semiconductor device having a structure different from that in FIG. 28, FIG. 29A, and FIG. 29B. FIG. 53 is a top view of a portion taken along the dashed-dotted line G3-G4 in FIG. 52. Note that the top view of the portion taken along the dashed-dotted line G1-G2 in FIG. 52 has substantially the same structure as that of FIG. 29A in some cases. Note that for clarity of the drawing, some components are not illustrated in the cross-sectional view of FIG. 52 and the top view of FIG. 53.

For the semiconductor device in FIG. 52 and FIG. 53, a conductor is formed on the side surface of the opening in the region 391 in the step illustrated in FIG. 32B, and the step in FIG. 34B and the subsequent steps are performed without performing the steps from FIG. 33A to FIG. 34A. Note that a region in the conductor is removed in the step of forming the depressed portion 393A and the depressed portion 393B in FIG. 36B. Thus, a conductor 361a, a conductor 361b, and a conductor 361c illustrated in FIG. 52 are formed.

For the conductor 361a, the conductor 361b, and the conductor 361c, a conductive material that forms a low-resistance region in the vicinity of an interface with the material layer 352 is preferably used.

In the case where a material containing metal oxide is, for example, used for the material layer 352, metal, nitride containing a metal element, or oxide containing a metal element with a resistance value lower than or equal to $2.4 \times 10^3$ [Ω/sq.], preferably lower than or equal to $1.0 \times 10^3$ [Ω/sq.] is used for the conductor 361a, the conductor 361b, and the conductor 361c. For the conductive material, it is possible to use, for example, a metal film of aluminum, ruthenium, titanium, tantalum, tungsten, or chromium, a nitride film containing a metal element, such as Al—Ti nitride or titanium nitride, or an oxide film containing a metal element, such as indium tin oxide or In—Ga—Zn oxide.

The conductor 361a, the conductor 361b, and the conductor 361c are not limited to the above-described conductive materials as long as the material has a function of reducing the resistance of the material layer 352. For example, an insulator such as silicon nitride can be used as alternatives to the conductor 361a, the conductor 361b, and the conductor 361c in some cases.

When heat treatment is performed after the step in FIG. 36B of forming the depressed portion 393A and the depressed portion 393B together with the conductor 361a, the conductor 361b, and the conductor 361c, in a region of the material layer 352 in contact with the conductor 361a, the conductor 361b, and the conductor 361c, components contained in the conductor 361a, the conductor 361b, and the conductor 361c and a component contained in the material layer 352 sometimes form a compound in the vicinity of an interface between the material layer 352 and the conductor 361a, the conductor 361b, and the conductor 361c. This compound reduces the resistance of the region 372 of the material layer 352 in contact with the conductor 361a, the conductor 361b, and the conductor 361c.

The heat treatment may be performed in an atmosphere containing nitrogen. By the heat treatment, a metal element that is a component of the conductor 361a (the conductor 361b and the conductor 361c) might diffuse from the conductor 361a (the conductor 361b and the conductor 361c) to the material layer 352, or a metal element that is a component of the material layer 352 might diffuse to the conductor 361a (the conductor 361b and the conductor 361c), so that the material layer 352 and the conductor 361a, the conductor 361b, and the conductor 361c might form a metal compound. At this time, the metal element of the material layer 352 and the metal element of the conductor 361a, the conductor 361b, and the conductor 361c may be alloyed. When the metal element of the material layer 352 and the metal element of the conductor 361a, the conductor 361b, and the conductor 361c are alloyed, the metal elements become comparatively stable; thus, a highly reliable semiconductor device can be provided.

By the heat treatment, hydrogen in the material layer 352 diffuses into the region 372 of the material layer 352 in contact with the conductor 361a, the conductor 361b, and the conductor 361c, and becomes comparatively stable when entering oxygen vacancies in the region. Furthermore, by heat treatment at 250° C. or higher, hydrogen in the oxygen vacancies in the region 371 of the material layer 352 exposed in the depressed portion 393A and the depressed portion 393B is released from the oxygen vacancies, diffuses into the region 372, and enters oxygen vacancies in the region 372 of the material layer 352 to become comparatively stable. Thus, by the heat treatment, the resistance of the region 372 is further reduced, and the resistance of the region 371 is further increased by high purification (reduction of impurities such as water or hydrogen).

In the case where, for example, a material containing silicon is used for the material layer 352 and the material layer 352 is in contact with the conductor 361a, the conductor 361b, and the conductor 361c, impurities (elements, ions, or the like) contained in the conductor 361a, the conductor 361b, and the conductor 361c diffuse into the material layer 352 in some cases. At this time, depending on the circumstances or the case, heat treatment is preferably performed after the step in FIG. 36B of forming the depressed portion 393A and the depressed portion 393B together with the conductor 361a, the conductor 361b, and the conductor 361c. That is, an impurity region is formed at a surface of the material layer 352 in contact with the conductor 361a, the conductor 361b, and the conductor 361c and in the vicinity of the interface.

In the case where an impurity contained in the conductor 361a, the conductor 361b, and the conductor 361c is an n-type impurity (a donor), an n-type impurity region is sometimes formed in the region 372 of the material layer 352 or in the vicinity of the interface between the material layer 352 and the conductor 361a, the conductor 361b, and the conductor 361c. In contrast, in the case where an impurity contained in the conductor 361a, the conductor 361b, and the conductor 361c is a p-type impurity (an acceptor), a p-type impurity region is sometimes formed in the region 372 of the material layer 352 or in the vicinity of the interface between the material layer 352 and the conductor 361a, the conductor 361b, and the conductor 361c. Accordingly, carriers are formed in the region 372 of the material layer 352 or in the vicinity of an interface between the region 372 of the material layer 352 and the conductor 361a, the conductor 361b, and the conductor 361c, and the resistance of the region 372 is reduced in some cases.

By the heat treatment, the conductive material contained in the conductor 361a, the conductor 361b, and the conductor 361c and the component contained in the material layer 352 sometimes form metal silicide in the vicinity of the interface between the region 372 of the material layer 352 and the conductor 361a, the conductor 361b, and the conductor 361c. The metal silicide formed in the vicinity of the interface between the region 372 of the material layer 352 and the conductor 361a, the conductor 361b, and the conductor 361c sometimes reduces the resistance in the vicinity of the interface between the region 372 of the material layer 352 and the conductor 361a, the conductor 361b, and the conductor 361c.

Note that in the case where the semiconductor device in FIG. 52 and FIG. 53 is manufactured, it is preferable that heat treatment not be performed before the step in FIG. 36B of forming the depressed portion 393A and the depressed portion 393B together with the conductor 361a, the conductor 361b, and the conductor 361c. This is because a conductor for forming the conductor 361a, the conductor 361b, and the conductor 361c is deposited on the material layer 352 in the step illustrated in FIG. 32B, and if heat treatment is performed in this step, a reduction in resistance might occur in a region of the material layer 352 in contact with the conductor. Therefore, in the case where the semiconductor device in FIG. 52 and FIG. 53 is manufactured, the heat treatment is preferably performed after the step in FIG. 36B of forming the depressed portion 393A and the depressed portion 393B together with the conductor 361a, the conductor 361b, and the conductor 361c.

<Structure Example 16 of Semiconductor Device>

Figure 54:
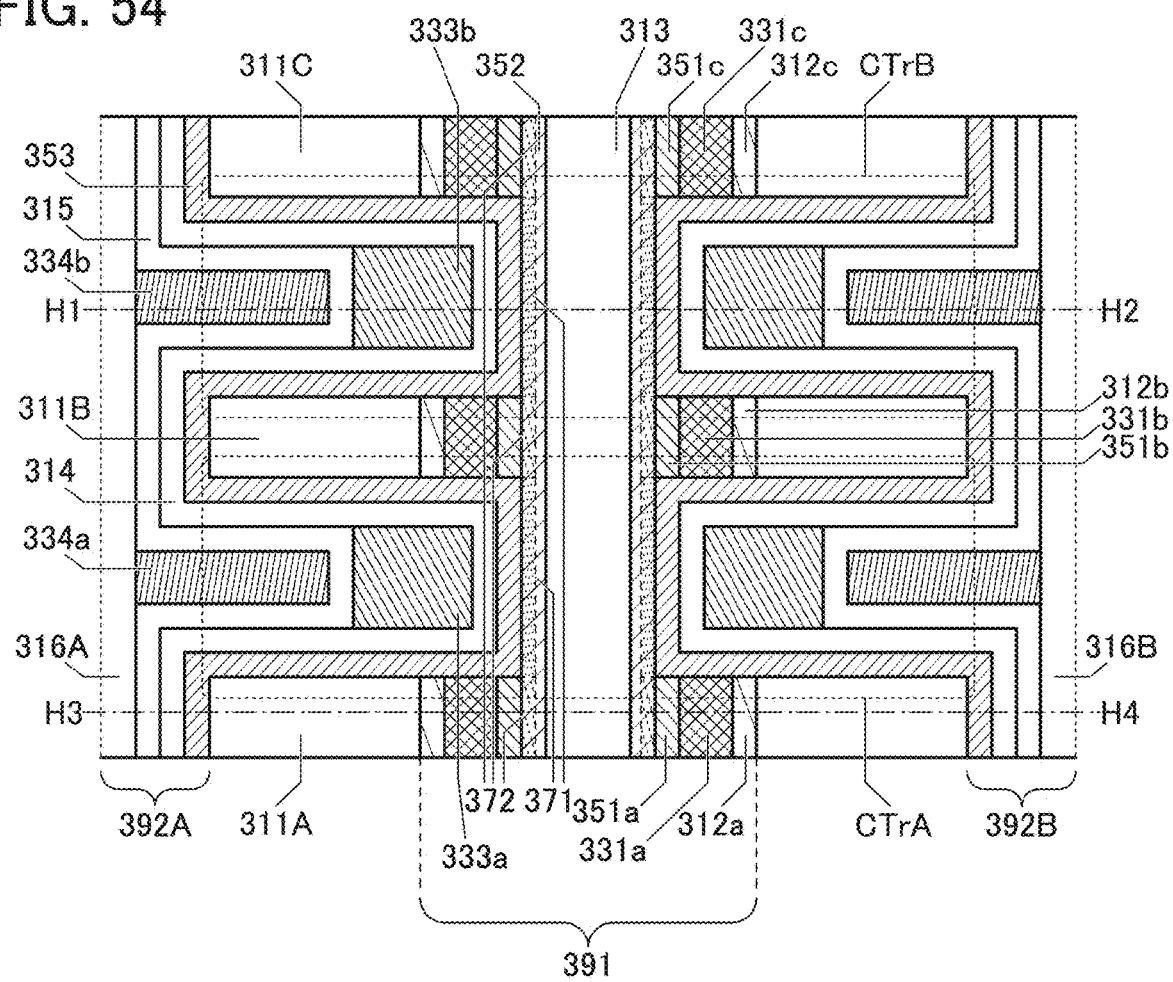
FIG. 54 is a cross-sectional view illustrating a structure example of a semiconductor device.
Figure 55A:
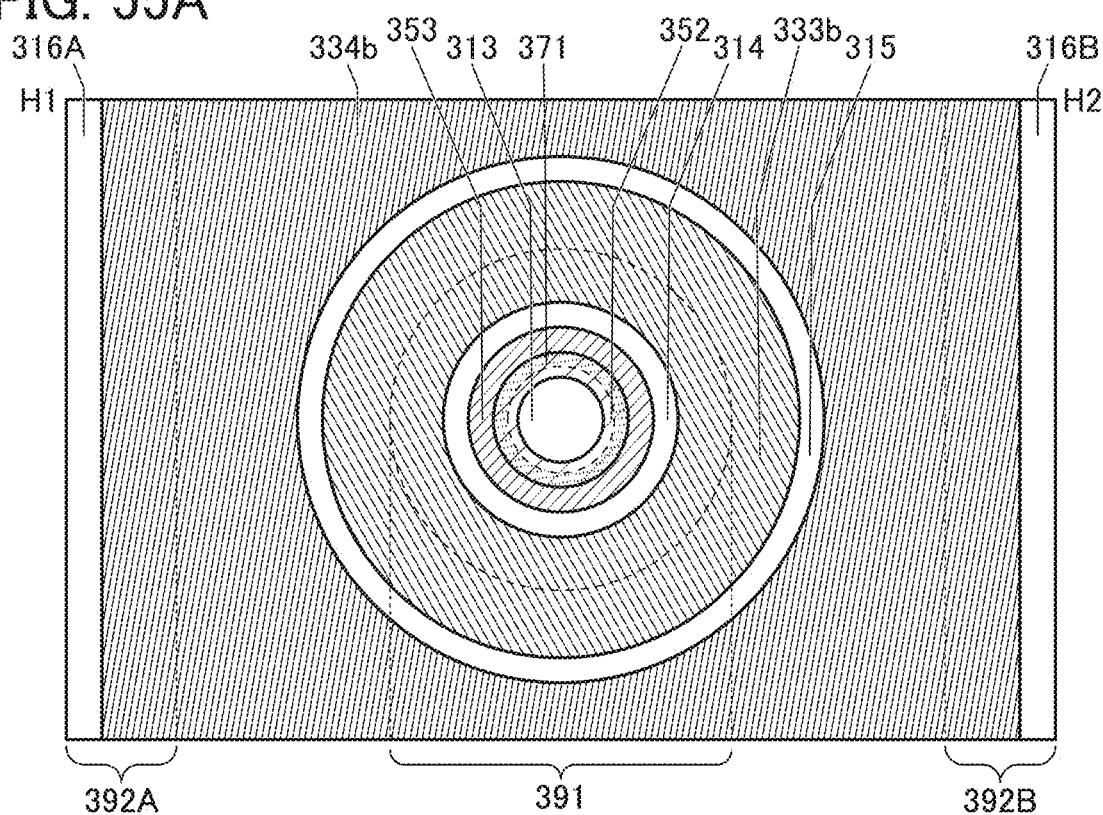
FIG. 55A and FIG. 55B are top views illustrating a structure example of a semiconductor device.
Figure 55B:
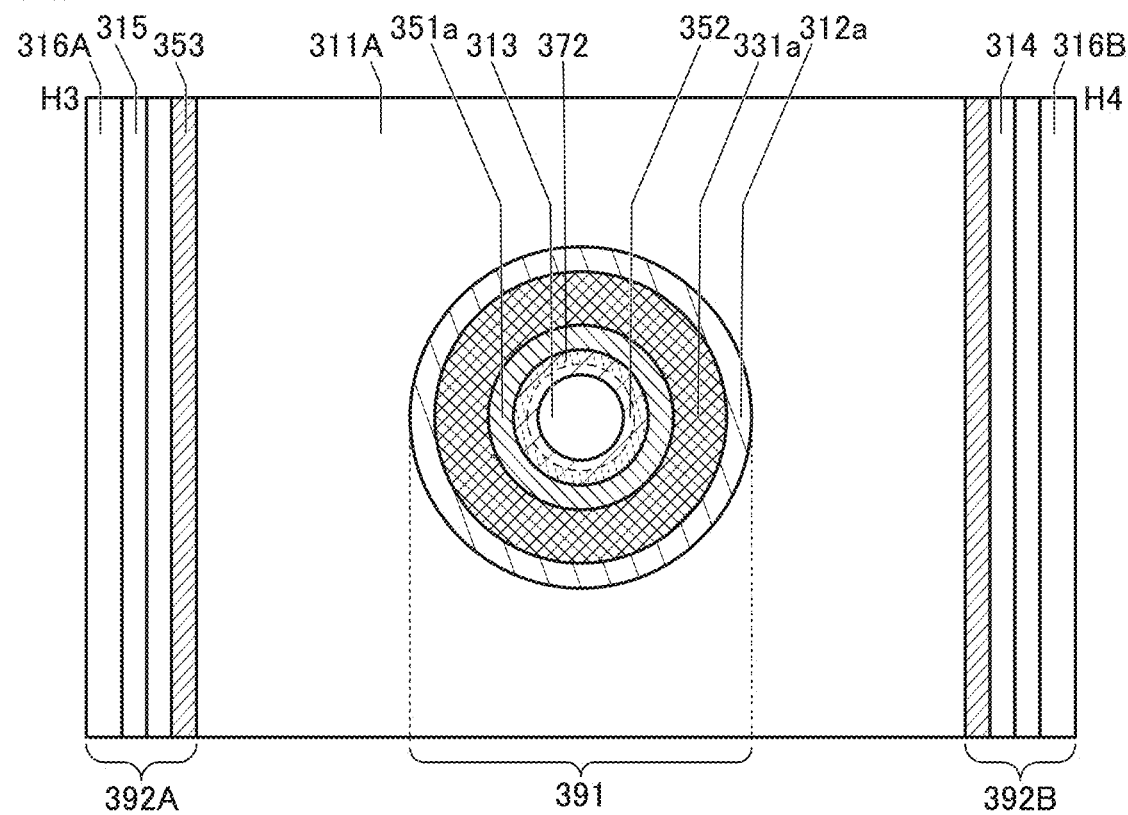

For example, the structure of the semiconductor device in FIG. 28, FIG. 29A, and FIG. 29B may be changed to the structure of the semiconductor device illustrated in FIG. 54, FIG. 55A, and FIG. 55B. FIG. 54 is a cross-sectional view of a semiconductor device having a structure different from that in FIG. 28, FIG. 29A, and FIG. 29B. FIG. 55A is a top view taken along the dashed-dotted line H1-H2 in FIG. 54, and FIG. 55B is a top view taken along the dashed-dotted line H3-H4 in FIG. 54. Note that for simplification of the drawings, some components are omitted in the cross-sectional view of FIG. 54, the top view of FIG. 55A, and the top view of FIG. 55B.

For the semiconductor device in FIG. 54, FIG. 55A, and FIG. 55B, in the step illustrated in FIG. 35A, the step in FIG. 36A and the subsequent steps are performed without performing a step of forming the conductor 332 in FIG. 35B.

That is, in the semiconductor device in FIG. 54, FIG. 55A, and FIG. 55B, a second gate electrode and a wiring supplying a potential to the second gate electrode are not provided.

Note that as a structure example of the semiconductor device of one embodiment of the present invention which functions as a storage device, the aforementioned structure examples 9 to 16 of the semiconductor devices may be combined as appropriate.

Note that the insulators, the conductors, the semiconductors, the material layers, and the like disclosed in this embodiment can be formed by the deposition method described in Embodiment 1.

Note that this embodiment can be combined with the other embodiments described in this specification as appropriate.

Embodiment 3

In this embodiment, described are structure examples for increasing the storage capacity of the semiconductor devices described in Embodiment 1 and Embodiment 2. Note that in this embodiment, the semiconductor device described in Embodiment 2 is described as an example, but this embodiment can also be applied to the semiconductor device described in Embodiment 1.

Figure 56A:
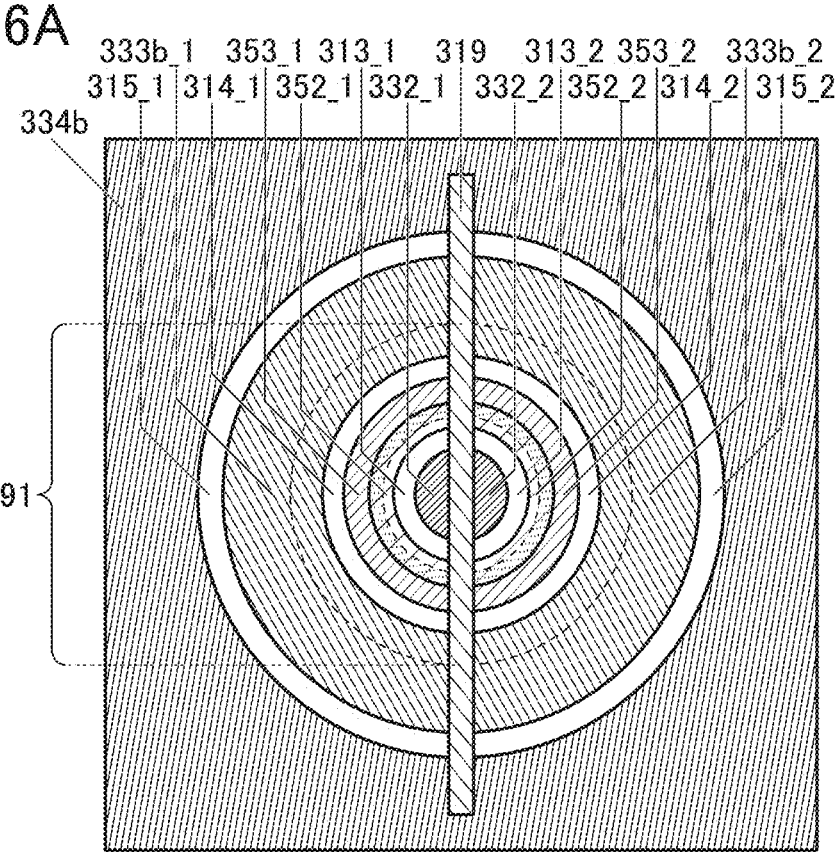
FIG. 56A and FIG. 56B are top views illustrating a structure example of a semiconductor device.
Figure 56B:
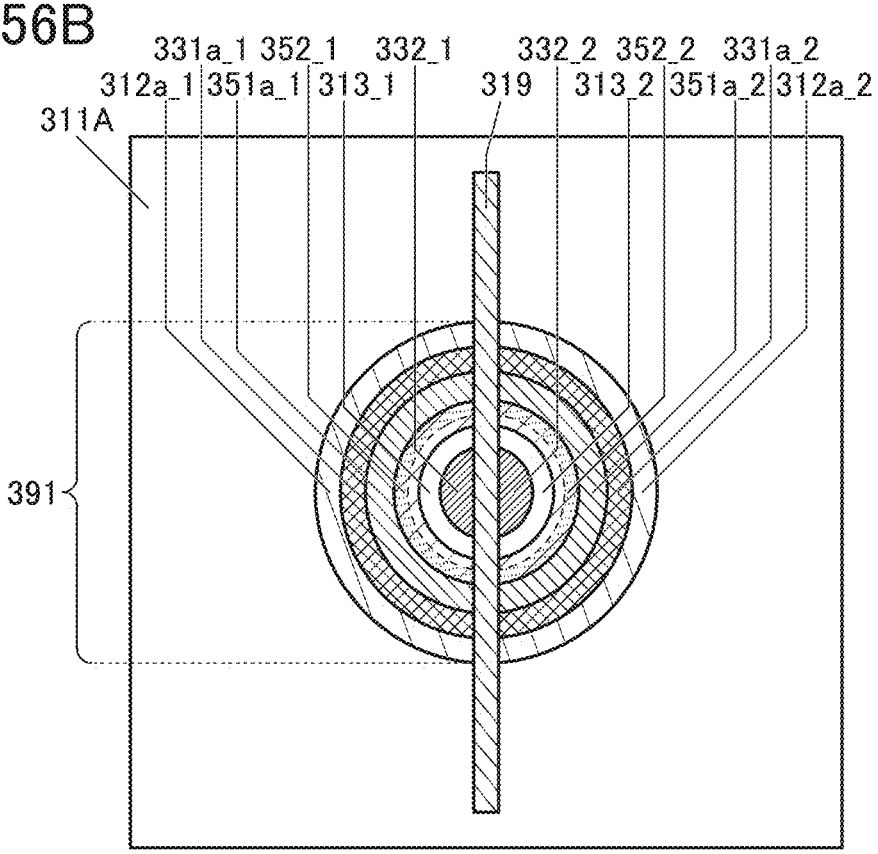

Each of FIG. 56A and FIG. 56B is a top view showing a structure of a semiconductor device in which an insulator 319 is newly formed in the region 391 and outside the region 391 shown in FIG. 29A and FIG. 29B.

Specifically, in the region 391 and outside the region 391 shown in FIG. 29A and FIG. 29B, an opening is formed first, and then the insulator 319 is formed to fill the opening.

For the insulator 319, the materials that can be used for the insulator 311A to the insulator 311C can be used, for example. Specifically, the insulator 319 can be formed using silicon oxide, silicon oxynitride, silicon nitride oxide, silicon nitride, aluminum oxide, aluminum oxynitride, aluminum nitride, aluminum nitride oxide, or the like. The insulator 319 may be not a single film but a film including a plurality of layers.

In FIG. 56A, an opening is formed to divide the conductor 332 into a conductor 332_1 and a conductor 332_2 and divide the region 391, as an example. That is, by forming the opening in the region 391, each of the conductor 332, the insulator 313, the material layer 352, the material layer 353, the insulator 314, the conductor 333b, and the insulator 315 which are included in the region 391 is divided into two. FIG. 56A shows a structure in which the conductor 332 is divided into the conductor 332_1 and the conductor 3322, the insulator 313 is divided into an insulator 313_1 and an insulator 313_2, the material layer 352 is divided into a material layer 352_1 and a material layer 352_2, the material layer 353 is divided into a material layer 353_1 and a material layer 353_2, the insulator 314 is divided into an insulator 314_1 and an insulator 314_2, the conductor 333b is divided into a conductor 333b_1 and a conductor 333b_2, and the insulator 315 is divided into an insulator 315_1 and an insulator 315_2.

When the opening is formed in the region 391 and around the region 391 as illustrated in FIG. 56A, the region 391 and the periphery of the outside of the region 391 in FIG. 29B have a structure illustrated in FIG. 56B. Specifically, FIG. 56B illustrates a structure in which the conductor 332 is divided into the conductor 332_1 and the conductor 332_2, the insulator 313 is divided into the insulator 313_1 and the insulator 313_2, the material layer 352 is divided into the material layer 352_1 and the material layer 352_2, the material layer 351 is divided into a material layer 351a_1 and a material layer 351a_2, the conductor 331a is divided into a conductor 331a_1 and a conductor 331a_2, and the insulator 312a is divided into an insulator 312a_1 and an insulator 312a_2.

In the semiconductor device where the region 391 is divided by the insulator 319 as illustrated in FIG. 56A and FIG. 56B, the number of cell transistors provided in the region 391 can be doubled. In other words, the number of strings provided in the region 391 can be doubled, whereby the semiconductor device with the structure illustrated in FIG. 56A and FIG. 56B can have higher storage capacity than the semiconductor device with the structure illustrated in FIG. 29A and FIG. 29B.

The semiconductor device of one embodiment of the present invention is not limited to the structure illustrated in FIG. 56A and FIG. 56B. Although FIG. 56A and FIG. 56B illustrate a structure in which the region 391 is divided into two, a structure in which the region 391 is divided into three as illustrated in FIG. 57A may be employed, for example.

Figure 57A:
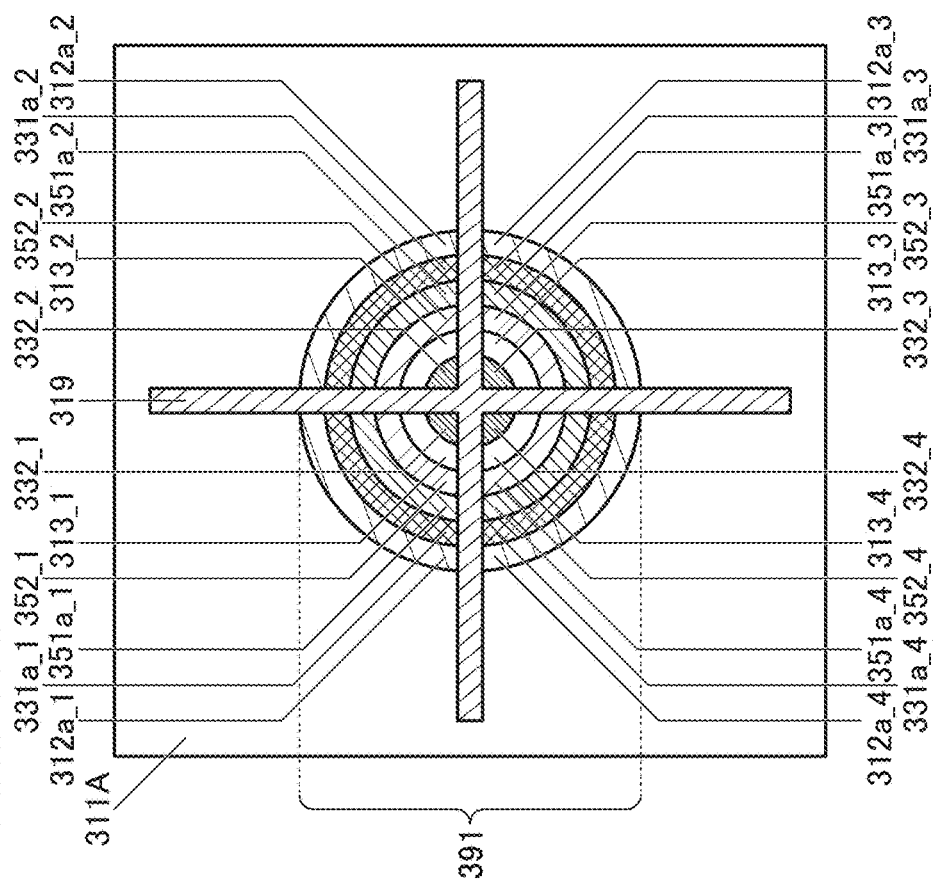
FIG. 57A and FIG. 57B are top views illustrating a structure example of a semiconductor device.
Figure 57B:
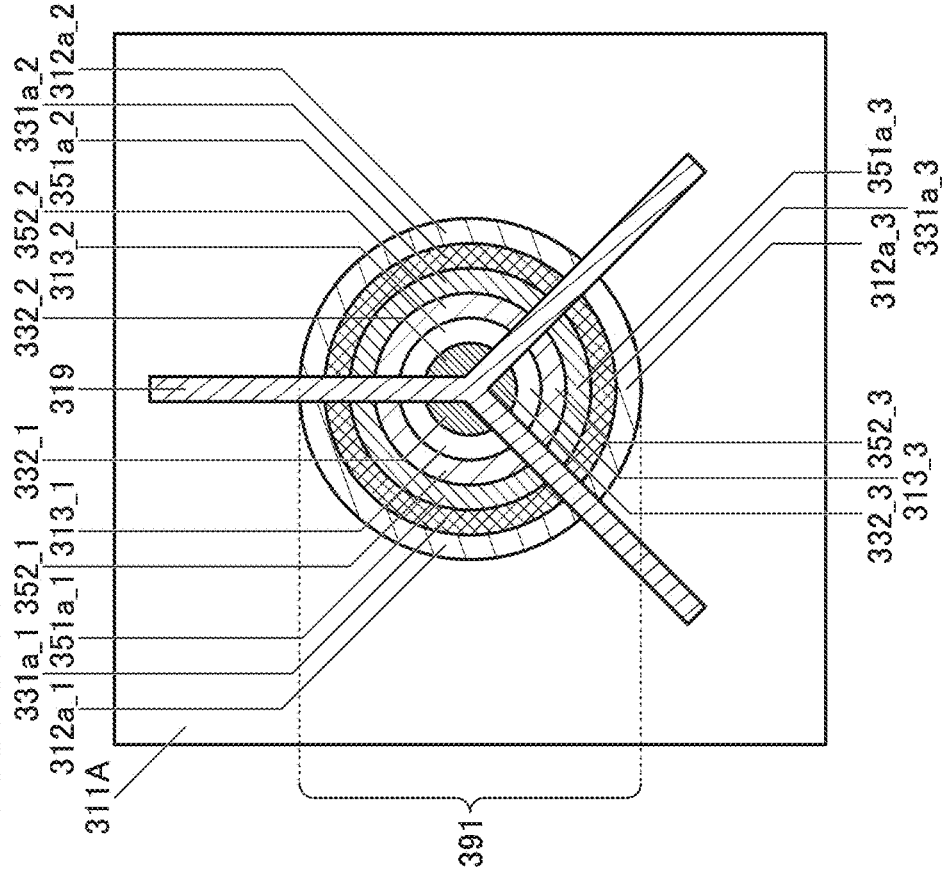

Alternatively, a structure in which the region 391 is divided into four as illustrated in FIG. 57B may be employed, for example.

FIG. 57A illustrates an example of a structure in which the region 391 in FIG. 29B is divided into three. Specifically, FIG. 57A illustrates a structure in which the conductor 332 is divided into the conductor 332_1, the conductor 332_2, and a conductor 332_3, the insulator 313 is divided into the insulator 313_1, the insulator 313_2, and an insulator 313_3, the material layer 352 is divided into the material layer 352_1, the material layer 352_2, and a material layer 352_3, the material layer 351a is divided into the material layer 351a_1, the material layer 351a_2, and a material layer 351a_3, the conductor 331a is divided into the conductor 331a_1, the conductor 331a_2, and a conductor 331a_3, and the insulator 312a is divided into the insulator 312a_1, the insulator 312a_2, and an insulator 312a_3.

FIG. 57B illustrates an example of a structure in which the region 391 in FIG. 29B is divided into four. Specifically, FIG. 57A illustrates a structure in which the conductor 332 is divided into the conductor 332_1, the conductor 332_2, the conductor 332_3, and a conductor 332_4, the insulator 313 is divided into the insulator 313_1, the insulator 3132, the insulator 313_3, and an insulator 313_4, the material layer 352 is divided into the material layer 352_1, the material layer 352_2, the material layer 352_3, and a material layer 352_4, the material layer 351a is divided into the material layer 351a_1, the material layer 351a_2, the material layer 351a_3, and a material layer 351a_4, the conductor 331a is divided into the conductor 331a_1, the conductor 331a_2, the conductor 331a_3, and a conductor 331a_4, and the insulator 312a is divided into the insulator 312a_1, the insulator 312a_2, the insulator 312a_3, and an insulator 312a_4.

Although the structure examples in which the region 391 in the semiconductor device is divided into two, three, or four are shown in the above, the semiconductor device of one embodiment of the present invention may have a structure in which the region 391 is divided into five or more.

The semiconductor device of one embodiment of the present invention may employ a structure in which an opening is provided to go across two or more regions 391 and the insulator 319 is embedded in the opening, not the structure in which one opening is provided for one region 391 as illustrated in FIG. 56A and FIG. 56B. Specifically, in a structure where the plurality of regions 391 are provided between the two slit-like regions 392 as illustrated in FIG. 58A, an opening may be provided substantially parallel to the slit-like region 392 and to go across the conductors 332 in the plurality of regions 391, and the insulator 319 may be embedded in the opening.

Figure 58A:
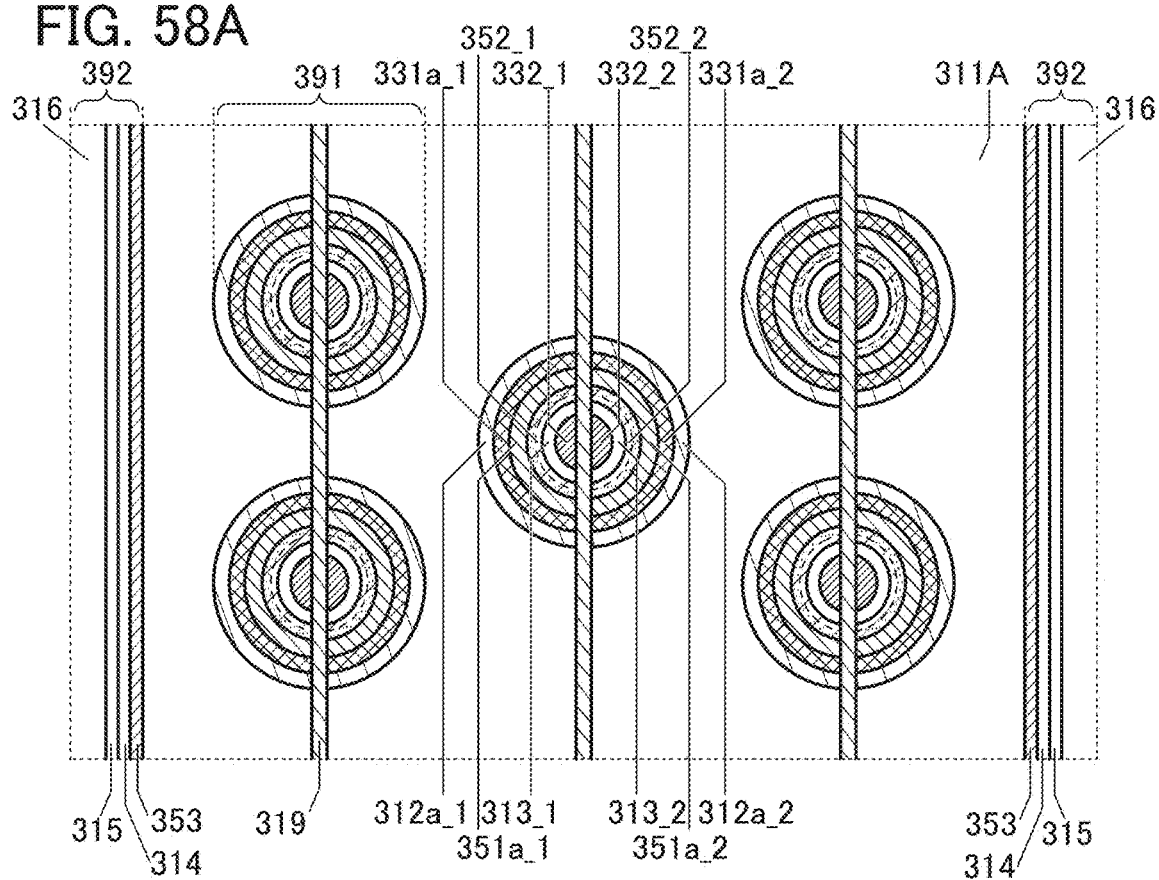
FIG. 58A and FIG. 58B are top views illustrating a structure example of a semiconductor device.

In the structure of FIG. 58A, a word line electrically connected to the first gate of the cell transistor is provided between the insulator 311A and the insulator 311B and between the insulator 311B and the insulator 311C, as illustrated in FIG. 28. Therefore, in the case where the opening is provided to go across the plurality of regions 391 and the insulator 319 is provided in the opening, the opening needs to be provided such that an electrically conducting state is formed between the first gate of the cell transistor and the word line and the external circuit or the like. Specifically, in the structure of FIG. 58A, the insulator 319 is provided substantially parallel to the slit-like region 392, whereby an electrically conducting state is formed between the first gate of the cell transistor and the word line and the external circuit or the like.

Figure 58B:
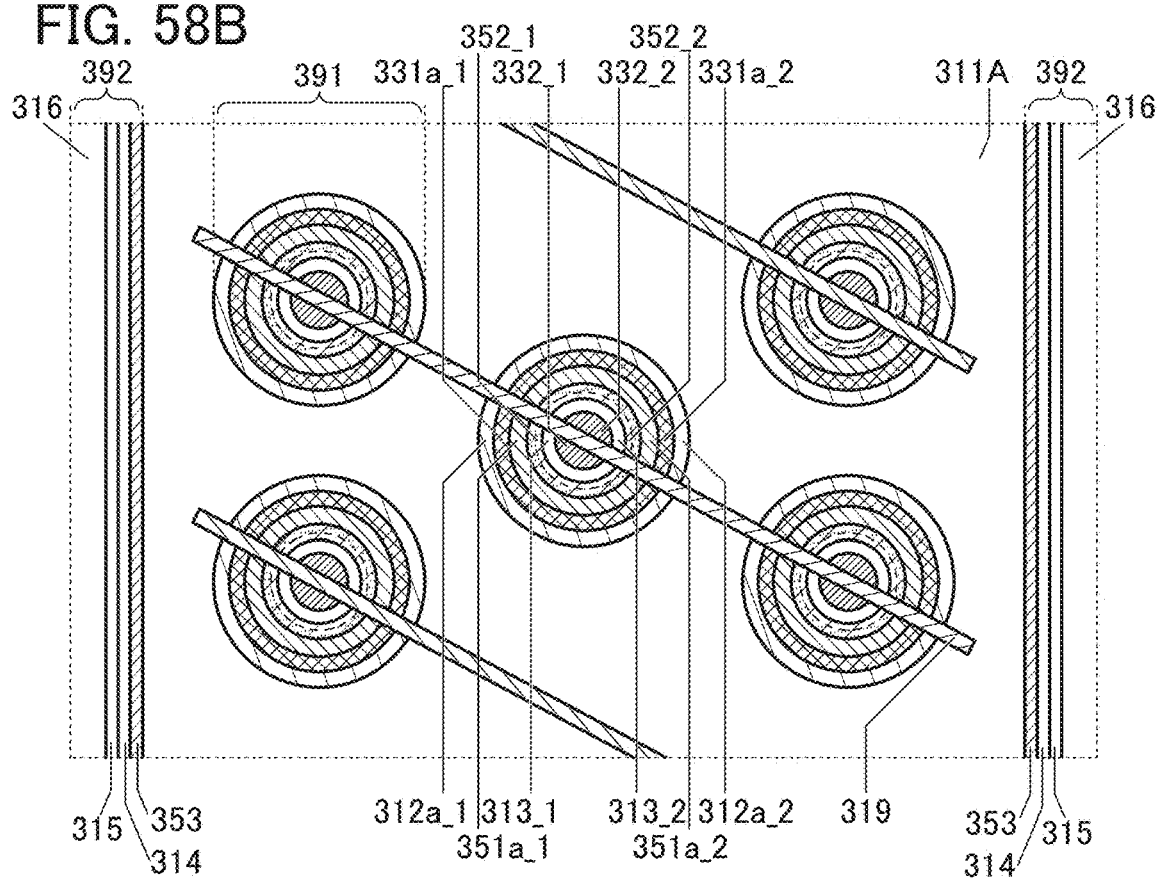

As long as an electrically conducting state is formed between the first gate of the cell transistor and the word line and the external circuit or the like, the positions and the shapes of the opening and the insulator 319 are not particularly limited. For example, as illustrated in FIG. 58B, an opening may be provided in a direction with an angle with respect to the slit-like region 392, and the insulator 319 may be provided in the opening. At this time, in the top surface of FIG. 58B, when part of the opening is not formed inside the both sides of the regions 392, an electrically conducting state can be formed between the first gate of the cell transistor and the word line and the external circuit or the like; thus, the semiconductor device with the structure in FIG. 58B can be operated. In contrast, when the opening is provided inside the both sides of the regions 392, an electrically non-conducting state is formed between the first gate of the cell transistor and the external circuit or the like, in which case the semiconductor device does not operate correctly.

Note that this embodiment can be combined with the other embodiments described in this specification as appropriate.

Embodiment 4

Described in this embodiment is metal oxide (hereinafter also referred to as an oxide semiconductor) that can be used in an OS transistor described in the above embodiment.

Metal oxide preferably contains at least indium or zinc. In particular, indium and zinc are preferably contained. In addition, aluminum, gallium, yttrium, tin, or the like is preferably contained. Furthermore, one or more kinds selected from boron, silicon, titanium, iron, nickel, germanium, zirconium, molybdenum, lanthanum, cerium, neodymium, hafnium, tantalum, tungsten, magnesium, cobalt, and the like may be contained.

<Classification of Crystal Structures>

First, the classification of the crystal structures of an oxide semiconductor will be described with reference to FIG. 59A. FIG. 59A is a diagram showing the classification of crystal structures of an oxide semiconductor, typically IGZO (metal oxide containing In, Ga, and Zn).

As shown in FIG. 59A, an oxide semiconductor is roughly classified into "Amorphous", "Crystalline", and "Crystal". The term "Amorphous" includes completely amorphous. The term "Crystalline" includes CAAC (c-axis-aligned crystalline), nc (nanocrystalline), and CAC (cloud-aligned composite) (excluding single crystal and poly crystal). Note that single crystal, poly crystal, and completely amorphous are excluded from the category of "Crystalline". The term "Crystal" includes single crystal and poly crystal.

Note that the structures in the thick frame in FIG. 59A are in an intermediate state between "Amorphous" and "Crystal", and belong to a new crystalline phase. That is, these structures are completely different from "Amorphous", which is energetically unstable, and "Crystal".

A crystal structure of a film or a substrate can be evaluated with an X-Ray Diffraction (XRD) spectrum. FIG. 59B shows an XRD spectrum, which is obtained by GIXD (Grazing-Incidence XRD) measurement, of a CAAC-IGZO film classified into "Crystalline" (the vertical axis represents intensity in arbitrary unit (a. u.)). Note that a GIXD method is also referred to as a thin film method or a Seemann-Bohlin method. The XRD spectrum that is shown in FIG. 59B and obtained by GIXD measurement is hereinafter simply referred to as an XRD spectrum. The CAAC-IGZO film in FIG. 59B has a composition in the neighborhood of In:Ga:Zn=4:2:3 [atomic ratio]. The CAAC-IGZO film in FIG. 59B has a thickness of 500 nm.

As shown in FIG. 59B, a clear peak indicating crystallinity is detected in the XRD spectrum of the CAAC-IGZO film. Specifically, a peak indicating c-axis alignment is detected at 2θ of around 31° in the XRD spectrum of the CAAC-IGZO film. As shown in FIG. 59B, the peak at 2θ of around 31° is asymmetric with respect to the axis of the angle at which the peak intensity is detected.

A crystal structure of a film or a substrate can also be evaluated with a diffraction pattern obtained by a nanobeam electron diffraction (NBED) method (such a pattern is also referred to as a nanobeam electron diffraction pattern). FIG. 59C shows a diffraction pattern of the CAAC-IGZO film. FIG. 59C shows a diffraction pattern obtained by the NBED method in which an electron beam is incident in the direction parallel to the substrate. The composition of the CAAC-IGZO film in FIG. 59C is In:Ga:Zn=4:2:3 [atomic ratio] or the neighborhood thereof. In the nanobeam electron diffraction method, electron diffraction is performed with a probe diameter of 1 nm.

As shown in FIG. 59C, a plurality of spots indicating c-axis alignment are observed in the diffraction pattern of the CAAC-IGZO film.

<<Structure of Oxide Semiconductor>>

Oxide semiconductors might be classified in a manner different from that in FIG. 59A when classified in terms of the crystal structure. Oxide semiconductors are classified into a single crystal oxide semiconductor and a non-single-crystal oxide semiconductor, for example. Examples of the non-single-crystal oxide semiconductor include the above-described CAAC-OS and nc-OS. Other examples of the non-single-crystal oxide semiconductor include a polycrystalline oxide semiconductor, an amorphous-like oxide semiconductor (a-like OS), and an amorphous oxide semiconductor.

Here, the above-described CAAC-OS, nc-OS, and a-like OS are described in detail.

[CAAC-OS]

The CAAC-OS is an oxide semiconductor that has a plurality of crystal regions each of which has c-axis alignment in a particular direction. Note that the particular direction refers to the film thickness direction of a CAAC-OS film, the normal direction of the surface where the CAAC-OS film is formed, or the normal direction of the surface of the CAAC-OS film. The crystal region refers to a region having a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more fine crystals (crystals each of which has a maximum diameter of less than 10 nm). In the case where the crystal region is formed of one fine crystal, the maximum diameter of the crystal region is less than 10 nm. In the case where the crystal region is formed of a large number of fine crystals, the size of the crystal region may be approximately several tens of nanometers.

In the case of an In-M-Zn oxide (the element M is one or more kinds selected from aluminum, gallium, yttrium, tin, titanium, and the like), the CAAC-OS tends to have a layered crystal structure (also referred to as a stacked-layer structure) in which a layer containing indium (In) and oxygen (hereinafter, an In layer) and a layer containing the element M, zinc (Zn), and oxygen (hereinafter, an (M,Zn) layer) are stacked. Indium and the element M can be replaced with each other. Therefore, indium may be contained in the (M,Zn) layer. In addition, the element M may be contained in the In layer. Note that Zn may be contained in the In layer. Such a layered structure is observed as a lattice image in a high-resolution TEM image, for example.

When the CAAC-OS film is subjected to structural analysis by out-of-plane XRD measurement with an XRD apparatus using θ/2θ scanning, for example, a peak indicating c-axis alignment is detected at 2θ of 31° or around 31°. Note that the position of the peak indicating c-axis alignment (the value of 2θ may change depending on the kind, composition, or the like of the metal element contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, and the like are included in the distortion in some cases. Note that a clear grain boundary cannot be observed even in the vicinity of the distortion in the CAAC-OS. That is, formation of a grain boundary is inhibited by the distortion of a lattice arrangement. This is probably because the CAAC-OS can tolerate distortion owing to a low density of arrangement of oxygen atoms in the a-b plane direction, an interatomic bond distance changed by substitution of a metal atom, and the like.

A crystal structure in which a clear grain boundary is observed is what is called polycrystal. It is highly probable that the grain boundary becomes a recombination center and captures carriers and thus decreases the on-state current and field-effect mobility of a transistor, for example. Thus, the CAAC-OS in which no clear grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a grain boundary as compared with an In oxide.

The CAAC-OS is an oxide semiconductor with high crystallinity in which no clear grain boundary is observed. Thus, in the CAAC-OS, a reduction in electron mobility due to the grain boundary is unlikely to occur. Entry of impurities, formation of defects, or the like might decrease the crystallinity of an oxide semiconductor, which means that the CAAC-OS can be referred to as an oxide semiconductor having small amounts of impurities and defects (e.g., oxygen vacancies). Therefore, an oxide semiconductor including the CAAC-OS is physically stable. Accordingly, the oxide semiconductor including the CAAC-OS is resistant to heat and has high reliability. In addition, the CAAC-OS is stable with respect to high temperatures in the manufacturing process (i.e., thermal budget). Accordingly, the use of the CAAC-OS for the OS transistor can extend the degree of freedom of the manufacturing process.

[nc-OS]

In the nc-OS, a microscopic region (e.g., a region greater than or equal to 1 nm and less than or equal to 10 nm, in particular, a region greater than or equal to 1 nm and less than or equal to 3 nm) has a periodic atomic arrangement. In other words, the nc-OS includes a fine crystal. Note that the size of the fine crystal is, for example, greater than or equal to 1 nm and less than or equal to 10 nm, particularly greater than or equal to 1 nm and less than or equal to 3 nm; thus, the fine crystal is also referred to as a nanocrystal. There is no regularity of crystal orientation between different nanocrystals in the nc-OS. Hence, the orientation in the whole film is not observed. Accordingly, in some cases, the nc-OS cannot be distinguished from an a-like OS or an amorphous oxide semiconductor, depending on the analysis method. For example, when an nc-OS film is subjected to structural analysis by out-of-plane XRD measurement with an XRD apparatus using θ/2θ scanning, a peak indicating crystallinity is not detected. Furthermore, a diffraction pattern like a halo pattern is observed when the nc-OS film is subjected to electron diffraction (also referred to as selected-area electron diffraction) using an electron beam with a probe diameter larger than the diameter of a nanocrystal (e.g., larger than or equal to 50 nm). Meanwhile, in some cases, a plurality of spots in a ring-like region with a direct spot as the center are observed in the obtained electron diffraction pattern when the nc-OS film is subjected to electron diffraction (also referred to as nanobeam electron diffraction) using an electron beam with a probe diameter nearly equal to or smaller than the diameter of a nanocrystal (e.g., 1 nm or larger and 30 nm or smaller).

[a-like OS]

The a-like OS is an oxide semiconductor having a structure between those of the nc-OS and the amorphous oxide semiconductor. The a-like OS has a void or a low-density region.

That is, the a-like OS has lower crystallinity than the nc-OS and the CAAC-OS. Moreover, the a-like OS has higher hydrogen concentration in the film than the nc-OS and the CAAC-OS.

<<Composition of Oxide Semiconductor>>

Next, the above-described CAC-OS is described in detail. Note that the CAC-OS relates to the material composition.

[CAC-OS]

The CAC-OS refers to one composition of a material in which elements constituting metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Note that the atomic proportions of In, Ga, and Zn in the metal elements contained in the CAC-OS in an In—Ga—Zn oxide are denoted by [In], [Ga], and [Zn], respectively. For example, the first region in the CAC-OS in the In—Ga—Zn oxide has [In] higher than that in the composition of the CAC-OS film. Moreover, the second region has [Ga] higher than that in the composition of the CAC-OS film. For example, the first region has higher [In] than the second region and lower [Ga] than the second region. Moreover, the second region has higher [Ga] than the first region and lower [In] than the first region.

Specifically, the first region includes indium oxide, indium zinc oxide, or the like as its main component. The second region includes gallium oxide, gallium zinc oxide, or the like as its main component. That is, the first region can be referred to as a region containing In as its main component. The second region can be referred to as a region containing Ga as its main component.

Note that a clear boundary between the first region and the second region cannot be observed in some cases.

For example, energy dispersive X-ray spectroscopy (EDX) is used to obtain EDX mapping, and according to the EDX mapping, the CAC-OS in the In—Ga—Zn oxide has a structure in which the region containing In as its main component (the first region) and the region containing Ga as its main component (the second region) are unevenly distributed and mixed.

In the case where the CAC-OS is used for a transistor, a switching function (on/off switching function) can be given to the CAC-OS owing to the complementary action of the conductivity derived from the first region and the insulating property derived from the second region. That is, the CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, high on-state current ($I_{on}$), high field-effect mobility ($\mu$) and excellent switching operation can be achieved.

An oxide semiconductor can have any of various structures that show various different properties. Two or more kinds among the amorphous oxide semiconductor, the polycrystalline oxide semiconductor, the a-like OS, the CAC-OS, the nc-OS, and the CAAC-OS may be included in an oxide semiconductor of one embodiment of the present invention.

<Transistor Including Oxide Semiconductor>

Next, a case where the above-described oxide semiconductor is used for a transistor is described.

When the above-described oxide semiconductor is used for a transistor, a transistor with high field-effect mobility can be achieved. In addition, a highly reliable transistor can be achieved.

An oxide semiconductor having a low carrier concentration is preferably used for the transistor. For example, the carrier concentration of an oxide semiconductor is lower than or equal to $1\times10^{17}$ cm$^{-3}$, preferably lower than or equal to $1\times10^{15}$ cm$^{-3}$, further preferably lower than or equal to $1\times10^{13}$ cm$^3$, still further preferably lower than or equal to $1\times10^{11}$ cm$^3$, yet further preferably lower than $1\times10^{10}$ cm$^3$, and higher than or equal to $1\times10^{-9}$ cm$^3$. In order to reduce the carrier concentration of an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor having a low carrier concentration may be referred to as a highly purified intrinsic or substantially highly purified intrinsic oxide semiconductor.

A highly purified intrinsic or substantially highly purified intrinsic oxide semiconductor film has a low density of defect states and accordingly has a low density of trap states in some cases.

Electric charges captured by the trap states in an oxide semiconductor take a long time to be released and may behave like fixed electric charges. A transistor whose channel formation region is formed in an oxide semiconductor having a high density of trap states has unstable electrical characteristics in some cases.

In order to obtain stable electrical characteristics of the transistor, it is effective to reduce the impurity concentration in the oxide semiconductor. In order to reduce the impurity concentration in the oxide semiconductor, the impurity concentration in a film that is adjacent to the oxide semiconductor is preferably reduced. Examples of impurities include hydrogen, nitrogen, an alkali metal, an alkaline earth metal, iron, nickel, and silicon.

<Impurities>

Here, the influence of each impurity in the oxide semiconductor is described.

When silicon or carbon, which is a Group 14 element, is contained in an oxide semiconductor, defect states are formed in the oxide semiconductor. Thus, the concentration of silicon or carbon in the oxide semiconductor and in the vicinity of an interface with the oxide semiconductor (the concentration obtained by secondary ion mass spectrometry (SIMS)) is lower than or equal to $2\times10^{18}$ atoms/cm$^3$, preferably lower than or equal to $2\times10^{17}$ atoms/cm$^3$.

When the oxide semiconductor contains an alkali metal or an alkaline earth metal, defect states are formed and carriers are generated in some cases. Accordingly, a transistor using an oxide semiconductor that contains an alkali metal or an alkaline earth metal tends to have normally-on characteristics. Thus, the concentration of an alkali metal or an alkaline earth metal in the oxide semiconductor, which is obtained by SIMS, is lower than or equal to $1\times10^{18}$ atoms/cm$^3$, preferably lower than or equal to $2\times10^{16}$ atoms/cm$^3$.

Note that in this specification and the like, "normally on" means a state where a channel exists without application of a voltage to a gate and a current flows through the transistor. Moreover, "normally off" means that a current per micrometer of channel width flowing through a transistor when a potential is not applied to a gate or a ground potential is supplied to the gate is lower than or equal to $1\times10^{-20}$ A at room temperature, lower than or equal to $1\times10^{-18}$ A at 85° C., or lower than or equal to $1\times10^{-16}$ A at 125° C.

An oxide semiconductor containing nitrogen easily becomes n-type by generation of electrons serving as carriers and an increase in carrier concentration. Thus, a transistor using an oxide semiconductor that contains nitrogen as the semiconductor tends to have normally-on characteristics. When nitrogen is contained in the oxide semiconductor, a trap state is sometimes formed. This might make the electrical characteristics of the transistor unstable. Therefore, the concentration of nitrogen in the oxide semiconductor, which is obtained by SIMS, is set lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

Hydrogen contained in an oxide semiconductor reacts with oxygen bonded to a metal atom to be water, and thus causes an oxygen vacancy in some cases. Entry of hydrogen into the oxygen vacancy generates an electron serving as a carrier in some cases. Furthermore, some hydrogen may react with oxygen bonded to a metal atom and generate an electron serving as a carrier. Thus, a transistor using an oxide semiconductor that contains hydrogen tends to have normally-on characteristics. For this reason, hydrogen in the oxide semiconductor is preferably reduced as much as possible. Specifically, the hydrogen concentration in the oxide semiconductor, which is obtained by SIMS, is set lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$.

When an oxide semiconductor with sufficiently reduced impurities is used for a channel formation region in a transistor, the transistor can have stable electrical characteristics.

Note that this embodiment can be combined with the other embodiments described in this specification as appropriate.

Embodiment 5

In this embodiment, a NAND memory, which is an example of the semiconductor device described in Embodiment 1, will be described.

<Circuit Configuration Example of Semiconductor Device>

Figure 60A:
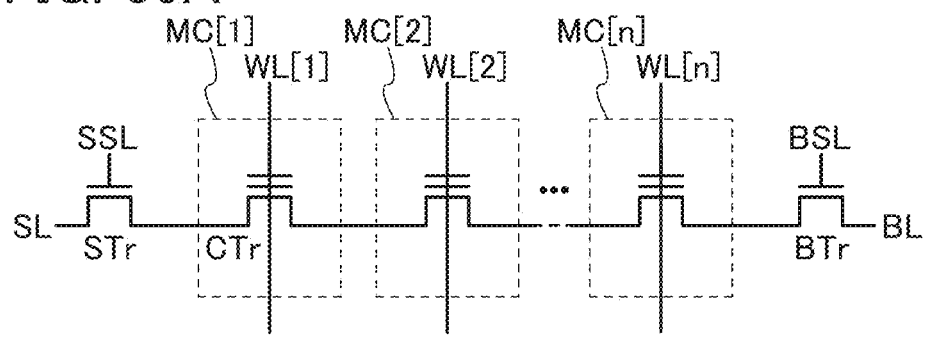
FIG. 60A and FIG. 60B are circuit diagrams showing structure examples of a semiconductor device.

First, a circuit configuration of a NAND memory that is an example of the semiconductor device will be described with reference to FIG. 60A. FIG. 60A is a circuit diagram of a one-string NAND memory. The one-string NAND memory includes memory cells including a memory cell MC[1] to a memory cell MC[n], a wiring WL[1] to a wiring WL[n] for controlling them, a wiring BL, a wiring SL, a transistor STr and a transistor BTr for selecting the string, a wiring SSL for controlling the transistor STr, and a wiring BSL for controlling the transistor BTr. Note that, in some cases, the wiring WL functions as a wiring for supplying a potential to a control gate (simply referred to as a gate in this specification and the like, in some cases) of a cell transistor in the memory cell MC which will be described below, and the wiring SL and the wiring BL each function as a wiring for supplying a potential to a first terminal and/or a second terminal of the cell transistor in the memory cell MC which will be described below.

Each of the memory cells MC includes a cell transistor CTr. In general, a cell transistor is a transistor that operates with normally-on characteristics and includes a control gate and a charge accumulation layer. The charge accumulation layer is provided in a region overlapping a channel formation region with a tunnel insulating film therebetween, and the control gate is provided in a region overlapping the charge accumulation layer with a blocking film therebetween. In the cell transistor, a tunnel current occurs when a write potential is applied to the control gate and a predetermined potential is applied to a first terminal or a second terminal of the cell transistor; hence, electrons are injected from the channel formation region into the charge accumulation layer of the cell transistor. Thus, the threshold voltage of a cell transistor in which electrons are injected into its charge accumulation layer is increased. The NAND memory is a semiconductor device utilizing this principle, and its detailed operating principle will be described later. Note that a floating gate may be used instead of the charge accumulation layer, and in Embodiment 2, a cell transistor included in the semiconductor device is described as a transistor including a floating gate.

The first terminal of the cell transistor CTr is electrically connected to a second terminal of a cell transistor CTr in an adjacent memory cell MC in series, in a circuit configuration. That is, in the circuit configuration illustrated in FIG. 1A, n cell transistors CTr are electrically connected in series. In addition, a second terminal of the cell transistor CTr in the memory cell MC[1] is electrically connected to a first terminal of the transistor STr, and a first terminal of the cell transistor CTr in the memory cell MC[n] is electrically connected to a first terminal of the transistor BTr. The control gates of the cell transistors CTr in the memory cell MC[1] to the memory cell MC[n] are electrically connected to the respective wirings WL[1] to WL[n]. A second terminal of the transistor STr is electrically connected to the wiring SL, and a gate of the transistor STr is electrically connected to the wiring SSL. A second terminal of the transistor BTr is electrically connected to the wiring BL, and a gate of the transistor BTr is electrically connected to the wiring BSL.

A channel formation region of the cell transistor CTr preferably contains any one or more materials selected from, for example, silicon, germanium, gallium arsenide, silicon carbide (SiC), and metal oxide that will be described in Embodiment 4. Particularly in the case where the channel formation region contains metal oxide of any one or more selected from indium, an element M (e.g., aluminum, gallium, yttrium, or tin can be given as the element M), and zinc, the metal oxide sometimes functions as a wide gap semiconductor; thus, a cell transistor containing the metal oxide in its channel formation region has ultralow off-state current characteristics. That is, the leakage current of the cell transistor CTr in an off state can be reduced, so that power consumption of the semiconductor device can be reduced in some cases. Moreover, channel formation regions of the transistor STr and the transistor BTr can contain the above metal oxide.

Furthermore, the channel formation region(s) of the transistor STr and/or the transistor BTr can have a composition different from that of the channel formation region of the cell transistor CTr. For example, it is possible to use a material containing the aforementioned metal oxide for the channel formation region of the cell transistor CTr and use a material containing silicon for the channel formation region(s) of the transistor STr and/or the transistor BTr.

Figure 60B:
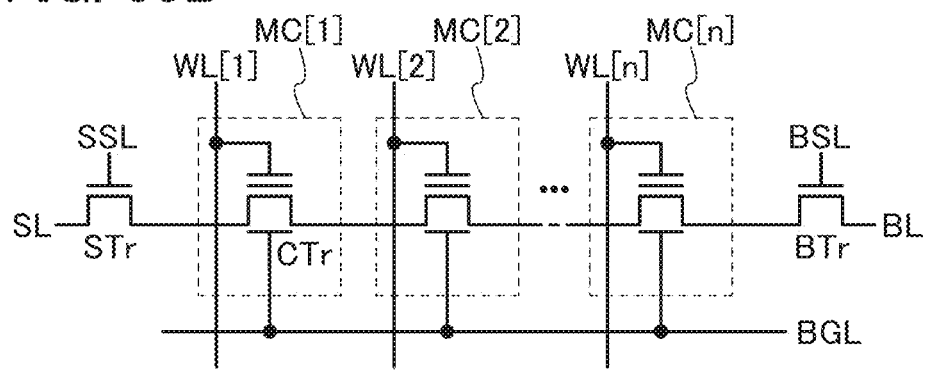

Note that one embodiment of the present invention is not limited to the semiconductor device illustrated in FIG. 60A. One embodiment of the present invention can have a circuit configuration which is changed as appropriate from that of the semiconductor device illustrated in FIG. 60A depending on the case, according to circumstances, or as needed. For example, one embodiment of the present invention may be a semiconductor device in which the cell transistor CTr is provided with a back gate as illustrated in FIG. 60B. Note that the semiconductor device illustrated in FIG. 60B has a configuration in which the cell transistors CTr included in the memory cell MC[1] to the memory cell MC[n] are provided with back gates, to each of which a wiring BGL is electrically connected, in addition to the configuration of the semiconductor device illustrated in FIG. 1A. Instead of the configuration in which the wiring BGL is electrically connected to each of the back gates of the cell transistors CTr included in the memory cell MC[1] to the memory cell MC[n], the semiconductor device illustrated in FIG. 60B may have a configuration in which electrical connection is made on the back gates independently to supply different potentials to the back gates. Note that an operation example of the semiconductor device illustrated in FIG. 60B will be described later.

In the case where the storage capacity of the semiconductor device illustrated in FIG. 60A or FIG. 60B is desired to be further increased, the semiconductor devices illustrated in FIG. 60A or FIG. 60B are arranged in a matrix. For example, the circuit configuration where the semiconductor devices illustrated in FIG. 60A are arranged in a matrix will be a configuration illustrated in FIG. 61. Note that in this specification and the like, a NAND memory with a plurality of strings as illustrated in FIG. 61 is referred to as a one-block NAND memory.

Figure 61:
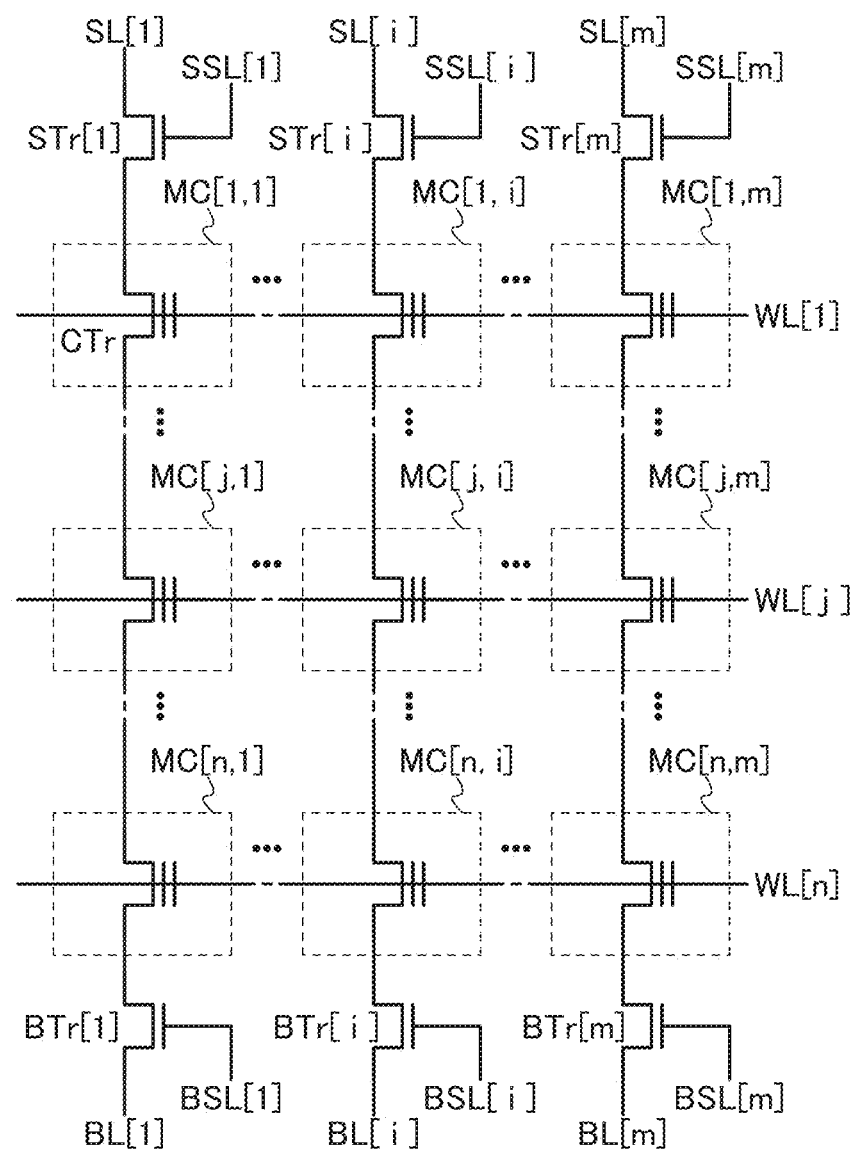
FIG. 61 is a circuit diagram showing a structure example of a semiconductor device.

In the semiconductor device illustrated in FIG. 61, the semiconductor devices illustrated in FIG. 60A are arranged in m columns (m is an integer greater than or equal to 1), and the wiring WL is electrically connected to and shared with memory cells MC in the same row. That is, the semiconductor device illustrated in FIG. 61 is a semiconductor device having a matrix of n rows and m columns and includes a memory cell MC[1,1] to a memory cell MC[n,m]. Accordingly, in the semiconductor device illustrated in FIG. 61, electrical connection is made through the wiring WL[1] to the wiring WL[n], a wiring BL[1] to a wiring BL[m], a wiring BSL[1] to a wiring BSL[m], a wiring SL [1] to a wiring SL[m], and a wiring SSL[1] to a wiring SSL[m]. Specifically, a control gate of a cell transistor CTr in the memory cell MC[j,i] (j is an integer greater than or equal to 1 and less than or equal to n, and i is an integer greater than or equal to 1 and less than or equal to m) is electrically connected to the wiring WL[j]. The wiring SL[i] is electrically connected to a second terminal of a transistor STr[i], and the wiring BL[i] is electrically connected to the second terminal of the transistor BTr.

FIG. 61 only illustrates the memory cell MC[1,1], the memory cell MC[1,i], the memory cell MC[1,m], the memory cell MC[j,1], the memory cell MC[j,i], the memory cell MC[j,m], the memory cell MC[n,1], the memory cell MC[n,i], the memory cell MC [n,m], the wiring WL[1], the wiring WL [j], the wiring WL [n], the wiring BL[1], the wiring BL[i], the wiring BL[m], the wiring BSL[1], a wiring BSL[i], a wiring BSL[m], the wiring SL[1], the wiring SL[i], the wiring SL[m], the wiring SSL[1], the wiring SSL[i], the wiring SSL[m], the cell transistors CTr, the transistor BTr[1], the transistor BTr[i], the transistor BTr [m], the transistor STr[1], the transistor STr[i], and the transistor STr[m].

Figure 62:
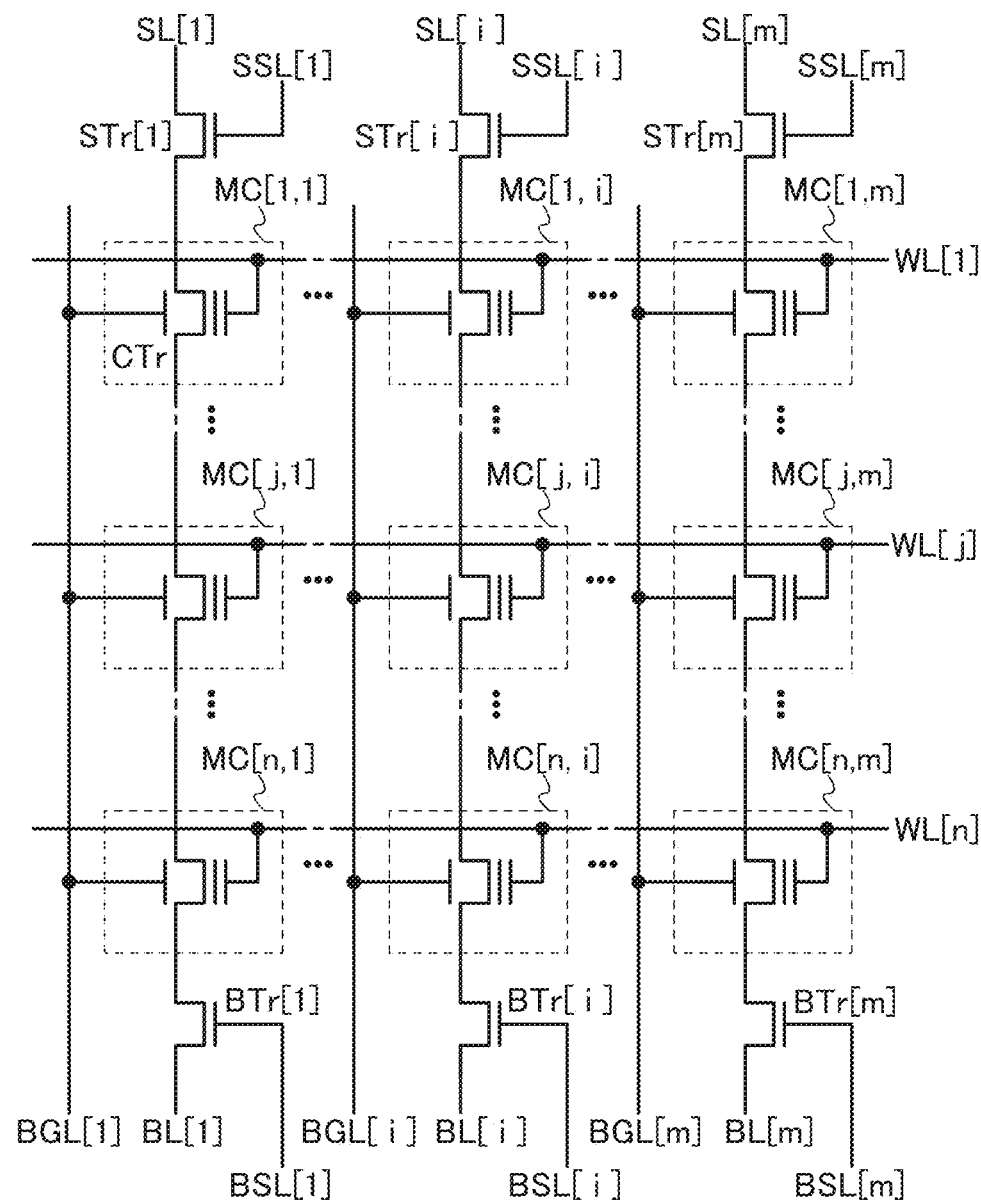
FIG. 62 is a circuit diagram showing a structure example of a semiconductor device.

In FIG. 62, the semiconductor devices illustrated in FIG. 60B are arranged in m columns (m is an integer greater than or equal to 1). Note that in the semiconductor device illustrated in FIG. 62, all the transistors included in the memory cells MC each have a back gate; hence, the semiconductor device illustrated in FIG. 62 includes a wiring BGL[1] to a wiring BGL[m] electrically connected to the corresponding back gates. Note that the description of the semiconductor device illustrated in FIG. 62 is referred to for the semiconductor device illustrated in FIG. 61.

Although the semiconductor devices illustrated in FIG. 61 and FIG. 62 have configurations in which the semiconductor devices illustrated in FIG. 60A and FIG. 60B, respectively, are arranged in a matrix, one embodiment of the present invention is not limited thereto. Depending on the case, according to circumstances, or as needed, the circuit configurations can be changed. For example, FIG. 61 and FIG. 62 illustrate the wiring BSL[1] to the wiring BSL[m] as the wirings for controlling the respective transistors BTr[1] to BTr[m]; alternatively, one wiring may be electrically connected to each of the gates of the transistor BTr[1] to the transistor BTr[m]. Similarly, as the wiring for controlling the transistor STr[1] to the transistor STr[m], one wiring instead of the wiring SSL[1] to the wiring SSL[m] may be electrically connected to each of the gates of the transistor STr[1] to the transistor STr[m].

Operation Example

Next, an example of a method of operating the semiconductor device illustrated in FIG. 60A and FIG. 60B will be described with reference to FIG. 63A, FIG. 63B, FIG. 64A, and FIG. 64B. Note that the semiconductor device of one embodiment of the present invention can handle not only binary data but also multilevel data or analog data in some cases. Therefore, in description of this operation method, data handled for writing and reading out is not limited to binary data.

In addition, a low-level potential and a high-level potential used in the following description do not represent any particular potentials, and specific potentials may be different between wirings. For example, a low-level potential and a high-level potential applied to the wiring BSL may be different from a low-level potential and a high-level potential applied to the wiring BL.

A potential $V_{PGM}$ enables electron injection into a charge accumulation layer of the cell transistor CTr when being applied to the control gate of the cell transistor CTr, and a potential $V_{PS}$ enables the cell transistor CTr to be brought into an on state when being applied to the control gate of the cell transistor CTr.

In this operation method example, a potential in a range where the cell transistor CTr operates normally has previously been applied to the wiring BGL illustrated in FIG. 60B, unless otherwise specified. Accordingly, the operations of the semiconductor devices illustrated in FIG. 60A and FIG. 60B can be considered the same.

[Write Operation]

Figure 63A:
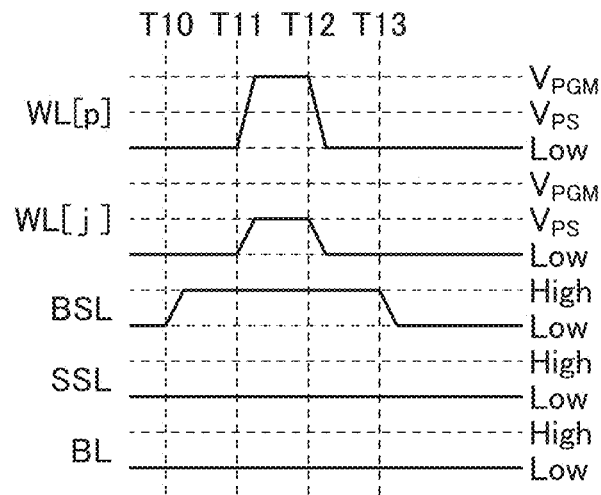
FIG. 63A and FIG. 63B are timing charts showing operation examples of a semiconductor device.

FIG. 63A is a timing chart showing an operation example for writing data into the semiconductor device. The timing chart in FIG. 63A shows changes in potential levels of the wiring WL[p] (p is an integer greater than or equal to 1 and less than or equal to n), the wiring WL[j] (here, j is an integer greater than or equal to 1 and less than or equal to n, except p), the wiring BSL, the wiring SSL, and the wiring BL. Note that the timing chart in FIG. 63A shows an operation example for writing data into the memory cell MC[p].

Before time T10, a low-level potential is supplied to the wiring BL.

Between time T10 and time T13, a low-level potential is constantly supplied to the wiring SSL. Thus, the low-level potential is applied to the gate of the transistor STr, so that the transistor STr is brought into an off state.

Between time T10 and time T11, a high-level potential is supplied to the wiring BSL. Thus, a high-level potential is applied to the gate of the transistor BTr, so that the transistor BTr is brought into an on state. When the transistor BTr is brought into an on state, the low-level potential supplied from the wiring BL is applied to the first terminal of the cell transistor CTr in the memory cell MC[n].

Between time T11 and time T12, the potential $V_{PS}$ is supplied to the wiring WL[j]. Hence, the potential VPs is applied to a control gate of a cell transistor CTr included in the memory cell MC[j]. At this time, the cell transistor CTr included in the memory cell MC[n] is brought into an on state because the low-level potential supplied from the wiring BL is applied to the first terminal of the cell transistor CTr in the memory cell MC[n]. Consequently, the low-level potential supplied from the wiring BL is applied to a first terminal of a cell transistor CTr in the memory cell MC

[n−1]. In other words, the cell transistor CTr included in the memory cell MC[j] is brought into an on state in sequence.

Moreover, between time T11 and time T12, the potential $V_{PGM}$ is supplied to the wiring WL[p]. Hence, the potential $V_{PGM}$ is applied to a control gate of a cell transistor CTr included in the memory cell MC[p]. Since the low-level potential supplied from the wiring BL is applied to a first terminal of the cell transistor CTr included in the memory cell MC[p] because of the aforementioned operation, electrons are injected into a charge accumulation layer from a channel formation region of the cell transistor CTr included in the memory cell MC[p]. Thus, data is written into the memory cell MC[p]. Note that the threshold voltage of the cell transistor CTr is increased by electron injection into the charge accumulation layer from the channel formation region of the cell transistor CTr included in the memory cell MC[p].

The low-level potential supplied from the wiring BL is applied also to the first terminal of the transistor STr by time T12. Between time T12 and time T13, a low-level potential is applied to the wiring WL[j] and the wiring WL[p].

After time T13, a low-level potential is supplied to the wiring BSL. Thus, the low-level potential is applied to the gate of the transistor BTr, so that the transistor BTr is brought into an off state. Alternatively, although not shown in the timing chart in FIG. 63A, the transistor BTr can be brought into an off state at this time by setting the potential of the wiring BL to a high-level potential and not supplying a low-level potential to the wiring BSL.

Through the above operation, data can be written into the semiconductor device illustrated in FIG. 60A or FIG. 60B.

[Read-Out Operation]

Figure 63B:
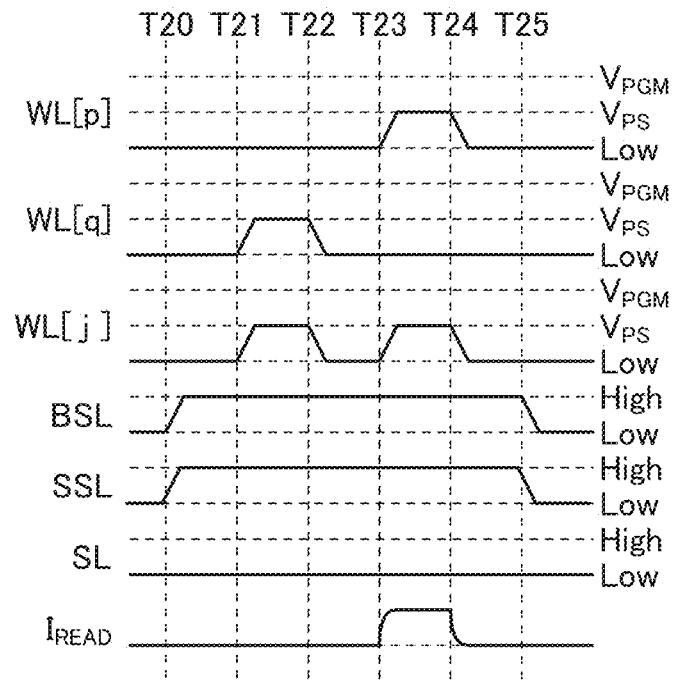

FIG. 63B is a timing chart showing an operation example for reading out data from the semiconductor device. The timing chart in FIG. 63A shows changes in potential levels of the wiring WL[p], the wiring WL[q] (q is an integer greater than or equal to 1 and less than or equal to n, except p), the wiring WL[j] (here, j is an integer greater than or equal to 1 and less than or equal to n, except p and q), the wiring BSL, the wiring SSL, and the wiring SL, and also shows a change in the amount of $I_{READ}$ as a current flowing between the wiring SL and the wiring BL. Note that the timing chart in FIG. 63B shows an operation example for reading out data from the memory cell MC[p] and the memory cell MC[q]. Electrons have been injected into the charge accumulation layer of the cell transistor CTr in the memory cell MC[p] but not into a charge accumulation layer of a cell transistor CTr in the memory cell MC[q].

Before time T20, a low-level potential is supplied to the wiring SL.

Between time T20 and time T21, a high-level potential is supplied to the wiring BSL and the wiring SSL. Thus, the high-level potential is applied to the gates of the transistor BTr and the transistor STr, so that the transistor BTr and the transistor STr are brought into an on state. When the transistor STr is brought into an on state, the low-level potential supplied from the wiring SL is applied to the second terminal of the cell transistor CTr in the memory cell MC[1].

Between time T21 and time T22, the potential $V_{PS}$ is supplied to the wiring WL[q] and the wiring WL[j]. Hence, the potential $V_{PS}$ is applied to control gates of the cell transistors CTr included in the memory cell MC[q] and the memory cell MC[j]. At this time, in the case where the low-level potential supplied from the wiring SL is applied to second terminal(s) of the cell transistor(s) CTr in the memory cell MC[q] and/or the memory cell MC[j], the cell transistor(s) CTr is/are brought into an on state.

Meanwhile, between time T21 and time T22, a low-level potential is supplied to the wiring WL[p]. Hence, the low-level potential is applied to the control gate of the cell transistor CTr included in the memory cell MC[p]. In addition, the threshold voltage of the cell transistor CTr in the memory cell MC[p] is increased because of electrons injected into the charge accumulation layer of the cell transistor CTr in the memory cell MC[p]. For these reasons, the cell transistor CTr in the memory cell MC [p] is brought into an off state, and current does not flow between the wiring SL and the wiring BL. Measuring the amount of current flowing through the wiring BL at this time to show that current does not flow between the wiring SL and the wiring BL demonstrates that electrons are injected into the charge accumulation layer of the cell transistor CTr in the memory cell MC[p].

Between time T22 and time T23, a low-level potential is supplied to each of the wiring WL[p], the wiring WL[q], and the wiring WL[j]. Hence, the low-level potential is applied to each of the control gates of the cell transistors CTr included in the memory cell MC[1] to the memory cell MC[n].

Between time T23 and time T24, the potential $V_{PS}$ is supplied to the wiring WL [j]. Thus, the potential $V_{PS}$ is applied to the control gate of the cell transistor CTr included in the memory cell MC[j]. At this time, in the case where the low-level potential supplied from the wiring SL is applied to a first terminal of the cell transistor CTr in the memory cell MC[j], the cell transistor CTr is brought into an on state.

Furthermore, between time T23 and time T24, the potential $V_{PS}$ is supplied to the wiring WL[p]. Thus, the potential $V_{PS}$ is applied to the control gate of the cell transistor CTr included in the memory cell MC[p]. In this operation example, the cell transistor CTr is substantially brought into an on state because the potential $V_{PS}$ is applied to the control gate of the cell transistor CTr, although the threshold voltage of the cell transistor CTr in the memory cell MC [p] is increased because of electrons injected into the charge accumulation layer of the cell transistor CTr in the memory cell MC [p].

Moreover, between time T23 and time T24, a low-level potential is supplied to the wiring WL[q]. Hence, the low-level potential is applied to the control gate of the cell transistor CTr included in the memory cell MC[j]. The cell transistor CTr included in the memory cell MC operates with normally-on characteristics; accordingly, the cell transistor CTr in the memory cell MC[j] is brought into an on state even when the low-level potential is supplied from the wiring SL is applied to the first terminal of the cell transistor CTr.

That is, the cell transistors CTr included in the memory cell MC[1] to the memory cell MC[n] are brought into an on state, so that current flows between a source and a drain of each of the cell transistors CTr. In other words, measuring the amount of current flowing through the wiring BL at this time to show that current flows between the wiring SL and the wiring BL demonstrates that electrons are not injected into the charge accumulation layer of the cell transistor CTr in the memory cell MC[q].

Between time T24 and time T25, a low-level potential is supplied to each of the wiring WL[p], the wiring WL[q], and the wiring WL[j]. Thus, the low-level potential is applied to each of the control gates of the cell transistors CTr included in the memory cell MC[1] to the memory cell MC [n]

After time T25, a low-level potential is supplied to the wiring BSL and the wiring SSL. Thus, the low-level potential is applied to each of the gates of the transistor BTr and the transistor STr, so that the transistor BTr and the transistor STr are brought into an off state.

That is, in the case of reading out data from a memory cell MC, a low-level potential is applied to the control gate of the cell transistor CTr in the memory cell MC and a high-level potential is applied to the control gates of the cell transistors CTr in the other memory cells MC, and then the amount of current flowing between the wiring SL and the wiring BL is measured, whereby data retained in the memory cell MC can be read out.

Through the above operations, data can be written into and read out from the semiconductor device illustrated in FIG. 60A or FIG. 60B.

[Erase Operation]

FIG. 64A is a timing chart showing an operation example for erasing data retained in the semiconductor device. The timing chart in FIG. 64A shows changes in potential levels of the wiring WL[j] (here, j is an integer greater than or equal to 1 and less than or equal to n), the wiring BSL, the wiring SSL, the wiring BL, and the wiring SL. Note that an erase operation for a general NAND memory is performed for each block and the same is applied to this operation example. Note that one embodiment of the present invention is not limited thereto; for example, an erase operation may be performed for each string.

Before time T30, a low-level potential is supplied to the wiring BL and the wiring SL.

Between time T30 and time T33, a low-level potential is constantly supplied to the wiring WL[j].

Between time T30 and time T31, a high-level potential is supplied to the wiring BSL and the wiring SSL. Thus, the high-level potential is applied to each of the gates of the transistor BTr and the transistor STr, so that the transistor BTr and the transistor STr are brought into an on state. When the transistor BTr and the transistor STr are brought into an on state, the low-level potential supplied from the wiring SL is applied to the second terminal of the cell transistor CTr included in the memory cell MC[1], and the low-level potential supplied from the wiring BL is applied to the first terminal of the cell transistor CTr included in the memory cell MC[n].

Between time T31 and time T32, a potential $V_{ER}$ is supplied to the wiring BL and the wiring SL. Note that the potential $V_{ER}$ is a potential higher than the high-level potential flowing through the wiring BL and the wiring SL. Accordingly, the potentials of the channel formation regions of all the cell transistors CTr included in the memory cell MC[1] to the memory cell MC [n] increase; hence, electrons injected into the charge accumulation layer of each of the cell transistors CTr are extracted to the channel formation region side.

Between time T32 and time T33, a low-level potential is supplied to the wiring BL and the wiring SL.

After time T33, a low-level potential is supplied to the wiring BSL and the wiring SSL. Thus, the low-level potential is applied to each of the gates of the transistor BTr and the transistor STr, so that the transistor BTr and the transistor STr are brought into an off state.

Through the above operation, data can be erased from the semiconductor device illustrated in FIG. 60A or FIG. 60B.

In the semiconductor device illustrated in FIG. 60B, the erase operation different from the above erase operation can be performed by using the wiring BGL. FIG. 64B shows an example of the operation.

Before time T40, a low-level potential is supplied to the wiring BL and the wiring SL.

Between time T40 and time T45, a low-level potential is constantly supplied to the wiring WL[j].

Between time T40 and time T41, a low-level potential is supplied to the wiring BSL and the wiring SSL. Thus, the low-level potential is applied to each of the gates of the transistor BTr and the transistor STr, so that the transistor BTr and the transistor STr are brought into an off state. Consequently, the state between the second terminal of the transistor STr and the first terminal of the transistor BTr becomes floating.

Moreover, between time T40 and time T41, a potential $V_{BGER}$ is supplied to the wiring BGL. The potential $V_{BGER}$ is an extremely high potential. The state between the second terminal of the transistor STr and the first terminal of the transistor BTr is floating, and the potential of the wiring BGL becomes $V_{BGER}$, whereby the potentials of the channel formation regions of all the cell transistors CTr included in the memory cell MC[1] to the memory cell MC[n] are raised by capacitive coupling. Thus, electrons injected into the charge accumulation layer of each of the cell transistors CTr are extracted to the channel formation region side.

Between time T41 and time T42, a high-level potential is supplied to the wiring BSL and the wiring SSL. Hence, the high-level potential is applied to each of the gates of the transistor BTr and the transistor STr, so that the transistor BTr and the transistor STr are brought into an on state.

Between time T42 and time T43, a high-level potential is supplied to the wiring BL. Thus, the electrons that are extracted from the charge accumulation layer of the cell transistor CTr can flow through the wiring BL.

Between time T43 and time T44, a low-level potential is supplied to the wiring BL. Then, from time T44 to time T45, a low-level potential is supplied to the wiring BSL and the wiring SSL. Thus, the low-level potential is applied to each of the gates of the transistor BTr and the transistor STr, so that the transistor BTr and the transistor STr are brought into an off state. Finally, after time T45, a low-level potential is supplied to the wiring BGL.

As shown in the above operation, data can be erased also from the semiconductor device illustrated in FIG. 60B by using the wiring BGL.

<Structure Example of Semiconductor Device>

Next, a structure example of the semiconductor device in FIG. 61 or FIG. 62 is described.

Figure 65A:
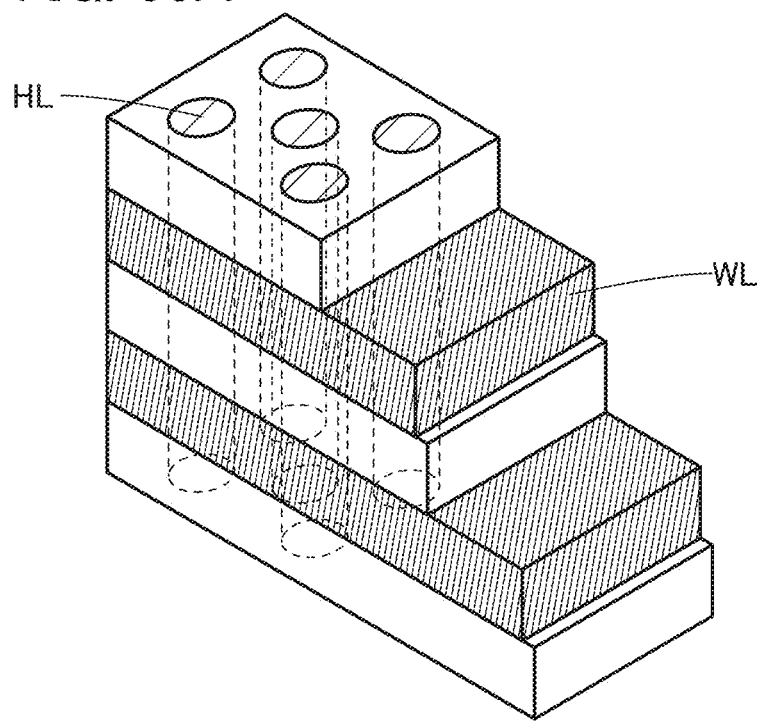
FIG. 65A is a perspective view illustrating a structure example of a semiconductor device.
Figure 65B:
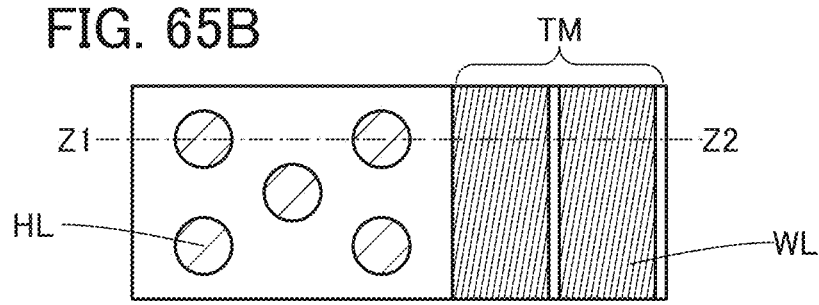
FIG. 65B is a top view illustrating a structure example of a semiconductor device.
Figure 65C:
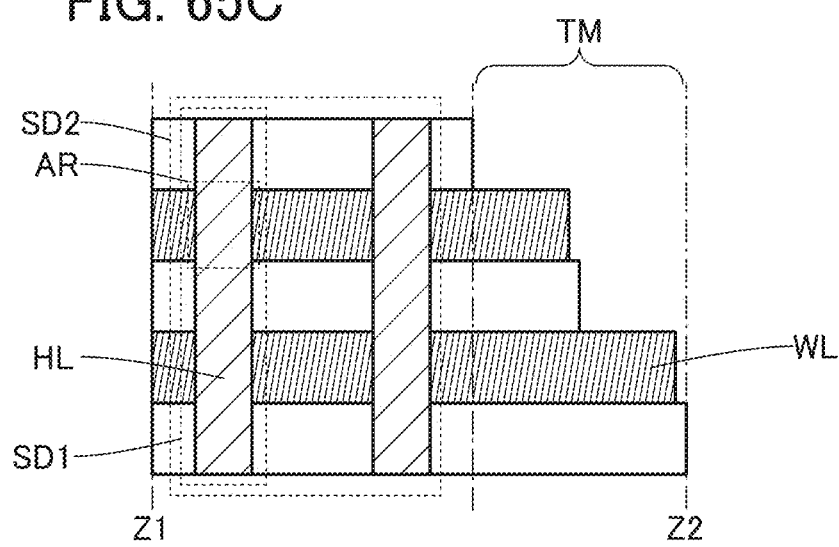
FIG. 65C is a cross-sectional view illustrating a structure example of a semiconductor device.

FIG. 65A to FIG. 65C are examples of schematic views illustrating part of the semiconductor device in FIG. 61 or FIG. 62. FIG. 65A is a perspective view illustrating part of the semiconductor device, and FIG. 65B is a top view of FIG. 65A. Furthermore, FIG. 65C is a cross-sectional view taken along the dashed-dotted line Z1-Z2 in FIG. 65B.

The semiconductor device includes a structure body in which the wirings WL and insulators (regions without a hatching pattern in FIG. 65A to FIG. 65C) are stacked.

An opening is formed in the structure body to penetrate the insulators and the wirings WL altogether. Then, to provide the memory cell MC in a region AR that penetrates the wirings WL, an insulator, a conductor, and a semiconductor are formed in the opening. Note that the conductor functions as a source electrode or a drain electrode of the cell transistor CTr in the memory cell MC, and the semiconductor functions as a channel formation region of the cell transistor CTr. Alternatively, without formation of the conductor, a channel formation region and a low-resistance region may be formed in the semiconductor and the low-resistance region may serve as the source electrode or the drain electrode of the cell transistor CTr. The region where the insulator, the conductor, and the semiconductor are formed in the opening is shown as a region HL in FIG. 65A to FIG. 65C. In particular, in FIG. 65A, the region HL included inside the structure body is indicated by a dashed line. Note that in the case where the transistor included in the memory cell MC is provided with a back gate, the conductor included in the region HL may function as the wiring BGL for electrical connection to the back gate.

In other words, FIG. 65C illustrate that the semiconductor device illustrated in any one of FIG. 60A and FIG. 60B is formed in a region SD1, and the semiconductor device illustrated in FIG. 61 or FIG. 62 is formed in a region SD2.

A region TM where the wiring WL is exposed functions as a connection terminal for supplying a potential to the wiring WL. That is, electrically connecting a wiring to the region TM enables a potential to be supplied to the gate of the cell transistor CTr.

Note that the wiring WL corresponds to the conductor 434a and the conductor 434b in the semiconductor device in FIG. 1, FIG. 2A, and FIG. 2B in Embodiment 1. In that case, although not shown, a charge accumulation layer of the semiconductor device is formed between the wiring WL and the region HL.

The wiring WL also corresponds to the conductor 334a and the conductor 334b in the semiconductor device in FIG. 28, FIG. 29A, and FIG. 29B in Embodiment 2. In that case, although not shown, a floating gate electrode in the semiconductor device is formed between the wiring WL and the region HL.

Figure 66A:
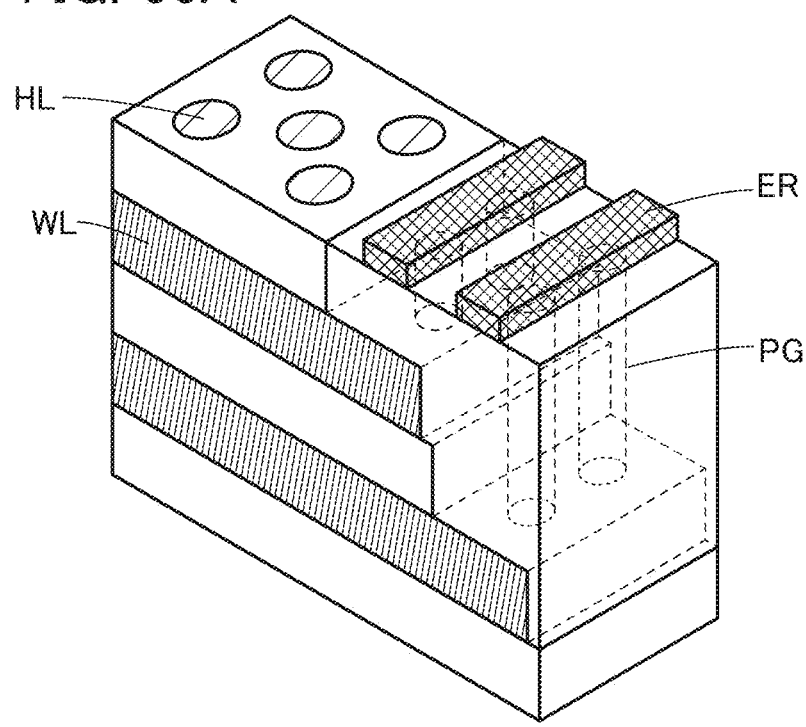
FIG. 66A is a perspective view illustrating a structure example of a semiconductor device.
Figure 66B:
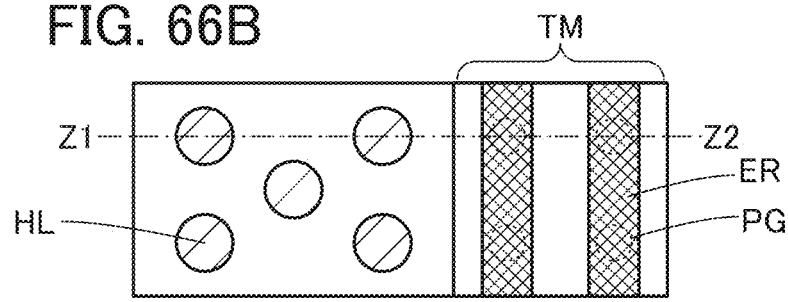
FIG. 66B is a top view illustrating a structure example of a semiconductor device.
Figure 66C:
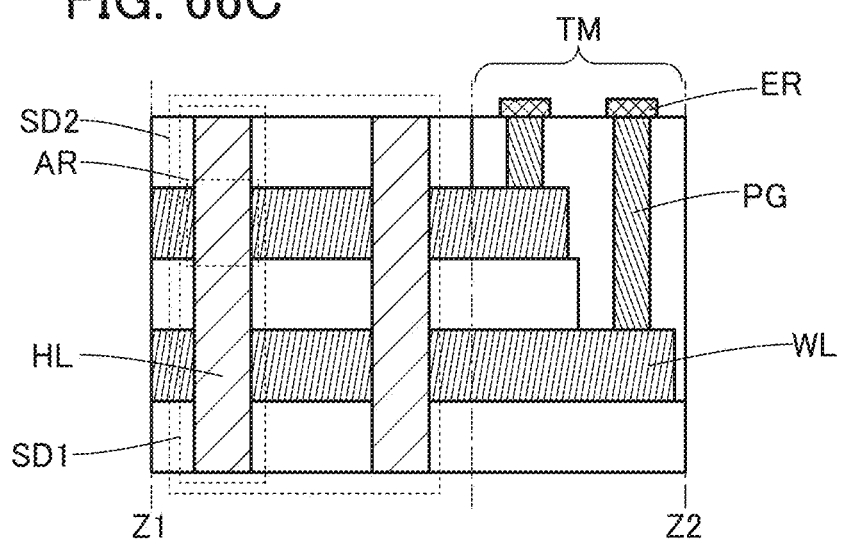
FIG. 66C is a cross-sectional view illustrating a structure example of a semiconductor device.

Note that the shape of the region TM is not limited to that in the structure example shown in FIG. 65A to FIG. 65C. The semiconductor device of one embodiment of the present invention may be configured, for example, such that an insulator is formed over the region TM illustrated in FIG. 65A to FIG. 65C, an opening is provided in the insulator, and a conductor PG is formed to fill the opening (FIG. 66A to FIG. 66C). Note that a wiring ER is formed over the conductor PG, whereby the wiring ER and the wiring WL are electrically connected to each other. Note that in FIG. 66A, the conductor PG provided inside the structure body is indicated by a dashed line, and the dashed line representing the region HL is omitted.

Figure 67A:
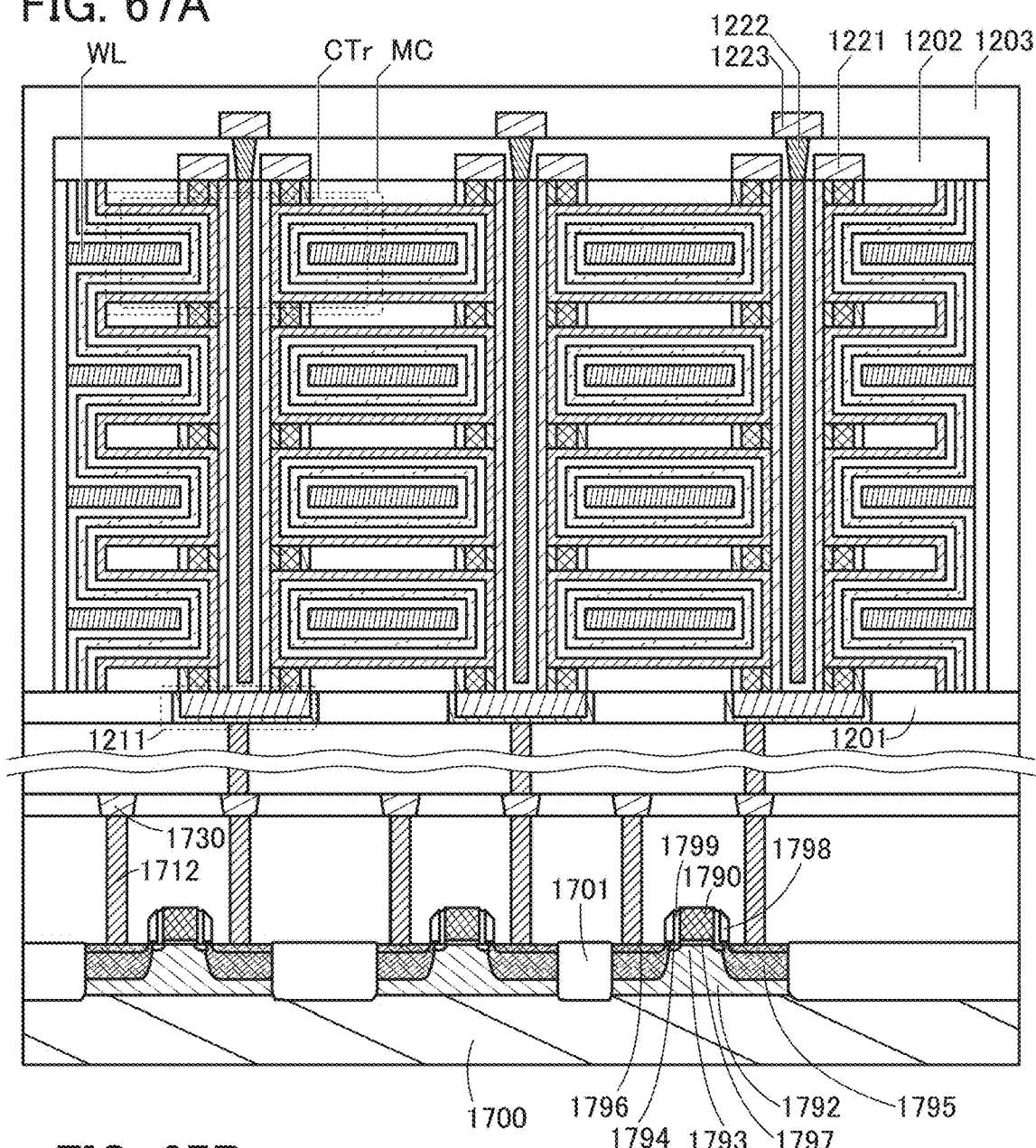
FIG. 67A and FIG. 67B are cross-sectional views illustrating a structure example of a semiconductor device.
Figure 68A:
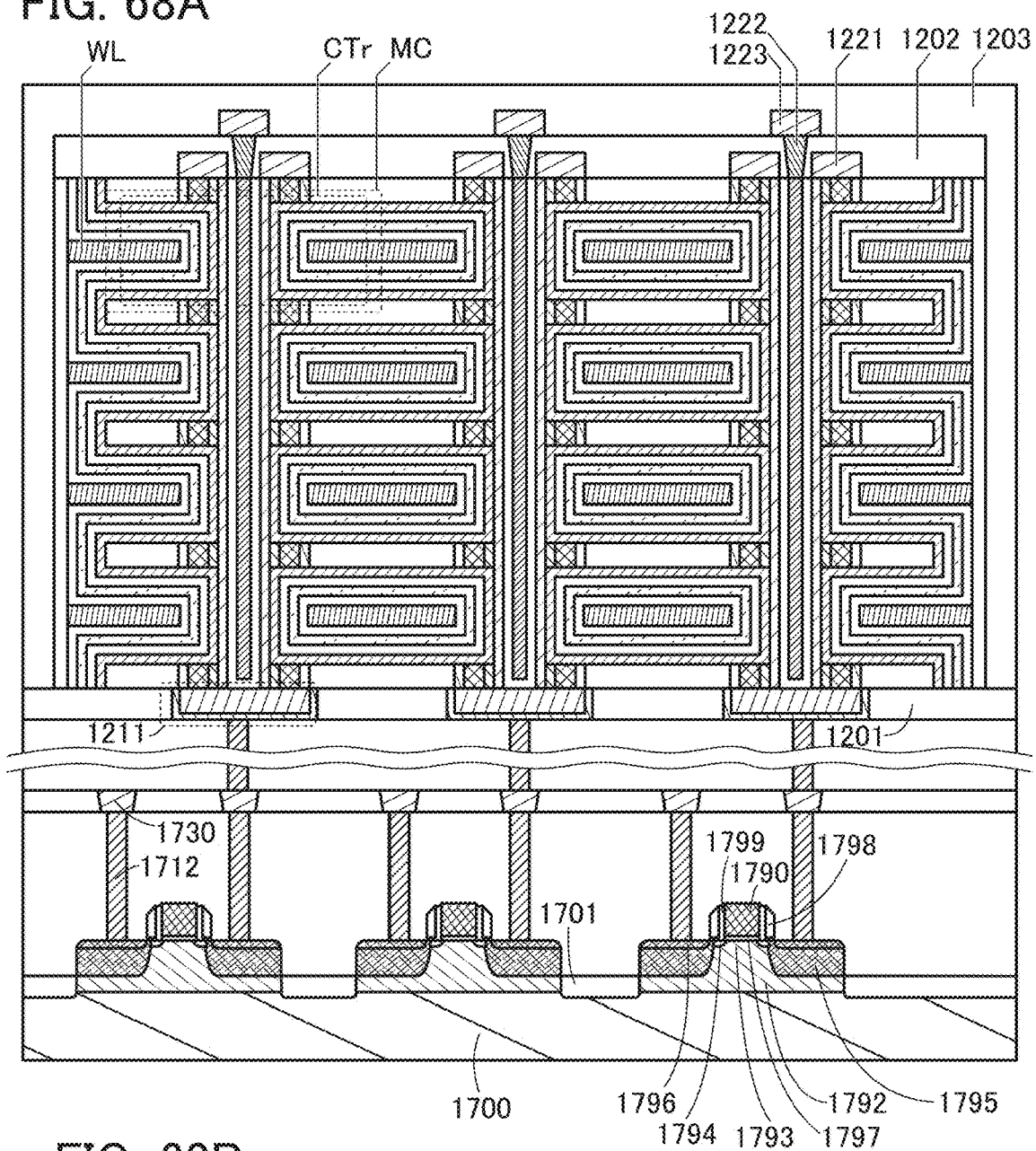
FIG. 68A and FIG. 68B are cross-sectional views illustrating a structure example of a semiconductor device.
Figure 69:
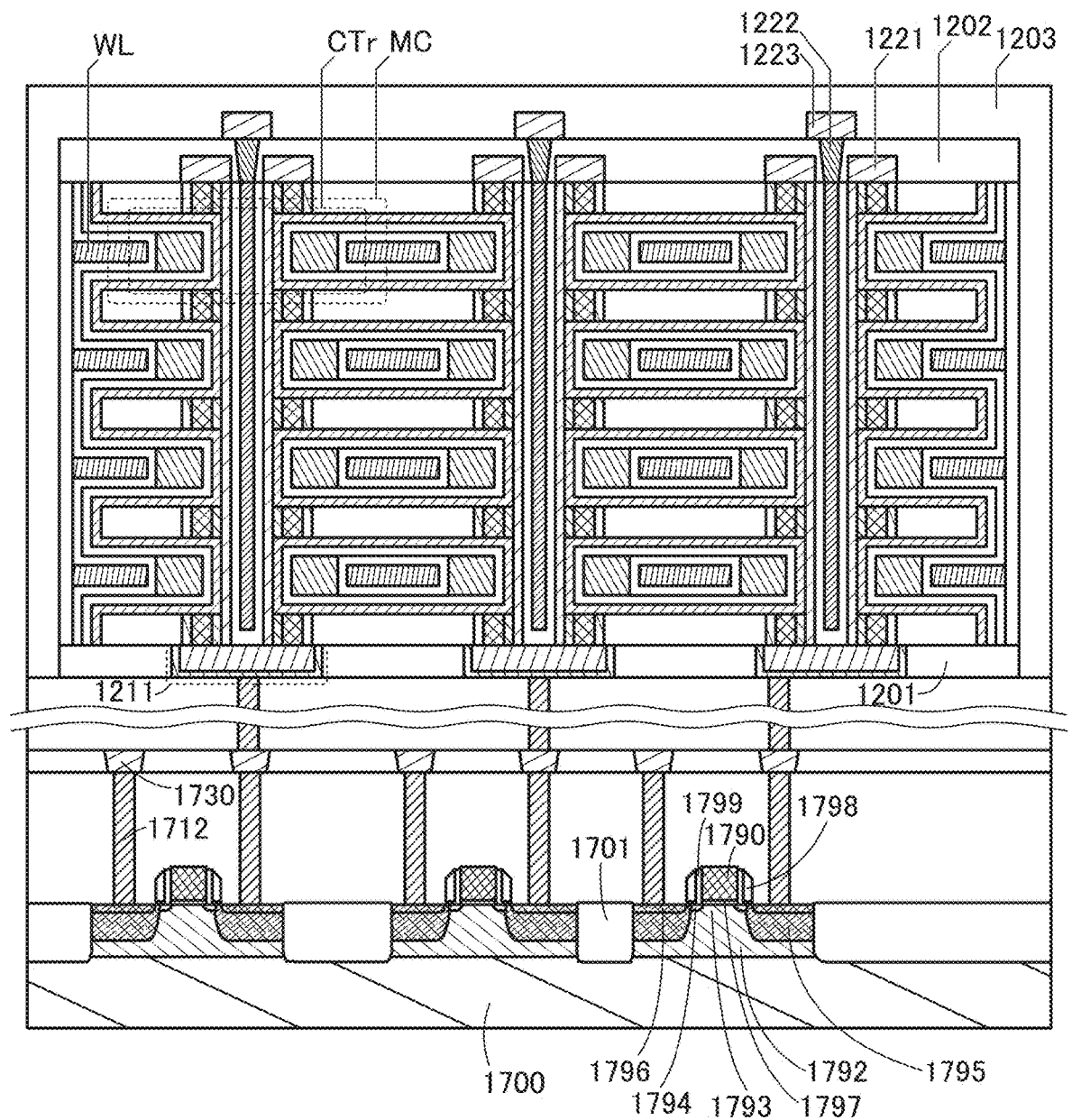
FIG. 69 is a cross-sectional view illustrating a structure example of a semiconductor device.
Figure 70:
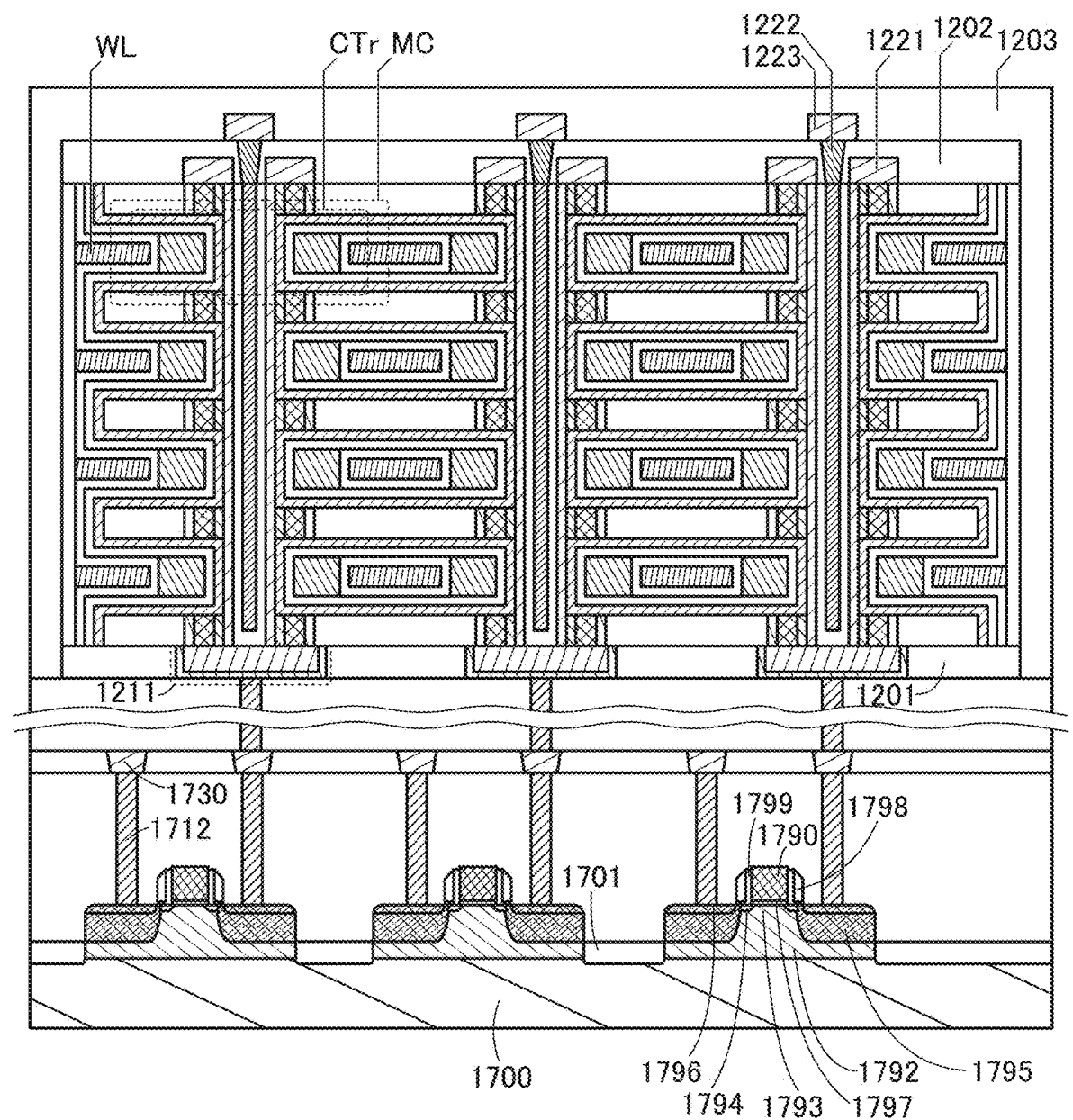
FIG. 70 is a cross-sectional view illustrating a structure example of a semiconductor device.

A peripheral circuit for the memory cell array, such as a readout circuit or a precharge circuit, may be provided below the semiconductor device. In that case, Si transistors are formed on a silicon substrate or the like to configure the peripheral circuit, and then the semiconductor device of one embodiment of the present invention described in Embodiment 1 or Embodiment 2 is formed over the peripheral circuit. FIG. 67A and FIG. 69 are cross-sectional views in which the peripheral circuit is configured with planar Si transistors and the semiconductor device of one embodiment of the present invention is formed thereover. FIG. 68A and FIG. 70 are cross-sectional views in which the peripheral circuit is configured with FIN Si transistors and the semiconductor device of one embodiment of the present invention is formed thereover. Note that the semiconductor device illustrated in FIG. 67A and FIG. 68A employs the structure of the semiconductor device in FIG. 1 as an example, and the semiconductor device illustrated in FIG. 69 and FIG. 70 employs the structure of the semiconductor device in FIG. 28 as an example.

Note that in the semiconductor devices in FIG. 67A, FIG. 68A, FIG. 69, and FIG. 70, a conductor 1221 electrically connected to one of a source and a drain of a cell transistor at an end of a string, a conductor 1222 and a conductor 1223 electrically connected to a backgate electrode of a cell transistor included in the string, an insulator 1202, and an insulator 1203 are illustrated.

The conductor 1221 is provided in contact with the insulator 412, the conductor 431, and the material layer 451 on a top surface of a stack of cell transistors. The insulator 1202 is formed to cover the stack of the cell transistors and the conductor 1221. An opening is provided in the insulator 1202 to expose the backgate electrode (the conductor 432) of the cell transistor, and the conductor 1222 is provided to fill the opening. The conductor 1223 is provided in contact with the conductor 1222. The insulator 1203 is formed to cover the conductor 1223, the insulator 1202, and the stack of the cell transistors.

For the conductor 1221, the conductor 1222, and the conductor 1223, for example, the material that can be used for the conductor 432 is preferably used.

For the insulator 1202 and the insulator 1203, the material that can be used for the insulator 412 is preferably used, for example. In particular, the insulator 1202 and the insulator 1203 preferably include a barrier insulating film that inhibits impurities from the outside (e.g., water molecules, hydrogen atoms, hydrogen molecules, oxygen atoms, oxygen molecules, nitrogen atoms, nitrogen molecules, nitrogen oxide molecules ($N_2O$, NO, $NO_2$, or the like) from diffusing into the stack of the cell transistors.

Note that although transistors corresponding to the transistor STr and the transistor BTr are omitted in the semiconductor devices in FIG. 67A, FIG. 68A, FIG. 69, and FIG. 70, these transistors may be provided between the stack including the cell transistor and the insulator 1202 and between the stack including the cell transistor and the insulator 1201.

In FIG. 67A, FIG. 68A, FIG. 69, and FIG. 70, the Si transistors configuring the peripheral circuit are formed on a substrate 1700. An element separation layer 1701 is formed between a plurality of Si transistors. Conductors 1712 are formed as a source and a drain of the Si transistor. A conductor 1730 is formed with extension in the channel width direction and connected to another Si transistor or the conductor 1712 (not illustrated).

As the substrate 1700, a single crystal semiconductor substrate or a polycrystalline semiconductor substrate of silicon or silicon carbide, a compound semiconductor substrate of silicon germanium, an SOI substrate, or the like can be used.

Moreover, a glass substrate, a quartz substrate, a plastic substrate, a metal substrate, a flexible substrate, an attachment film, paper containing a fibrous material, or a base film, for example, may be used as the substrate 1700. Alternatively, after a semiconductor element is formed using one substrate, the semiconductor element may be transferred to another substrate. As an example, FIG. 67A, FIG. 68A, FIG. 69, and FIG. 70 show examples in which a single crystal silicon wafer is used as the substrate 1700.

Figure 67B:
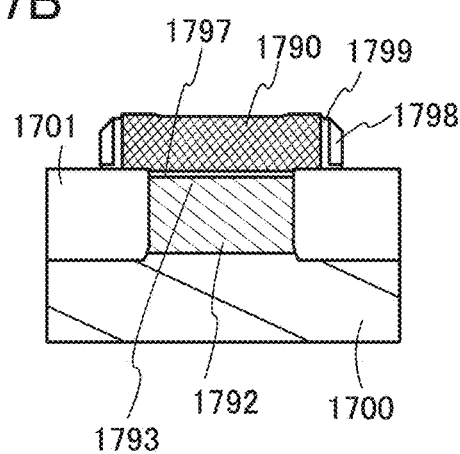

Here, the details of the Si transistors are described. FIG. 67A and FIG. 69 are cross-sectional views of the planar Si transistor in the channel length direction, and FIG. 67B is a cross-sectional view of the planar Si transistor in the channel width direction. The Si transistor includes a channel formation region 1793 provided in a well 1792, low-concentration impurity regions 1794 and high-concentration impurity regions 1795 (also collectively referred to simply as impurity regions), conductive regions 1796 provided in contact with the impurity regions, a gate insulating film 1797 provided over the channel formation region 1793, a gate electrode 1790 provided over the gate insulating film 1797, and sidewall insulating layers 1798 and sidewall insulating layers 1799 provided on side surfaces of the gate electrode 1790. Note that for the conductive regions 1796, a metal silicide or the like may be used.

Figure 68B:
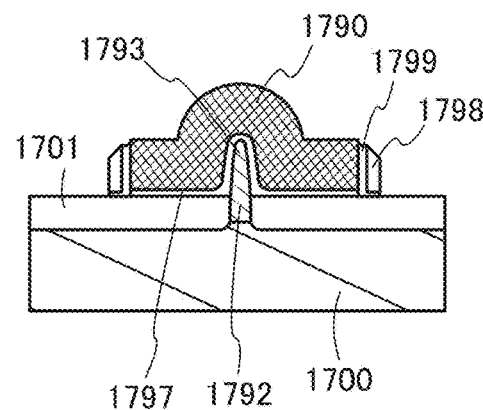

FIG. 68A and FIG. 70 are cross-sectional views of the FIN Si transistor in the channel length direction, and FIG. 68B is a cross-sectional view of the FIN Si transistor in the channel width direction. In the Si transistor illustrated in FIG. 68A, FIG. 68B, and FIG. 70, the channel formation region 1793 has a projecting portion, and the gate insulating film 1797 and the gate electrode 1790 are provided along its side and top surfaces. Although the case where the projecting portion is formed by processing part of the semiconductor substrate is described in this embodiment, a semiconductor layer with a projecting shape may be formed by processing an SOI substrate.

The insulator 1201 is formed above the circuit formed by the Si transistors, the conductor 1712, the conductor 1730, and the like over the substrate 1700. A conductor 1211 for electrically connecting to the circuit is formed so as to be embedded in the insulator 1201. In the case where metal oxide is contained in the channel formation region of the cell transistor CTr, an insulator with barrier properties against hydrogen and the like is preferably used for the insulator 1201 and the conductor 1211. This is to inhibit diffusion of hydrogen from the Si transistor into the cell transistor CTr through the insulator 1201 and/or the conductor 1211.

Any of the above materials usable for the insulator 411A to the insulator 411C can be used for the insulator 1201.

For example, tantalum nitride, which has barrier properties against hydrogen, is preferably used for the conductor 1211. In addition, by stacking tantalum nitride and tungsten, which has high conductivity, the diffusion of hydrogen from the Si transistor can be inhibited while the conductivity as a wiring is kept.

Note that the reference numerals in FIG. 68A, FIG. 68B, FIG. 69, and FIG. 70 are the same as those in FIG. 67A and FIG. 67B.

Note that this embodiment can be combined with the other embodiments described in this specification as appropriate.

Embodiment 6

In this embodiment, a semiconductor device having a different structure from the semiconductor device described in Embodiment 1 will be described.

Figure 71A:
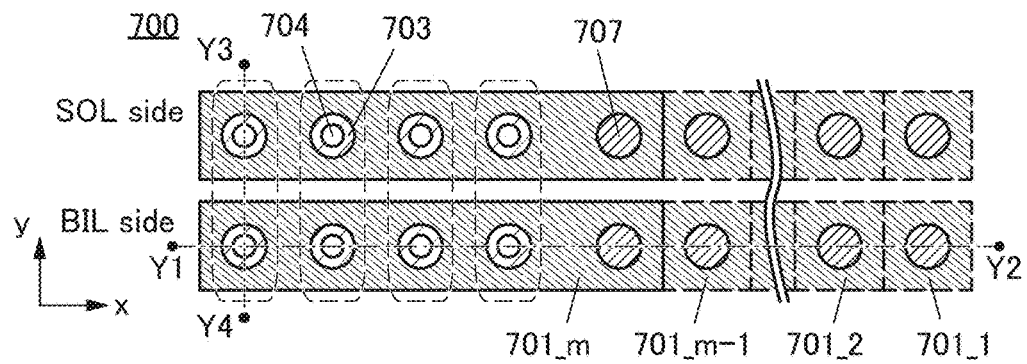
FIG. 71A is a top view illustrating a structure example of a semiconductor device and FIG. 71B to FIG. 71D are cross-sectional views illustrating structure examples of a semiconductor device.
Figure 71B:
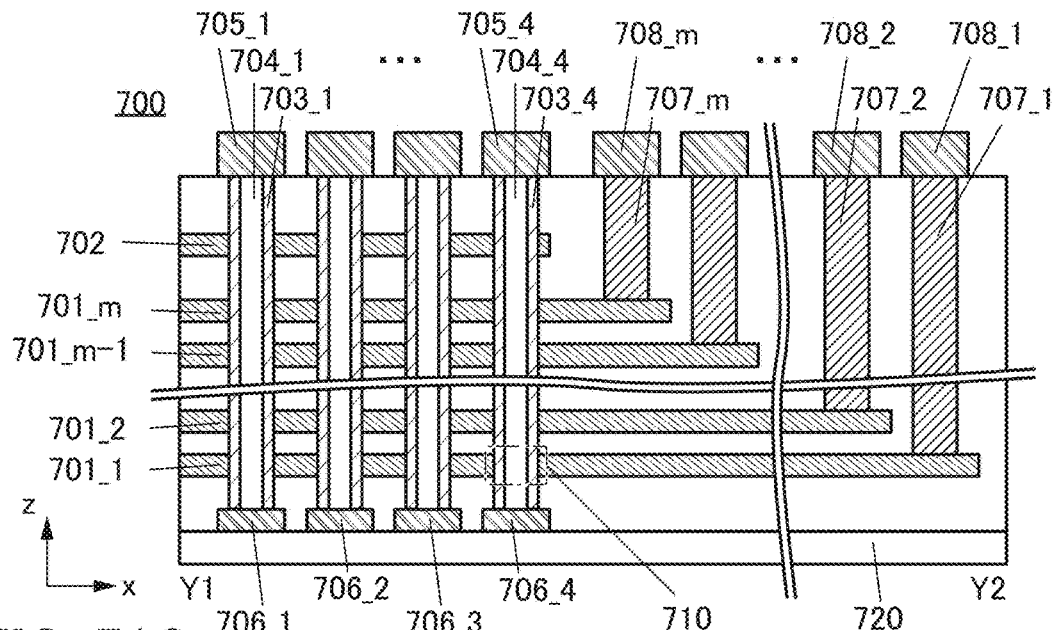
Figure 71C:
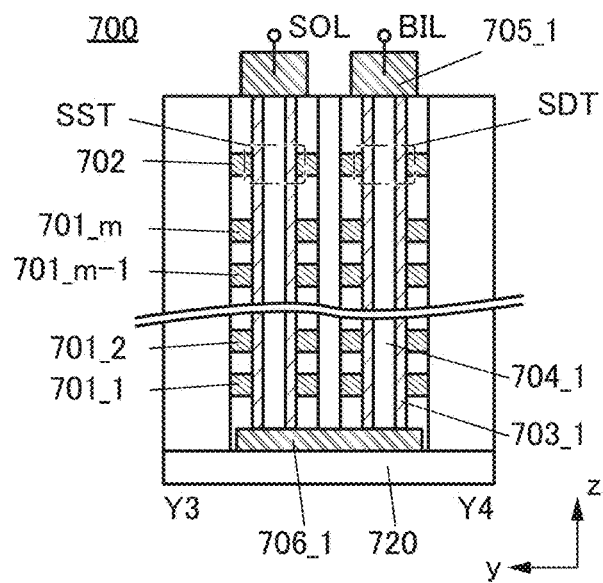
Figure 71D:
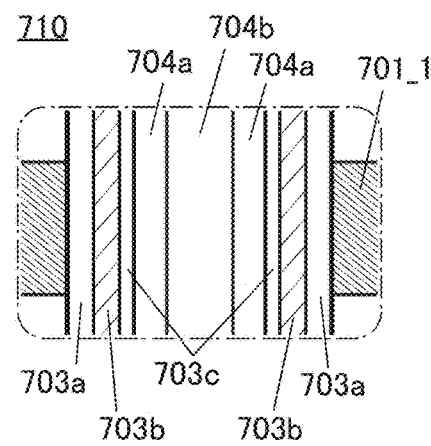
Figure 72A:
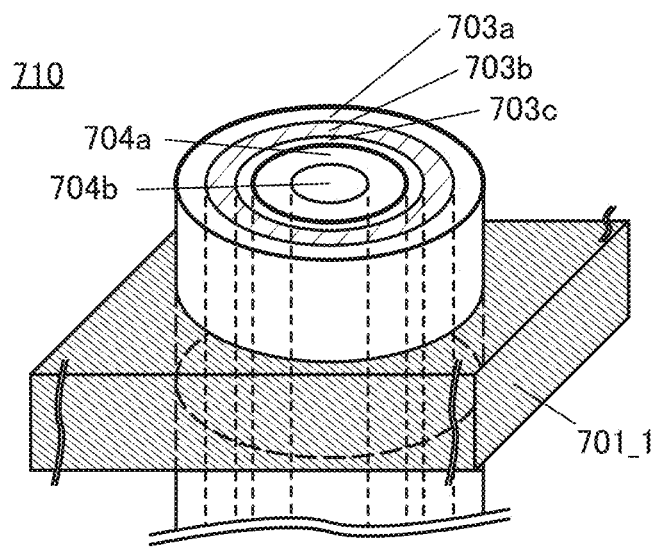
FIG. 72A to FIG. 72C are perspective views illustrating structure examples of a semiconductor device.
Figure 72B:
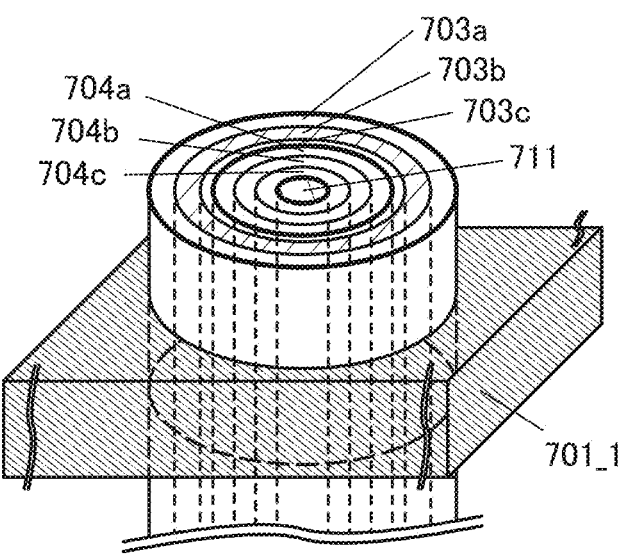
Figure 72C:
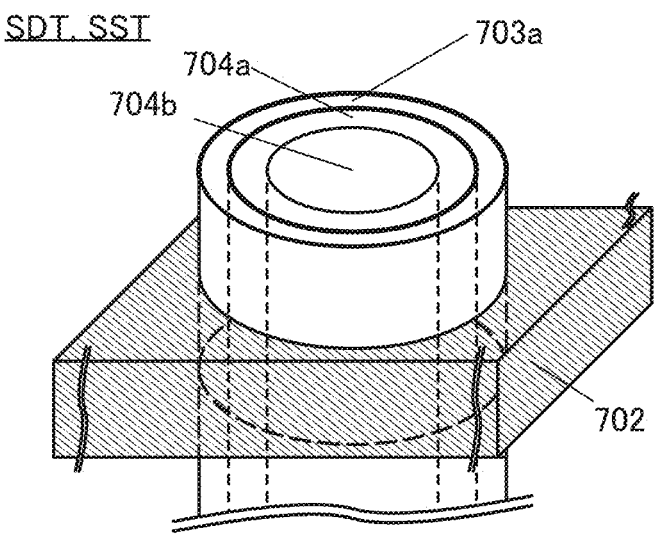

Examples of structures of a cell transistor and a memory cell array in the semiconductor device are described with reference to FIG. 71A to FIG. 71D, FIG. 72A to FIG. 72C, and FIG. 73. FIG. 71A is a top view of a memory cell array 700 and FIG. 71B is a cross-sectional view taken along the dashed-dotted line Y1-Y2 in FIG. 71A. FIG. 71C is a cross-sectional view taken along the dashed-dotted line Y3-Y4 in FIG. 71A and is a cross-sectional view illustrating a memory string. FIG. 71D is an enlarged cross-sectional view of a portion surrounded by a dashed-dotted line in FIG. 71B; FIG. 72A and FIG. 72B are enlarged perspective views of a portion surrounded by the dashed-dotted line in FIG. 71B and are each a diagram illustrating an example of the cell transistor 710 serving as a memory cell. FIG. 72C is an enlarged perspective view of a portion surrounded by the dashed-dotted line in FIG. 71C and is a diagram illustrating a transistor serving as a selection transistor. Note that in the following description, rectangular coordinates using an x-axis, a y-axis, and a z-axis are set as illustrated in FIG. 71A to FIG. 71C for the sake of convenience. Here, the x-axis and the y-axis are parallel to a top surface of a base 720 provided with the memory cell array 700, and the z-axis is perpendicular to the top surface of the base 720.

The memory cell array 700 includes: over the base 720, a stack in which a conductor 701 (a conductor 701_1 to a conductor 701_m (m is a natural number of 2 or more)) or a conductor 702 and an insulating film are alternately stacked; an insulator 703 (an insulator 703_1 to an insulator 703_4) inside an opening portion to penetrate the stack, oxide 704 (oxide 704_1 to oxide 704_4) on the inner side of the insulator 703; a conductor 705 (a conductor 705_1 to a conductor 705_4) electrically connected to upper end portions of the oxide 704_1 to the oxide 704_4; a conductor 706 (a conductor 706_1 to a conductor 706_4) electrically connected to lower end portions of the oxide 704_1 to the oxide 704_4; a conductor 707 (a conductor 707_1 to a conductor 707_m) electrically connected to the conductor 701_1 to the conductor 701_m; and a conductor 708 (a conductor 708_1 to a conductor 708_m) electrically connected to the conductor 707_1 to the conductor 707_m. Note that in FIG. 71B, four or more stages of the conductors 701 are illustrated to show a plurality of conductors 701; however, this embodiment is not limited to FIG. 71B and at least two stages of the conductors 701 are provided.

In FIG. 71A, the memory cell array 700 includes an SOL-side stack connected to a source line SOL and a BIL-side stack electrically connected to a bit line BIL. Note that the source line SOL and the bit line BIL will be described later.

As illustrated in FIG. 71A and FIG. 71B, the conductor 701 is provided to extend in the x-axis direction. As illustrated in FIG. 71B and FIG. 71C, the insulator 703 and the oxide 704 are provided to extend in the z-axis direction. That is, the conductor 701 is preferably provided to cross the insulator 703 and oxide 704 perpendicularly. Furthermore, as illustrated in FIG. 71B, the conductor 707 is provided to extend in the z-axis direction. The conductor 708 may be provided to extend in the y-axis direction. In addition, a conductor functioning as a bit line BL connected to the conductor 705 may be provided to extend in the y-axis direction. Part of the conductor 705 may function as the bit line BL and the conductor may be provided to extend in the y-axis direction.

The oxide 704 is formed in a columnar shape and provided to extend in the z-axis direction. The insulator 703 is provided to surround the periphery of the side of the columnar oxide 704. The conductor 707 is formed in a columnar shape and provided to extend in the z-axis direction.

The columnar oxide 704 is, in the z-axis direction, electrically connected to the conductor 706 at the lower end and electrically connected to the conductor 705 at the upper end. As illustrated in FIG. 71C, the conductor 706 is electrically connected to the lower ends of two adjacent columnar oxides 704, and the upper ends of the two columnar oxides 704 are electrically connected to the electrically separated conductors 705.

Here, a region where the conductor 701 crosses the insulator 703 and the oxide 704 and the vicinity of the region function as the cell transistor. A region where the conductor 702 crosses the insulator 703 and the oxide 704 and the vicinity of the region function as the selection transistor. The channel length directions of these cell transistor and selection transistor are parallel to the z-axis direction. The cell transistor and the selection transistor are electrically connected in series to form the memory string.

Note that the structure of the semiconductor device described in this embodiment is an example, and the present invention is not limited to the number, the position, and the like of the circuit element, the wiring, and the like illustrated in the drawings and the like according to this embodiment. The number, the position, and the like of the circuit element, the wiring, and the like included in the semiconductor device in this embodiment can be determined as appropriate in accordance with the circuit configuration and the driving method.

The base 720 provided with the memory cell array 700 preferably has an insulating surface. As a substrate having an insulating surface, a semiconductor substrate provided with an insulating film on its surface, an insulator substrate, a conductor substrate provided with an insulator on its surface, or the like is used. Note that the semiconductor substrate, the insulator substrate, or the conductor substrate which is used as the base 720 can be the substrate that can be used for the semiconductor device described in Embodiment 1.

The conductor 701 functions as the gate of the cell transistor and is electrically connected to a word line. That is, the conductor 701, the conductor 707, and the conductor 708 also function as part of the word line. Here, as illustrated in FIG. 71B, the conductor 701 is preferably provided in a step-like shape where the conductor 701 in the lower layer extends to be closer to the Y2 side than the conductor 701 in the upper layer does. The conductor 701 is provided in this manner, so that the conductor 701 in the upper layer does not overlap with a region of part of the top surface of the conductor 701 in the lower layer; thus, the regions in the conductors 701 can be connected to the respective conductors 707.

For the conductor 701, a material having conductivity, such as silicon to which an impurity is added or metal, can be used. When silicon is used for the conductor 701, amorphous silicon or polysilicon can be used. A p-type impurity or an n-type impurity may be added to impart conductivity to silicon. As a conductive material containing silicon, silicide containing titanium, cobalt, or nickel can be used for the conductor 701. When a metal material is used for the conductor 701, a material containing one or more metal elements selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, and the like can be used.

The conductor 702 is provided over the conductor 701. The conductor 702 functions as the gate of the selection transistor (the selection transistor on the bit line side: SDT and the selection transistor on the source line side: SST). For the conductor 702, a material similar to that for the conductor 701 can be used. For the conductor 702, the same material as the conductor 701 may be used or a material different from that for the conductor 701 may be used. The materials used for the conductor 701 and the conductor 702 are determined depending on the usage of the conductor 701 and the conductor 702 in consideration of work function or the like.

As insulating film provided in the upper layer and the lower layer of the conductor 701 and the conductor 702, oxide, nitride, oxynitride, nitride oxide, metal oxide, metal oxynitride, metal nitride oxide, or the like which has an insulating property can be used. Silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or a resin has a low relative permittivity and thus is preferably used for the insulating film. Note that oxynitride refers to a material that contains more oxygen than nitrogen, and nitride oxide refers to a material that contains more nitrogen than oxygen. Metal oxynitride refers to a material that contains more oxygen than nitrogen, and metal nitride oxide refers to a material that contains more nitrogen than oxygen.

Although aluminum oxide, gallium oxide, hafnium oxide, zirconium oxide, oxide including aluminum and hafnium, oxynitride including aluminum and hafnium, oxide including silicon and hafnium, oxynitride including silicon and hafnium, nitride including silicon and hafnium, or the like can be used for the insulating film, these materials have a high relative permittivity; thus, parasitic capacitance may be generated between the conductors 701 or between the conductor 701 and the conductor 702. The material used for the insulating film can be determined depending on the design or the usage of the device.

The insulator 703 includes an insulator 703a, an insulator 703b, and an insulator 703c, as illustrated in FIG. 72A. The insulator 703a is provided on the conductor 701 side, the insulator 703c is provided on the oxide 704 side, and the insulator 703b is provided between the insulator 703a and the insulator 703c. In particular, in the cell transistor in the vicinity of a region where the conductor 701, the insulator 703, and the oxide 704 intersect with one another, the insulator 703a functions as a gate insulating layer, the insulator 703b functions as a charge accumulation layer, and the insulator 703c functions as a tunnel insulating layer.

The charge accumulation layer or the tunnel insulating layer is not necessarily provided in the selection transistor as illustrated in FIG. 72C. Thus, the transistor on the bit line side: SDT and the transistor on the source line side: SST may have a structure in which the insulator 703b and the insulator 703c are not provided and only the insulator 703a is provided as the insulator 703. In FIG. 72A and FIG. 72C, the oxide 704 has a two-layer structure of the oxide 704a and the oxide 704b; however, the present invention is not limited thereto. As illustrated in FIG. 72B, the oxide 704 may have a three-layer structure of the oxide 704a, the oxide 704b, and the oxide 704c or a stacked-layer structure of four or more layers. In addition, an insulator 711 may be provided on the inner side of the oxide 704b.

For the insulator 703a, silicon oxide or silicon oxynitride is preferably used. Aluminum oxide, hafnium oxide, or oxide including aluminum and hafnium may be used. These materials may be stacked to be the insulator 703a.

For the insulator 703b, a material functioning as a charge accumulation layer is preferably used, and silicon nitride or silicon nitride oxide is preferably used. Aluminum oxide, hafnium oxide, or oxide including aluminum and hafnium may be used.

For the insulator 703c, silicon oxide or silicon oxynitride is preferably used. Aluminum oxide, hafnium oxide, or oxide including aluminum and hafnium may be used. These materials may be stacked to be the insulator 703c. The insulator 703c is preferably thinner than the insulator 703a. Although details are described later, in writing or erasing data to/from the cell transistor, charge is transferred between the oxide 704 and the insulator 703b through the insulator 703c. That is, the insulator 703c functions as a tunnel insulating layer.

In particular, in the case where the insulator 703 is formed in the opening provided in the stack including the conductor 701, the conductor 702, and the insulating films, the insulator 703 formed on the bottom portion of the opening needs to be removed by anisotropic etching using dry etching or the like. In anisotropic etching, the side surface of the insulator 703c is also exposed to plasma, a radical, a gas, a chemical solution, or the like. When they damage the side surface of the insulator 703c, trap centers might be generated in the insulator 703c and might affect electrical characteristics of the transistor. In order that the generation of the trap centers be inhibited, the side surface of the insulator 703c is required to be highly resistant to damage from etching. In this case, for the insulator 703c, aluminum oxide, a stack of silicon oxide and aluminum oxide, or a stack of silicon oxynitride and aluminum oxide is preferably used.

The insulator 703a, the insulator 703b, and the insulator 703c can be formed by an ALD method, a CVD method, or the like. In order that the interfaces between the insulator 703a, the insulator 703b, and the insulator 703c be prevented from being contaminated, these insulators are preferably deposited in succession without exposure to an air atmosphere in the same chamber or with a multi-chamber deposition apparatus including a plurality of chambers.

Metal oxide functioning as an oxide semiconductor is preferably used as the oxide 704. More preferably, an oxide semiconductor with high field effect mobility is used. Such an oxide semiconductor has favorable on-state characteristics and high mobility of a transistor as compared with a semiconductor made of silicon or the like.

For example, metal oxide such as In-M-Zn oxide (an element M is one or more kinds selected from aluminum, gallium, yttrium, copper, vanadium, beryllium, boron, titanium, iron, nickel, germanium, zirconium, molybdenum, lanthanum, cerium, neodymium, hafnium, tantalum, tungsten, magnesium, and the like) can be used as the oxide 704. In particular, In—Ga—Zn oxide is preferably used. Alternatively, In—Ga oxide or In—Zn oxide may be used as the oxide 704.

With use of an oxide semiconductor with a high field effect mobility for the semiconductor device, the speed of writing, reading, or erase operation can be increased in some cases.

For example, the oxide 704 preferably includes the oxide 704a provided on the insulator 703c side and the oxide 704b provided on the inner side of the oxide 704a as illustrated in FIG. 71D, FIG. 72A, and FIG. 72C. Note that FIG. 71D is an enlarged view of the cell transistor 710 surrounded by the dashed-dotted line in FIG. 71B. At this time, as the oxide 704a, oxide having an energy gap relatively wider than that of the oxide 704b is preferably used. Here, in some cases, oxide having a wide energy gap is referred to as a wide gap, and oxide having a narrow energy gap is referred to as a narrow gap.

In the case where the oxide 704a is a wide gap and the oxide 704b is a narrow gap, an energy of the conduction band minimum of the oxide 704a is preferably higher than an energy of the conduction band minimum of the oxide 704b. In other words, the electron affinity of the oxide 704a is preferably smaller than the electron affinity of the oxide 704b.

The oxide 704a and the oxide 704b are preferably combined to have different atomic ratios of metal atoms. Specifically, the atomic ratio of the element M to constituent elements in the metal oxide used as the oxide 704a is preferably higher than the atomic ratio of the element M to constituent elements in the metal oxide used as the oxide 704b. The atomic ratio of the element M to In in the metal oxide used as the oxide 704a is preferably higher than the atomic ratio of the element M to In in the metal oxide used as the oxide 704b. The atomic ratio of In to the element M in the metal oxide used as the oxide 704b is preferably higher than the atomic ratio of In to the element M in the metal oxide used as the oxide 704a.

As the oxide 704a, for example, metal oxide having a composition of In:Ga:Zn=1:3:4, In:Ga:Zn=1:3:2, or In:Ga:Zn=1:1:1, or a composition which is in the neighborhood thereof can be used as described in Embodiment 1. As the oxide 704b, for example, metal oxide having a composition of In:Ga:Zn=4:2:3 to 4:2:4.1, In:Ga:Zn=1:1:1, In:Ga:Zn=5:1:6, In:Ga:Zn=5:1:3, or In:Ga:Zn=10:1:3, or a composition which is in the neighborhood thereof can be used. As the oxide 704b, metal oxide having a composition of In:Zn=5:1 or In:Zn=10:1 or a composition which is in the neighborhood thereof can be used, for example. Indium oxide can be used as the oxide 704b.

These oxide 704a and oxide 704b are preferably combined to satisfy the above relation of the atomic ratios. For example, it is preferable that the oxide 704a be metal oxide having a composition of In:Ga:Zn=1:3:4 or a composition which is in the neighborhood thereof and the oxide 704b be metal oxide having a composition of In:Ga:Zn=4:2:3 to 4:2:4.1 or a composition which is in the neighborhood thereof. Note that the above composition represents the atomic ratio of oxide formed over a base or the atomic ratio of a sputtering target.

The oxide 704a and the oxide 704b may be formed by a sputtering method, a plasma CVD method, a thermal CVD method (an ALD method, an MOCVD method, or the like), or the like. To prevent contamination of the interface between the oxide 704a and the oxide 704b, these oxides are preferably deposited in succession in the same chamber or with a multi-chamber deposition apparatus including a plurality of chambers without exposure to an air atmosphere. For this reason, the insulator 703a, the insulator 703b, the insulator 703c, the oxide 704a, and the oxide 704b are preferably formed successively.

It is also preferable that the CAAC-OS described in Embodiment 4 be used as the oxide 704a and a CAC-OS be used as the oxide 704b. In the case where the CAAC-OS is used as the oxide 704a, the c-axes are preferably aligned parallel to the x-y plane shown in FIG. 71A and the like, that is, perpendicular to the z-axis, and preferably aligned from the side surface of the opening to the central portion.

Here, in a junction portion of the oxide 704a and the oxide 704b, the conduction band minimum is gradually changed. In other words, the conduction band minimum at the junction portion of the oxide 704a and the oxide 704b is continuously varied or continuously connected. For this, the density of defect states in a mixed layer formed at the interface between the oxide 704a and the oxide 704b can be decreased.

Specifically, when the oxide 704a and the oxide 704b contain the same element (as a main component) in addition to oxygen, a mixed layer with a low density of defect states can be formed. For example, in the case where the oxide 704b is an In—Ga—Zn oxide, it is preferable to use an In—Ga—Zn oxide, a Ga—Zn oxide, gallium oxide, or the like for the oxide 704a. Accordingly, the density of defect states at the interface between the oxide 704a and the oxide 704b can be decreased. Thus, the influence of interface scattering on carrier conduction is small, and the cell transistor 710 can have a high on-state current.

Note that the details of the metal oxide that can be used as the oxide 704 are described later.

As illustrated in FIG. 71D and FIG. 72A, the oxide 704b is provided to be surrounded by the oxide 704a. In the case of such a structure, carriers mainly flow in the component having a narrow gap when the carriers flow in the oxide 704 from the conductor 705 toward the conductor 706 or from the conductor 706 toward the conductor 705. Therefore, in the case where the above structure is used, high current drive capability in the on state of the transistor, that is, high on-state current and high field-effect mobility, can be obtained.

The oxide 704a is provided between the oxide 704b and the insulator 703c, whereby the oxide 704b serving as a carrier path and the insulator 703c are not in direct contact with each other, so that the formation of trap centers can be inhibited. The trap centers formed at the interface between the semiconductor (oxide semiconductor) and the insulator trap electrons and cause the threshold voltage of the transistor to shift in the positive direction, which might adversely affect the reliability and the on-off characteristics of the transistor. Thus, electrical characteristics of a transistor using the oxide are not affected by the trap centers, so that higher current drive capability in the on state, i.e., higher on-state current and higher field-effect mobility can be obtained. Furthermore, the transistor and a semiconductor device using the transistor can have high reliability.

Note that although the oxide 704 illustrated in FIG. 71D and FIG. 72A is provided such that the oxide 704a surrounds the oxide 704b, this embodiment is not limited thereto. FIG. 72B illustrates a different example of the cell transistor 710. In FIG. 72B, in the cell transistor 710, the oxide 704a is provided on the inner side of the insulator 703a, the insulator 703b, and the insulator 703c, the oxide 704b is provided on the inner side of the oxide 704a, and the oxide 704c is provided on the inner side of the oxide 704b. The insulator 711 may be provided to be embedded on the inner side of the oxide 704c. Note that the insulator 711 is not necessarily provided, and the inner side of the oxide 704c may be a void.

The oxide 704b may be provided to be sandwiched between the oxide 704a and the oxide 704c. At this time, the oxide 704c is preferably a wide gap like the oxide 704a. When the oxide 704c which is a wide gap is provided, carriers flowing through the oxide 704 can be confined in the oxide 704b, so that high current drive capability in the on state of the transistor, i.e., high on-state current and high field-effect mobility can be obtained.

In the case where the insulator 711 is provided on the inner side of the oxide 704c, the insulator 711 is preferably a material that can supply oxygen to the oxide 704 or a material that can supply impurities, such as hydrogen and nitrogen. When oxide that contains hydrogen and nitrogen as little as possible is used for the insulator 711, oxygen can be supplied to the oxide 704 in some cases. By supplying oxygen to the oxide 704, impurities such as hydrogen and water contained in the oxide 704 can be removed and the oxide 704 is highly purified. When oxide in which impurities are reduced as much as possible is used as the oxide 704, the memory transistor and the semiconductor device using the transistor can have high reliability.

When oxide containing hydrogen and nitrogen is used for the insulator 711, hydrogen and nitrogen can be supplied to the oxide 704 in some cases. When hydrogen and nitrogen are supplied to the oxide 704, the resistance value of the oxide 704 is decreased in some cases. The resistance value of the oxide 704 is decreased to such an extent that it does not hinder the circuit operation, whereby the cell transistor can operate with lower driving voltage. Furthermore, high current drive capability in the on state of the cell transistor, i.e., high on-state current and high field-effect mobility can be obtained.

The top view of the opening formed in the stack provided with the cell transistor 710 is, but not limited to, circular as illustrated in FIG. 71A, FIG. 72A, and FIG. 72B, and the like; the top view may be, for example, elliptic or polygonal, e.g., a triangle or a quadrangle. In the case of a polygonal shape, corner portions in the shape may be rounded. The top-view shapes of the insulator 703 and the oxide 704 may change depending on the top-view shape of the opening. The opening may have a shape where a lower cross sectional area of the opening (on the conductor 706 side) is narrower than an upper cross sectional area of the opening (on the conductor 705 side).

The cell transistor is formed of the oxide 704, the insulator 703, and the conductor 701 (any one of the conductor 701_1 to the conductor 701_m). FIG. 71 shows an example in which m stages of cell transistors (m is a natural number of 4 or more) are stacked.

The conductor 705 is electrically connected to the oxide 704 and functions as part of the source line SOL or part of the bit line BIL. As the conductor 705, a conductive material containing a metal element is preferably used. A metal compound layer containing the metal element included in the conductor 705 and the component of the oxide 704 is preferably formed at the interface between the conductor 705 and the oxide 704. The metal compound is preferably formed, in which case the contact resistance between the conductor 705 and the oxide 704 is reduced. Alternatively, oxygen contained in the oxide 704 is absorbed by the conductor 705 and the resistance of the oxide 704 in the vicinity of the interface between the conductor 705 and the oxide 704 is reduced, whereby the contact resistance between the conductor 705 and the oxide 704 can be reduced.

A conductive material containing one or more metal elements selected from aluminum, ruthenium, titanium, tantalum, chromium, tungsten, and copper is preferably used as the conductor 705.

As illustrated in FIG. 71C, the conductor 706 is electrically connected to the oxide 704 electrically connected to the conductor 705 that functions as part of the bit line BIL and to the oxide 704 electrically connected to the conductor 705 that functions as part of the source line SOL, so that the memory string is formed. Regions surrounded by dotted lines in FIG. 71A represents memory strings. In other words, FIG. 71A illustrates a memory cell array 700 including four memory strings.

For the conductor 706, a material similar to that for the conductor 705 can be used. For the conductor 706, the same material as the conductor 705 may be used or a material different from that for the conductor 705 may be used.

A metal compound layer containing the metal element included in the conductor 706 and the component of the oxide 704 is preferably formed at the interface between the conductor 706 and the oxide 704. The metal compound is preferably formed, in which case the contact resistance between the conductor 706 and the oxide 704 is reduced. Alternatively, oxygen contained in the oxide 704 is absorbed by the conductor 706 and the resistance of the oxide 704 in the vicinity of the interface between the conductor 706 and the oxide 704 is reduced, whereby the contact resistance between the conductor 706 and the oxide 704 can be reduced.

<Memory Cell Array 700A>

Figure 73:
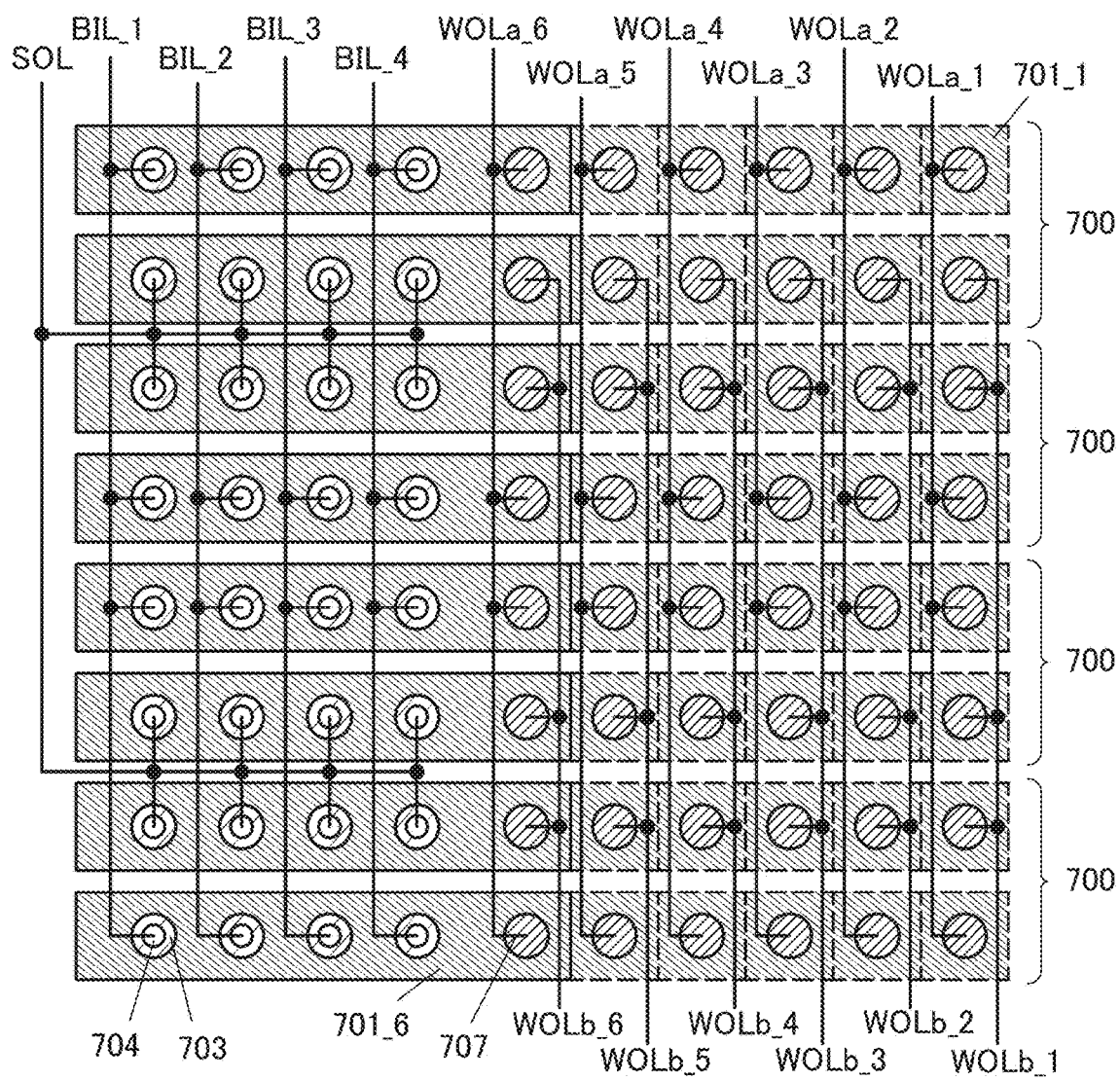
FIG. 73 is a top view illustrating a structure example of a semiconductor device.

FIG. 73 is a top view illustrating a memory cell array 700A in which a plurality of memory cell arrays 700 including six stages of cell transistors are combined. Note that in FIG. 73, some components are omitted for simple description. For example, the selection transistors (the transistor on the bit line side: SDT and the transistor on the source line side: SST) provided over the conductor 701 and the conductor 702 which is the component thereof are omitted. The conductors 705 (see FIG. 71) functioning as part of the bit line BIL and part of the source line SOL and the conductor 708 (see FIG. 71) functioning as part of the word line WOL are shown by solid lines.

In the memory cell array 700A, each memory cell array 700 includes four memory strings including six stages of cell transistors.

The ends of the memory strings on the bit line side are electrically connected to the respective bit lines BIL (a bit line BIL_1 to a bit line BIL_4). The ends of the memory strings on the source line side are electrically connected to the source line SOL and are supplied with a common potential. The source line SOL may be grounded or may be supplied with a constant potential. Alternatively, the potential may be changed depending on the circuit operation.

The conductor 701_1 to the conductor 701_6 are electrically connected to the respective word lines WOL. Note that in FIG. 73, the conductor 701_1 and the conductor 701_6 are denoted by reference numerals among the conductor 701_1 to the conductor 701_6. The conductors 701 on the bit line side are electrically connected to the word line WOLa_1 to the word line WOLa_6, and the conductors 701 on the source line side are electrically connected to the word line WOLb_1 to the word line WOLb_6.

By selecting the bit line BIL (the bit line BL_1 to the bit line BL_4) and the word line (the word line WOLa_1 to the word line WOLa_6 and the word line WOLb_1 to the word line WOLb_6) as appropriate, a given cell transistor in the memory cell array 700 can be selected. In addition, writing, reading, erasing, and the like can be performed on the selected cell transistor.

Since the selection transistor (not illustrated) is provided in each memory string, the given memory cell array 700 in the memory cell array 700A can be selected, and writing, readout, erasing, and the like can be performed on the given cell transistor in the selected memory cell array 700.

Note that this embodiment can be combined with the other embodiments described in this specification as appropriate.

Embodiment 7

In this embodiment, a storage device including the semiconductor device described in the foregoing embodiment will be described.

Figure 74:
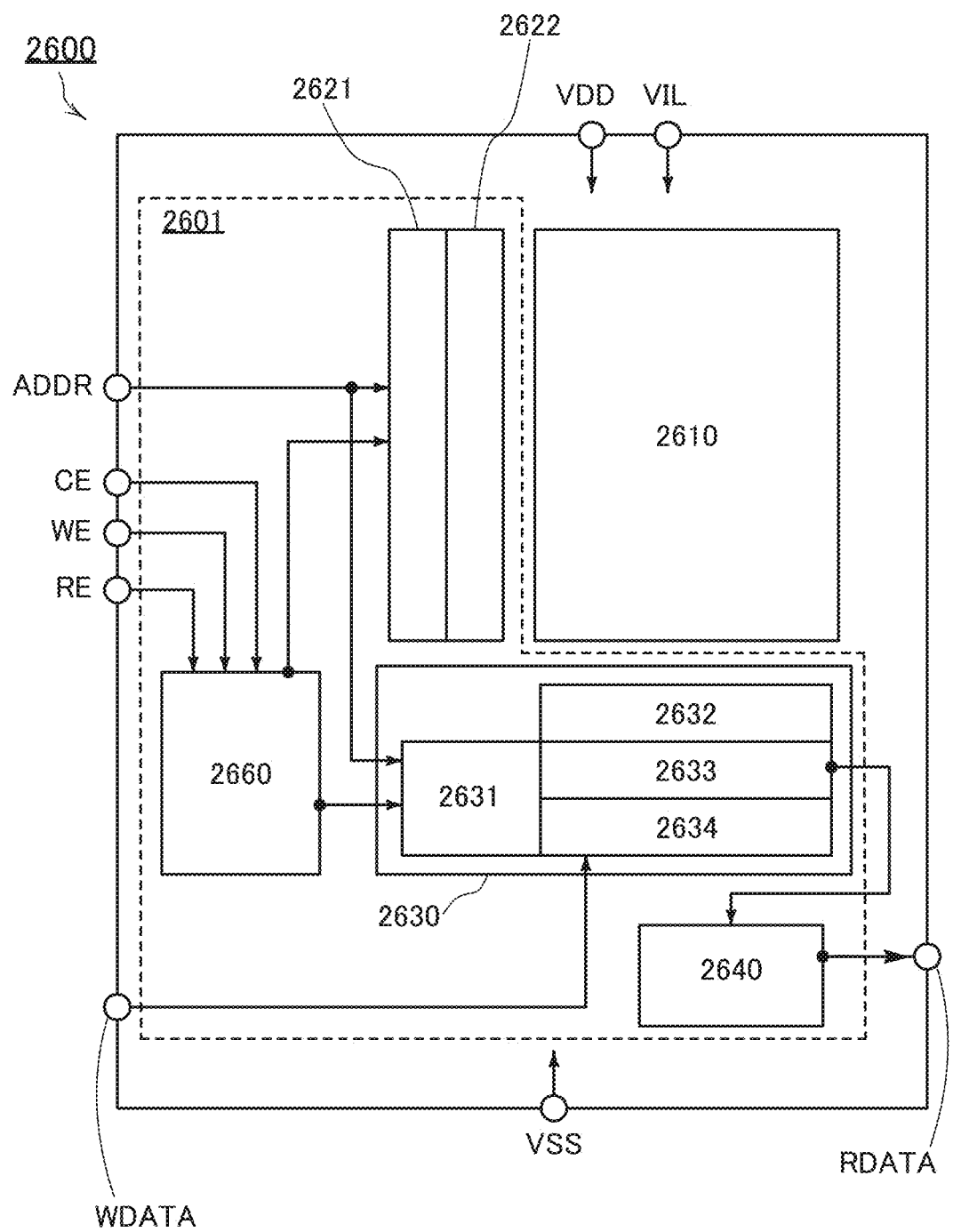
FIG. 74 is a block diagram illustrating an example of a storage device.

FIG. 74 illustrates a configuration example of a storage device. A storage device 2600 includes a peripheral circuit 2601 and a memory cell array 2610. The peripheral circuit 2601 includes a row decoder 2621, a word line driver circuit 2622, a bit line driver circuit 2630, an output circuit 2640, and a control logic circuit 2660).

The semiconductor device described in Embodiment 1 can be used for the memory cell array 2610, for example.

The bit line driver circuit 2630 includes a column decoder 2631, a precharge circuit 2632, a sense amplifier 2633, and a write circuit 2634. The precharge circuit 2632 has a function of precharging the wirings SL and/or the wirings BL (not illustrated in FIG. 74), which are described in Embodiment 5, to a predetermined potential. The sense amplifier 2633 has a function of obtaining a potential (or current) read out from the memory cell MC as a data signal and amplifying the data signal. The amplified data signal is output to the outside of the storage device 2600 as a digital data signal RDATA through the output circuit 2640.

As power supply voltages, a low power supply voltage (VSS), a high power supply voltage (VDD) for the peripheral circuit 2601, and a high power supply voltage (VIL) for the memory cell array 2610 are supplied to the storage device 2600 from the outside.

Control signals (CE, WE, RE), an address signal ADDR, and a data signal WDATA are input to the storage device 2600 from the outside. The address signal ADDR is input to the row decoder 2621 and the column decoder 2631, and the data signal WDATA is input to the write circuit 2634.

The control logic circuit 2660 processes the control signals (CE, WE, RE) input from the outside, and generates control signals to be input to the row decoder 2621 and the column decoder 2631. CE denotes a chip enable signal, WE denotes a write enable signal, and RE denotes a read-out enable signal. Signals processed by the control logic circuit 2660 are not limited to those listed above, and other control signals may be input as necessary.

Note that whether each circuit or each signal described above is provided or not can be determined as appropriate as needed.

When a p-channel Si transistor and a transistor whose channel formation region contains an oxide semiconductor described in the following embodiment (preferably oxide containing In, Ga, and Zn) are used in the storage device 2600, the storage device 2600 having a small size can be provided. In addition, the storage device 2600 that can be reduced in power consumption can be provided. Furthermore, the storage device 2600 that can be increased in operating speed can be provided. Particularly when the Si transistors are only p-channel ones, the manufacturing cost can be reduced.

Note that the configuration example of this embodiment is not limited to the configuration illustrated in FIG. 74. The configuration may be changed as appropriate in such a manner that part of the peripheral circuit 2601, for instance, the precharge circuit 2632 and/or the sense amplifier 2633 is provided below the memory cell array 2610, for example.

Note that this embodiment can be combined with the other embodiments described in this specification as appropriate.

Embodiment 8

This embodiment will show examples of a semiconductor wafer where the semiconductor device or the like described in the above embodiment is formed and electronic components incorporating the semiconductor device.

<Semiconductor Wafer>

First, an example of a semiconductor wafer where a semiconductor device or the like is formed is described with reference to FIG. 75A.

A semiconductor wafer 4800 illustrated in FIG. 75A includes a wafer 4801 and a plurality of circuit portions 4802 provided on the top surface of the wafer 4801. A portion without the circuit portion 4802 on the top surface of the wafer 4801 is a spacing 4803 that is a region for dicing.

The semiconductor wafer 4800 can be fabricated by forming the plurality of circuit portions 4802 on the surface of the wafer 4801 by a pre-process. After that, a surface of the wafer 4801 opposite to the surface provided with the plurality of circuit portions 4802 may be ground to thin the wafer 4801. Through this step, warpage or the like of the wafer 4801 is reduced and the size of the component can be reduced.

A dicing step is performed as the next step. The dicing is performed along scribe lines SCL1 and scribe lines SCL2 (referred to as dicing lines or cutting lines in some cases) indicated by dashed-dotted lines. Note that to perform the dicing step easily, it is preferable that the spacing 4803 be provided so that the plurality of scribe lines SCL1 are parallel to each other, the plurality of scribe lines SCL2 are parallel to each other, and the scribe lines SCL1 are perpendicular to the scribe lines SCL2.

With the dicing step, a chip 4800a illustrated in FIG. 75B can be cut out from the semiconductor wafer 4800. The chip 4800a includes a wafer 4801a, the circuit portion 4802, and a spacing 4803a. Note that it is preferable to make the spacing 4803a small as much as possible. In this case, the width of the spacing 4803 between adjacent circuit portions 4802 is substantially the same as a cutting allowance of the scribe line SCL1 or a cutting allowance of the scribe line SCL2.

Note that the shape of the element substrate of one embodiment of the present invention is not limited to the shape of the semiconductor wafer 4800 illustrated in FIG. 75A. The element substrate may be a rectangular semiconductor wafer, for example. The shape of the element substrate can be changed as appropriate, depending on a manufacturing process of an element and an apparatus for manufacturing the element.

<Electronic Component>

FIG. 75C is a perspective view of an electronic component 4700 and a substrate (a mounting board 4704) on which the electronic component 4700 is mounted. The electronic component 4700 illustrated in FIG. 75C includes the chip 4800a in a mold 4711. Note that the chip 4800a illustrated in FIG. 75C is shown to have a structure in which the circuit portions 4802 are stacked. That is, the semiconductor device described in the above embodiment can be used for the circuit portion 4802. To illustrate the inside of the electronic component 4700, some portions are omitted in FIG. 75C. The electronic component 4700 includes a land 4712 outside the mold 4711. The land 4712 is electrically connected to an electrode pad 4713, and the electrode pad 4713 is electrically connected to the chip 4800a through a wire 4714. The electronic component 4700 is mounted on a printed circuit board 4702, for example. A plurality of such electronic components are combined and electrically connected to each other on the printed circuit board 4702, whereby the mounting board 4704 is completed.

FIG. 75D shows a perspective view of an electronic component 4730. The electronic component 4730 is an example of a SiP (System in package) or an MCM (Multi Chip Module). In the electronic component 4730, an interposer 4731 is provided on a package substrate 4732 (a printed circuit board), and a semiconductor device 4735 and a plurality of semiconductor devices 4710 are provided on the interposer 4731.

The electronic component 4730 includes the semiconductor devices 4710. Examples of the semiconductor device 4710 include the semiconductor device described in the above embodiment and a high bandwidth memory (HBM). An integrated circuit (a semiconductor device) such as a CPU, a GPU, an FPGA, or a storage device can be used as the semiconductor device 4735.

As the package substrate 4732, a ceramic substrate, a plastic substrate, a glass epoxy substrate, or the like can be used. As the interposer 4731, a silicon interposer, a resin interposer, or the like can be used.

The interposer 4731 includes a plurality of wirings and has a function of electrically connecting a plurality of integrated circuits with different terminal pitches. The plurality of wirings are provided in a single layer or multiple layers. Moreover, the interposer 4731 has a function of electrically connecting an integrated circuit provided on the interposer 4731 to an electrode provided on the package substrate 4732. Accordingly, the interposer is referred to as a "redistribution substrate" or an "intermediate substrate" in some cases. A through electrode is provided in the interposer 4731 and the through electrode is used to electrically connect an integrated circuit and the package substrate 4732 in some cases. In a silicon interposer, a TSV (Through Silicon Via) can also be used as the through electrode.

A silicon interposer is preferably used as the interposer 4731. A silicon interposer can be manufactured at lower cost than an integrated circuit because it is not necessary to provide an active element. Moreover, since wirings of a silicon interposer can be formed through a semiconductor process, formation of minute wirings, which is difficult for a resin interposer, is easy.

In order to achieve a wide memory bandwidth, many wirings need to be connected to HBM. Therefore, formation of minute and high-density wirings is required for an interposer on which HBM is mounted. For this reason, a silicon interposer is preferably used as the interposer on which HBM is mounted.

In a SiP, an MCM, or the like using a silicon interposer, a decrease in reliability due to a difference in expansion coefficient between an integrated circuit and the interposer is less likely to occur. Furthermore, the surface of a silicon interposer has high planarity, so that a poor connection between the silicon interposer and an integrated circuit provided on the silicon interposer is less likely to occur. It is particularly preferable to use a silicon interposer for a 2.5D package (2.5-dimensional mounting) in which a plurality of integrated circuits are arranged side by side on an interposer.

A heat sink (a radiator plate) may be provided to overlap with the electronic component 4730. In the case of providing a heat sink, the heights of integrated circuits provided on the interposer 4731 are preferably equal to each other. For example, in the electronic component 4730 described in this embodiment, the heights of the semiconductor devices 4710 and the semiconductor device 4735 are preferably equal to each other.

To mount the electronic component 4730 on another substrate, an electrode 4733 may be provided on the bottom portion of the package substrate 4732. FIG. 75D illustrates an example where the electrode 4733 is formed of a solder ball. Solder balls are provided in a matrix on the bottom portion of the package substrate 4732, whereby BGA (Ball Grid Array) mounting can be achieved. Alternatively, the electrode 4733 may be formed of a conductive pin. When conductive pins are provided in a matrix on the bottom portion of the package substrate 4732, PGA (Pin Grid Array) mounting can be achieved.

The electronic component 4730 can be mounted on another substrate by various mounting methods not limited to BGA and PGA. For example, a mounting method such as SPGA (Staggered Pin Grid Array), LGA (Land Grid Array), QFP (Quad Flat Package), QFJ (Quad Flat J-leaded package), or QFN (Quad Flat Non-leaded package) can be employed.

Note that this embodiment can be combined with the other embodiments described in this specification as appropriate.

Embodiment 9

In this embodiment, a CPU that can include the semiconductor device of the foregoing embodiment will be described.

Figure 76:
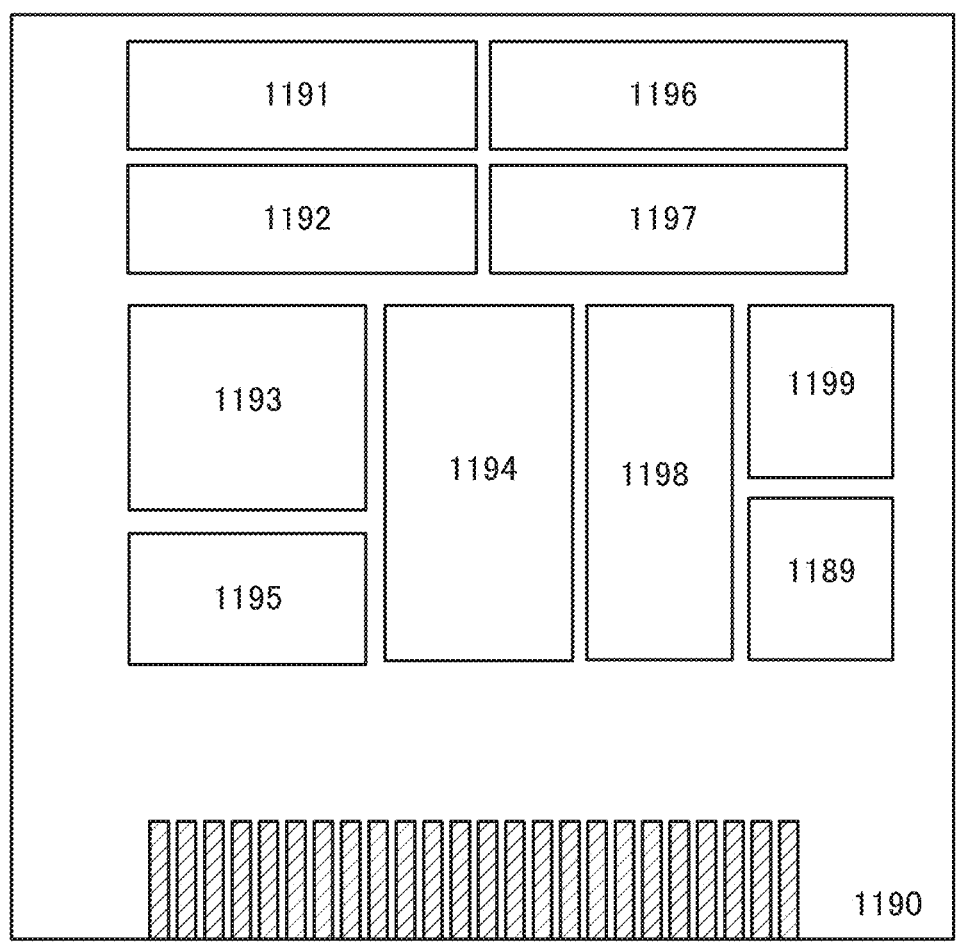
FIG. 76 is a block diagram illustrating a CPU.

FIG. 76 is a block diagram illustrating a configuration example of a CPU in part of which the semiconductor device described in the above embodiment is used.

The CPU illustrated in FIG. 76 includes an ALU 1191 (ALU: Arithmetic logic unit), an ALU controller 1192, an instruction decoder 1193, an interrupt controller 1194, a timing controller 1195, a register 1196, a register controller 1197, a bus interface 1198 (Bus I/F), a rewritable ROM 1199, and a ROM interface 1189 (ROM I/F) over a substrate 1190. A semiconductor substrate, an SOI substrate, a glass substrate, or the like is used as the substrate 1190. The ROM 1199 and the ROM interface 1189 may be provided over separate chips. Needless to say, the CPU illustrated in FIG. 76 is just an example of a simplified structure, and an actual CPU may have a variety of configurations depending on the usage. For example, the CPU may have a configuration in which a structure including the CPU illustrated in FIG. 76 or an arithmetic circuit is considered as one core, a plurality of the cores are included, and the cores operate in parallel, namely a configuration like that of a GPU. The number of bits that the CPU can process in an internal arithmetic circuit or in a data bus can be 8, 16, 32, or 64, for example.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 judges an interrupt request from an external input/output device or a peripheral circuit on the basis of its priority or a mask state, and processes the request. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal based on a reference clock signal, and supplies the internal clock signal to the above circuits.

In the CPU illustrated in FIG. 76, a memory cell is provided in the register 1196. As the memory cell of the register 1196, the transistors described in the foregoing embodiments can be used, for example.

In the CPU illustrated in FIG. 76, the register controller 1197 selects a retaining operation in the register 1196 in accordance with an instruction from the ALU 1191. That is, the register controller 1197 selects whether data retaining by a flip-flop is performed or data retaining by a capacitor is performed in the memory cell included in the register 1196. In the case where data retaining by the flip-flop is selected, a power supply voltage is supplied to the memory cell in the register 1196. In the case where data retaining by the capacitor is selected, the data is rewritten into the capacitor, and supply of power supply voltage to the memory cell in the register 1196 can be stopped.

Note that this embodiment can be combined with the other embodiments described in this specification as appropriate.

Embodiment 10

This embodiment will show examples of electronic devices including the semiconductor device described in the above embodiment. FIG. 77A to FIG. 77(J) and FIG. 78A to FIG. 78E illustrate electronic devices each of which includes the electronic component 4700 including the semiconductor device.

[Mobile Phone]

Figure 77A:
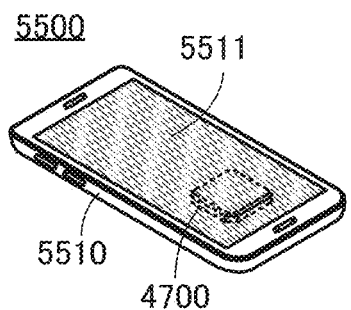
FIG. 77A to FIG. 77J are each a perspective view or a schematic view illustrating an example of a product.

An information terminal 5500 illustrated in FIG. 77A is a mobile phone (smartphone), which is a type of information terminal. The information terminal 5500 includes a housing 5510 and a display portion 5511, and as input interfaces, a touch panel is provided in the display portion 5511 and a button is provided in the housing 5510.

By using the semiconductor device described in the above embodiment, the information terminal 5500 can retain a temporary file generated at the time of executing an application (e.g., a web browser's cache).

[Wearable Terminal]

Figure 77B:
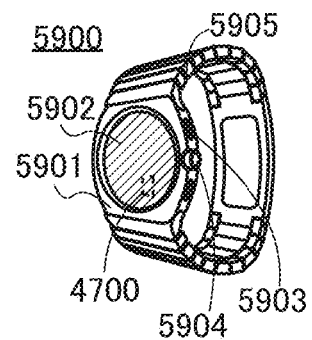

FIG. 77B illustrates an information terminal 5900 that is an example of a wearable terminal. The information terminal 5900 includes a housing 5901, a display portion 5902, an operation button 5903, an operator 5904, a band 5905, and the like.

Like the information terminal 5500 described above, the wearable terminal can retain a temporary file generated at the time of executing an application by using the semiconductor device described in the above embodiment.

[Information Terminal]

Figure 77C:
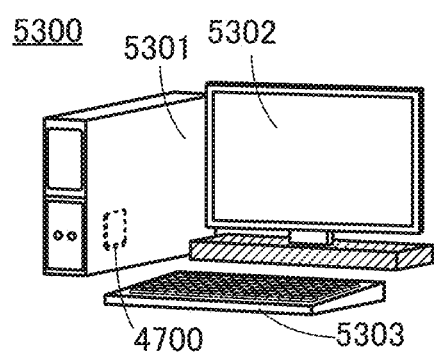

FIG. 77C illustrates a desktop information terminal 5300. The desktop information terminal 5300 includes a main body 5301 of the information terminal, a display 5302, and a keyboard 5303.

Like the information terminal 5500 described above, the desktop information terminal 5300 can retain a temporary file generated at the time of executing an application by using the semiconductor device described in the above embodiment.

Note that although the smartphone, the wearable terminal, and the desktop information terminal are respectively illustrated in FIG. 77A and FIG. 77C as examples of the electronic device, one embodiment of the present invention can be applied to an information terminal other than a smartphone, a wearable terminal, and a desktop information terminal. Examples of an information terminal other than a smartphone, a wearable terminal, and a desktop information terminal include a PDA (Personal Digital Assistant), a laptop information terminal, and a workstation.

[Household Appliance]

Figure 77D:
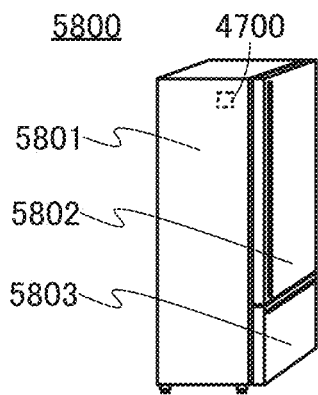

FIG. 77D illustrates an electric refrigerator-freezer 5800 as an example of a household appliance. The electric refrigerator-freezer 5800 includes a housing 5801, a refrigerator door 5802, a freezer door 5803, and the like.

When the semiconductor device described in the above embodiments is used in the electric refrigerator-freezer 5800, the electric refrigerator-freezer 5800 can be used for IoT (Internet of Things), for example. When used for IoT, the electric refrigerator-freezer 5800 can send and receive data on food stored in the electric refrigerator-freezer 5800 and food expiration dates, for example, to/from the above-described information terminal and the like via the Internet. When sending the data, the electric refrigerator-freezer 5800 can retain the data as a temporary file in the semiconductor device.

Although the electric refrigerator-freezer is described in this example as a household appliance, examples of other household appliances include a vacuum cleaner, a microwave oven, an electric oven, a rice cooker, a water heater, an IH cooker, a water server, a heating-cooling combination appliance such as an air conditioner, a washing machine, a drying machine, and an audiovisual appliance.

[Game Machines]

Figure 77E:
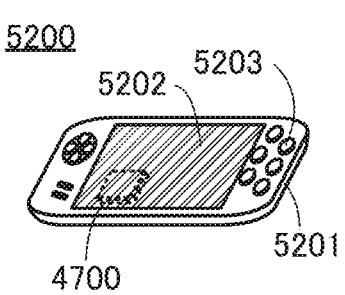

FIG. 77E illustrates a portable game machine 5200 that is an example of a game machine. The portable game machine 5200 includes a housing 5201, a display portion 5202, a button 5203, and the like.

Figure 77F:
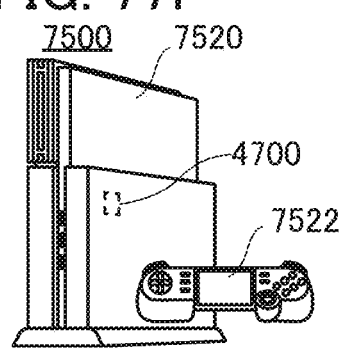

FIG. 77F illustrates a stationary game machine 7500 that is another example of a game machine. The stationary game machine 7500 includes a main body 7520 and a controller 7522. The controller 7522 can be connected to the main body 7520 with or without a wire. Although not illustrated in FIG. 77F, the controller 7522 can include a display portion that displays a game image, and an input interface besides a button, such as a touch panel, a stick, a rotating knob, and a sliding knob, for example. The shape of the controller 7522 is not limited to that illustrated in FIG. 77F, and can be changed variously in accordance with the genres of games. For example, for a shooting game such as an FPS (First Person Shooter) game, a gun-shaped controller having a trigger button can be used. As another example, for a music game or the like, a controller having a shape of a musical instrument, audio equipment, or the like can be used. Furthermore, the stationary game machine may include a camera, a depth sensor, a microphone, and the like so that the game player can play a game using a gesture and/or a voice instead of a controller.

Videos displayed on the game machine can be output with a display device such as a television device, a personal computer display, a game display, or a head-mounted display.

When the semiconductor device described in the above embodiment is used in the portable game machine 5200, the portable game machine 5200 with low power consumption can be achieved. Furthermore, heat generation from a circuit can be reduced owing to low power consumption; thus, the influence of heat generation on the circuit itself, the peripheral circuit, and the module can be reduced.

Moreover, with the use of the semiconductor device described in the above embodiment, the portable game machine 5200 can retain a temporary file necessary for arithmetic operation that occurs during game play.

Although FIG. 77E and FIG. 77F illustrate a portable game machine and a home stationary game machine, respectively, as examples of game machines, the electronic device of one embodiment of the present invention is not limited thereto. Examples of the electronic device of one embodiment of the present invention include an arcade game machine installed in entertainment facilities (e.g., a game center and an amusement park) and a throwing machine for batting practice installed in sports facilities.

[Moving Vehicle]

The semiconductor device described in the above embodiment can be used for an automobile, which is a moving vehicle, and around the driver's seat in an automobile.

Figure 77G:
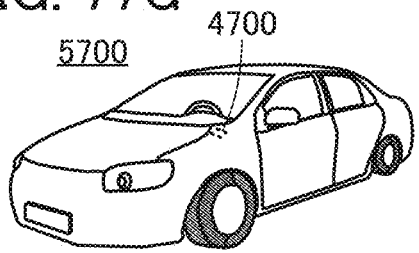

FIG. 77G illustrates an automobile 5700 that is an example of a moving vehicle.

An instrument panel that provides various kinds of information by displaying a speedometer, a tachometer, a mileage, a fuel meter, a gearshift state, and air-conditioning settings is provided around the driver's seat in the automobile 5700. In addition, a display device showing the above information may be provided around the driver's seat.

In particular, the display device can compensate for the view obstructed by the pillar or the like, the blind areas for the driver's seat, and the like by displaying a video taken by an imaging device (not illustrated) provided for the automobile 5700, which improves safety.

The semiconductor device described in the above embodiment can temporarily retain data, and thus the computer can be used to retain temporary data necessary in an automatic driving system for the automobile 5700 and a system for navigation and risk prediction, for example. The display device may be configured to display temporary information regarding navigation, risk prediction, or the like. Moreover, the semiconductor device may be configured to retain a video taken by a driving recorder provided in the automobile 5700.

Although an automobile is described above as an example of a moving vehicle, a moving vehicle is not limited to an automobile. Examples of moving vehicles include a train, a monorail train, a ship, and a flying object (a helicopter, an unmanned aircraft (a drone), an airplane, and a rocket).

[Camera]

The semiconductor device described in the above embodiment can be used in a camera.

Figure 77H:
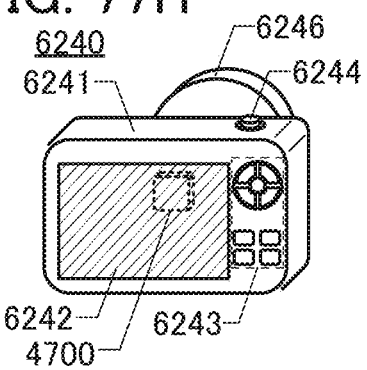

FIG. 77H illustrates a digital camera 6240 that is an example of an imaging device. The digital camera 6240 includes a housing 6241, a display portion 6242, operation buttons 6243, a shutter button 6244, and the like, and an attachable lens 6246 is attached to the digital camera 6240. Here, the lens 6246 of the digital camera 6240 is detachable from the housing 6241 for replacement; alternatively, the lens 6246 may be incorporated into the housing 6241. A stroboscope, a viewfinder, or the like may be additionally attached to the digital camera 6240.

When the semiconductor device described in the above embodiment is used in the digital camera 6240, the digital camera 6240 with low power consumption can be achieved. Furthermore, heat generation from a circuit can be reduced owing to low power consumption; thus, the influence of heat generation on the circuit itself, the peripheral circuit, and the module can be reduced.

[Video Camera]

The semiconductor device described in the above embodiment can be used in a video camera.

Figure 77I:
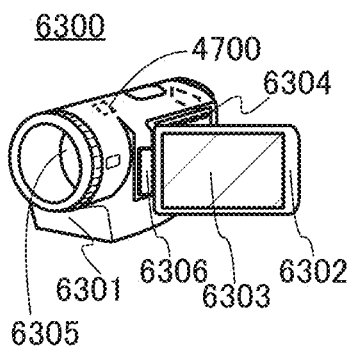

FIG. 77I illustrates a video camera 6300 that is an example of an imaging device. The video camera 6300 includes a first housing 6301, a second housing 6302, a display portion 6303, operation keys 6304, a lens 6305, a joint 6306, and the like. The operation keys 6304 and the lens 6305 are provided in the first housing 6301, and the display portion 6303 is provided in the second housing 6302. The first housing 6301 and the second housing 6302 are connected to each other with the joint 6306, and the angle between the first housing 6301 and the second housing 6302 can be changed with the joint 6306. Images displayed on the display portion 6303 may be changed in accordance with the angle at the joint 6306 between the first housing 6301 and the second housing 6302.

When images taken by the video camera 6300 are recorded, the images need to be encoded in accordance with a data recording format. With the use of the above semiconductor device, the video camera 6300 can retain a temporary file generated in encoding.

[ICD]

The semiconductor device described in the above embodiment can be used in an implantable cardioverter-defibrillator (ICD).

Figure 77J:
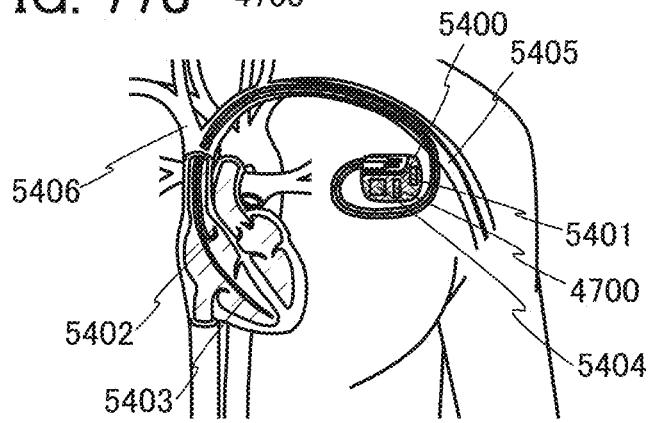

FIG. 77(J) is a schematic cross-sectional view illustrating an example of an ICD. An ICD main unit 5400 includes at least a battery 5401, an electric component 4700, a regulator, a control circuit, an antenna 5404, a wire 5402 reaching a right atrium, and a wire 5403 reaching a right ventricle.

The ICD main unit 5400 is implanted in the body by surgery, and the two wires pass through a subclavian vein 5405 and a superior vena cava 5406 of the human body, with the end of one of the wires placed in the right ventricle and the end of the other wire placed in the right atrium.

The ICD main unit 5400 functions as a pacemaker and paces the heart when the heart rate is not within a predetermined range. When the heart rate is not recovered by pacing (e.g., when ventricular tachycardia or ventricular fibrillation occurs), treatment with an electrical shock is performed.

The ICD main unit 5400 needs to monitor the heart rate all the time in order to perform pacing and deliver electrical shocks as appropriate. For that reason, the ICD main unit 5400 includes a sensor for measuring the heart rate. In the ICD main unit 5400, data on the heart rate obtained by the sensor, the number of times the treatment with pacing is performed, and the time taken for the treatment, for example, can be stored in the electronic component 4700.

The antenna 5404 can receive electric power, and the battery 5401 is charged with the electric power. When the ICD main unit 5400 includes a plurality of batteries, the safety can be improved. Specifically, even if one of the batteries in the ICD main unit 5400 is dead, the other batteries can work properly; hence, the batteries also function as an auxiliary power source.

In addition to the antenna 5404 capable of receiving electric power, an antenna that can transmit physiological signals may be included to construct, for example, a system that monitors the cardiac activity by checking physiological signals such as a pulse, a respiratory rate, a heart rate, and body temperature with an external monitoring device.

[Expansion Device for PC]

The semiconductor device described in the above embodiment can be used in a calculator such as a PC (Personal Computer) and an extension device for an information terminal.

Figure 78A:
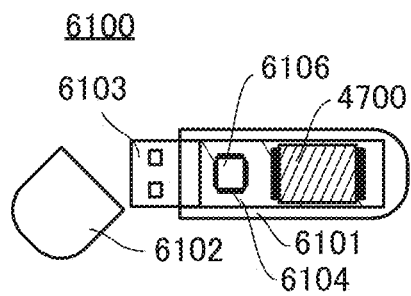
FIG. 78A to FIG. 78E are each a perspective view or a schematic view illustrating an example of a product.

FIG. 78A illustrates, as an example of the extension device, a portable extension device 6100 that includes a chip capable of retaining data and is externally provided on a PC. The extension device 6100 can retain data using the chip when connected to a PC with a USB (Universal Serial Bus), for example. FIG. 78A illustrates the portable extension device 6100; however, the extension device of one embodiment of the present invention is not limited thereto and may be a relatively large extension device including a cooling fan or the like, for example.

The expansion device 6100 includes a housing 6101, a cap 6102, a USB connector 6103, and a substrate 6104. The substrate 6104 is held in the housing 6101. The substrate 6104 is provided with a circuit for driving the semiconductor device or the like described in the above embodiment. For example, the substrate 6104 is provided with the electronic component 4700 and a controller chip 6106. The USB connector 6103 functions as an interface for connection to an external device.

[SD Card]

The semiconductor device described in the above embodiment can be used in an SD card that can be attached to an electronic device such as an information terminal or a digital camera.

Figure 78B:
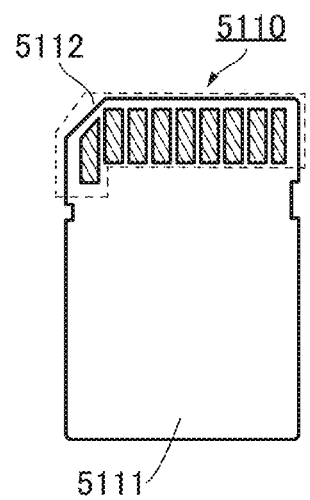
Figure 78C:
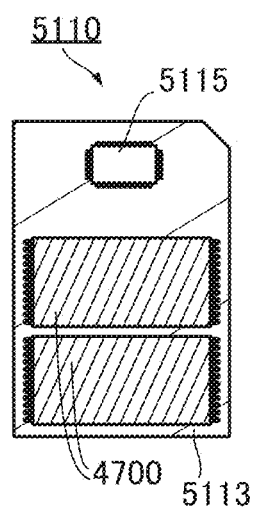

FIG. 78B is a schematic external view of an SD card, and FIG. 78C is a schematic view of the internal structure of the SD card. An SD card 5110 includes a housing 5111, a connector 5112, and a substrate 5113. The connector 5112 functions as an interface for connection to an external device. The substrate 5113 is held in the housing 5111. The substrate 5113 is provided with a storage device and a circuit for driving the storage device. For example, electronic components 4700 and a controller chip 5115 are attached to the substrate 5113. Note that the circuit structures of the electronic components 4700 and the controller chip 5115 are not limited to those described above, and can be changed as appropriate according to circumstances. For example, a write circuit, a row driver, a readout circuit, and the like that are provided in an electronic component may be incorporated into the controller chip 5115 instead of the electronic component 4700.

When the electronic components 4700 are provided also on a rear surface side of the substrate 5113, the capacitance of the SD card 5110 can be increased. In addition, a wireless chip with a wireless communication function may be provided on the substrate 5113. This allows wireless communication between an external device and the SD card 5110 and enables data reading and writing from/to the electronic components 4700.

[SSD]

The semiconductor device described in the above embodiment can be used in a solid state drive (SSD) that can be attached to an electronic device such as an information terminal.

Figure 78D:
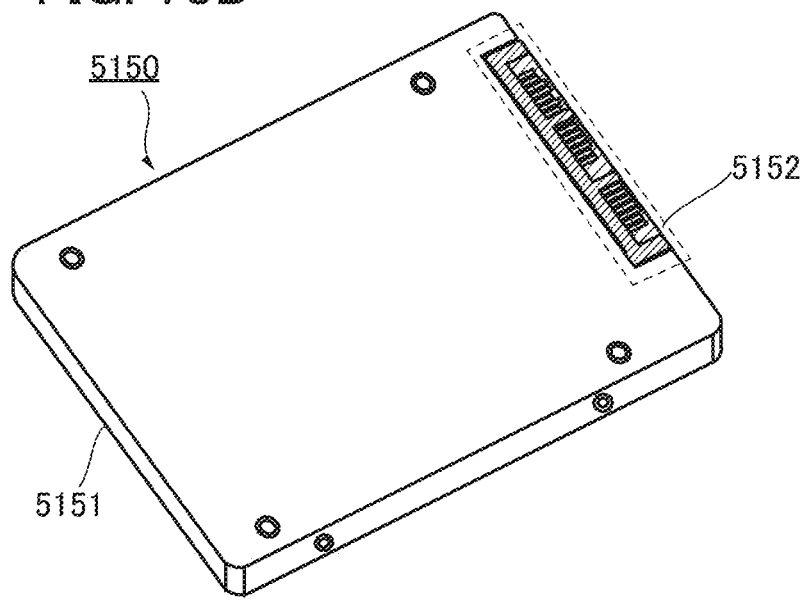
Figure 78E:
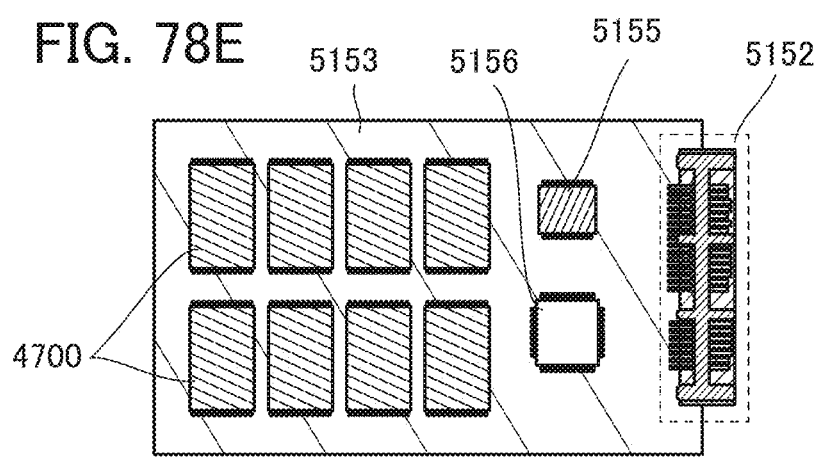

FIG. 78D is a schematic external view of an SSD, and FIG. 78E is a schematic view of the internal structure of the SSD. An SSD 5150 includes a housing 5151, a connector 5152, and a substrate 5153. The connector 5152 functions as an interface for connection to an external device. The substrate 5153 is held in the housing 5151. The substrate 5153 is provided with a storage device and a circuit for driving the storage device. For example, the electronic components 4700, a memory chip 5155, and a controller chip 5156 are attached to the substrate 5153. When the electronic components 4700 are also provided on a rear surface side of the substrate 5153, the capacitance of the SSD 5150 can be increased. A work memory is incorporated in the memory chip 5155. For example, a DRAM chip may be used as the memory chip 5155. A processor, an ECC circuit, and the like are incorporated in the controller chip 5156. Note that the circuit structures of the electronic components 4700, the memory chip 5155, and the controller chip 5115 are not limited to those described above, and the circuit structures can be changed as appropriate according to circumstances. For example, a memory functioning as a work memory can also be provided in the controller chip 5156.

Note that this embodiment can be combined with the other embodiments described in this specification as appropriate.

REFERENCE NUMERALS

MC: memory cell, MC[1]: memory cell, MC[2]: memory cell, MC[n]: memory cell, MC[1,1]: memory cell, MC[j,1]: memory cell, MC[n,1]: memory cell, MC[1,i]: memory cell, MC[0]: memory cell, MC[n,i]: memory cell, MC[1,m]: memory cell, MC[j,m]: memory cell, MC[n,m]: memory cell, CTr: cell transistor, CTrA: cell transistor, CTrB: cell transistor, STr: transistor, STr[1]: transistor, STr[i]: transistor, STr[m]: transistor, BTr: transistor, BTr[1]: transistor, BTr[i]: transistor, BTr[m]: transistor, SL: wiring, SL[1]: wiring, SL[i]: wiring, SL [m]: wiring, SSL: wiring, SSL[1]: wiring, SSL[i]: wiring, SSL[m]: wiring, BL: wiring, BL[1]: wiring, BL[i]: wiring, BL[m]: wiring, BSL: wiring, BSL[1]: wiring, BSL[i]: wiring, BSL[m]: wiring, WL[1]: wiring, WL[2]: wiring, WL [n]: wiring, BGL: wiring, BGL[1]: wiring, BGL[i]: wiring, BGL[m]: wiring, WL: wiring, ER: wiring, PG: conductor, HL: region, TM: region, AR: region, SD1: region, SD2: region, SOL: source line, WOL: word line, WOLa_1: word line, WOLa_2: word line, WOLa_3: word line, WOLa_4: word line, WOLa_5: word line, WOLa_6: word line, WOLb_1: word line, WOLb_2: word line, WOLb_3: word line, WOLb_4: word line, WOLb_5: word line, WOLb_6: word line, BIL: bit line, BIL_1: bit line, BIL_2: bit line, BIL_3: bit line, BIL_4: bit line, 10: treatment, 300: stack, 301A: sacrificial layer, 301B: sacrificial layer, 311A: insulator, 311B: insulator, 311C: insulator, 312: insulator, 312a: insulator, 312a_1: insulator, 312a_2: insulator, 312a_3: insulator, 312a_4: insulator, 312b: insulator, 312c: insulator, 313: insulator, 313_1: insulator, 313_2: insulator, 313_3: insulator, 313_4: insulator, 314: insulator, 314_1: insulator, 314_2: insulator, 314a: insulator, 314b: insulator, 315: insulator, 315_1: insulator, 315_2: insulator, 315a: insulator, 315b: insulator, 316: insulator, 316A: insulator, 316B: insulator, 319: insulator, 331: conductor, 331a: conductor, 331a_1: conductor, 331a_2: conductor, 331a_3: conductor, 331a_4: conductor, 331b: conductor, 331c: conductor, 332: conductor, 332_1: conductor, 332_2: conductor, 332_3: conductor, 332_4: conductor, 333: conductor, 333a: conductor, 333b: conductor, 333b_1: conductor, 333b_2: conductor, 334: conductor, 334a: conductor, 334b: conductor, 351: material layer, 351a: material layer, 351a_1: material layer, 351a_2: material layer, 351a_3: material layer, 351a_4: material layer, 351b: material layer, 351c: material layer, 352: material layer, 352_1: material layer, 352_2: material layer, 352_3: material layer, 352_4: material layer, 352A: material layer, 352B: material layer, 353: material layer, 353_1: material layer, 353_2: material layer, 353a: material layer, 353b: material layer, 353A: material layer, 353B: material layer, 361a: conductor, 361b: conductor, 361c: conductor, 371: region, 372: region, 391: region, 392: region, 392A: region, 392B: region, 393A: depressed portion, 393B: depressed portion, 394: region, 400: stack, 401A: sacrificial layer, 401B: sacrificial layer, 411A: insulator, 411B: insulator, 411C: insulator, 412: insulator, 412a: insulator, 412b: insulator, 412c: insulator, 413: insulator, 414: insulator, 414a: insulator, 414b: insulator, 415: insulator, 415a: insulator, 415b: insulator, 416: insulator, 416A: insulator, 416B: insulator, 421: insulator, 421a: insulator, 421b: insulator, 431: conductor, 431a: conductor, 431b: conductor, 431c: conductor, 432: conductor, 434: conductor, 434a: conductor, 434b: conductor, 451: material layer, 451a: material layer, 451b: material layer, 451c: material layer, 452: material layer, 452A: material layer, 452B: material layer, 453: material layer, 453a: material layer, 453b: material layer, 453A: material layer, 453B: material layer, 461a: conductor, 461b: conductor, 461c: conductor, 471: region, 472: region, 491: region, 492: region, 492A: region, 492B: region, 493A: depressed portion, 493B: depressed portion, 494: region, 700: memory cell array, 700A: memory cell array, 701: conductor, 701_m: conductor, 701_1: conductor, 701_6: conductor, 702: conductor, 703: insulator, 703a: insulator, 703b: insulator, 703c: insulator, 703_1: insulator, 703_4: insulator, 704: oxide, 704a: oxide, 704b: oxide, 704c: oxide, 704_1: oxide, 704_4: oxide, 705: conductor, 705_1: conductor, 705_4: conductor, 706: conductor, 706_1: conductor, 7064: conductor, 707: conductor, 707_m: conductor, 707_1: conductor, 708: conductor, 708_m: conductor, 708_1: conductor, 710: cell transistor, 711: insulator, 720: base, 1189: ROM interface, 1190: substrate, 1191: ALU, 1192: ALU controller, 1193: instruction decoder, 1194: interrupt controller, 1195: timing controller, 1196: register, 1197: register controller, 1198: bus interface, 1201: insulator, 1202: insulator, 1203: insulator, 1211: conductor, 1221: conductor, 1222: conductor, 1223: conductor, 1700: substrate, 1701: element separation layer, 1712: conductor, 1730: conductor, 1790: gate electrode, 1793: channel formation region, 1794: low-concentration impurity region, 1795: high-concentration impurity region, 1796: conductive region, 1797: gate insulating film, 1798: sidewall insulating layer, 1799: sidewall insulating layer, 2600: storage device, 2601: peripheral circuit, 2610: memory cell array, 2621: row decoder, 2622: word line driver circuit, 2630: bit line driver circuit, 2631: column decoder, 2632: precharge circuit, 2633: sense amplifier, 2634: writing circuit, 2640: output circuit, 2660: control logic circuit, 4700: electronic component, 4702: printed circuit board, 4704: mounting board, 4710: semiconductor device, 4714: wire, 4730: electronic component, 4731: interposer, 4732: package substrate, 4733: electrode, 4735: semiconductor device, 4800: semiconductor wafer, 4800a: chip, 4801: wafer, 4801a: wafer, 4802: circuit portion, 4803: spacing, 4803a: spacing, 5110: SD card, 5111: housing, 5112: connector, 5113: substrate, 5115: controller chip, 5150: SSD, 5151: housing, 5152: connector, 5153: substrate, 5155: memory chip, 5156: controller chip, 5200: portable game machine, 5201: housing, 5202: display portion, 5203: button, 5300: desktop information terminal, 5301: main body, 5302: display, 5303: keyboard, 5400: ICD main body, 5401: battery, 5402: wire, 5403: wire, 5404: antenna, 5405: subclavian vein, 5406: superior vena cava, 5500: information terminal, 5510: housing, 5511: display portion, 5700: automobile, 5800: electric refrigerator-freezer, 5801: housing, 5802: refrigerator door, 5803: freezer door, 5900: information terminal, 5901: housing, 5902: display portion, 5903: operation button, 5904: operator, 5905: band, 6100: expansion device, 6101: housing, 6102: cap, 6103: USB connector, 6104: substrate, 6106: controller chip, 6240: digital camera, 6241: housing, 6242: display portion, 6243: operation button, 6244: shutter button, 6246: lens, 6300: video camera, 6301: first housing, 6302: second housing, 6303: display portion, 6304: operation key, 6305: lens, 6306: joint, 7520: main body, 7522: controller

The invention claimed is:

1. A semiconductor device comprising:
a first conductor with a columnar shape;
a second conductor;
a third conductor;
a first insulator;
a second insulator;
a third insulator;
a fourth insulator;
a fifth insulator, and insulator;
a sixth insulator;
a first material layer;
a second material layer; and
a third material layer,
wherein the first insulator is adjacent to the first conductor, wherein the first material layer is adjacent to the first insulator,
wherein the first material layer comprises a first region and a second region,
wherein the second material layer is adjacent to the first region of the first material layer,
wherein the second conductor is adjacent to the second material layer,
wherein the second insulator is adjacent to the second conductor,
wherein the third insulator is adjacent to the second insulator,
wherein the third material layer covers the second material layer, the second conductor, the second insulator, the third insulator, and the second region of the first material layer,
wherein the fourth insulator is adjacent to the third material layer,
wherein the sixth insulator is adjacent to the fourth insulator,
wherein the fifth insulator is adjacent to the sixth insulator,
wherein the third conductor is adjacent to the fifth insulator and in a region facing the second region of the first material layer with the fifth insulator provided therebetween,
wherein the second insulator is configured to be a barrier insulating film that inhibits diffusion of oxygen into the second conductor,
wherein the fourth insulator is configured to be a tunnel insulating film,
wherein the sixth insulator is configured to be a charge accumulation layer,
wherein the fifth insulator is configured to be a gate insulating film,
wherein the first material layer comprises oxide containing indium, an element M, and zinc,
wherein the element M is any one of aluminum, gallium, tin, and titanium,
wherein the second material layer comprises oxide containing indium, the element M, and zinc, and
wherein the third material layer comprises oxide containing indium, the element M, and zinc.

2. The semiconductor device according to claim 1,
wherein the first material layer comprises a fourth material layer and a fifth material layer,
wherein the fourth material layer is adjacent to the first insulator,
wherein the fifth material layer is adjacent to the fourth material layer,
wherein the first region of the first material layer is positioned in the fifth material layer,
wherein the second region of the first material layer is positioned in the fifth material layer,
wherein an atomic ratio of the element M to indium contained in the second material layer is higher than an atomic ratio of the element M to indium contained in the fifth material layer, and
wherein an atomic ratio of the element M to indium contained in the fourth material layer is higher than an atomic ratio of the element M to indium contained in the fifth material layer.

3. The semiconductor device according to claim 1,
wherein the second region of the first material layer has a higher oxygen concentration than the first region of the first material layer.

4. The semiconductor device according to claim 1,
wherein a thickness of the second region of the first material layer is smaller than a thickness of the first region of the first material layer.

5. A storage device comprising the semiconductor device according to claim 1 and a peripheral circuit.

6. An electronic device comprising the storage device according to claim 5 and a housing.

7. A semiconductor device comprising:
a first conductor with a columnar shape;
a second conductor;
a third conductor;
a fourth conductor;
a first insulator;
a second insulator;
a third insulator;
a fourth insulator, and insulator;
a fifth insulator;
a first material layer;
a second material layer; and
a third material layer,
wherein the first insulator is adjacent to the first conductor,
wherein the first material layer is adjacent to the first insulator,
wherein the first material layer comprises a first region and a second region,
wherein the second material layer is adjacent to the first region of the first material layer,
wherein the second conductor is adjacent to the second material layer,
wherein the second insulator is adjacent to the second conductor,
wherein the third insulator is adjacent to the second insulator,
wherein the third material layer covers the second material layer, the second conductor, the second insulator, the third insulator, and the second region of the first material layer,
wherein the fourth insulator is adjacent to the third material layer,
wherein the fourth conductor is adjacent to the fourth insulator and in a region facing the second region of the first material layer with the fourth insulator provided therebetween,
wherein the fifth insulator covers the fourth conductor and the fourth insulator,
wherein the third conductor is adjacent to the fifth insulator and in the region facing the second region of the first material layer with the fifth insulator provided therebetween,
wherein the second insulator is configured to be a barrier insulating film that inhibits diffusion of oxygen into the second conductor,
wherein the fourth insulator is configured to be a tunnel insulating film,
wherein the fourth conductor is configured to be a floating gate electrode,
wherein the fifth insulator is configured to be a gate insulating film,
wherein the first material layer comprises oxide containing indium, an element M, and zinc,
wherein the element M is any one of aluminum, gallium, tin, and titanium,
wherein the second material layer comprises oxide containing indium, the element M, and zinc, and wherein the third material layer comprises oxide containing indium, the element M, and zinc.

8. The semiconductor device according to claim 7,
wherein the first material layer comprises a fourth material layer and a fifth material layer,
wherein the fourth material layer is adjacent to the first insulator,
wherein the fifth material layer is adjacent to the fourth material layer,
wherein the first region of the first material layer is in the fifth material layer,
wherein the second region of the first material layer is in the fifth material layer,
wherein an atomic ratio of the element M to indium contained in the second material layer is higher than an atomic ratio of the element M to indium contained in the fifth material layer, and
wherein an atomic ratio of the element M to indium contained in the fourth material layer is higher than an atomic ratio of the element M to indium contained in the fifth material layer.

9. The semiconductor device according to claim 7,
wherein the second region of the first material layer has a higher oxygen concentration than the first region of the first material layer.

10. The semiconductor device according to claim 7,
wherein a thickness of the second region of the first material layer is smaller than a thickness of the first region of the first material layer.

11. A storage device comprising the semiconductor device according to claim 2 and a peripheral circuit.

12. An electronic device comprising the storage device according to claim 11 and a housing.

* * * * *